(12) United States Patent
Stadelmeier et al.

(10) Patent No.: US 11,431,544 B2
(45) Date of Patent: *Aug. 30, 2022

(54) CODING AND MODULATION APPARATUS USING NON-UNIFORM CONSTELLATION

(71) Applicant: SATURN LICENSING LLC, New York, NY (US)

(72) Inventors: Lothar Stadelmeier, Stuttgart (DE); Nabil Sven Loghin, Freiburg (DE); Jan Zoellner, Braunschweig (DE)

(73) Assignee: SATURN LICENSING LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/184,208

(22) Filed: Feb. 24, 2021

(65) Prior Publication Data

US 2021/0184910 A1 Jun. 17, 2021

Related U.S. Application Data

(63) Continuation of application No. 16/447,589, filed on Jun. 20, 2019, now Pat. No. 10,958,498, which is a (Continued)

(30) Foreign Application Priority Data

Apr. 30, 2013 (EP) .................................. 13166018

(51) Int. Cl.
*H04L 27/36* (2006.01)
*H03M 13/35* (2006.01)
(Continued)

(52) U.S. Cl.
CPC ............ *H04L 27/36* (2013.01); *H03M 13/25* (2013.01); *H03M 13/251* (2013.01);
(Continued)

(58) Field of Classification Search
CPC .. H03M 13/25; H03M 13/251; H03M 13/255; H03M 13/356; H04L 27/36;
(Continued)

(56) References Cited

U.S. PATENT DOCUMENTS 8,750,398 B2 6/2014 Ko et al.
8,867,640 B2 10/2014 Ko et al.
(Continued)

FOREIGN PATENT DOCUMENTS

CN 1490972 A 4/2004
CN 1863182 A 11/2006
(Continued)

OTHER PUBLICATIONS

Liu et al., "APSK Constellation with Gray Mapping," IEEE Communication Letters, vol. 15, No. 12, XP011389300, (Dec. 2011). pp. 1271-1273.
(Continued)

*Primary Examiner* — Kevin M Burd
(74) *Attorney, Agent, or Firm* — Oblon, McClelland, Maier & Neustadt, L.L.P.

(57) ABSTRACT

A coding and modulation apparatus and method are presented. The apparatus (10) comprises an encoder (11) that encodes input data into cell words, and a modulator (12) that modulates said cell words into constellation values of a non-uniform constellation. The modulator (12) is configured to use, based on the total number M of constellation points of the constellation and the signal-to-noise ratio SNR in dB, a non-uniform constellation from a group of constellations comprising one or more of predetermined constellations defined by the constellation position vector $w_{0 \ldots b-1}$, wherein b=M/4.

16 Claims, 6 Drawing Sheets

Related U.S. Application Data continuation of application No. 15/899,501, filed on Feb. 20, 2018, now abandoned, which is a continuation of application No. 14/786,725, filed as application No. PCT/EP2014/058719 on Apr. 29, 2014, now Pat. No. 9,906,396.

(51) Int. Cl.
*H04L 27/34* (2006.01)
*H03M 13/25* (2006.01)
*H04L 1/00* (2006.01)

(52) U.S. Cl.
CPC ....... *H03M 13/255* (2013.01); *H03M 13/356* (2013.01); *H04L 1/0003* (2013.01); *H04L 1/0058* (2013.01); *H04L 1/0071* (2013.01); *H04L 27/3405* (2013.01)

(58) Field of Classification Search
CPC . H04L 27/3405; H04L 1/0003; H04L 1/0058; H04L 1/0071
USPC .......................................................... 375/298
See application file for complete search history.

(56) References Cited

U.S. PATENT DOCUMENTS

| | | | |
|---|---|---|---|
| 9,094,276 | B2 | 7/2015 | Ko et al. |
| 9,148,251 | B2 | 9/2015 | Ko et al. |
| 9,680,684 | B2 | 6/2017 | Stadelmeier et al. |
| 9,813,279 | B2 * | 11/2017 | Loghin ............... H04L 1/0003 |
| 9,906,392 | B2 | 2/2018 | Hwang et al. |
| 10,868,706 | B2 * | 12/2020 | Loghin ............... H04L 27/362 |
| 10,958,498 | B2 * | 3/2021 | Stadelmeier ......... H04L 1/0003 |
| 2005/0047517 | A1 | 3/2005 | Georgios et al. |
| 2005/0220197 | A1 | 10/2005 | Noda |
| 2007/0115864 | A1 | 5/2007 | Bar-Ness et al. |
| 2009/0034635 | A1 | 2/2009 | Golitschek Edler Von Elbwart et al. |
| 2009/0097582 | A1 | 4/2009 | Barsoum et al. |
| 2009/0129477 | A1 | 5/2009 | Yang |
| 2009/0168909 | A1 | 7/2009 | Stadelmeier et al. |
| 2009/0220034 | A1 | 9/2009 | Ramprashad |
| 2010/0210301 | A1 | 8/2010 | Dietz et al. |
| 2011/0090948 | A1 | 4/2011 | Zhou et al. |
| 2011/0260327 | A1 | 10/2011 | Ko et al. |
| 2011/0274211 | A1 | 11/2011 | Ko et al. |
| 2013/0064313 | A1 * | 3/2013 | Gatti ................ H04L 25/0212 375/260 |
| 2014/0269960 | A1 | 9/2014 | Petrov |
| 2014/0270012 | A1 | 9/2014 | Sagi |
| 2014/0314177 | A1 | 10/2014 | Choi et al. |
| 2015/0049844 | A1 * | 2/2015 | Stott ................ H03M 13/2732 375/298 |
| 2015/0163085 | A1 | 6/2015 | Stadelmeier et al. |
| 2015/0222471 | A1 | 8/2015 | Myung et al. |

FOREIGN PATENT DOCUMENTS

| | | |
|---|---|---|
| CN | 101106435 A | 1/2008 |
| CN | 101291200 A | 10/2008 |
| CN | 101640940 A | 2/2010 |
| CN | 101779453 A | 7/2010 |
| CN | 101867438 A | 10/2010 |
| CN | 102292982 A | 12/2011 |
| CN | 103036845 A | 4/2013 |
| EP | 2 031 786 A2 | 3/2009 |
| EP | 2 134 051 A1 | 12/2009 |
| EP | 2 211 493 | 7/2010 |
| EP | 2 375 666 | 10/2011 |
| EP | 2 378 666 A2 | 10/2011 |
| JP | 2010-538502 A | 12/2010 |
| WO | 2010/029615 A1 | 3/2010 |
| WO | 2010/078472 A1 | 7/2010 |
| WO | 2015/002507 A1 | 1/2015 |

OTHER PUBLICATIONS

International Search Report issued in corresponding International Application No. PCT/EP14/058719 dated Aug. 22, 2014.
Erik Agrell, et al., On the Optimality of the Binary Reflected Gray Code, IEEE Transactions On Information Theory, vol. 50, No. 12, Dec. 2004, 13 pgs.
Giuseppe Caire et al., "Bit-Interleaved Coded Modulation", IEEE Transactions On Information Theory, vol. 44, No. 3, May 1998, pp. 927-946.
G. Caire et al., "Capacity of Bit Interleaved Channels", Electronics Letters, Jun. 6, 1996, vol. 32, No. 12, pp. 1060-1061.
Christine Fragouli et al.,"Turbo Codes with Non-Uniform Constellations", ICC 2001. IEEE International Conference on Communications, 4 pages.
Le Goff, Stéphane Y., "Signal Constellations for Bit-Interleaved Coded Modulation", IEEE Transactions On Information Theory, vol. 49, No. 1, Jan. 2003, p. 307-313 (7 pgs).
Haffenden, Digital Video Broadcasting (DVB): Implementation Guidelines for a Second Generation Television Broadcasting System DVB-T2, ETSI TR 102 831, vol. 10.04, 2010, 227 pages / Jan. 1, 2010.
Li, Jun, et al., "Rayleigh Flat Fading Channels Capacity", Proceedings of the 3rd Annual Communication Networks and Services Research Conference (CNSR'05), 0-7695-2333-1/05 $20.00 © 2005 IEEE (4 pgs).
MOSS_TM-H1841_TM-NGH1259_Position_Table.pdf (2 pgs) 2011.
Muhammad, "Coding and Modulation for Spectral Efficient Transmission", Institut für Nachrichtenübertragung der Universität Stuttgart, 2010 (173 pgs).
Nokia: "16-QAM for GERAN evolution", 3GPP TSG GERAN#26, Schaumburg, US, Aug. 29-Sep. 2, 2005 (14 pgs).
Stott, Jonathan, "CM and BICM Limits for Rectangular Constellations", JSGBBC 022 Aug. 2012 (92 pgs).
STOTT_TM-H2036_TM-NGH1453_Position_Table.pdf (2 pgs) 2012.
Wachsmann, et al., "Multilevel Codes: Theoretical Concepts and Practical Design Rules", IEEE Transactions on Information Theory, vol. 45, No. 5, Jul. 1999, (31 pgs).
Chaudhari, (Oct. 7, 2016,), Wireless Pi. Wirelesspi.Com. Retrieved Feb. 23, 2022, from https://wirelesspi.com/quadrature-amplitude-modulation-qam/ (Year: 2016).

\* cited by examiner

CODING AND MODULATION APPARATUS USING NON-UNIFORM CONSTELLATION

CROSS-REFERENCE TO RELATED APPLICATION

This application is a continuation of U.S. application Ser. No. 16/447,589, filed Jun. 20, 2019, which is a continuation of U.S. application Ser. No. 15/899,501, filed Feb. 20, 2018, which is a continuation of U.S. application Ser. No. 14/786,725, filed Oct. 23, 2015 (now U.S. Pat. No. 9,906,396), which is a National Stage of International Application No. PCT/EP2014/058719, filed Apr. 29, 2014, and claims priority to European Application No. 13166018.5, filed Apr. 30, 2013, the entire contents of each of which are incorporated herein by reference.

BACKGROUND

Field of the Disclosure

The present disclosure relates to a coding and modulation apparatus and method. Further, the present disclosure relates to a transmission apparatus and method. Still further, the present disclosure relates to a computer program and a non-transitory computer-readable recording medium.

Description of Related Art

Modern communications systems typically employ, among other elements, a coding and modulation apparatus (as part of a transmission apparatus) and a decoding and demodulation apparatus (as part of a receiving apparatus). The coding and modulation apparatus is often part of a so called BICM (Bit Interleaved Coded Modulation) apparatus, which generally comprises (at the transmitter side) a serial concatenation of a FEC (Forward Error Correction) encoder, a bit interleaver, and a modulator, which uses spectral efficient modulation such as multilevel PAM (Pulse Amplitude Modulation), PSK (Phase Shift Keying), or QAM (Quadrature Amplitude Modulation). It should be noted that hereinafter, whenever QAM is mentioned it should be understood as a generally term covering PAM, PSK and QAM.

BICM allows for good performance over both non-fading and fading channels due to the use of the interleaver and/or the FEC encoder. It has a reasonable decoding complexity as opposed to multilevel coding (MLC) coding schemes and is thus used frequently in communications systems, such as in all DVB systems, powerline communications (e.g., Homeplug AV, DAB, LTE, WiFi, etc.).

Generally, the coding and modulation capacity, such as the BICM capacity in systems using a BICM apparatus, is considered as a target function, and it is desired to find optimum constellation points such that this capacity is maximized, often subject to a power normalization, i.e., the average power of the constellation points should be normalized to e.g. 1.

The "background" description provided herein is for the purpose of generally presenting the context of the disclosure. Work of the presently named inventor(s), to the extent it is described in this background section, as well as aspects of the description which may not otherwise qualify as prior art at the time of filing, are neither expressly or impliedly admitted as prior art against the present disclosure.

SUMMARY

It is an object to provide a coding and modulation apparatus and method providing an increased or even maximized coding and modulation capacity. It is a further object to provide a demodulation and decoding apparatus and method as well as a corresponding computer program for implementing said methods and a non-transitory computer-readable recording medium for implementing said methods.

According to an aspect there is provided a coding and modulation apparatus comprising
- an encoder that encodes input data into cell words, and
- a modulator that modulates said cell words into constellation values of a non-uniform constellation, wherein said modulator is configured to use, based on the total number M of constellation points of the constellation and the signal-to-noise ratio SNR in dB, a non-uniform constellation from a group of constellations comprising one or more of the following constellations, wherein the constellation points of the different quadrants of a constellation are defined by a constellation position vector $w_{0 \ldots b-1}$, wherein b=M/4, wherein the constellation points $x_{0 \ldots b-1}$ of a first quadrant are defined as $x_{0 \ldots b-1} = w_{0 \ldots b-1}$, the constellation points $x_{b \ldots 2b-1}$ of a second quadrant are defined as $x_{b \ldots 2b-1} = \text{conj}(w_{0 \ldots b-1})$, the constellation points $x_{3b \ldots 4b-1}$ of a third quadrant are defined as $x_{3b \ldots 4b-1} = -w_{0 \ldots b-1}$, the constellation points $x_{2b \ldots 3b-1}$ of a fourth quadrant are defined as $x_{2b \ldots 3b-1} = -\text{conj}(w_{0 \ldots b-1})$, wherein conj is the complex conjugate, and wherein the constellation position vectors of the different constellations of the group of constellations are defined in claim 1.

According to a further aspect there is provided a transmission apparatus comprising
- a coding and modulation apparatus as proposed herein that encodes and modulates input data into constellation values,
- a converter that converts said constellation values into one or more transmission streams to be transmitted, and
- a transmitter that transmits said one or more transmission streams.

According to still further aspects corresponding methods, a computer program comprising program means for causing a computer to carry out the steps of the coding and modulation method disclosed herein, when said computer program is carried out on a computer, as well as a non-transitory computer-readable recording medium that stores therein a computer program product, which, when executed by a processor, causes the coding and modulation method disclosed herein to be performed are provided.

Preferred embodiments are defined in the dependent claims. It shall be understood that the claimed methods, the claimed computer program and the claimed computer-readable recording medium have similar and/or identical preferred embodiments as the claimed apparatus and as defined in the dependent claims.

One of the aspects of the disclosure is that the constellation points of the used constellations are not located on a regular grid with equidistant symbols, but rather on optimized locations, dependent on the channel characteristics, e.g., channel transition probabilities due to AWGN (Additive White Gaussian Noise), fading, etc. Further, the used constellation is selected (preferably in advance, but generally on the fly in other embodiments) dependent on the SNR (signal-to-noise ratio) and the desired total number of constellation points of the used constellation. A method how to find and optimize these non-uniform constellations (in the following called NUCs) will be explained below.

It should be noted that to every M-QAM, one can also think of the underlying sqrt(M)-PAM. Further, it should be noted that in other aspects the group of constellations defined in the claims comprises less constellations, e.g. only constellations for non-fading channels, only constellations for fading channels, only constellations for selected values of M, only constellation for M-QAM or sqrt(M)-PAM and/or constellations for less SNR values. In other words, less constellations may be contained in the group of constellations available for selection and subsequent use by the modulator, i.e. the group of constellations available for use by the modulator may comprise one or more of the constellations defined in the claims. Accordingly, the present disclosure is also directed to a coding and modulation apparatus and method that have a smaller group of constellations available for use (as explained above) and/or where less constellations are available for a particular value of M.

A QAM mapping consisting of M constellation points is denoted as M-QAM. If a (uniform or non-uniform) QAM allows separate encoding and decoding of each of its two dimensions ("inphase" and "quadrature phase" in the literature), then this QAM will be called a $N^2$-QAM. This implies that the constellation can be designed by two N-PAM constellations, one for each dimension. $N^2$-QAMs have significantly lower decoding complexity for ML-decoding, as only N constellation points have to be investigated, compared with $N^2$ points for the M-QAM, when $M=N^2$, but when the two dimensions cannot be separated (as is usually the case for N-PSK, e.g. 8-PSK, where 8 points are located on a unit circle). In addition QAM constellations that are completely defined by a single quadrant of the constellation will be called Q-QAM, with the other quadrants being derived from the first quadrant. E.g. normal uniform square QAM constellations (UC) are also Q-QAM constellations, due to their symmetry.

However, the constellation points of the QAM constellations considered in this disclosure are not located on a regular grid with equidistant symbols, but rather on optimized locations, dependent on the channel characteristics, e.g., channel transition probabilities due to AWGN, fading, etc.

It should be noted that the constellation position vector w as defined in the claims must not necessarily contain the constellation points of the first quadrant of the constellation, but could also contain the constellation points of any of the four quadrants (expressed by the definition "of a first quadrant" in the claims). Due to the quadrant symmetry this leads to constellations with a different bit mapping but with identical performance. The constellation position vector w in the tables defined herein should therefore be considered as an example for all four symmetric constellations with different bit mapping but identical performance.

It is to be understood that both the foregoing general description of the disclosure and the following detailed description are exemplary, but are not restrictive, of the disclosure.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DESCRIPTION OF THE EMBODIMENTS

Figure 1:
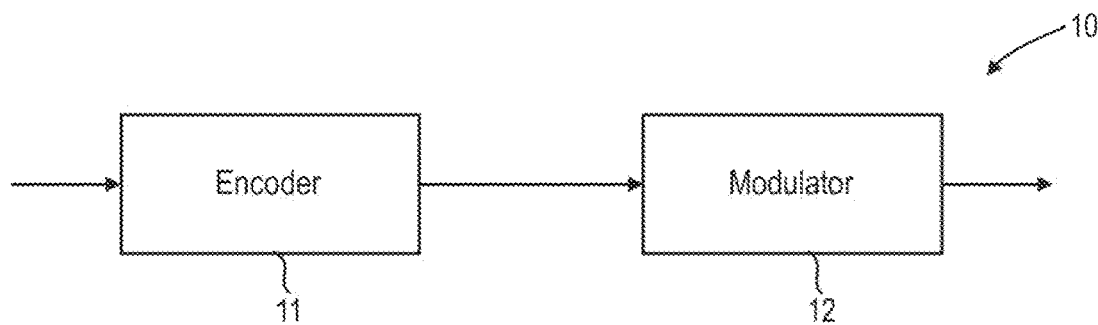
FIG. 1 shows an embodiment of a coding and modulation apparatus according to the present disclosure.

Referring now to the drawings, wherein like reference numerals designate identical or corresponding parts throughout the several views, FIG. 1 shows an embodiment of a coding and modulation apparatus 10 according to the present disclosure. It comprises an encoder 11 that encodes input data into cell words, and a modulator 12 that modulates said cell words into constellation values of a non-uniform constellation. Said modulator 12 is configured to use, based on the total number M of constellation points of the constellation and the signal-to-noise ratio SNR in dB (and, in some embodiments, the channel characteristics), a non-uniform constellation from a group of constellations comprising predetermined constellations, wherein the constellation points of the different quadrants of a constellation are defined by a constellation position vector $w_{0 \ldots b-1}$, wherein b=M/4, wherein the constellation points $x_{0 \ldots b-1}$ of a first quadrant are defined as $x_{0 \ldots b-1} = w_{b-1}$, the constellation points $x_{b \ldots 2b-1}$ of a second quadrant are defined as $x_{b \ldots 2b-1} = \text{conj}(w_{0 \ldots b-1})$, the constellation points $x_{3b \ldots 4b-1}$ of a third quadrant are defined as $x_{3b \ldots 4b-1} = -w_{0 \ldots b-1}$, the constellation points $x_{2b \ldots 3b-1}$ of a fourth quadrant are defined as $x_{2b \ldots 3b-1} = -\text{conj}(w_{0 \ldots b-1})$, wherein conj is the complex conjugate, and wherein the constellation position vectors of the different constellations of the group of constellations will be derived and shown below.

It should be noted that the constellation position vector w as defined in the claims must not necessarily contain the constellation points of the first quadrant of the constellation, but could also contain the constellation points of any of the four quadrants (expressed by the definition "of a first quadrant" in the claims). Due to the quadrant symmetry this leads to constellations with a different bit mapping but with identical performance. The constellation position vector w in the tables defined herein should therefore be considered as an example for all four symmetric constellations with different bit mapping but identical performance.

In other embodiments of the coding and modulation apparatus 10 additional elements may be provided, such as a BCH encoder, an LCPC encoder, a bit interleaver and/or a demultiplexer (for demultiplexing bits of encoded data into the cell words). Some or all of these elements may separate elements or may be part of the encoder 11. For instance, a BICM device as conventionally used in the transmission apparatus of a DVB system may be used as coding and modulation apparatus 10.

Figure 2:
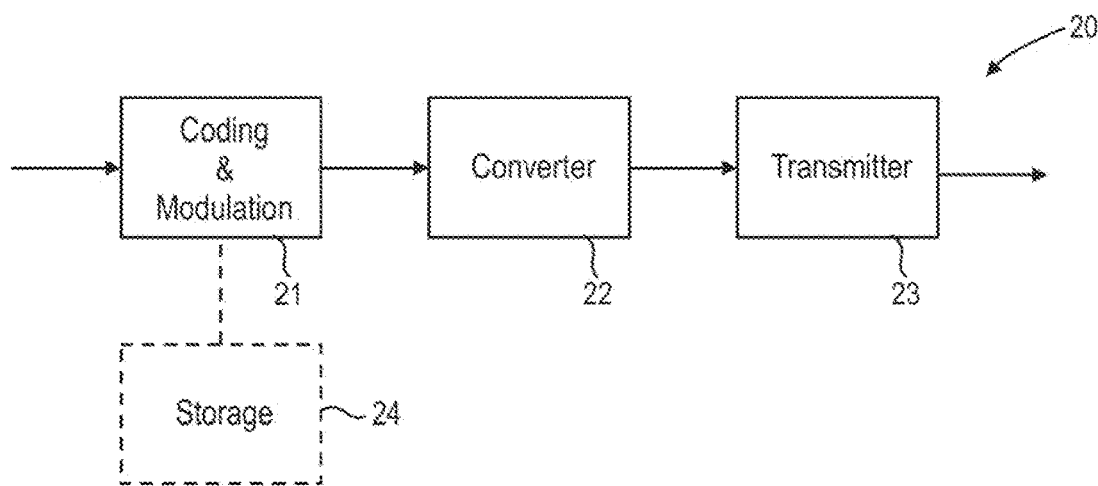
FIG. 2 shows an embodiment of a transmission apparatus according to the present disclosure.

FIG. 2 shows an embodiment of a transmission apparatus 20 according to the present disclosure comprising a coding and modulation apparatus 21 (referenced by 10 in FIG. 1) as proposed herein that encodes and modulates input data into constellation values, a converter 22 that converts said constellation values into one or more transmission streams to be transmitted, and a transmitter 23 that transmits said one or more transmission streams. In an exemplary embodiment the converter 22 may comprise one or more elements like a time, cell and/or frequency interleaver, a frame builder, an OFDM modulator, etc., as e.g. described in the various standards related to DVB. The constellations and the constellations values are generally predetermined and e.g. stored in a constellations storage 24 or retrieved from an external source.

In other embodiments of the transmission apparatus 20 addition elements may be provided, such as an input processing unit, a frame building unit and/or an OFDM generation unit as e.g. conventionally used in transmission apparatus of a DVB system.

Figure 3:
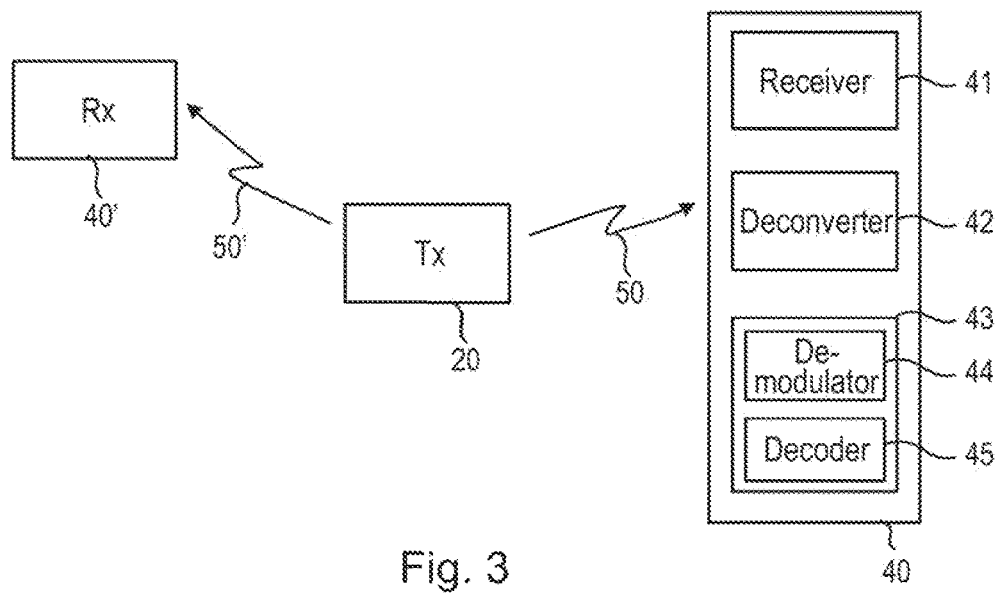
FIG. 3 shows an embodiment of a communications system according to the present disclosure.

FIG. 3 shows an embodiment of a communications system 30 according to the present disclosure comprising one (or more) transmission apparatus 20 (Tx) as shown in FIG. 2 and one or more receiving apparatus 40, 40' (Rx).

A receiving apparatus 40 generally comprises a receiver 41 that receives one or more transmission streams, a deconverter 42 that deconverts the received one or more transmission streams into constellation values, and a demodulation and decoding apparatus 43 that demodulates and decodes said constellation values into output data. The demodulation and decoding apparatus 43 generally comprises a demodulator 44 for demodulating constellation values of a non-uniform constellation into cell words, and a decoder 45 for decoding cell words into output data words, wherein based on the total number M of constellation points of the constellation, the signal-to-noise ratio in dB and the channel characteristics, a non-uniform constellation is selected from the group of constellations comprising the same predetermined constellations as used in the coding and modulation apparatus 10.

The preferred demodulation and decoding considers soft values as opposed to hard decided values (0 and 1). Soft values represent the continuously distributed received values (possibly after A/D conversion including quantization) by more than two states (as in the case of binary (hard) decision). The reason is that for hard decision, the NUCs are generally not optimal. Nowadays, BICM receivers typically are soft receivers anyway.

Generally, data (e.g. communications data, broadcast data, etc.) shall be transmitted from a transmission apparatus 20 to one or more of said receiving apparatus 40 over a transmission channel 50, 50'. The transmission channel 50, 50' can be unicast channel, multicast channel, a broadcast channel and may be employed as one-directional or bi-directional channel (i.e. having a return channel from the receiving apparatus to the transmission apparatus).

In an embodiment the modulator 12 is configured to use a non-uniform constellation based on the total number M of constellation points of the constellation, the required signal-to-noise ratio SNR for error free decoding in dB and the channel characteristics. In broadcasting applications the constellation is generally not selected dependent on the SNR in the receiver, but dependent on the SNR that is required for error free decoding with a used channel code (if a code is used, for example LDPC codes in case of DVB $2^{nd}$ generation transmission systems) for an expected channel characteristic, e.g., static reception or multipath fading.

The total number M of constellation points is generally selected according to the desired payload throughput jointly with the code rate of the FEC encoder. The SNR for error free decoding for typical channel characteristic is generally known, e.g. by simulation. In broadcasting the channel characteristics of the receivers are not known, i.e. a compromise is selected. For instance, in broadcasting for each code rate of the FEC encoder one non-uniform constellation is selected, optimized for an SNR that is a compromise for all channel characteristics.

The transmitter generally targets a certain scenario. For instance, a broadcast transmission over cable or satellite considers the channel to be just a non-fading AWGN (appropriate channel model), while a terrestrial broadcaster typically considers the channel to be a fading channel, e.g. with Rayleigh distribution, as several echoes are usually received.

In another embodiment the modulator 12 is configured to adaptively select a non-uniform constellation based on the total number M of constellation points of the constellation, the signal-to-noise ratio SNR in dB and the channel characteristics, wherein said signal-to-noise ratio SNR in dB and channel characteristics are received from a receiving device 40 to which data shall be transmitted. Such an adaptive selection of the constellation is generally only possible with a return channel in unicast environments. A non-uniform constellation may be adapted e.g. in time and/or frequency domain, e.g. for different OFDM sub carriers.

Depending on the SNR the optimum value for M and the code rate of the FEC encoder can be selected, which offers the highest throughput (equivalent to $C_B$). In other words, for a large SNR a high value of M is selected leading to a high data throughput (and vice versa).

The channel characteristics describe the statistical properties of the channel, e.g., the extent of the multipath propagation of the transmission channel between transmitter and receiver. If the channel is characterized by no multipath propagation, corresponding to the AWGN channel, the required SNR for error free decoding is relatively low, i.e. the NUC has to be selected accordingly for optimum performance. If the transmission channel is characterized by strong multipath propagation, the required SNR for error free reception is larger compared to a channel without multipath propagation, i.e. a NUC optimized for higher SNR has to be used. Further, the NUCs should be optimized taking the fading characteristics into account, as will be discussed below.

As mentioned above, the number M of the constellation points of the constellations is selected according to the desired payload throughput. Larger values of M allow for higher data throughput, but require a larger SNR for error free reception. This is further influenced by the code rate of the FEC encoder, if any FEC encoder is used.

Another explanation (which is closely related to the optimization task) is that for each SNR, optimized constellations are proposed for different M. The optimization target is the BICM capacity. For an expected SNR, say 15 dB of SNR should be guaranteed, M is chosen, for which the respective optimized NUC yields the largest BICM capacity. As a general rule it holds that for low SNR a low value of M should be selected and vice versa. But from a theoretical point of view, it turns out that high M is generally optimum, e.g., choosing M=4096 or M=1024 is preferred, because even for low SNR, the optimized NUC will "look (almost) like" a constellation with effectively smaller M, as several points will overlap. However, modulation and demodulation complexity increase with increasing M, so a tradeoff has to be considered.

As mentioned above known communications systems often employ among other blocks a so called BICM apparatus which may also be used as coding and modulation apparatus according to the present disclosure. The maximum possible capacity over a BICM apparatus is described by the BICM capacity $C_B$:

$$C_B = \sum_{i=0}^{m-1} E_{b,r_k} \left[ \log_2 \frac{\sum_{x_l \in \mathbb{X}_b^i} p(r_k | s_k = x_l)}{p(r_k)} \right] = \quad (1)$$

$$\int_{r_k \in \mathbb{C}} \sum_{b=0}^{m-1} \sum_{b=0}^{1} \sum_{x_l \in \mathbb{X}_b^i} \frac{1}{M} \cdot p(r_k | s_k = x_l)$$

$$\log_2 \frac{\sum_{x_l \in \mathbb{X}_b^i} p(r_k | s_k = x_l)}{\frac{1}{M} \cdot \sum_{x_l' \in \mathbb{X}} p(r_k | s_k = x_l')} dr_k,$$

where l denotes the i-th bit label of the constellation point, and m is the total number of bits/QAM symbol point. Altogether the QAM constellation consists of $M=2^m$ constellation points, each assigned a particular bit label (00 ... 00, 00 ... 01, ..., 11 ... 11). In (1), E[·] denotes expectation operator, $p(r_k)$ is the probability density function (pdf) of the received symbols, $s_k$ is the transmitted symbol according to a particular bit label, k is the discrete time (or subcarrier index in case of OFDM modulation), $x_l$ is a particular symbol of the set of all constellation symbols, this set being denoted by $\mathbb{X}$ (=symbol alphabet, with cardinality $M=2^m$).

$p(r_k|s_k=x_l)$ is the likelihood function (transition probability—defined by the channel characteristics) that $r_k$ is received given the fact that $s_k=x_l$ was transmitted. The subset $\mathbb{X}_b^i$ includes all symbols from $\mathbb{X}$, where the i-th bit label is b (either b=0 or b=1).

As seen in (1), $C_B$ is a 2-dimensional integral. If only constellations are considered that can be split into two 1-dim. PAM constellations, it is easy to see that $$C_B(\text{2-dim.}) = 2 \times C_B(\text{1-dim.}) \quad (2)$$

All investigated channels here include AWGN (only or after the fading channel). This can be described by the signal-to-noise ratio SNR, typically in dB:

$$\text{SNR} = 10 * \log_{10}(E_s/\sigma^2), \quad (3)$$

where $E_s$ is the average symbol power of the QAM constellation (typically normalized to 1), and $\sigma^2$ is the variance (=power) of the additive white Gaussian noise (which is assumed to be of zero-mean).

In (2), the 1-dimensional consideration for $C_B$ (1-dim.) uses an N-PAM constellation, which has only half the symbol power, if just the projection on the in-phase or quadrature-phase, respectively, is taken. However, if again a power normalization to 1 is considered, the noise variance by a factor of 2 is increased. Thus, to be more precise, the target function for the optimization process considered is given by $$C_B(\text{2-dim. at SNR } x) = 2 \times C_B(\text{1-dim. at SNR } x/2), \quad (4)$$

where the 1-dimensional PAM has normalized power 1, thus just half the SNR (here, in absolute values, i.e. not in dB) as explained above. The 1-dimensional BICM capacity is also computed according to (1), where the 2-dimensional integral becomes a 1-dimensional integral with $r_k \in \mathfrak{R}$, $\mathfrak{R}$ being the set of real numbers.

This equation (4) is optimized, given all degrees of freedom, namely the constellation points of the underlying 1-dim. constellation, subject to the power constraint, i.e.

$$\mathcal{P}_x = E_{s_k}[|s_k|^2] = E_{x_l}[|x_l|^2] = \frac{1}{M} \sum_{l=0}^{M-1} |x_l|^2 \stackrel{!}{=} 1 \quad (5)$$

Figures 4A, 4B:
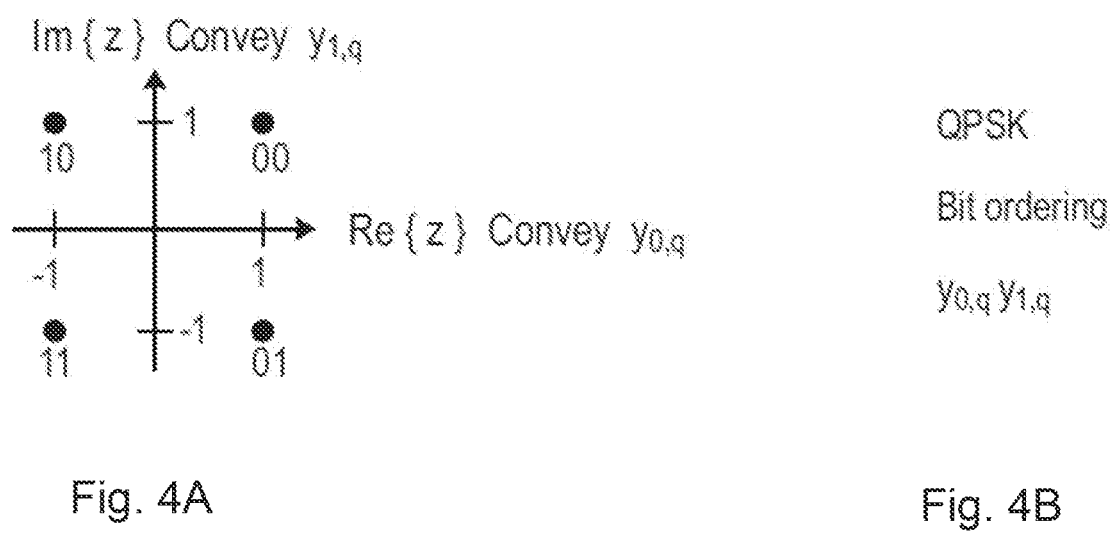
FIGS. 4A and 4B show a regular 4-QAM constellation as a simple example for a constellation.

For example, a regular 4-QAM consists of constellation points ($e^{j\pi/4}$, $e^{j7\pi/4}$, $e^{j3\pi/4}$, $e^{j5\pi/4}$), as can be seen in FIGS. 4A and 4B. The average symbol power is 1 (all symbols are located on unit circle here). The above symbol vector ($e^{j\pi/4}$, $e^{j7\pi/4}$, $e^{j3\pi/4}$, $e^{j5\pi/4}$) is to be understood such that the first entry ($e^{j\pi/4}$) belongs to the bit vector 00, the second entry ($e^{j7\pi/4}$) to 01 and so on, i.e. the entries belong to bit vectors with increasing values, where the first bit position is the most significant bit (MSB) and the last one the least significant bit (LSB). This 4-QAM is a particular case of an $N^2$-QAM, with N=2. Note that this definition (of being an $N^2$ QAM) does not only require $N^2$ being a square number ($N^2=2^2$), but also that the constellation is symmetrical and can be described by two independent N-PAM constellations, here a 2-PAM: the in-phase component (real-part of the complex symbols) is a 2-PAM with symbol vector (1/sqrt(2), −1/sqrt(2)) and describes the $1^{st}$ bit of the 4-QAM, whereas the quadrature-phase component (imaginary-part of the complex symbols) is the same 2-PAM, this time describing the $2^{nd}$ bit of the 4-QAM. Note further that the decomposition of the $N^2$-QAM into two N-PAMs is only possible if the bit labeling is according to binary reflected Gray mapping, which is typically applied (e.g. in DVB-systems).

The above example can be extended to higher order $N^2$-QAMs, with N>2. Then the underlying N-PAM describes for one component the $1^{st}$, $3^{rd}$, $5^{th}$ and so on bit label, while for the other component it describes the $2^{nd}$, $4^{th}$, $6^{th}$ and so on label.

Constellation shaping is generally known and has a long history. Only in recent years, constellations were investigated which maximize the BICM capacity $C_B$. In [6], the authors propose an heuristic approach to maximize $C_B$ by forcing the underlying PAM to approach a Gauss-like form (as is well known from Shannon's capacity theorem, the optimum constellation over the AWGN channel should have a Gaussian distribution; note that this means that there is an infinite number of continuously distributed input signals, having a Gaussian distribution, i.e., symbols with small power should occur more frequently than symbols with large power). There is no proof that this maximizes $C_B$, indeed those NUCs designed according to this method do not maximize $C_B$. The resulting NUCs are in general no $N^2$ NUCs, i.e., a 2-dimensional NUC was optimized, not the underlying PAM. However, in N. Muhammad, "Coding and modulation for spectral efficient transmission", Ph.D. dissertation, Universität Stuttgart, Institut für Nachrichtenübertragung, Pfaffenwaldring 47, 70569 Stuttgart, Germany, June 2006, the first time constellations have been directly optimized with respect to the target function $C_B$. For this method two differences to the current method occur:

M-NUCs were proposed for M=8, 16, and 32. No higher order NUCs were investigated, as the optimization becomes very time consuming and the optimization algorithms became numerically unstable.

The optimization algorithm was a hand-written gradient search algorithm, where both the BICM capacity and the gradient thereof consisted of improper integrals. No special care about either the numerical solution of the improper integral or the problematic integrants was considered. This consideration of these two issues is fundamental to obtain results for high order constellations, such as 1k (i.e. 1024) NUC.

As described above, two problems arise when solving the optimization:
a) improper integral: integration border selection; and
b) integrant.

With respect to problem a) (improper integral: integration border selection), as seen in eq. (1), the BICM capacity involves an integral from − infinity to + infinity (=improper integral). Any numerical solution of this integral has to consider finite integration borders such as from −b to +b, with b sufficiently large. Matlab provides several functions for numerical integration, even for improper integrals, such as the function "quad", which internally optimizes the appropriate integration borders b. However, it has been observed that even these functions yield numerical instabilities and do not end up with the correct integral.

Figure 5A:
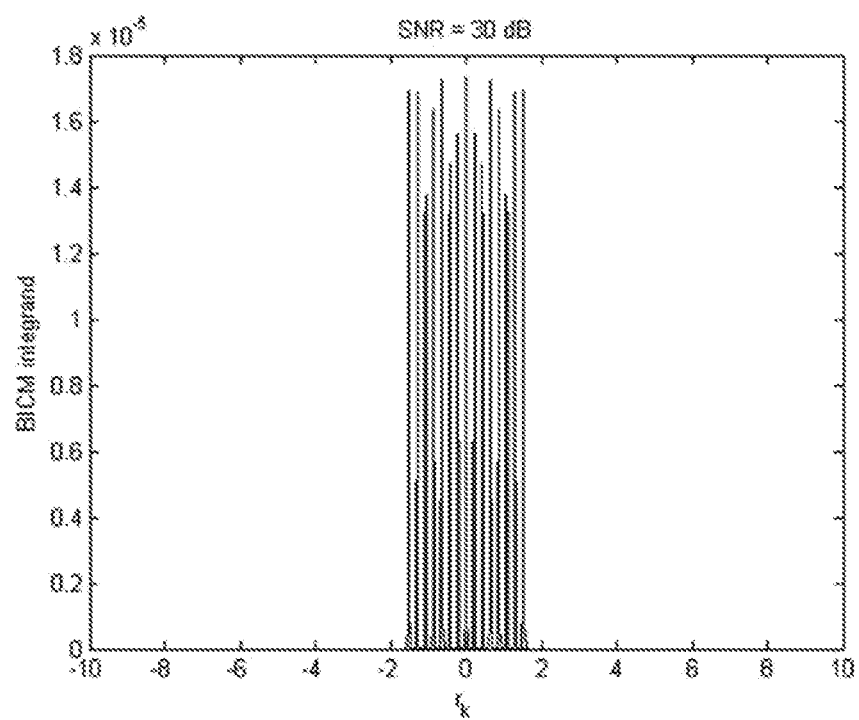
FIGS. 5A and 5B show diagrams depicting the integrant of the 1-dimensional BICM capacity function at 10 dB and at 30 dB SNR.
Figure 5B:
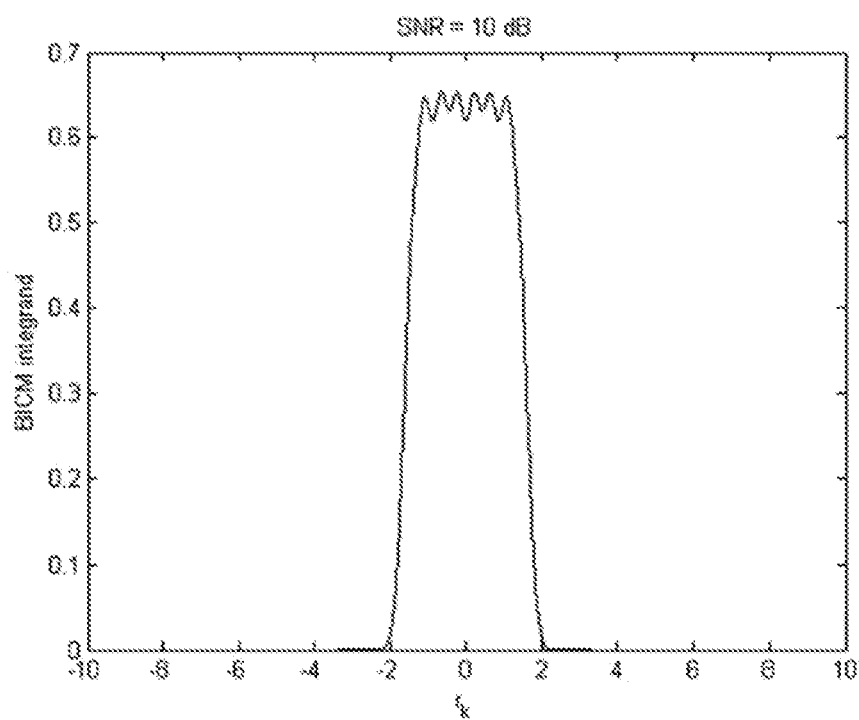

It can be observed that the integrant in (1) approaches 0 if the variable $r_k$ is sufficiently large (b→Inf). So a naïve approach would be to stepwise increase the variable $r_k$, until the integrant falls below a certain threshold (say $10^{-300}$ or if it even becomes exactly 0) and chose this value for the integration border b. However, it has further been observed that the integrant can take on very small values even before it converges to 0 for large variables, as can be seen in the two examples depicted in FIGS. 5A and 5B: the plot shown in FIG. 5B is the integrant of the 1-dimensional BICM capacity function, if a regular 32-PAM is used, at 10 dB SNR, while the plot shown in FIG. 5A 30 dB is considered.

Note that for 30 dB, many very small integrant values occur in the interval [−2,2] and any optimized integration border would be misleading in this interval. Thus, it is proposed to find the optimum (=numerically correct) integration border b as follows:

i) start with a large positive value S, iteratively reduce the value by decrements D, compute the integrant with this value as variable $r_k$, until the first non-zero value of the integrant is computed. If no non-zero integrant can be found before $r_k$=0, start again with a larger initial value S (say 10 times larger than before) and reduce D (say by factor of 10) to have a larger search interval and a finer granularity.

ii) As this search is time consuming, it is proposed to adjust the initial value S and the decrement D according to the SNR. If $\sigma^2$ is the noise variance of the 1-dimensional mapping (see eq. (3)), then as a good compromise S=4000*$\sigma^2$ and D=50*$\sigma^2$ has been chosen.

With respect to problem b) (integrant) it has further been observed that the integrant of the BICM capacity integral can cause numerical instabilities for large SNR values. As can be seen in eq. (1), the integrant consists of sums, including terms such as $x*\log(x)$, $x*\log(1/x)$, or $x*1/\log(x)$.

The value of x is e.g. the transition probability $p(r_k|s\_k=x_l)$, or a pdf or includes parts thereof. The values of x become increasingly small (even approaching 0) if the SNR is very large, as the pdfs typically correspond to Gaussian distributions. Thus, the following limits might occur:

$\lim_{\{x\to 0\}} x*\log(x)$, $\lim_{\{x\to 0\}} x*\log(1/x)$, or $\lim_{\{x\to 0\}} x*1/\log(x)$.

Note that in theory, each limit converges to 0 (see l'Hospital's rule), but in a numerical computation, values such as + or − infinite or NaN ("not a number") will occur. Thus, the following is proposed: during the computation of each element (i.e., each addend in the integrant of (1)), the value has to be checked if it is finite (otherwise infinite or NaN), and replace it by 0 in case it is not finite. Only this way, reliable integration results can be obtained.

The presented optimization is preferably based on the Matlab's fmincon function for constrained nonlinear optimization: the target function is the BICM capacity, the constraints are as follows:

all dof (degrees of freedom)>0;
all dof need to fulfill the power normalization, when the N-PAM is created based on them;
the dof must occur in increasing order.

The function fmincon requires an initial set of dof, where the values were taken from a regular, i.e. uniform constellation, but a random mutation was applied on them. It is to be noted that the resulting values should still be in increasing order, otherwise the Gray bit labeling is not fulfilled anymore. The NUCs will be described by their degrees of freedom, e.g., a 64-NUC optimized for the AWGN channel at SNR=11.5 dB yields the following values (optimized degrees of freedom):

2.2794 4.6229 7.5291.

This means that the positive constellation values are 1 2.2794 4.6229 7.5291

(the 1 was redundant, due to the power normalization, which will be applied in the end). The underlying 1-dim. 8-PAM NUC is thus described by the symbol vector (1.6405 1.0073 0.2179 0.4967 −1.6405 −1.0073 −0.2179 −0.4967), where the values are already normalized to unit average power.

As described before, the first entry (1.6405) corresponds to the bit label 000, the next one (1.0073) to 001 and so on. The 2-dim. 64-NUC is then obtained by symmetry, where both in-phase and quadrature-phase component of the NUC are based on the 8-PAM NUC.

Figure 6A:
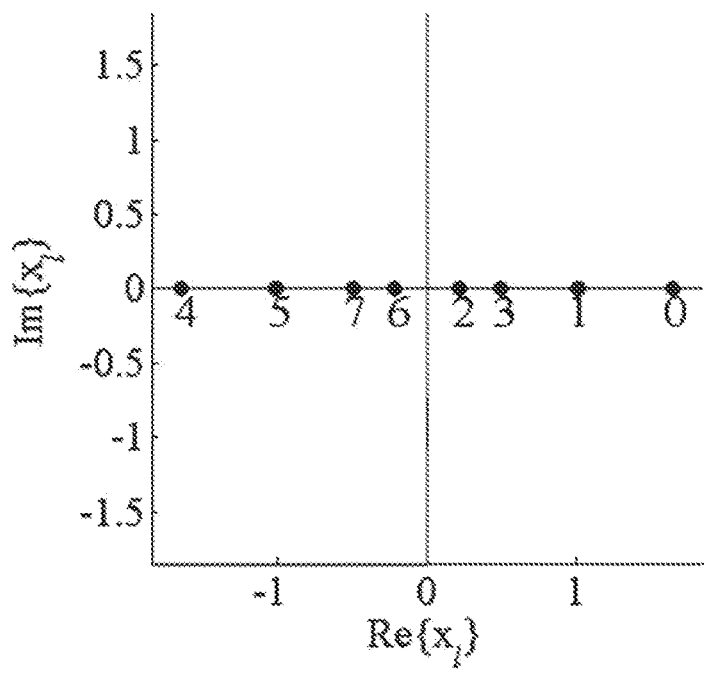
FIGS. 6A and 6B show a 8-PAM non-uniform constellation and a 64-QAM non-uniform constellation.
Figure 6B:
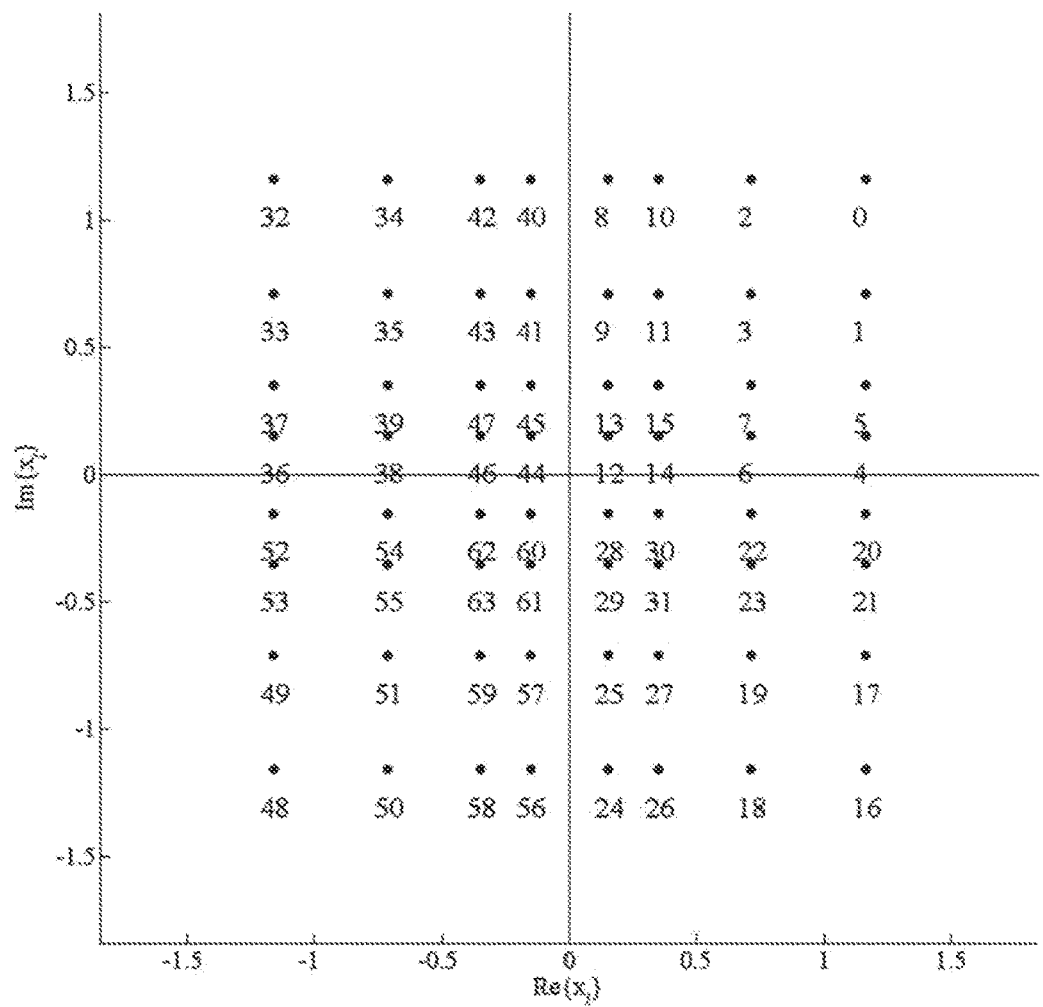
Figure 7:
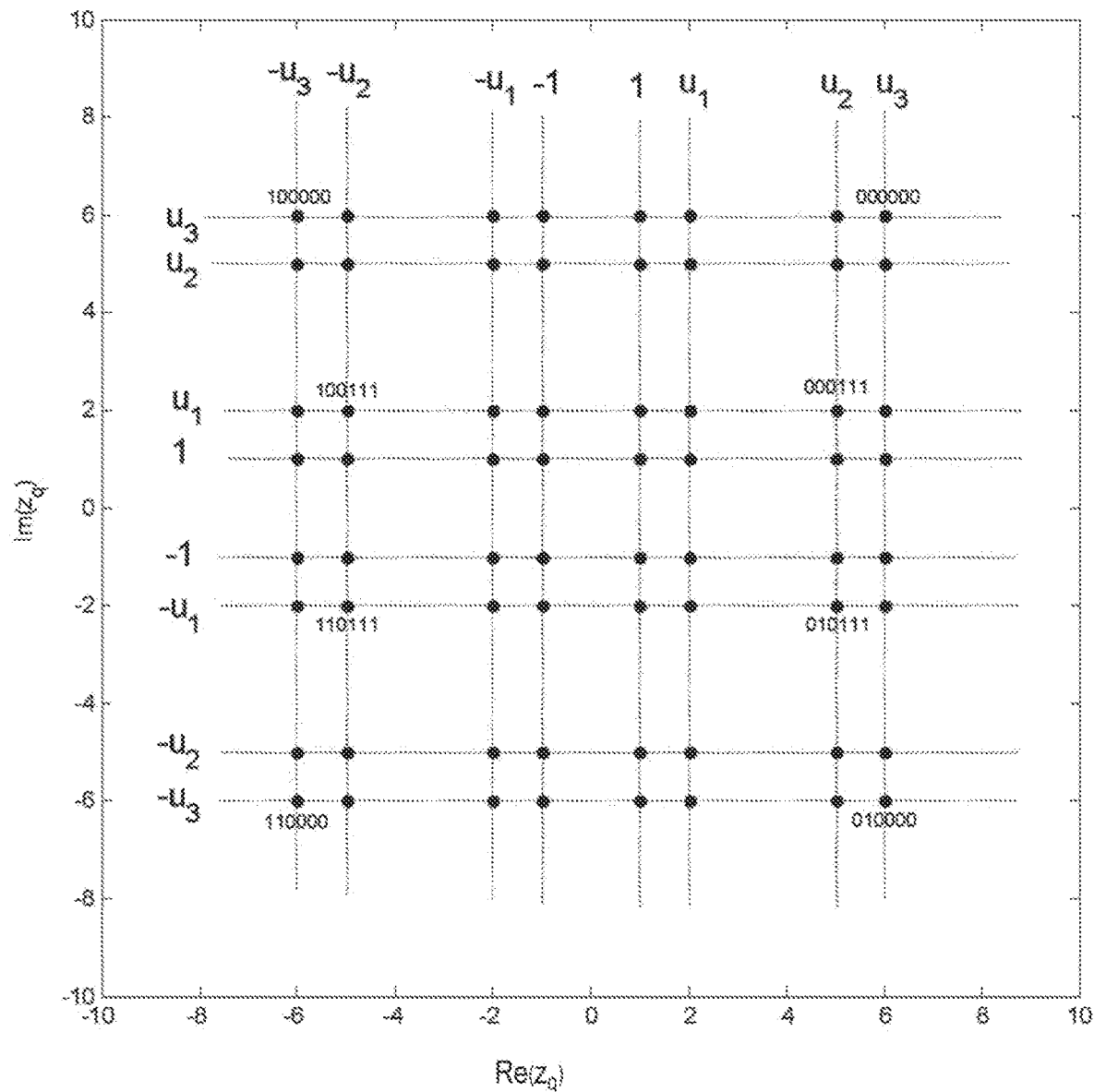
FIG. 7 shows a constellation for a 64-QAM non-uniform constellation generally defining the constellation points.

FIGS. 6A and 6B depict both 8-PAM NUC (FIG. 6A) and 64-QAM NUC (FIG. 6B). The bit labels are given in integer numbers (000→0, 001→1, 010→2 and so on).

The creation of the 2-dim. NUC based on the optimized degrees of freedom will be explained in more detail below.

Since the performance of NUCs depends on the SNR value they are optimized for, a thorough selection is preferably carried out depending on the (FEC) code rate to achieve optimum performance. If the channel characteristics are known, the required SNR value for FEC convergence can be determined by simulation. Then the NUC that has been optimized for this SNR value is chosen for best performance. If the SNR at the receiver is lower than this SNR decoding threshold, the constellation is not optimal. However, this is no drawback, since the BICM capacity is too low for successful decoding anyhow. On the other hand if the SNR at the receiver is clearly higher than the decoding threshold, a sufficient amount of BICM capacity for successful decoding is available, even though the NUC is suboptimal for this SNR range. Therefore, the NUC needs to be optimized for the SNR value at the waterfall region (i.e., decoding threshold for (quasi-) error free decoding) of the FEC. As the SNR value of the waterfall region depends on the code rate of the FEC, a different NUC is selected for each code rate.

The SNR value for (quasi-) error free decoding also depends on the channel characteristics of the receiver. For instance the required SNR for error free decoding of the DVB-T2 LDPC code in the AWGN channel is 0.8 dB, whereas 2.5 dB are required in the Rayleigh P1 multipath channel. The selected NUC for each code rate is thus not optimal in all channel environments and a tradeoff is necessary in a broadcasting environment that suits all (or most) users in the network. In a point-to-point network with return channel, the optimal NUC may be selected based on the measured channel characteristics in the receiver.

In the following some more explanation is provided regarding the definition of the non-uniform QAM constellations. Each input cell word $(y_{0,q} \ldots y_{m-1,q})$ (i.e. provided to the modulator) shall be modulated using a non-uniform QAM constellation to give a constellation point $z_q$ prior to normalization, where m corresponds to the number of bits per QAM symbol $m=\log_2(M)$. It should be noted that the parameter q used here for discrete time or subcarrier index corresponds to the parameter k as used in the above. The exact values of the real and imaginary components $Re(z_q)$ and $Im(z_q)$ for each combination of the relevant input bits $y_{0 \ldots m-1,q}$ are given in the following tables for the various constellation sizes depending on the NUC position vector.

In the following the Q-NUC optimization will be described, i.e. the optimization of a 2-dimensional constellation that is derived from a single quadrant. The above described optimization of a $N^2$-QAM requires the optimization of sqrt(M)/2−1 degrees of freedom. Since the optimization of a 2-dimensional QAM constellation has 2*M degrees of freedom (real and imaginary part of each constellation point) the optimization is significantly more time consuming. This is also caused by the need of calculating the BICM capacity during the optimization for the 2-dimensional case instead of the 1-dimensional case. Since the optimum 2D-constellations for the 16-QAM case are symmetric with respect to the different quadrants of the constellations, the following simplifications can be applied during the optimization: Only one quadrant of the constellation is optimized during the constellation, reducing the degrees of freedom during the optimization from 2*M to M/2. From this quadrant the remaining quadrants can be derived, leading to a so called QQAM constellation. However, care must be taken to ensure that the properties of the bit labeling of the constellation points are retained. If the first quadrant is Gray-Mapped, offering a maximum Hamming distance of 1, the same must be ensured for the remaining quadrants of the QQAM constellation. This is ensured by the algorithm defined below.

Figure 8:
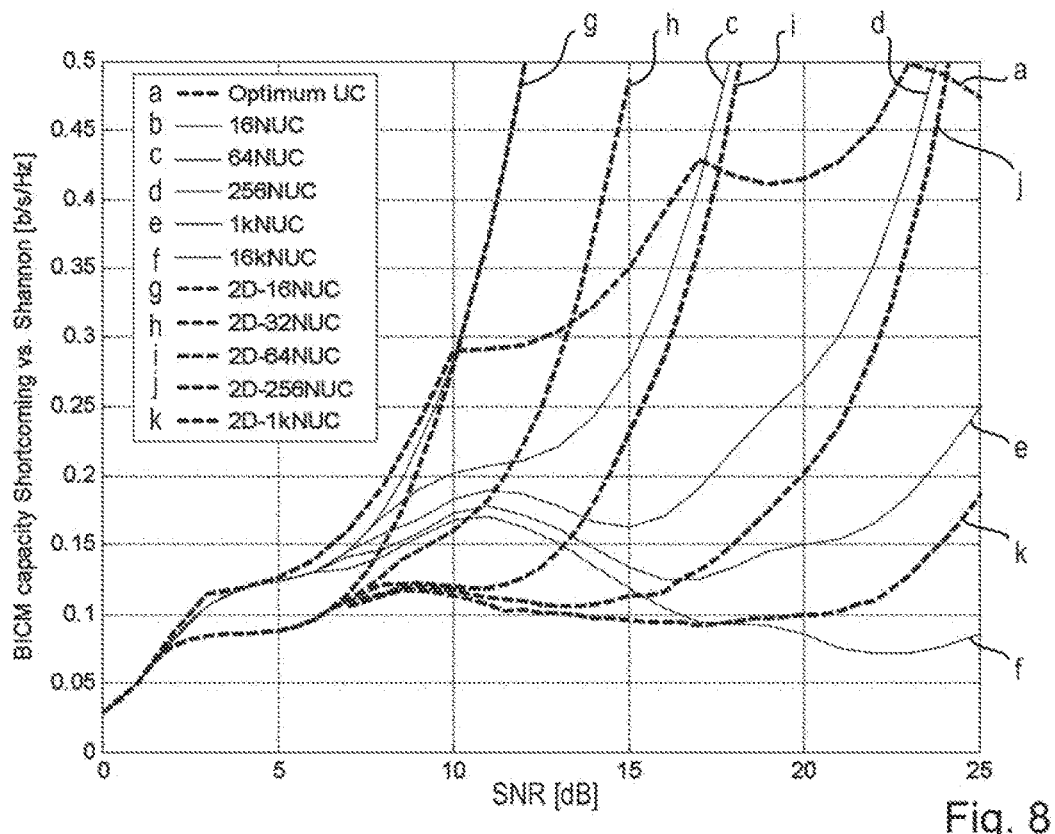
FIG. 8 shows a diagram illustrating the performance of non-uniform 16-QQAM, 32-QQAM, 64-QQAM, 256-QQAM and 1024-QQAM constellations compared to non-uniform $N^2$-QAM constellations.

To uniquely define a 16-QQAM only 8 real values are required, corresponding to 4 complex values representing the constellation points of the first quadrant. Based on the QQAM approach 16-QQAM, 32-QQAM, 64QQAM, 256-QQAM and 1024-QQAM constellations have been optimized, clearly outperforming the $N^2$-QAM constellations, especially in the low SNR regime. The performance of the 16-QQAM, 32-QQAM, 64-QQAM, 256-QQAM and 1024-QQAM constellations is depicted in FIG. 8. The presented QQAM optimization approach can be used for any channel condition, e.g. for the AWGN channel as well as for fading channels.

In the following the definition of the NUC position vectors obtained by use of the above described approach for obtaining QQAM constellations is provided. The signal-to-noise ratio (SNR) is always denoted in dB.

a) 16QQAM—AWGN Channel

| | w | | | |
|---|---|---|---|---|
| SNR | w0 | w1 | w2 | w3 |
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.6921 + 0.8373i | 0.8373 + 0.6921i | 0.5853 + 0.6908i | 0.6908 + 0.5854i |
| 2 | 0.5879 + 0.4053i | 1.0566 + 0.6114i | 0.4053 + 0.5879i | 0.6114 + 1.0566i |
| 2.5 | 0.5354 + 0.3507i | 0.3507 + 0.5354i | 1.1217 + 0.5763i | 0.5763 + 1.1217i |
| 3 | 0.5551 + 1.1571i | 0.3189 + 0.5012i | 1.1571 + 0.5551i | 0.5012 + 0.3189i |
| 3.5 | 0.5410 + 1.1789i | 1.1789 + 0.5410i | 0.2981 + 0.4781i | 0.4781 + 0.2981i |
| 4 | 0.5309 + 1.1928i | 1.1928 + 0.5309i | 0.2842 + 0.4633i | 0.4633 + 0.2842i |
| 4.5 | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5169i |
| 5.5 | 1.2092 + 0.5115i | 0.4530 + 0.2663i | 0.5115 + 1.2092i | 0.2663 + 0.4530i |
| 6 | 0.2642 + 0.4570i | 0.4570 + 0.2642i | 0.5067 + 1.2102i | 1.2102 + 0.5067i |
| 6.5 | 0.4634 + 0.2626i | 1.2100 + 0.5023i | 0.2626 + 0.4634i | 0.5023 + 1.2100i |
| 7 | 0.2606 + 0.4718i | 0.4718 + 0.2606i | 0.4984 + 1.2088i | 1.2088 + 0.4984i |
| 7.5 | 0.4951 + 1.2068i | 1.2068 + 0.4951i | 0.2575 + 0.4819i | 0.4819 + 0.2575i |
| 8 | 0.4925 + 1.2040i | 0.2530 + 0.4936i | 1.2040 + 0.4925i | 0.4936 + 0.2530i |
| 8.5 | 0.5061 + 0.2474i | 0.2474 + 0.5061i | 1.2007 + 0.4909i | 0.4909 + 1.2007i |
| 9 | 0.2472 + 0.5461i | 0.4910 + 0.2363i | 0.5032 + 1.2019i | 1.1908 + 0.4773i |
| 9.5 | 0.6186 + 0.2544i | 0.2213 + 0.4416i | 1.2080 + 0.5377i | 0.4487 + 1.1657i |
| 10 | 0.2173 + 0.4189i | 0.6578 + 0.2571i | 0.4326 + 1.1445i | 1.2088 + 0.5659i |
| 10.5 | 0.9576 + 0.2881i | 0.2881 + 0.2881i | 0.9576 + 0.9576i | 0.2881 + 0.9576i |
| 11 | 0.2918 + 0.2918i | 0.9565 + 0.2918i | 0.2918 + 0.9565i | 0.9565 + 0.9565i |
| 11.5 | 0.2949 − 0.2949i | 0.9555 − 0.2949i | 0.2949 − 0.9555i | 0.9555 − 0.9555i |
| 12 | 0.2976 − 0.2976i | 0.9547 − 0.2976i | 0.2976 − 0.9547i | 0.9547 − 0.9547i |
| 12.5 | 0.2999 − 0.2999i | 0.9540 − 0.2999i | 0.2999 − 0.9540i | 0.9540 − 0.9540i |
| 13 | 0.3018 − 0.3018i | 0.9534 − 0.3018i | 0.3018 − 0.9534i | 0.9534 − 0.9534i |
| 13.5 | 0.3035 − 0.3035i | 0.9528 − 0.3035i | 0.3035 − 0.9528i | 0.9528 − 0.9528i |
| 14 | 0.3050 − 0.3050i | 0.9523 − 0.3050i | 0.3050 − 0.9523i | 0.9523 − 0.9523i |
| 14.5 | 0.3063 − 0.3063i | 0.9519 − 0.3063i | 0.3063 − 0.9519i | 0.9519 − 0.9519i |
| 15 | 0.9516 + 0.9512i | 0.9516 + 0.3073i | 0.3074 + 0.9519i | 0.3075 + 0.3076i | b) 32QQAM—AWGN Channel

| SNR/w | w0 | w1 | w2 | w3 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.5852 + 0.6908i | 0.6906 + 0.5853i | 0.6919 + 0.8373i | 0.8369 + 0.6921i |
| 2 | 0.4053 + 0.5879i | 0.5879 + 0.4054i | 0.6114 + 1.0565i | 1.0566 + 0.6114i |
| 2.5 | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1571 + 0.5551i |
| 3.5 | 0.2981 + 0.4781i | 0.4781 + 0.2981i | 0.5410 + 1.1789i | 1.1789 + 0.5410i |
| 4 | 0.2842 + 0.4633i | 0.4633 + 0.2842i | 0.5309 + 1.1927i | 1.1927 + 0.5309i |
| 4.5 | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5170 + 1.2065i | 1.2065 + 0.5169i |
| 5.5 | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i |
| 6.5 | 0.2553 + 0.4543i | 0.4543 + 0.2553i | 0.4305 + 1.2537i | 1.2537 + 0.4305i |
| 7 | 0.2470 + 0.4515i | 0.4515 + 0.2470i | 0.3595 + 1.2746i | 1.2746 + 0.3595i |
| 7.5 | 0.2410 + 0.4578i | 0.4577 + 0.2410i | 0.3211 + 1.2755i | 1.2755 + 0.3211i |
| 8 | 0.2351 + 0.4699i | 0.4699 + 0.2351i | 0.2957 + 1.2701i | 1.2701 + 0.2957i |
| 8.5 | 0.2270 + 0.3121i | 0.6255 + 0.2091i | 0.3173 + 1.3160i | 1.3378 + 0.3422i |
| 9 | 0.2117 + 0.2518i | 0.6564 + 0.1984i | 0.3463 + 1.3865i | 1.3392 + 0.3470i |
| 9.5 | 0.2014 + 0.2235i | 0.6716 + 0.1924i | 0.3533 + 1.4075i | 1.3374 + 0.3431i |
| 10 | 0.1946 + 0.2025i | 0.6811 + 0.1872i | 0.3555 + 1.4163i | 1.3323 + 0.3370i |
| 10.5 | 0.1917 + 0.1863i | 0.6885 + 0.1824i | 0.3554 + 1.4185i | 1.3247 + 0.3312i |
| 11 | 0.1929 + 0.1744i | 0.6963 + 0.1782i | 0.3541 + 1.4168i | 1.3162 + 0.3270i |
| 11.5 | 0.1978 + 0.1660i | 0.7046 + 0.1752i | 0.3521 + 1.4127i | 1.3074 + 0.3244i |
| 12 | 0.2047 + 0.1603i | 0.7126 + 0.1738i | 0.3499 + 1.4076i | 1.2978 + 0.3226i |
| 12.5 | 0.2121 + 0.1569i | 0.7185 + 0.1739i | 0.3478 + 1.4027i | 1.2867 + 0.3209i |
| 13 | 0.2187 + 0.1559i | 0.7211 + 0.1755i | 0.3459 + 1.3987i | 1.2734 + 0.3186i |
| 13.5 | 0.2234 + 0.1575i | 0.7198 + 0.1782i | 0.3442 + 1.3961i | 1.2579 + 0.3156i |
| 14 | 0.2261 + 0.1614i | 0.7147 + 0.1816i | 0.3425 + 1.3949i | 1.2405 + 0.3119i |
| 14.5 | 0.2113 + 0.1819i | 0.6590 + 0.1934i | 0.6163 + 1.2930i | 1.1691 + 0.2524i |
| 15 | 0.2082 + 0.1903i | 0.6467 + 0.1971i | 0.6624 + 1.2634i | 1.1455 + 0.2430i |

| SNR/w | w4 | w5 | w6 | w7 |
|---|---|---|---|---|
| 0 | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i |
| 1 | 0.7071 + 0.7071i | 0.7071 + 0.7071i | 0.7071 + 0.7071i | 0.7071 + 0.7071i |
| 1.5 | 0.5856 + 0.6908i | 0.6911 + 0.5854i | 0.6923 + 0.8374i | 0.8376 + 0.6922i |
| 2 | 0.4053 + 0.5879i | 0.5879 + 0.4053i | 0.6114 + 1.0565i | 1.0566 + 0.6114i |
| 2.5 | 0.3507 + 0.5354i | 0.5354 + 0.3507i | 0.5763 + 1.1217i | 1.1217 + 0.5763i |
| 3 | 0.3189 + 0.5012i | 0.5012 + 0.3189i | 0.5551 + 1.1571i | 1.1572 + 0.5551i |
| 3.5 | 0.2980 + 0.4781i | 0.4781 + 0.2981i | 0.5410 + 1.1789i | 1.1789 + 0.5410i |
| 4 | 0.2842 + 0.4633i | 0.4633 + 0.2842i | 0.5310 + 1.1928i | 1.1928 + 0.5310i |
| 4.5 | 0.2752 + 0.4551i | 0.4551 + 0.2752i | 0.5232 + 1.2014i | 1.2014 + 0.5232i |
| 5 | 0.2696 + 0.4521i | 0.4521 + 0.2696i | 0.5169 + 1.2065i | 1.2065 + 0.5170i |
| 5.5 | 0.2663 + 0.4530i | 0.4530 + 0.2663i | 0.5115 + 1.2092i | 1.2092 + 0.5115i |
| 6 | 0.2642 + 0.4570i | 0.4570 + 0.2642i | 0.5067 + 1.2102i | 1.2102 + 0.5067i |
| 6.5 | 0.2699 + 0.4632i | 0.4632 + 0.2699i | 0.5752 + 1.1632i | 1.1632 + 0.5752i |
| 7 | 0.2734 + 0.4630i | 0.4630 + 0.2734i | 0.6396 + 1.1327i | 1.1327 + 0.6395i |
| 7.5 | 0.2728 + 0.4655i | 0.4655 + 0.2728i | 0.6715 + 1.1226i | 1.1226 + 0.6715i |
| 8 | 0.2695 + 0.4698i | 0.4698 + 0.2695i | 0.6913 + 1.1190i | 1.1190 + 0.6913i |
| 8.5 | 0.2428 + 0.4444i | 0.5783 + 0.3109i | 0.4151 + 1.0074i | 1.0441 + 0.8436i |
| 9 | 0.2317 + 0.4565i | 0.6091 + 0.3434i | 0.3354 + 0.9582i | 0.9927 + 0.8356i |
| 9.5 | 0.2276 + 0.4678i | 0.6230 + 0.3674i | 0.3047 + 0.9383i | 0.9683 + 0.8393i |
| 10 | 0.2266 + 0.4818i | 0.6303 + 0.3928i | 0.2860 + 0.9269i | 0.9538 + 0.8460i |
| 10.5 | 0.2273 + 0.4949i | 0.6340 + 0.4191i | 0.2729 + 0.9204i | 0.9446 + 0.8543i |
| 11 | 0.2283 + 0.5036i | 0.6364 + 0.4437i | 0.2627 + 0.9170i | 0.9382 + 0.8637i |
| 11.5 | 0.2287 + 0.5076i | 0.6386 + 0.4654i | 0.2546 + 0.9154i | 0.9335 + 0.8738i |
| 12 | 0.2280 + 0.5086i | 0.6410 + 0.4845i | 0.2485 + 0.9154i | 0.9299 + 0.8841i |
| 12.5 | 0.2258 + 0.5089i | 0.6431 + 0.5018i | 0.2443 + 0.9172i | 0.9274 + 0.8949i |
| 13 | 0.2225 + 0.5103i | 0.6446 + 0.5183i | 0.2415 + 0.9207i | 0.9257 + 0.9059i |
| 13.5 | 0.2189 + 0.5139i | 0.6455 + 0.5346i | 0.2398 + 0.9259i | 0.9246 + 0.9174i |
| 14 | 0.2157 + 0.5201i | 0.6463 + 0.5505i | 0.2389 + 0.9324i | 0.9230 + 0.9294i |
| 14.5 | 0.2042 + 0.5736i | 0.6214 + 0.5984i | 0.2154 + 1.0277i | 1.0670 + 0.7825i |
| 15 | 0.2028 + 0.5942i | 0.6209 + 0.6087i | 0.2221 + 1.0561i | 1.0812 + 0.7572i | c) 64QQAM—AWGN Channel

| SNR/w | w0 | w1 | w2 | w3 | w4 | w5 | w6 | w7 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.8374 + 0.6919i | 0.6909 + 0.5852i | 0.8371 + 0.6921i | 0.6907 + 0.5853i | 0.8375 + 0.6921i | 0.6910 + 0.5854i | 0.8372 + 0.6923i | 0.6908 + 0.5855i |
| 1.5 | 1.0566 + 0.6114i | 1.0566 + 0.6114i | 0.5879 + 0.4053i | 0.5879 + 0.4053i | 0.6114 + 1.0566i | 0.6114 + 1.0566i | 0.4053 + 0.5879i | 0.4053 + 0.5879i |
| 2 | 1.1217 + 0.5763i | 1.1217 + 0.5763i | 0.5879 + 0.4053i | 1.1217 + 0.5763i | 0.5354 + 0.3507i | 0.5354 + 0.3507i | 0.5354 + 0.3507i | 0.5354 + 0.3507i |
| 2.5 | 0.5551 + 1.1571i | 0.3189 + 0.5012i | 1.1571 + 0.5551i | 0.5012 + 0.3189i | 0.5551 + 1.1571i | 0.3189 + 0.5012i | 1.1572 + 0.5551i | 0.5012 + 0.3189i |
| 3 | 1.1789 + 0.5410i | 1.1789 + 0.5410i | 1.1789 + 0.5410i | 1.1789 + 0.5410i | 0.4781 + 0.2981i | 0.4781 + 0.2981i | 0.4781 + 0.2981i | 0.4781 + 0.2981i |
| 3.5 | 0.2842 + 0.4633i | 0.2842 + 0.4633i | 1.1789 + 0.5410i | 0.5309 + 1.1927i | 0.2842 + 0.4633i | 0.2842 + 0.4633i | 0.5309 + 1.1928i | 0.5309 + 1.1927i |
| 4 | 0.5232 + 1.2014i | 0.5232 + 1.2014i | 0.5232 + 1.2014i | 0.5232 + 1.2014i | 0.5232 + 1.2014i | 0.5232 + 1.2014i | 0.5232 + 1.2014i | 0.5232 + 1.2014i |
| 4.5 | 1.2065 + 0.5170i | 1.2065 + 0.5169i | 1.2065 + 0.5169i | 1.2066 + 0.5169i | 0.5170 + 1.2065i | 0.5169 + 1.2065i | 0.5169 + 1.2065i | 0.5169 + 1.2065i |
| 5 | 1.2092 + 0.5115i | 1.2092 + 0.5115i | 1.2092 + 0.5115i | 1.2092 + 0.5115i | 0.4530 + 0.2663i | 0.4530 + 0.2663i | 0.4530 + 0.2664i | 0.4530 + 0.2663i |
| 5.5 | 0.2642 + 0.4570i | 0.2642 + 0.4570i | 0.2642 + 0.4570i | 0.2642 + 0.4570i | 0.4570 + 0.2642i | 0.4570 + 0.2642i | 0.4570 + 0.2642i | 0.4570 + 0.2642i |
| 6 | 0.5752 + 1.1632i | 0.4305 + 1.2537i | 0.5752 + 1.1632i | 0.4305 + 1.2537i | 1.1632 + 0.5752i | 1.2537 + 0.4305i | 1.1632 + 0.5752i | 1.2537 + 0.4305i |
| 6.5 | 0.3595 + 1.2746i | 0.6396 + 1.1327i | 0.3595 + 1.2746i | 0.6396 + 1.1327i | 1.2746 + 0.3595i | 1.1327 + 0.6396i | 1.2746 + 0.3595i | 1.1327 + 0.6396i |
| 7 | 0.7476 + 1.2181i | 0.5961 + 1.0258i | 0.3325 + 1.3887i | 0.3069 + 1.1510i | 1.2181 + 0.7475i | 1.0258 + 0.5961i | 1.3887 + 0.3325i | 1.1510 + 0.3069i |
| 7.5 | 0.3109 + 1.4253i | 0.7943 + 1.2523i | 0.2868 + 1.0998i | 0.5786 + 0.9799i | 1.4253 + 0.3109i | 1.2523 + 0.7943i | 1.0998 + 0.2868i | 0.9799 + 0.5786i |
| 8 | 1.6023 + 0.4387i | 1.0881 + 0.8753i | 0.4387 + 1.6023i | 0.8753 + 1.0881i | 0.9239 + 0.2202i | 0.8454 + 0.3049i | 0.2202 + 0.9239i | 0.7540 + 0.2653i |
| 8.5 | 0.4221 + 1.5951i | 1.5951 + 0.4221i | 0.8732 + 1.0971i | 1.0971 + 0.8732i | 0.7823 + 0.2020i | 0.9288 + 0.2247i | 0.2020 + 0.7823i | 0.8479 + 0.3175i |
| 9 | 0.8408 + 1.2670i | 0.5485 + 0.9136i | 0.2950 + 1.4844i | 0.2548 + 1.0308i | 1.2670 + 0.8407i | 0.9136 + 0.5485i | 1.4844 + 0.2950i | 1.0308 + 0.2548i |
| 9.5 | 1.2647 + 0.8443i | 1.4891 + 0.2935i | 0.9020 + 0.5498i | 1.0230 + 0.2451i | 0.3069 + 0.1750i | 0.3075 + 0.1615i | 0.5944 + 0.3252i | 0.6401 + 0.2182i |
| 10 | 0.2925 + 1.4892i | 0.8449 + 1.2622i | 0.2351 + 1.0196i | 0.5555 + 0.8926i | 1.4892 + 0.2925i | 1.2622 + 0.8449i | 1.0196 + 0.2351i | 0.8926 + 0.5555i |
| 10.5 | 0.8435 + 1.2594i | 0.5630 + 0.8851i | 0.2921 + 1.4867i | 0.2255 + 1.0193i | 1.2594 + 0.8435i | 0.8851 + 0.5630i | 1.4867 + 0.2921i | 1.0193 + 0.2255i |
| 11 | 0.2920 + 1.4827i | 0.8411 + 1.2563i | 0.2174 + 1.0211i | 0.5702 + 0.8798i | 1.4827 + 0.2920i | 1.2563 + 0.8411i | 1.0211 + 0.2174i | 0.8798 + 0.5702i |
| 11.5 | 0.2920 + 1.4781i | 0.8380 + 1.2527i | 0.2112 + 1.0242i | 0.5763 + 0.8768i | 1.4781 + 0.2920i | 1.2527 + 0.8380i | 1.0242 + 0.2112i | 0.8768 + 0.5763i |
| 12 | 0.2920 + 1.4732i | 0.8348 + 1.2487i | 0.2071 + 1.0283i | 0.5811 + 0.8760i | 1.4732 + 0.2920i | 1.2487 + 0.8348i | 1.0283 + 0.2071i | 0.8760 + 0.5811i |
| 12.5 | 0.2978 + 1.4669i | 0.8421 + 1.2355i | 0.2135 + 1.0389i | 0.6055 + 0.8654i | 1.4685 + 0.2859i | 1.2516 + 0.8201i | 1.0279 + 0.1981i | 0.8857 + 0.5642i |
| 13 | 1.4627 + 0.2996i | 1.0469 + 0.2187i | 1.2278 + 0.8422i | 0.8605 + 0.6179i | 0.4106 + 0.1299i | 0.7441 + 0.1749i | 0.3822 + 0.1824i | 0.6160 + 0.4168i |
| 13.5 | 0.2989 + 1.4602i | 0.8389 + 1.2232i | 0.2232 + 1.0534i | 0.6245 + 0.8593i | 1.4560 + 0.2819i | 1.2434 + 0.8085i | 1.0319 + 0.1914i | 0.8945 + 0.5550i |
| 14 | 0.2878 + 1.4388i | 0.8133 + 1.2150i | 0.2219 + 1.0386i | 0.6145 + 0.8494i | 1.4656 + 0.2931i | 1.2278 + 0.8230i | 1.0649 + 0.2069i | 0.8971 + 0.5677i |
| 14.5 | 0.9687 - 0.4488i | 0.1261 - 0.4419i | 0.6752 - 0.4269i | 0.3896 - 0.4201i | 1.0304 - 0.1506i | 0.1248 - 0.1379i | 0.6647 - 0.1295i | 0.3769 - 0.1364i |
| 15 | 0.9856 - 0.4661i | 0.1264 - 0.4145i | 0.6825 - 0.4329i | 0.3948 - 0.4179i | 1.0366 - 0.1534i | 0.1272 - 0.1353i | 0.6796 - 0.1340i | 0.3877 - 0.1359i |
| 15.5 | 1.0161 - 0.4912i | 0.1287 - 0.4061i | 0.6966 - 0.4427i | 0.4025 - 0.4142i | 1.0441 - 0.1581i | 0.1321 - 0.1317i | 0.6995 - 0.1411i | 0.4035 - 0.1354i |
| 16 | 1.0519 - 0.5188i | 0.1325 - 0.3998i | 0.7146 - 0.4532i | 0.4122 - 0.4120i | 1.0500 - 0.1642i | 0.1374 - 0.1295i | 0.7170 - 0.1473i | 0.4185 - 0.1357i |
| 16.5 | 1.0725 - 0.5328i | 0.1361 - 0.4023i | 0.7267 - 0.4592i | 0.4198 - 0.4151i | 1.0501 - 0.1676i | 0.1398 - 0.1309i | 0.7233 - 0.1496i | 0.4246 - 0.1370i |
| 17 | 1.0854 - 0.5394i | 0.1392 - 0.4078i | 0.7353 - 0.4623i | 0.4262 - 0.4205i | 1.0474 - 0.1695i | 0.1407 - 0.1336i | 0.7243 - 0.1504i | 0.4265 - 0.1388i |
| 17.5 | 1.0941 - 0.5424i | 0.1418 - 0.4131i | 0.7424 - 0.4645i | 0.4318 - 0.4266i | 1.0439 - 0.1707i | 0.1411 - 0.1361i | 0.7235 - 0.1509i | 0.4269 - 0.1406i |
| 18 | 1.0998 - 0.5430i | 0.1439 - 0.4173i | 0.7487 - 0.4666i | 0.4370 - 0.4325i | 1.0405 - 0.1713i | 0.1414 - 0.1380i | 0.7224 - 0.1517i | 0.4269 - 0.1425i |
| 18.5 | 1.1032 - 0.5410i | 0.1458 - 0.4204i | 0.7543 - 0.4691i | 0.4418 - 0.4382i | 1.0373 - 0.1716i | 0.1414 - 0.1393i | 0.7213 - 0.1527i | 0.4267 - 0.1443i |
| 19 | 1.1043 - 0.5346i | 0.1473 - 0.4225i | 0.7587 - 0.4731i | 0.4459 - 0.4435i | 1.0338 - 0.1710i | 0.1414 - 0.1401i | 0.7201 - 0.1544i | 0.4264 - 0.1461i |
| 19.5 | 1.1039 - 0.5232i | 0.1486 - 0.4237i | 0.7620 - 0.4802i | 0.4492 - 0.4482i | 1.0304 - 0.1696i | 0.1413 - 0.1405i | 0.7193 - 0.1572i | 0.4263 - 0.1477i |
| 20 |  |  |  |  |  |  |  |  |

| SNR/w | w8 | w9 | w10 | w11 | w12 | w13 | w14 | w15 |
|---|---|---|---|---|---|---|---|---|
| 0 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 0.5 | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i | 0.7071 + 0.7071i |
| 1 | 0.6922 + 0.8371i | 0.5854 + 0.6907i | 0.6920 + 0.8373i | 0.5852 + 0.6908i | 0.6923 + 0.8373i | 0.5854 + 0.6908i | 0.6920 + 0.8375i | 0.5853 + 0.6910i |
| 1.5 | 1.0565 + 0.6114i | 1.0565 + 0.6114i | 0.5879 + 0.4053i | 0.5879 + 0.4053i | 0.6114 + 1.0566i | 0.6114 + 1.0566i | 0.4053 + 0.5879i | 0.4053 + 0.5879i |
| 2 | 0.5763 + 1.1217i | 0.5763 + 1.1217i | 0.5763 + 1.1217i | 0.5763 + 1.1217i | 0.3507 + 0.5354i | 0.3507 + 0.5354i | 0.3507 + 0.5354i | 0.3507 + 0.5354i |

-continued

| | | | | | | |
|---|---|---|---|---|---|---|
| 3 | 0.5551 + 1.1571i | 0.3189 + 0.5012i | 1.1571 + 0.5551i | 0.5012 + 0.3189i | 0.5551 + 1.1572i | 0.3189 + 0.5012i | 1.1571 + 0.5551i | 0.5012 + 0.3189i |
| 3.5 | 0.5410 + 1.1789i | 0.5410 + 1.1789i | 0.5410 + 1.1789i | 0.5410 + 1.1789i | 0.2980 + 0.4781i | 0.2980 + 0.4781i | 0.2980 + 0.4781i | 0.2980 + 0.4781i |
| 4 | 0.4633 + 0.2842i | 0.4633 + 0.2842i | 0.1927 + 0.5309i | 0.1927 + 0.5309i | 0.4633 + 0.2842i | 0.4633 + 0.2842i | 1.1928 + 0.5309i | 1.1928 + 0.5309i |
| 4.5 | 0.2752 + 0.4551i | 0.2752 + 0.4551i | 0.2752 + 0.4551i | 0.2752 + 0.4551i | 0.4551 + 0.2752i | 0.4551 + 0.2752i | 0.4551 + 0.2752i | 0.4551 + 0.2752i |
| 5 | 0.4521 + 0.2696i | 0.4521 + 0.2696i | 0.4521 + 0.2696i | 0.4521 + 0.2696i | 0.2696 + 0.4521i | 0.2696 + 0.4521i | 0.2696 + 0.4521i | 0.2696 + 0.4521i |
| 5.5 | 0.5115 + 1.2092i | 0.5115 + 1.2092i | 0.5115 + 1.2092i | 0.5115 + 1.2092i | 0.2663 + 0.4530i | 0.2663 + 0.4530i | 0.2663 + 0.4530i | 0.2663 + 0.4530i |
| 6 | 0.5067 + 1.2102i | 0.5067 + 1.2102i | 0.5067 + 1.2102i | 0.5067 + 1.2102i | 1.2102 + 0.5067i | 1.2102 + 0.5067i | 1.2102 + 0.5067i | 1.2102 + 0.5067i |
| 6.5 | 0.2699 + 0.4632i | 0.2553 + 0.4543i | 0.2699 + 0.4632i | 0.2553 + 0.4543i | 0.4632 + 0.2699i | 0.4543 + 0.2553i | 0.4632 + 0.2699i | 0.4543 + 0.2553i |
| 7 | 0.2470 + 0.4515i | 0.2734 + 0.4630i | 0.2470 + 0.4515i | 0.2734 + 0.4630i | 0.4515 + 0.2470i | 0.4630 + 0.2734i | 0.4515 + 0.2470i | 0.4630 + 0.2734i |
| 7.5 | 0.2486 + 0.4162i | 0.2870 + 0.4969i | 0.2266 + 0.4085i | 0.2500 + 0.4969i | 0.4162 + 0.2486i | 0.4969 + 0.2870i | 0.4084 + 0.2266i | 0.4969 + 0.2500i |
| 8 | 0.2104 + 0.3815i | 0.2282 + 0.3849i | 0.2478 + 0.5286i | 0.2937 + 0.5184i | 0.3815 + 0.2104i | 0.3849 + 0.2282i | 0.5286 + 0.2478i | 0.5184 + 0.2937i |
| 8.5 | 0.2019 + 0.7818i | 0.2653 + 0.7540i | 0.2202 + 0.9239i | 0.3049 + 0.8454i | 0.2701 + 0.2890i | 0.2479 + 0.2675i | 0.2675 + 0.2479i | 0.2890 + 0.2701i |
| 9 | 0.2247 + 0.9288i | 0.2020 + 0.7823i | 0.3175 + 0.8479i | 0.2686 + 0.7537i | 0.2676 + 0.2415i | 0.2415 + 0.2676i | 0.2913 + 0.2660i | 0.2660 + 0.2913i |
| 9.5 | 0.1831 + 0.3172i | 0.3159 + 0.5815i | 0.1695 + 0.3173i | 0.2278 + 0.6175i | 0.3172 + 0.1821i | 0.5815 + 0.3159i | 0.3173 + 0.1695i | 0.6176 + 0.2278i |
| 10 | 0.8443 + 1.2648i | 0.2935 + 1.4891i | 0.5498 + 0.9020i | 0.2451 + 1.0230i | 0.1750 + 0.3069i | 0.1615 + 0.3075i | 0.3252 + 0.5944i | 0.2182 + 0.6401i |
| 10.5 | 0.1558 + 0.3029i | 0.1712 + 0.3021i | 0.2075 + 0.6586i | 0.3354 + 0.6030i | 0.3029 + 0.1558i | 0.3021 + 0.1712i | 0.6586 + 0.2075i | 0.6030 + 0.3354i |
| 11 | 0.1697 + 0.3011i | 0.3460 + 0.6087i | 0.1514 + 0.3020i | 0.969 + 0.6737i | 0.3011 + 0.1697i | 0.6087 + 0.3460i | 0.3020 + 0.1514i | 0.6737 + 0.1696i |
| 11.5 | 0.1475 + 0.3040i | 0.1691 + 0.3028i | 0.1871 + 0.6855i | 0.3563 + 0.6126i | 0.3040 + 0.1475i | 0.3028 + 0.1691i | 0.6855 + 0.1871i | 0.6126 + 0.3563i |
| 12 | 0.1436 + 0.3081i | 0.1684 + 0.3059i | 0.1789 + 0.6942i | 0.3657 + 0.6155i | 0.3081 + 0.1436i | 0.3059 + 0.1684i | 0.6942 + 0.1789i | 0.6155 + 0.3657i |
| 12.5 | 0.1393 + 0.3138i | 0.1671 + 0.3094i | 0.1720 + 0.7004i | 0.3741 + 0.6174i | 0.3138 + 0.1393i | 0.3094 + 0.1671i | 0.7004 + 0.1720i | 0.6174 + 0.3741i |
| 13 | 0.1338 + 0.3767i | 0.1752 + 0.3563i | 0.1756 + 0.7261i | 0.4023 + 0.6180i | 0.2713 + 0.1337i | 0.2748 + 0.1572i | 0.6840 + 0.1578i | 0.6145 + 0.3555i |
| 13.5 | 0.2831 + 1.4625i | 0.1935 + 1.0296i | 0.8124 + 1.2487i | 0.5574 + 0.8909i | 0.1287 + 0.2512i | 0.1488 + 0.6759i | 0.1538 + 0.2598i | 0.3493 + 0.6111i |
| 14 | 0.1266 + 0.4289i | 0.1907 + 0.3970i | 0.1717 + 0.7575i | 0.4261 + 0.6136i | 0.2362 + 0.1255i | 0.2560 + 0.1549i | 0.6735 + 0.1418i | 0.6085 + 0.3483i |
| 14.5 | 0.1177 + 0.4119i | 0.2516 + 0.3998i | 0.1559 + 0.7442i | 0.4328 + 0.5954i | 0.1678 + 0.1166i | 0.3325 + 0.1582i | 0.7408 + 0.1355i | 0.6200 + 0.3227i |
| 15 | 0.1704 − 0.7904i | 0.1452 − 0.7405i | 0.6932 − 0.8128i | 0.4017 − 0.7221i | 0.4580 − 0.2741i | 0.1644 − 1.0798i | 0.7344 − 1.2171i | 0.2867 − 1.4419i |
| 15.5 | 0.1580 − 0.8178i | 0.1416 − 0.7330i | 0.6913 − 0.8132i | 0.4018 − 0.7177i | 0.4529 − 0.2702i | 0.1686 − 1.0718i | 0.7097 − 1.2125i | 0.2732 − 1.4375i |
| 16 | 0.1306 − 0.8649i | 0.1385 − 0.7199i | 0.6874 − 0.8123i | 0.4017 − 0.7107i | 0.4516 − 0.2578i | 0.1689 − 1.0567i | 0.6750 − 1.2072i | 0.2558 − 1.4247i |
| 16.5 | 0.0952 − 0.9115i | 0.1369 − 0.7073i | 0.6868 − 0.8108i | 0.4044 − 0.7057i | 0.4480 − 0.2403i | 0.1677 − 1.0405i | 0.6406 − 1.1995i | 0.2402 − 1.4087i |
| 17 | 0.0771 − 0.9315i | 0.1373 − 0.7043i | 0.6956 − 0.8095i | 0.4114 − 0.7109i | 0.4380 − 0.2294i | 0.1680 − 1.0338i | 0.6220 − 1.1896i | 0.2326 − 1.3986i |
| 17.5 | 0.0693 − 0.9408i | 0.1388 − 0.7057i | 0.7092 − 0.8073i | 0.4197 − 0.7206i | 0.4261 − 0.2216i | 0.1682 − 1.0316i | 0.6106 − 1.1783i | 0.2287 − 1.3914i |
| 18 | 0.0666 − 0.9452i | 0.1406 − 0.7083i | 0.7229 − 0.8052i | 0.4275 − 0.7307i | 0.4143 − 0.2157i | 0.1685 − 1.0310i | 0.6029 − 1.1680i | 0.2262 − 1.3855i |
| 18.5 | 0.0673 − 0.9458i | 0.1425 − 0.7109i | 0.7349 − 0.8045i | 0.4344 − 0.7399i | 0.4036 − 0.2110i | 0.1691 − 1.0309i | 0.5971 − 1.1599i | 0.2240 − 1.3805i |
| 19 | 0.0720 − 0.9431i | 0.1445 − 0.7131i | 0.7452 − 0.8057i | 0.4404 − 0.7481i | 0.3941 − 0.2072i | 0.1697 − 1.0309i | 0.5918 − 1.1539i | 0.2216 − 1.3761i |
| 19.5 | 0.0847 − 0.9271i | 0.1467 − 0.7148i | 0.7552 − 0.8112i | 0.4463 − 0.7557i | 0.3857 − 0.2033i | 0.1703 − 1.0305i | 0.5851 − 1.1507i | 0.2181 − 1.3721i |
| 20 | 0.1043 − 0.9013i | 0.1491 − 0.7159i | 0.7655 − 0.8232i | 0.4529 − 0.7625i | 0.3785 − 0.1990i | 0.1705 − 1.0293i | 0.5745 − 1.1503i | 0.2128 − 1.3684i | d) 256QQAM—AWGN Channel

| SNR/w | w0 | w1 | w2 | w3 | w4 | w5 | w6 | w7 |
|---|---|---|---|---|---|---|---|---|
| 5 | 0.4521 + 0.2696i | 0.4521 + 0.2696i | 0.4521 + 0.2696i | 0.4521 + 0.2696i | 0.4521 + 0.2696i | 0.4521 + 0.2696i | 0.4521 + 0.2696i | 0.4521 + 0.2696i |
| 5.5 | 0.4530 + 0.2663i | 0.4530 + 0.2663i | 0.4530 + 0.2663i | 0.4530 + 0.2663i | 0.4530 + 0.2663i | 0.4530 + 0.2663i | 0.4530 + 0.2663i | 0.4530 + 0.2663i |
| 6 | 0.5067 + 0.5067i | 0.5067 + 0.5067i | 0.5067 + 0.5067i | 0.5067 + 0.5067i | 0.5067 + 0.5067i | 0.5067 + 0.5067i | 0.5067 + 0.5067i | 0.5067 + 0.5067i |
| 6.5 | 1.2537 + 0.4305i | 1.2537 + 0.4305i | 1.2537 + 0.4305i | 1.2537 + 0.4305i | 1.1632 + 0.5752i | 1.1632 + 0.5752i | 1.1632 + 0.5752i | 1.1632 + 0.5752i |
| 7 | 1.1322 + 0.6970i | 1.0432 + 0.6178i | 1.5234 + 1.0871i | 1.1322 + 0.6970i | 1.2925 + 0.3605i | 1.1632 + 0.5752i | 1.6996 + 0.3860i | 1.2925 + 0.3605i |
| 7.5 | 0.2741 + 0.4749i | 0.2526 + 0.4285i | 0.5864 + 1.0293i | 0.6995 + 1.1198i | 0.2951 + 0.5185i | 0.2741 + 0.4749i | 0.5525 + 0.9862i | 0.5864 + 1.0293i |
| 8 | 0.3565 + 1.7813i | 0.3059 + 1.2626i | 0.3059 + 1.2626i | 0.2962 + 1.2626i | 0.0099 + 1.5146i | 0.6749 + 1.1091i | 0.6749 + 1.1091i | 0.6000 + 1.0201i |
| 8.5 | 0.3488 + 1.7914i | 0.2880 + 1.2587i | 0.2880 + 1.2587i | 0.2788 + 1.1468i | 1.0152 + 1.5168i | 0.6879 + 1.1023i | 0.6879 + 1.1023i | 0.6127 + 1.0130i |
| 9 | 1.6414 + 0.6837i | 0.9335 + 0.8803i | 0.2681 + 1.4953i | 0.7270 + 0.9501i | 1.8682 + 0.2925i | 0.8579 + 0.9067i | 0.3433 + 1.4695i | 0.6978 + 1.0003i |
| 9.5 | 1.6327 + 0.6734i | 0.9469 + 0.8771i | 0.2526 + 1.4830i | 0.7372 + 0.9369i | 1.8490 + 0.2874i | 0.8644 + 0.9027i | 0.3370 + 1.4511i | 0.7054 + 0.9892i |
| 10 | 1.7476 − 0.3437i | 1.4279 − 0.2830i | 0.9979 − 0.2435i | 1.0202 − 0.2443i | 1.4280 − 0.2830i | 1.3530 − 0.2686i | 1.0202 − 0.2443i | 1.0415 − 0.2449i |
| 10.5 | 1.7549 − 0.3495i | 1.4293 − 0.2804i | 0.9857 − 0.2340i | 0.0112 − 0.2349i | 1.4293 − 0.2804i | 1.3614 − 0.2635i | 0.0112 − 0.2349i | 1.0372 − 0.2356i |
| 11 | 0.3538 + 1.7624i | 0.2785 + 1.4265i | 0.2791 + 1.4266i | 0.2610 + 1.3647i | 0.9952 + 1.4965i | 0.8099 + 1.2071i | 0.8097 + 1.2074i | 0.7783 + 1.1510i |
| 11.5 | 0.3289 + 1.7624i | 0.3556 + 1.4165i | 0.2605 + 1.3630i | 0.2302 + 1.4276i | 1.4293 − 0.2804i | 1.0007 + 1.5057i | 0.7800 + 1.1485i | 0.8472 + 1.1728i |
| 12 | 0.6800 + 1.6926i | 0.3911 + 1.3645i | 0.2191 + 1.7524i | 0.2274 + 1.4208i | 0.8678 + 1.2487i | 0.7275 + 1.1667i | 0.8747 + 1.1546i | 0.7930 + 1.0406i |
| 12.5 | 0.7085 + 1.6630i | 0.4337 + 1.3632i | 0.2265 + 1.7707i | 0.2214 + 1.4346i | 0.8829 + 1.2345i | 0.7423 + 1.1546i | 0.9077 + 1.0034i | 0.8363 + 0.9971i |
| 13 | 0.7232 + 1.6427i | 0.4625 + 1.3572i | 0.2081 + 1.4453i | 0.2081 + 1.4453i | 0.8955 + 1.2316i | 0.7485 + 1.1494i | 0.9349 + 0.9699i | 0.8724 + 0.9626i |
| 13.5 | 0.7280 + 1.6381i | 0.4787 + 1.3492i | 0.2367 + 1.7836i | 0.1966 + 1.4478i | 0.9185 + 1.2490i | 0.7448 + 1.1524i | 0.9349 + 0.9699i | 0.8755 + 0.9516i |
| 14 | 0.6852 + 1.6631i | 0.4978 + 1.3396i | 0.2417 + 1.7872i | 0.1891 + 1.4343i | 1.0300 + 1.3532i | 0.7389 + 1.1771i | 0.9536 + 0.9516i | 0.8912 + 0.9461i |
| 14.5 | 0.6850 + 1.6565i | 0.5110 + 1.3346i | 0.2241 + 1.7618i | 0.1836 + 1.4363i | 1.0485 + 1.3578i | 0.7448 + 1.1781i | 0.9797 + 0.9598i | 0.8864 + 0.9798i |
| 15 | 1.1831 + 1.3352i | 1.5548 + 0.8930i | 0.2284 + 1.7618i | 1.1944 + 0.8535i | 1.7139 + 0.2236i | 1.4688 + 0.5085i | 0.9923 + 0.9464i | 0.9014 + 0.9717i |
| 15.5 | 1.3333 + 1.1727i | 0.9525 + 1.0450i | 1.0563 + 0.9473i | 0.8595 + 1.2191i | 1.2665 + 0.7890i | 1.0238 + 0.8157i | 0.9846 + 0.6522i | 1.0982 + 0.6522i |
| 16 | 1.0693 + 1.3695i | 1.6456 + 0.7233i | 0.8764 + 1.0450i | 1.3351 + 0.9489i | 1.6696 + 0.1992i | 1.4116 + 0.4773i | 1.0119 + 0.5685i | 1.0066 + 0.6087i |
| 16.5 | 1.3185 + 1.1655i | 1.0729 + 0.9416i | 1.0401 + 0.9844i | 1.3351 + 0.9489i | 1.4986 + 0.8198i | 1.2084 + 0.6881i | 0.9912 + 0.6923i | 1.1625 + 0.6341i |
| 17 | 1.1514 + 1.3474i | 1.3447 + 1.0136i | 0.9781 + 1.3517i | 0.9292 + 0.9707i | 1.1112 + 0.5426i | 1.2864 + 0.5679i | 0.9265 + 0.5535i | 0.9824 + 0.6211i |
| 17.5 | 1.1159 + 1.3726i | 1.3078 + 1.0458i | 0.9323 + 1.1378i | 0.9510 + 0.9427i | 2.1112 + 1.5066i | 1.3032 + 0.5672i | 0.9873 + 0.5679i | 0.9676 + 0.7289i |
| 18 | 1.1058 + 1.3496i | 1.2204 + 1.0180i | 0.9051 + 1.1657i | 0.9509 + 0.9581i | 1.2283 + 0.6284i | 1.4576 + 0.8033i | 0.9966 + 0.5672i | 0.9755 + 0.7547i |
| 18.5 | 1.1022 + 1.3396i | 1.0122 + 1.0122i | 0.8713 + 1.1743i | 0.9189 + 0.9604i | 1.2205 + 0.6352i | 1.4496 + 0.8012i | 1.0010 + 0.6008i | 0.9350 + 0.7635i |
| 19 | 1.5817 + 1.4283i | 1.4894 + 1.1404i | 0.8669 + 1.1800i | 0.9153 + 0.9665i | 1.0586 + 0.3317i | 0.6533 + 0.3125i | 0.9972 + 0.5981i | 0.9328 + 0.7745i |
| 19.5 | 0.8375 + 1.4782i | 1.3271 + 0.8728i | 1.4735 + 1.1381i | 1.2229 + 0.6533i | 1.0586 + 0.3317i | 0.6533 + 0.3125i | 0.9114 + 0.4575i | 1.0349 + 0.5768i |
| 20 | 1.1577 + 1.2607i | 1.2132 + 0.9665i | 1.1494 + 1.1881i | 1.0720 + 0.8655i | 1.5541 + 0.6145i | 1.2416 + 0.5886i | 0.9113 + 0.4993i | 1.0207 + 0.6225i |
| 20.5 | 1.1623 + 1.2367i | 1.2152 + 0.9464i | 0.8650 + 1.2652i | 0.9371 + 1.0167i | 1.2341 + 0.6321i | 1.4507 + 0.7875i | 0.9999 + 0.6438i | 0.9509 + 0.8111i |
| 21 | 1.1584 + 1.2194i | 1.2110 + 0.9321i | 0.8671 + 1.2704i | 0.9416 + 1.0203i | 1.2263 + 0.6212i | 1.4418 + 0.7638i | 0.9979 + 0.6457i | 0.9519 + 0.8158i |
| 21.5 | 1.1541 + 1.1980i | 1.2082 + 0.9192i | 0.8614 + 1.2738i | 0.9374 + 1.0274i | 1.2218 + 0.6145i | 1.4309 + 0.7504i | 0.9986 + 0.6649i | 0.9484 + 0.8261i |
| 22 | 1.1564 + 1.1321i | 1.2409 + 0.8772i | 0.8523 + 1.2778i | 0.9253 + 1.0390i | 1.2200 + 0.6057i | 1.4217 + 0.7371i | 1.0021 + 0.6678i | 0.9448 + 0.8412i |
| 22.5 | 1.1672 + 1.0989i | 1.2422 + 0.8522i | 0.8304 + 1.2958i | 0.8902 + 1.0738i | 1.2195 + 0.5872i | 1.4329 + 0.6862i | 1.0077 + 0.6857i | 0.9610 + 0.8761i |
| 23 | 1.2322 + 1.0269i | 1.4082 + 0.7080i | 0.8024 + 1.2971i | 0.8967 + 1.0878i | 1.2134 + 0.5744i | 1.4239 + 0.6620i | 1.0091 + 0.6909i | 0.9644 + 0.8828i |
| 23.5 | 1.1616 + 1.0595i | 1.2384 + 0.8218i | 0.7782 + 1.3193i | 0.9660 + 1.1333i | 1.4427 + 0.4179i | 1.1837 + 0.7680i | 0.9625 + 0.7036i | 0.9821 + 0.8987i |
| 24 | 1.2424 + 0.9493i | 1.2834 + 0.7245i | 0.7696 + 1.2863i | 0.8965 + 1.0947i | 1.4989 + 0.5582i | 1.4012 + 0.6249i | 1.0129 + 0.6976i | 0.9657 + 0.8860i |
| 24.5 | 1.2328 + 0.9369i | 1.2653 + 0.7160i | 0.9545 + 1.2183i | 1.0015 + 1.0002i | 1.1739 + 0.5257i | 1.3794 + 0.4917i | 1.0065 + 0.6128i | 1.0346 + 0.7930i |
| 25 | 1.2245 + 0.9258i | 1.2535 + 0.7077i | 0.9349 + 1.2178i | 0.9989 + 1.0051i | 1.1766 + 0.5132i | 1.3771 + 0.4884i | 1.0162 + 0.6131i | 1.0287 + 0.7970i |
| 25.5 | 1.2171 + 0.9128i | 1.2413 + 0.6969i | 0.9208 + 1.2135i | 0.9969 + 1.0052i | 1.1757 + 0.5047i | 1.3715 + 0.4846i | 1.0198 + 0.6112i | 1.0268 + 0.7962i |
| 26 | 1.2103 + 0.9014i | 1.2323 + 0.6874i | 0.9105 + 1.2064i | 0.9951 + 1.0017i | 1.1707 + 0.4940i | 1.3617 + 0.4870i | 1.0203 + 0.6087i | 1.0247 + 0.7923i |

| SNR/w | w8 | w9 | w10 | w11 | w12 | w13 | w14 | w15 |
|---|---|---|---|---|---|---|---|---|
| 5 | 0.4521 + 0.2696i | 0.4521 + 0.2696i | 0.4521 + 0.2696i | 0.4521 + 0.2696i | 0.4521 + 0.2696i | 0.4521 + 0.2696i | 0.4521 + 0.2696i | 0.4521 + 0.2696i |
| 5.5 | 0.4530 + 0.2663i | 0.4530 + 0.2663i | 0.4530 + 0.2663i | 0.4530 + 0.2663i | 0.4530 + 0.2663i | 0.4530 + 0.2663i | 0.4530 + 0.2663i | 0.4530 + 0.2663i |
| 6 | 0.5067 + 0.5067i | 0.5067 + 0.5067i | 0.5067 + 0.5067i | 0.5067 + 0.5067i | 0.5067 + 0.5067i | 0.5067 + 0.5067i | 0.5067 + 0.5067i | 0.5067 + 0.5067i |
| 6.5 | 1.2538 + 0.4305i | 1.2538 + 0.4305i | 1.2538 + 0.4305i | 1.2538 + 0.4305i | 1.1632 + 0.5752i | 1.1632 + 0.5752i | 1.1632 + 0.5752i | 1.1632 + 0.5752i |

| SNR/w | w16 | w17 | w18 | w19 | w20 | w21 | w22 | w23 |
|---|---|---|---|---|---|---|---|---|
| 7 | 1.0432 + 0.6178i | 0.9995 + 0.5797i | 1.1321 + 0.6970i | 1.0432 + 0.6178i | 1.1735 + 0.3522i | 1.1130 + 0.3476i | 1.2925 + 0.3604i | 1.1736 + 0.3522i |
| 7.5 | 0.4749 + 0.2741i | 0.4285 + 0.2526i | 1.0293 + 0.5865i | 1.1198 + 0.6595i | 0.5185 + 0.2951i | 0.4749 + 0.2741i | 0.9862 + 0.5525i | 1.0293 + 0.5865i |
| 8 | 0.3059 + 1.2626i | 0.2962 + 1.2102i | 0.2962 + 1.1484i | 0.2917 + 1.0949i | 0.6749 + 1.1091i | 0.6000 + 1.0201i | 0.6000 + 1.0201i | 0.5650 + 0.9791i |
| 8.5 | 0.2880 + 1.2587i | 0.2788 + 1.1484i | 0.2788 + 1.1468i | 0.2750 + 1.0951i | 0.6879 + 1.1023i | 0.6127 + 1.0130i | 0.6127 + 1.0130i | 0.5775 + 0.9727i |
| 9 | 1.5505 + 1.0696i | 0.9759 + 0.9428i | 0.3350 + 1.5307i | 0.7461 + 0.9896i | 1.1886 + 1.6606i | 0.8973 + 0.9758i | 0.4528 + 1.5320i | 0.7212 + 1.0496i |
| 9.5 | 1.5654 + 1.1053i | 0.9822 + 0.9424i | 0.3199 + 1.5216i | 0.7507 + 0.9792i | 1.1323 + 1.6886i | 0.8963 + 0.9732i | 0.4510 + 1.5195i | 0.7234 + 1.0425i |
| 10 | 1.4799 − 0.9890i | 1.2150 − 0.8088i | 0.8831 − 0.5335i | 0.8998 − 0.5486i | 1.2150 − 0.8088i | 1.1516 − 0.7656i | 0.8998 − 0.5486i | 0.9155 − 0.5630i |
| 10.5 | 1.4880 − 0.9918i | 1.2116 − 0.8109i | 0.8680 − 0.5320i | 0.8870 − 0.5496i | 1.2116 − 0.8109i | 1.1516 − 0.7744i | 0.8870 − 0.5496i | 0.9058 − 0.5674i |
| 11 | 0.2244 + 0.9784i | 0.2256 + 1.0058i | 0.2257 + 1.0057i | 0.2268 + 1.0350i | 0.5343 + 0.8558i | 0.5530 + 0.8761i | 0.5530 + 0.8761i | 0.5730 + 0.8975i |
| 11.5 | 0.2281 + 0.9987i | 0.2159 + 0.9723i | 0.2194 + 1.0327i | 0.2068 + 1.0040i | 0.5478 + 0.8715i | 0.5381 + 0.8437i | 0.5789 + 0.8889i | 0.5679 + 0.8596i |
| 12 | 0.2098 + 0.9768i | 0.2241 + 1.0454i | 0.1858 + 0.9878i | 0.1901 + 1.0659i | 0.5547 + 0.8312i | 0.5479 + 0.8651i | 0.6073 + 0.8182i | 0.5955 + 0.8420i |
| 12.5 | 0.2230 + 0.9889i | 0.2479 + 1.0582i | 0.1802 + 1.0070i | 0.1891 + 1.0869i | 0.5702 + 0.8176i | 0.5659 + 0.8534i | 0.6329 + 0.7937i | 0.6244 + 0.8161i |
| 13 | 0.2408 + 0.9979i | 0.2750 + 1.0662i | 0.1741 + 1.0211i | 0.1849 + 1.1031i | 0.5789 + 0.8090i | 0.5764 + 0.8491i | 0.6515 + 0.7734i | 0.6454 + 0.7958i |
| 13.5 | 0.2553 + 0.9993i | 0.2988 + 1.0689i | 0.1656 + 1.0288i | 0.1779 + 1.1140i | 0.5802 + 0.8040i | 0.5788 + 0.8534i | 0.6616 + 0.7612i | 0.6574 + 0.7871i |
| 14 | 0.2659 + 0.9951i | 0.3199 + 1.0652i | 0.1586 + 1.0330i | 0.1732 + 1.1198i | 0.5806 + 0.7935i | 0.5791 + 0.8600i | 0.6672 + 0.7597i | 0.6655 + 0.7988i |
| 14.5 | 0.2918 + 0.9977i | 0.3457 + 1.0677i | 0.1513 + 1.0448i | 0.1608 + 1.1366i | 0.5795 + 0.7993i | 0.5814 + 0.8684i | 0.6777 + 0.7528i | 0.6798 + 0.7908i |
| 15 | 0.7901 + 1.2547i | 0.5814 + 1.0118i | 0.8074 + 1.0302i | 0.6237 + 1.0012i | 0.6052 + 0.6617i | 0.5759 + 0.7150i | 0.7056 + 0.6773i | 0.6439 + 0.7138i |
| 15.5 | 0.2231 + 1.7092i | 0.6616 + 0.9740i | 0.5030 + 1.4567i | 0.6230 + 1.1163i | 0.6633 + 0.6064i | 0.6841 + 0.7162i | 0.7194 + 0.5707i | 0.7211 + 0.6351i |
| 16 | 0.7189 + 1.2484i | 0.5519 + 1.0360i | 0.8125 + 1.3080i | 0.6001 + 0.9735i | 0.6062 + 0.6558i | 0.5673 + 0.7044i | 0.7357 + 0.7025i | 0.6195 + 0.7364i |
| 16.5 | 0.5954 + 1.6721i | 0.6356 + 0.9282i | 0.6612 + 1.3085i | 0.6870 + 0.9890i | 0.6139 + 0.5878i | 0.6161 + 0.6843i | 0.7069 + 0.5730i | 0.6968 + 0.6615i |
| 17 | 0.7916 + 1.5326i | 0.5781 + 0.9103i | 0.6737 + 1.2261i | 0.6488 + 0.9682i | 0.6008 + 0.5904i | 0.5968 + 0.6937i | 0.7280 + 0.5839i | 0.7207 + 0.6853i |
| 17.5 | 0.7546 + 1.5371i | 0.5791 + 0.9008i | 0.6529 + 1.2248i | 0.6563 + 0.9619i | 0.5998 + 0.5837i | 0.5965 + 0.6939i | 0.7601 + 0.5787i | 0.7439 + 0.6985i |
| 18 | 0.7460 + 1.5301i | 0.5607 + 0.8951i | 0.6305 + 1.2208i | 0.6414 + 0.9625i | 0.5848 + 0.5763i | 0.5797 + 0.7001i | 0.7518 + 0.5786i | 0.7339 + 0.7041i |
| 18.5 | 0.7388 + 1.5187i | 0.5534 + 0.8948i | 0.6245 + 1.2171i | 0.6469 + 0.9671i | 0.5816 + 0.5744i | 0.5746 + 0.7125i | 0.7634 + 0.5763i | 0.7384 + 0.7224i |
| 19 | 1.0419 + 1.2518i | 0.8657 + 1.0272i | 1.2891 + 1.0296i | 1.0567 + 1.0470i | 0.6260 + 0.6701i | 0.7308 + 0.8371i | 0.7597 + 0.5841i | 0.8864 + 0.7205i |
| 19.5 | 0.6600 + 1.2390i | 0.6575 + 0.9736i | 0.8905 + 1.1414i | 0.8571 + 0.9152i | 0.6106 + 0.5775i | 0.6382 + 0.7572i | 0.7620 + 0.5398i | 0.8086 + 0.7221i |
| 20 | 0.5458 + 1.2087i | 0.5280 + 0.9935i | 0.6621 + 1.4483i | 0.7224 + 0.9905i | 0.5909 + 0.6140i | 0.5567 + 0.7928i | 0.7623 + 0.6325i | 0.7410 + 0.7994i |
| 20.5 | 0.5495 + 1.2117i | 0.5295 + 0.9994i | 0.6564 + 1.4451i | 0.7273 + 1.0021i | 0.5962 + 0.6217i | 0.5627 + 0.8030i | 0.7674 + 0.6377i | 0.7457 + 0.8086i |
| 21 | 0.5460 + 1.2128i | 0.5252 + 1.0028i | 0.6465 + 1.4397i | 0.7242 + 1.0131i | 0.6013 + 0.6294i | 0.5660 + 0.8106i | 0.7730 + 0.6458i | 0.7464 + 0.8190i |
| 21.5 | 0.5373 + 1.2127i | 0.5165 + 1.0048i | 0.6343 + 1.4321i | 0.7152 + 1.0245i | 0.6073 + 0.6384i | 0.5684 + 0.8175i | 0.7801 + 0.6568i | 0.7459 + 0.8311i |
| 22 | 0.5187 + 1.2100i | 0.4960 + 1.0047i | 0.6102 + 1.4243i | 0.6926 + 1.0375i | 0.6194 + 0.6507i | 0.5744 + 0.8249i | 0.7952 + 0.6762i | 0.7540 + 0.8498i |
| 22.5 | 0.5099 + 1.2100i | 0.4914 + 1.0072i | 0.5898 + 1.4201i | 0.6910 + 1.0470i | 0.6271 + 0.6619i | 0.5827 + 0.8346i | 0.8016 + 0.6867i | 0.7612 + 0.8629i |
| 23 | 0.5427 + 1.2003i | 0.5813 + 1.0089i | 0.5291 + 1.4273i | 0.7630 + 1.0578i | 0.6294 + 0.6610i | 0.6110 + 0.8310i | 0.7906 + 0.6835i | 0.7844 + 0.8645i |
| 23.5 | 0.4976 + 1.2018i | 0.4821 + 1.0103i | 0.5648 + 1.4016i | 0.6826 + 1.0558i | 0.6404 + 0.6801i | 0.5954 + 0.8500i | 0.8128 + 0.7021i | 0.7699 + 0.8797i |
| 24 | 0.5286 + 1.2015i | 0.6120 + 1.0209i | 0.7270 + 1.2479i | 0.7961 + 1.0299i | 0.6617 + 0.6693i | 0.6621 + 0.8401i | 0.8310 + 0.6617i | 0.8389 + 0.8357i |
| 24.5 | 0.5158 + 1.1967i | 0.6077 + 1.0231i | 0.7117 + 1.2419i | 0.7917 + 1.0319i | 0.6714 + 0.6767i | 0.6662 + 0.8463i | 0.8411 + 0.6694i | 0.8402 + 0.8434i |
| 25 | 0.5056 + 1.1921i | 0.6041 + 1.0245i | 0.7005 + 1.2353i | 0.7883 + 1.0319i | 0.6790 + 0.6831i | 0.6702 + 0.8514i | 0.8475 + 0.6749i | 0.8427 + 0.8479i |
| 25.5 | 0.4973 + 1.1878i | 0.6009 + 1.0255i | 0.6921 + 1.2284i | 0.7855 + 1.0302i | 0.6850 + 0.6886i | 0.6728 + 0.8554i | 0.8517 + 0.6775i | 0.8443 + 0.8495i |
| 26 | 0.4905 + 1.1842i | 0.5982 + 1.0262i | 0.6854 + 1.2221i | 0.7829 + 1.0274i | 0.6911 + 0.6930i | 0.6740 + 0.8584i | 0.8561 + 0.6778i | 0.8451 + 0.8492i |

| SNR/w | w16 | w17 | w18 | w19 | w20 | w21 | w22 | w23 |
|---|---|---|---|---|---|---|---|---|
| 5 | 0.4521 + 0.2696i | 0.4521 + 0.2696i | 1.2066 + 0.5169i | 1.2065 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4543 + 0.2553i | 0.4543 + 0.2553i | 0.4543 + 0.2553i | 0.4543 + 0.2553i | 0.4632 + 0.2699i | 0.4632 + 0.2699i | 0.4632 + 0.2699i | 0.4632 + 0.2699i |
| 7 | 0.4447 + 0.2583i | 0.4838 + 0.2760i | 0.4059 + 0.2408i | 0.4446 + 0.2583i | 0.4489 + 0.2323i | 0.4922 + 0.2439i | 0.4072 + 0.2200i | 0.4489 + 0.2323i |
| 7.5 | 0.2526 + 0.42858i | 0.2320 + 0.3831i | 0.6595 + 1.1198i | 0.9931 + 1.5130i | 0.2741 + 0.4749i | 0.2526 + 0.4285i | 0.5864 + 1.0293i | 0.6595 + 1.1198i |
| 8 | 1.7914 + 0.3488i | 1.2587 + 0.2880i | 1.2587 + 0.2880i | 1.1468 + 0.2788i | 1.5168 + 1.0152i | 1.1023 + 0.6879i | 1.1023 + 0.6879i | 1.0130 + 0.6127i |
| 8.5 | 1.1513 + 0.2749i | 0.9582 + 0.3853i | 0.9263 + 0.2229i | 0.8516 + 0.3197i | 1.1613 + 0.2336i | 0.9349 + 0.3518i | 0.9192 + 0.2077i | 0.8418 + 0.2979i |
| 9 | 1.1819 + 0.2793i | 0.9635 + 0.4036i | 0.9172 + 0.2197i | 0.8422 + 0.3264i | 1.2076 + 0.2313i | 0.9381 + 0.3697i | 0.9115 + 0.2050i | 0.8325 + 0.3045i |
| 9.5 | 0.3155 − 0.1636i | 0.3150 − 0.1635i | 0.6148 − 0.2161i | 0.6216 − 0.2169i | 0.3150 − 0.1635i | 0.3145 − 0.1634i | 0.6216 − 0.2169i | 0.6290 − 0.2176i |
| 10 | 0.3085 − 0.1570i | 0.3061 − 0.1564i | 0.6354 − 0.2066i | 0.6404 − 0.2071i | 0.3061 − 0.1564i | 0.3037 − 0.1557i | 0.6404 − 0.2071i | 0.6460 − 0.2075i |

-continued

| SNR/w | w24 | w25 | w26 | w27 | w28 | w29 | w30 | w31 |
|---|---|---|---|---|---|---|---|---|
| 11 | | 1.4267 + 0.2786i | 1.4265 + 0.2791i | 1.3649 + 0.2609i | 1.4961 + 0.9954i | 1.2073 + 0.8102i | 1.2072 + 0.8097i | 1.1510 + 0.7784i |
| 11.5 | | 1.7739 + 0.3287i | 1.3649 + 0.2600i | 1.4293 + 0.2298i | 1.2376 + 0.7681i | 1.5057 + 1.0025i | 1.1507 + 0.7776i | 1.1738 + 0.8449i |
| 12 | | 1.7227 + 0.1790i | 1.3246 + 0.2562i | 1.3636 + 0.3654i | 1.3708 + 1.2834i | 1.6701 + 0.8403i | 1.1614 + 0.7909i | 1.1241 + 0.7367i |
| 12.5 | | 1.7386 + 0.2869i | 1.3213 + 0.2614i | 1.3555 + 0.3818i | 1.3728 + 1.2802i | 1.6730 + 0.8349i | 1.1629 + 0.7604i | 1.2237 + 0.7169i |
| 13 | | 1.7480 + 0.2870i | 1.3169 + 0.2677i | 1.3479 + 0.3950i | 1.3698 + 1.2765i | 1.6671 + 0.8318i | 1.1603 + 0.7369i | 1.2208 + 0.7017i |
| 13.5 | | 1.7492 + 0.2856i | 1.3108 + 0.2733i | 1.3393 + 0.4031i | 1.3733 + 1.2596i | 1.6601 + 0.8198i | 1.1559 + 0.7249i | 1.2163 + 0.6897i |
| 14 | | 1.7176 + 0.2506i | 1.2890 + 0.2587i | 1.3115 + 0.3882i | 1.4490 + 1.1367i | 1.6791 + 0.7233i | 1.1637 + 0.7318i | 1.2117 + 0.6596i |
| 14.5 | | 1.7146 + 0.2469i | 1.2824 + 0.2560i | 1.3020 + 0.3885i | 1.4514 + 1.1095i | 1.6674 + 0.7048i | 1.1614 + 0.7220i | 1.2096 + 0.6442i |
| 15 | | 0.9761 + 0.1132i | 0.9155 + 0.1657i | 0.9251 + 0.1710i | 1.3276 + 0.1371i | 1.2605 + 0.2607i | 0.9657 + 0.4185i | 1.0313 + 0.4086i |
| 15.5 | | 1.4175 + 0.1304i | 1.0142 + 0.1107i | 1.0875 + 0.1106i | 1.5669 + 0.6281i | 1.3668 + 0.3723i | 1.0160 + 0.3423i | 1.0838 + 0.3367i |
| 16 | | 0.9824 + 0.1194i | 0.9073 + 0.0782i | 0.9217 + 0.1835i | 1.3198 + 0.1175i | 1.2383 + 0.2709i | 0.9483 + 0.4442i | 1.0242 + 0.4164i |
| 16.5 | | 1.3265 + 0.1294i | 0.9609 + 0.1136i | 1.0472 + 0.1153i | 1.6046 + 0.4875i | 1.2991 + 0.3994i | 0.9506 + 0.3440i | 1.0402 + 0.3427i |
| 17 | | 1.3221 + 0.1224i | 1.0381 + 0.1026i | 0.9427 + 0.1024i | 1.2802 + 0.3500i | 1.5980 + 0.5501i | 0.9903 + 0.3365i | 0.9340 + 0.2929i |
| 17.5 | | 1.3275 + 0.1269i | 1.0687 + 0.1778i | 0.9443 + 0.0988i | 1.2837 + 0.3590i | 1.5920 + 0.5468i | 1.0024 + 0.3379i | 0.9388 + 0.2809i |
| 18 | | 1.3214 + 0.1348i | 1.0864 + 0.1085i | 0.9690 + 0.1136i | 1.2847 + 0.3887i | 1.5877 + 0.4787i | 1.0252 + 0.3747i | 0.9593 + 0.3085i |
| 18.5 | | 1.3267 + 0.1381i | 1.1074 + 0.1075i | 0.9719 + 0.1124i | 1.2798 + 0.3928i | 1.5690 + 0.4783i | 1.0323 + 0.3791i | 0.9610 + 0.2983i |
| 19 | | 0.8818 + 0.0863i | 0.6659 + 0.0671i | 0.6786 + 0.1287i | 0.9883 + 0.2131i | 1.1539 + 0.0898i | 0.7883 + 0.3358i | 0.7109 + 0.2753i |
| 19.5 | | 1.5486 + 0.1257i | 0.9028 + 0.1029i | 1.0498 + 0.1027i | 1.4788 + 0.3590i | 1.2369 + 0.3451i | 0.9051 + 0.3205i | 1.0533 + 0.3050i |
| 20 | | 1.5281 + 0.1441i | 0.9743 + 0.0673i | 1.0261 + 0.1720i | 1.4715 + 0.4355i | 1.2435 + 0.3351i | 0.9816 + 0.4825i | 1.0252 + 0.3371i |
| 20.5 | | 1.5048 + 0.1396i | 0.9704 + 0.0648i | 1.0197 + 0.1762i | 1.4594 + 0.4244i | 1.2338 + 0.3332i | 0.9790 + 0.4840i | 1.0192 + 0.3364i |
| 21 | | 1.4884 + 0.1372i | 0.9743 + 0.0635i | 1.0194 + 0.1825i | 1.4526 + 0.4196i | 1.2302 + 0.3337i | 0.9804 + 0.4906i | 1.0189 + 0.3404i |
| 21.5 | | 1.4742 + 0.1349i | 0.9796 + 0.0634i | 1.0198 + 0.1891i | 1.4461 + 0.4142i | 1.2279 + 0.3323i | 0.9827 + 0.4998i | 1.0202 + 0.3467i |
| 22 | | 1.4534 + 0.1259i | 0.9789 + 0.0639i | 1.0144 + 0.1947i | 1.4356 + 0.3854i | 1.2194 + 0.3249i | 0.9844 + 0.5115i | 1.0179 + 0.3535i |
| 22.5 | | 1.4370 + 0.1217i | 0.9794 + 0.0652i | 1.0117 + 0.2003i | 1.4268 + 0.3730i | 1.2148 + 0.3198i | 0.9818 + 0.5182i | 1.0172 + 0.3596i |
| 23 | | 1.1919 + 0.0896i | 1.0017 + 0.0743i | 0.9909 + 0.2196i | 1.2082 + 0.5145i | 1.2105 + 0.3112i | 1.0055 + 0.5362i | 1.0096 + 0.3698i |
| 23.5 | | 1.4070 + 0.1153i | 0.9784 + 0.0686i | 1.0093 + 0.2102i | 1.4123 + 0.3539i | 1.2076 + 0.3137i | 0.9768 + 0.5294i | 1.0171 + 0.3701i |
| 24 | | 1.1265 + 0.0892i | 0.9524 + 0.0959i | 0.9403 + 0.2321i | 1.4948 + 0.2501i | 1.2660 + 0.2959i | 0.9649 + 0.4426i | 1.0812 + 0.1311i |
| 24.5 | | 1.1278 + 0.0893i | 0.9556 + 0.0782i | 0.9422 + 0.2341i | 1.4851 + 0.2508i | 1.2669 + 0.2917i | 0.9719 + 0.4412i | 1.0855 + 0.3077i |
| 25 | | 1.1316 + 0.0895i | 0.9608 + 0.0790i | 0.9429 + 0.2357i | 1.4766 + 0.2540i | 1.2666 + 0.2886i | 0.9763 + 0.4381i | 1.0887 + 0.3028i |
| 25.5 | | 1.1477 + 0.0888i | 0.9772 + 0.0808i | 0.9387 + 0.2361i | 1.4686 + 0.2702i | 1.2647 + 0.2863i | 0.9779 + 0.4321i | 1.0881 + 0.2935i |
| 26 | | 1.1595 + 0.0882i | 0.9894 + 0.0820i | 0.9367 + 0.2358i | 1.4613 + 0.2782i | 1.2637 + 0.2839i | 0.9800 + 0.4265i | 1.0889 + 0.2858i |

| SNR/w | w24 | w25 | w26 | w27 | w28 | w29 | w30 | w31 |
|---|---|---|---|---|---|---|---|---|
| 5 | 0.4521 + 0.2696i | 0.4521 + 0.2696i | 1.2066 + 0.5170i | 1.2066 + 0.5169i | 0.4521 + 0.2696i | 0.4521 + 0.2696i | 1.2065 + 0.5169i | 1.2065 + 0.5169i |
| 5.5 | 0.4530 + 0.2663i | 0.4530 + 0.2663i | 1.2092 + 0.5115i | 1.2092 + 0.5115i | 0.4530 + 0.2663i | 0.4530 + 0.2663i | 1.2092 + 0.5115i | 1.2092 + 0.5115i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.4543 + 0.2553i | 0.4543 + 0.2553i | 0.4543 + 0.2553i | 0.4543 + 0.2553i | 0.4632 + 0.2699i | 0.4632 + 0.2699i | 0.4632 + 0.2699i | 0.4632 + 0.2699i |
| 7 | 0.4838 + 0.2760i | 0.5211 + 0.2931i | 0.4447 + 0.2583i | 0.4838 + 0.2760i | 0.4922 + 0.2439i | 0.4489 + 0.2323i | 0.4489 + 0.2323i | 0.4922 + 0.2439i |
| 7.5 | 0.4285 + 0.2526i | 0.3831 + 0.2320i | 0.1198 + 0.6595i | 1.5130 + 0.9931i | 0.4749 + 0.2741i | 0.5344 + 0.2543i | 0.5344 + 0.2543i | 1.1198 + 0.6595i |
| 8 | 1.2626 + 0.3059i | 1.1484 + 0.2921i | 1.1484 + 0.2921i | 1.0949 + 0.2917i | 1.1091 + 0.6749i | 0.4285 + 0.2526i | 0.4285 + 0.2526i | 0.9791 + 0.5650i |
| 8.5 | 1.2587 + 0.2880i | 1.1468 + 0.2788i | 1.1468 + 0.2788i | 1.0951 + 0.2750i | 1.1023 + 0.6879i | 1.0201 + 0.6000i | 1.0201 + 0.6000i | 0.9727 + 0.5775i |
| 9 | 0.9975 + 0.2556i | 0.9006 + 0.3666i | 0.8710 + 0.2142i | 0.8224 + 0.3027i | 0.9862 + 0.2318i | 1.0130 + 0.6127i | 1.0130 + 0.6127i | 0.8149 + 0.2834i |
| 9.5 | 0.0053 + 0.2519i | 0.8985 + 0.3753i | 0.8625 + 0.2071i | 0.8135 + 0.3017i | 0.9978 + 0.2280i | 0.8825 + 0.3368i | 0.8657 + 0.2019i | 0.8067 + 0.2829i |
| 10 | 0.3146 − 0.1777i | 0.3142 − 0.1775i | 0.5742 − 0.3118i | 0.5798 − 0.3157i | 0.3142 − 0.1775i | 0.8803 + 0.3458i | 0.8585 + 0.1955i | 0.5859 − 0.3199i |
| 10.5 | 0.3073 − 0.1726i | 0.3050 − 0.1716i | 0.5854 − 0.3219i | 0.5893 − 0.3250i | 0.3050 − 0.1716i | 0.3138 − 0.1773i | 0.5798 − 0.3157i | 0.5937 − 0.3285i |
| 11 | 0.9785 + 0.2245i | 1.0059 + 0.2256i | 1.0059 + 0.2258i | 1.0352 + 0.2267i | 0.8559 + 0.5343i | 0.3028 − 0.1707i | 0.5893 − 0.3250i | 0.8976 + 0.5730i |
| 11.5 | 0.9987 + 0.2268i | 0.9721 + 0.2149i | 1.0331 + 0.2184i | 1.0039 + 0.2063i | 0.8726 + 0.5450i | 0.8762 + 0.5535i | 0.8762 + 0.5535i | 0.8612 + 0.5648i |
| 12 | 0.9769 + 0.1863i | 0.9452 + 0.2057i | 1.0100 + 0.2182i | 0.9795 + 0.2417i | 0.8241 + 0.4856i | 0.8450 + 0.5352i | 0.8906 + 0.5760i | 0.8796 + 0.5356i |
| 12.5 | 0.9683 + 0.1724i | 0.9333 + 0.1897i | 1.0041 + 0.2062i | 0.9683 + 0.2269i | 0.8178 + 0.4576i | 0.8232 + 0.4837i | 0.8799 + 0.5391i | 0.8722 + 0.5104i |
| 13 | 0.9630 + 0.1618i | 0.9257 + 0.1770i | 1.0010 + 0.1965i | 0.9611 + 0.2140i | 0.8118 + 0.4407i | 0.8166 + 0.4551i | 0.8733 + 0.5139i | 0.8649 + 0.4934i |
| 13.5 | 0.9601 + 0.1547i | 0.9220 + 0.1683i | 1.0004 + 0.1894i | 0.9581 + 0.2045i | 0.8067 + 0.4374i | 0.8110 + 0.4440i | 0.8663 + 0.4978i | 0.8598 + 0.4876i |
| 14 | 0.9469 + 0.1512i | 0.9124 + 0.1673i | 0.9890 + 0.1827i | 0.9504 + 0.2018i | 0.7985 + 0.4530i | 0.8036 + 0.4426i | 0.8538 + 0.5071i | 0.8600 + 0.4961i |

| SNR/w | w32 | w33 | w34 | w35 | w36 | w37 | w38 | w39 |
|---|---|---|---|---|---|---|---|---|
| 14.5 | | | | | | | 0.8518 + 0.5057i | 0.8594 + 0.4926i |
| 15 | | | | | | | 0.6631 + 0.4203i | 0.6466 + 0.4063i |
| 15.5 | | | | | | | 0.7230 + 0.3385i | 0.7071 + 0.3272i |
| 16 | | | | | | | 0.6844 + 0.4315i | 0.6536 + 0.4074i |
| 16.5 | | | | | | | 0.7010 + 0.3475i | 0.6697 + 0.3280i |
| 17 | | | | | | | 0.7073 + 0.3701i | 0.7192 + 0.3275i |
| 17.5 | | | | | | | 0.7339 + 0.3759i | 0.7430 + 0.3188i |
| 18 | | | | | | | 0.7535 + 0.3905i | 0.7704 + 0.3249i |
| 18.5 | | | | | | | 0.7649 + 0.4029i | 0.7817 + 0.3156i |
| 19 | | | | | | | 0.6422 + 0.4556i | 0.5543 + 0.3409i |
| 19.5 | | | | | | | 0.7319 + 0.3429i | 0.6646 + 0.2744i |
| 20 | | | | | | | 0.7906 + 0.4757i | 0.8007 + 0.3342i |
| 20.5 | | | | | | | 0.7913 + 0.4796i | 0.8013 + 0.3338i |
| 21 | | | | | | | 0.7953 + 0.4864i | 0.8070 + 0.3371i |
| 21.5 | | | | | | | 0.8008 + 0.4955i | 0.8141 + 0.3431i |
| 22 | | | | | | | 0.8073 + 0.5082i | 0.8199 + 0.3516i |
| 22.5 | | | | | | | 0.8087 + 0.5167i | 0.8230 + 0.3582i |
| 23 | | | | | | | 0.8160 + 0.5191i | 0.8231 + 0.3662i |
| 23.5 | | | | | | | 0.8099 + 0.5313i | 0.8291 + 0.3705i |
| 24 | | | | | | | 0.8056 + 0.5017i | 0.7792 + 0.3548i |
| 24.5 | | | | | | | 0.8156 + 0.5101i | 0.7875 + 0.3608i |
| 25 | | | | | | | 0.8234 + 0.5160i | 0.7936 + 0.3653i |
| 25.5 | | | | | | | 0.8292 + 0.5189i | 0.7961 + 0.3682i |
| 26 | | | | | | | 0.8353 + 0.5198i | 0.7994 + 0.3695i |

| SNR/w | w32 | w33 | w34 | w35 | w36 | w37 | w38 | w39 |
|---|---|---|---|---|---|---|---|---|
| 5 | 0.2696 + 0.4521i | 0.2696 + 0.4521i | 0.5169 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5066i | 0.4570 + 0.2642i | 0.4570 + 0.2642i | 0.4570 + 0.2642i | 0.4570 + 0.2642i |
| 6.5 | 0.4304 + 1.2538i | 0.4304 + 1.2538i | 0.4305 + 1.2537i | 0.4305 + 1.2537i | 0.5752 + 1.1632i | 0.5752 + 1.1632i | 0.5752 + 1.1632i | 0.5752 + 1.1632i |
| 7 | 0.5818 + 1.1302i | 0.5321 + 1.1302i | 0.7162 + 1.1332i | 0.5818 + 1.1302i | 0.3631 + 1.2644i | 0.3443 + 1.1417i | 0.4291 + 1.7565i | 0.3631 + 1.2644i |
| 7.5 | 0.2435 + 0.4714i | 0.2297 + 0.4213i | 0.3175 + 1.1489i | 0.3279 + 1.2665i | 0.2555 + 0.5207i | 0.2435 + 0.4714i | 0.3124 + 1.0924i | 0.3175 + 1.1489i |
| 8 | 0.2078 + 0.3708i | 0.2228 + 0.4230i | 0.2228 + 0.4230i | 0.2369 + 0.4792i | 0.2257 + 0.3788i | 0.2485 + 0.4714i | 0.2485 + 0.4288i | 0.2729 + 0.4799i |
| 8.5 | 0.1998 + 0.3693i | 0.2156 + 0.4280i | 0.2156 + 0.4280i | 0.2299 + 0.4909i | 0.2178 + 0.3747i | 0.2432 + 0.4300i | 0.2432 + 0.4300i | 0.2708 + 0.4861i |
| 9 | 0.1831 + 0.6858i | 0.2571 + 0.6818i | 0.2571 + 0.6818i | 0.2811 + 0.7667i | 0.1851 + 0.6883i | 0.2602 + 0.6851i | 0.2602 + 0.6851i | 0.2857 + 0.7722i |
| 9.5 | 0.1794 + 0.6888i | 0.2585 + 0.6798i | 0.1879 + 0.8249i | 0.2921 + 0.7656i | 0.1820 + 0.6921i | 0.2630 + 0.6841i | 0.1926 + 0.8288i | 0.2983 + 0.7729i |
| 10 | 0.3437 − 1.7476i | 0.2830 − 1.4280i | 0.2435 − 1.4280i | 0.2443 − 1.0202i | 0.2830 − 1.4280i | 0.2686 − 1.3530i | 0.2443 − 1.0202i | 0.2449 − 1.0415i |
| 10.5 | 0.3495 − 1.7549i | 0.2804 − 1.4293i | 0.2340 − 1.4293i | 0.2349 − 1.0112i | 0.2804 − 1.4293i | 0.2635 − 1.3614i | 0.2349 − 1.0112i | 0.2356 − 1.0372i |
| 11 | 0.1519 + 0.3049i | 0.1510 + 0.3016i | 0.1510 + 0.3016i | 0.1502 + 0.2983i | 0.1699 + 0.3036i | 0.1685 + 0.3005i | 0.1685 + 0.3005i | 0.1671 + 0.2974i |
| 11.5 | 0.1463 + 0.3055i | 0.1471 + 0.3053i | 0.1453 + 0.2979i | 0.1463 + 0.3015i | 0.1666 + 0.2998i | 0.1683 + 0.3032i | 0.1650 + 0.2964i | 0.1666 + 0.2998i |
| 12 | 0.1376 + 0.3342i | 0.1383 + 0.3292i | 0.1363 + 0.3322i | 0.1370 + 0.3273i | 0.1655 + 0.3265i | 0.1656 + 0.3227i | 0.1634 + 0.3246i | 0.1636 + 0.3208i |
| 12.5 | 0.1305 + 0.3817i | 0.1310 + 0.3772i | 0.1295 + 0.3801i | 0.1300 + 0.3756i | 0.1670 + 0.3628i | 0.1669 + 0.3598i | 0.1652 + 0.3613i | 0.1652 + 0.3583i |
| 13 | 0.1255 + 0.4148i | 0.1258 + 0.4110i | 0.1246 + 0.4139i | 0.1249 + 0.4100i | 0.1693 + 0.3879i | 0.1679 + 0.3856i | 0.1679 + 0.3867i | 0.1675 + 0.3844i |
| 13.5 | 0.1222 + 0.4300i | 0.1222 + 0.4272i | 0.1213 + 0.4297i | 0.1213 + 0.4269i | 0.1716 + 0.3987i | 0.1708 + 0.3972i | 0.1707 + 0.3976i | 0.1700 + 0.3962i |
| 14 | 0.1189 + 0.4354i | 0.1187 + 0.4342i | 0.1181 + 0.4360i | 0.1178 + 0.4348i | 0.1722 + 0.4014i | 0.1713 + 0.4009i | 0.1720 + 0.4006i | 0.1711 + 0.4002i |
| 14.5 | 0.1162 + 0.4484i | 0.1159 + 0.4493i | 0.1156 + 0.4497i | 0.1152 + 0.4507i | 0.1751 + 0.4102i | 0.1743 + 0.4102i | 0.1765 + 0.4086i | 0.1757 + 0.4095i |
| 15 | 0.2366 + 1.7925i | 0.1132 + 1.0217i | 0.1343 + 1.4296i | 0.1131 + 1.0934i | 0.1130 + 0.6377i | 0.1142 + 0.7348i | 0.1100 + 0.6285i | 0.1120 + 0.7126i |
| 15.5 | 0.1057 + 0.9757i | 0.1704 + 0.9162i | 0.1155 + 0.9873i | 0.1783 + 0.9299i | 0.1349 + 0.6360i | 0.1478 + 0.6586i | 0.1365 + 0.6293i | 0.1479 + 0.6511i |
| 16 | 0.1430 + 1.4001i | 0.1156 + 1.1081i | 0.1884 + 1.0661i | 0.1078 + 1.0066i | 0.1071 + 0.6135i | 0.1080 + 0.7000i | 0.1069 + 0.6283i | 0.1060 + 0.7438i |
| 16.5 | 0.1053 + 1.2977i | 0.1293 + 0.9737i | 0.1785 + 1.2326i | 0.1473 + 0.9932i | 0.1149 + 0.6198i | 0.1198 + 0.7262i | 0.1195 + 0.6155i | 0.1240 + 0.7155i |
| 17 | 0.1490 + 1.6173i | 0.1183 + 0.9591i | 0.1303 + 1.3054i | 0.1236 + 1.0413i | 0.1061 + 0.6094i | 0.1122 + 0.7387i | 0.1133 + 0.5999i | 0.1188 + 0.7034i |
| 17.5 | 0.1411 + 1.5896i | 0.1170 + 0.9512i | 0.1278 + 1.2852i | 0.1257 + 1.0327i | 0.1004 + 0.5984i | 0.1100 + 0.7473i | 0.1141 + 0.5926i | 0.1221 + 0.7136i |

| | w40 | w41 | w42 | w43 | w44 | w45 | w46 | w47 |
|---|---|---|---|---|---|---|---|---|
| 18 | 0.1396 + 1.5775i | 0.1131 + 0.9418i | 0.1242 + 1.2789i | 0.1226 + 1.0347i | 0.0938 + 0.5780i | 0.1063 + 0.7507i | 0.1145 + 0.5762i | 0.1223 + 0.7129i |
| 18.5 | 0.1401 + 1.5712i | 0.1104 + 0.9411i | 0.1233 + 1.2808i | 0.1220 + 1.0474i | 0.0863 + 0.5683i | 0.1030 + 0.7613i | 0.1177 + 0.5704i | 0.1259 + 0.7175i |
| 19 | 0.1202 + 1.4352i | 0.0996 + 1.2052i | 0.2171 + 1.6874i | 0.2773 + 1.1812i | 0.0839 + 0.8147i | 0.0834 + 0.9964i | 0.1971 + 0.8041i | 0.2436 + 0.9839i |
| 19.5 | 0.1542 + 1.5593i | 0.0710 + 0.9899i | 0.1176 + 1.2799i | 0.1750 + 1.0404i | 0.0755 + 0.6559i | 0.0799 + 0.8133i | 0.1865 + 0.6474i | 0.2027 + 0.8117i |
| 20 | 0.1167 + 1.2700i | 0.0962 + 1.0708i | 0.1297 + 1.5321i | 0.0883 + 0.8994i | 0.0749 + 0.5327i | 0.0612 + 0.6589i | 0.1829 + 0.5465i | 0.1233 + 0.7216i |
| 20.5 | 0.1161 + 1.2756i | 0.0974 + 1.0790i | 0.1295 + 1.5298i | 0.0884 + 0.9064i | 0.0720 + 0.5415i | 0.0591 + 0.6728i | 0.1883 + 0.5570i | 0.1297 + 0.7318i |
| 21 | 0.1140 + 1.2762i | 0.0978 + 1.0812i | 0.1280 + 1.5231i | 0.0867 + 0.9060i | 0.0704 + 0.5429i | 0.0574 + 0.6772i | 0.1921 + 0.5608i | 0.1353 + 0.7334i |
| 21.5 | 0.1108 + 1.2731i | 0.0977 + 1.0794i | 0.1256 + 1.5126i | 0.0853 + 0.9029i | 0.0694 + 0.5429i | 0.0559 + 0.6795i | 0.1945 + 0.5628i | 0.1410 + 0.7326i |
| 22 | 0.1045 + 1.2645i | 0.0959 + 1.0725i | 0.1201 + 1.4962i | 0.0871 + 0.8987i | 0.0687 + 0.5451i | 0.0549 + 0.6836i | 0.1961 + 0.5662i | 0.1487 + 0.7336i |
| 22.5 | 0.1015 + 1.2588i | 0.0952 + 1.0704i | 0.1161 + 1.4831i | 0.0884 + 0.8992i | 0.0685 + 0.5510i | 0.0545 + 0.6912i | 0.1980 + 0.5732i | 0.1557 + 0.7375i |
| 23 | 0.1141 + 1.4950i | 0.0679 + 0.9023i | 0.1059 + 1.2572i | 0.1019 + 1.0664i | 0.0653 + 0.5841i | 0.0662 + 0.7419i | 0.2015 + 0.5913i | 0.1899 + 0.7378i |
| 23.5 | 0.0985 + 1.2520i | 0.0938 + 1.0710i | 0.1059 + 1.4628i | 0.0905 + 0.9054i | 0.0693 + 0.5689i | 0.0563 + 0.7102i | 0.2034 + 0.5915i | 0.1695 + 0.7506i |
| 24 | 0.0901 + 1.1911i | 0.0801 + 1.0038i | 0.1114 + 1.4060i | 0.2328 + 0.9654i | 0.0680 + 0.6561i | 0.0697 + 0.8236i | 0.2070 + 0.6480i | 0.2108 + 0.8051i |
| 24.5 | 0.0894 + 1.1877i | 0.0808 + 1.0036i | 0.1106 + 1.3967i | 0.2340 + 0.9604i | 0.0695 + 0.6593i | 0.0707 + 0.8259i | 0.2118 + 0.6478i | 0.2131 + 0.8017i |
| 25 | 0.0890 + 1.1877i | 0.0816 + 1.0065i | 0.1074 + 1.3967i | 0.2349 + 0.9570i | 0.0709 + 0.6644i | 0.0718 + 0.8309i | 0.2160 + 0.6470i | 0.2150 + 0.7989i |
| 25.5 | 0.0889 + 1.1889i | 0.0823 + 1.0105i | 0.1053 + 1.3909i | 0.2355 + 0.9547i | 0.0721 + 0.6705i | 0.0727 + 0.8369i | 0.2196 + 0.6455i | 0.2165 + 0.7966i |
| 26 | 0.0888 + 1.1903i | 0.0829 + 1.0145i | 0.1037 + 1.3867i | 0.2357 + 0.9536i | 0.0732 + 0.6770i | 0.0737 + 0.8430i | 0.2228 + 0.6437i | 0.2175 + 0.7949i |
| | | | 0.1023 + 1.3833i | | | | | |

| SNR/w | w40 | w41 | w42 | w43 | w44 | w45 | w46 | w47 |
|---|---|---|---|---|---|---|---|---|
| 5 | 0.2696 + 0.4521i | 0.2696 + 0.4521i | 0.5170 + 1.2065i | 0.5170 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 1.2102 + 0.5067i | 1.2102 + 0.5067i | 1.2102 + 0.5067i | 1.2102 + 0.5067i | 0.4570 + 0.2642i | 0.4570 + 0.2642i | 0.4570 + 0.2642i | 0.4570 + 0.2642i |
| 6.5 | 0.4304 + 1.2538i | 0.4304 + 1.2538i | 0.4304 + 1.2537i | 0.4304 + 1.2537i | 0.5752 + 1.1632i | 0.5752 + 1.1632i | 0.5752 + 1.1632i | 0.5752 + 1.1632i |
| 7 | 0.5321 + 1.0488i | 0.5054 + 1.0028i | 0.5818 + 1.1302i | 0.5321 + 1.0488i | 0.3443 + 1.0806i | 0.3344 + 1.0806i | 0.3631 + 1.2644i | 0.3443 + 1.1417i |
| 7.5 | 0.4714 + 0.2435i | 0.4213 + 0.2297i | 1.1489 + 0.3175i | 1.2665 + 0.3279i | 0.5207 + 0.2555i | 0.4714 + 0.2435i | 1.0924 + 0.3124i | 1.1489 + 0.3175i |
| 8 | 0.2228 + 0.4230i | 0.2369 + 0.4792i | 0.2369 + 0.4792i | 0.2486 + 0.5341i | 0.2485 + 0.4288i | 0.2729 + 0.4799i | 0.2729 + 0.4799i | 0.2969 + 0.5272i |
| 8.5 | 0.2156 + 0.4280i | 0.2299 + 0.4909i | 0.2299 + 0.4909i | 0.2411 + 0.5508i | 0.2432 + 0.4300i | 0.2708 + 0.4861i | 0.2708 + 0.4861i | 0.2980 + 0.5370i |
| 9 | 0.1856 + 0.6747i | 0.2596 + 0.6730i | 0.1922 + 0.7921i | 0.2849 + 0.7548i | 0.1875 + 0.6772i | 0.2626 + 0.6762i | 0.1956 + 0.7959i | 0.2892 + 0.7605i |
| 9.5 | 0.1819 + 0.6783i | 0.2610 + 0.6715i | 0.1923 + 0.8010i | 0.2956 + 0.7536i | 0.1845 + 0.6814i | 0.2653 + 0.6756i | 0.1970 + 0.8057i | 0.3015 + 0.7610i |
| 10 | 0.9890 − 1.4789i | 0.8088 − 1.2150i | 0.5335 − 0.8831i | 0.5486 − 0.8998i | 0.8088 − 1.2150i | 0.7657 − 1.1516i | 0.5486 − 0.8998i | 0.5630 − 0.9155i |
| 10.5 | 0.9918 − 1.4880i | 0.8109 − 1.2116i | 0.5320 − 0.8680i | 0.5496 − 0.8870i | 0.8109 − 1.2116i | 0.7744 − 1.1516i | 0.5496 − 0.8870i | 0.5674 − 0.9058i |
| 11 | 0.1967 + 0.6516i | 0.1969 + 0.6552i | 0.1969 + 0.6552i | 0.1972 + 0.6592i | 0.3323 + 0.5926i | 0.3347 + 0.5953i | 0.3347 + 0.5953i | 0.3374 + 0.5982i |
| 11.5 | 0.1885 + 0.6662i | 0.1878 + 0.6638i | 0.1877 + 0.6689i | 0.1869 + 0.6663i | 0.3440 + 0.5986i | 0.3433 + 0.5965i | 0.3466 + 0.5998i | 0.3458 + 0.5975i |
| 12 | 0.1779 + 0.6841i | 0.1828 + 0.6845i | 0.1745 + 0.6828i | 0.1793 + 0.6829i | 0.3547 + 0.6009i | 0.3593 + 0.6011i | 0.3576 + 0.5990i | 0.3624 + 0.5994i |
| 12.5 | 0.1792 + 0.7116i | 0.1856 + 0.7087i | 0.1709 + 0.7113i | 0.1774 + 0.7076i | 0.3740 + 0.6070i | 0.3778 + 0.6065i | 0.3777 + 0.6018i | 0.3817 + 0.6013i |
| 13 | 0.1817 + 0.7335i | 0.1889 + 0.7276i | 0.1660 + 0.7356i | 0.1734 + 0.7283i | 0.3879 + 0.6101i | 0.3903 + 0.6093i | 0.3925 + 0.6005i | 0.3948 + 0.5996i |
| 13.5 | 0.1825 + 0.7468i | 0.1898 + 0.7378i | 0.1588 + 0.7521i | 0.1666 + 0.7410i | 0.3967 + 0.6104i | 0.3971 + 0.6093i | 0.4022 + 0.5964i | 0.4020 + 0.5952i |
| 14 | 0.1826 + 0.7535i | 0.1893 + 0.7416i | 0.1516 + 0.7621i | 0.1596 + 0.7470i | 0.4024 + 0.6084i | 0.3991 + 0.6069i | 0.4059 + 0.5914i | 0.4018 + 0.5896i |
| 14.5 | 0.1878 + 0.7652i | 0.1918 + 0.7501i | 0.1441 + 0.7789i | 0.1507 + 0.7597i | 0.4094 + 0.6093i | 0.4040 + 0.6061i | 0.4153 + 0.5858i | 0.4089 + 0.5826i |
| 15 | 0.6334 + 1.5624i | 0.3445 + 1.0222i | 0.3767 + 1.3678i | 0.3375 + 1.0864i | 0.3311 + 0.6416i | 0.3353 + 0.7232i | 0.3182 + 0.6339i | 0.3260 + 0.7097i |
| 15.5 | 0.1266 + 1.3390i | 0.4298 + 0.9537i | 0.2698 + 1.2595i | 0.4136 + 1.0326i | 0.4146 + 0.6068i | 0.4236 + 0.6703i | 0.4011 + 0.5965i | 0.4047 + 0.6466i |
| 16 | 0.4307 + 1.3657i | 0.3427 + 1.0736i | 0.5886 + 1.6752i | 0.3211 + 0.9921i | 0.3296 + 0.6322i | 0.3421 + 0.6984i | 0.3115 + 0.6358i | 0.3204 + 0.7350i |
| 16.5 | 0.2029 + 1.6229i | 0.4061 + 0.9419i | 0.4138 + 1.2839i | 0.3981 + 0.9966i | 0.3744 + 0.6031i | 0.3838 + 0.6977i | 0.3484 + 0.6000i | 0.3571 + 0.6873i |
| 17 | 0.4551 + 1.5890i | 0.3688 + 0.9394i | 0.3994 + 1.2831i | 0.3584 + 1.0296i | 0.3706 + 0.5982i | 0.3667 + 0.7052i | 0.3292 + 0.5917i | 0.3315 + 0.6797i |
| 17.5 | 0.4310 + 1.5685i | 0.3688 + 0.9291i | 0.3899 + 1.2664i | 0.3578 + 1.0211i | 0.3781 + 0.5910i | 0.3716 + 0.7091i | 0.3216 + 0.5867i | 0.3245 + 0.6863i |
| 18 | 0.4257 + 1.5553i | 0.3653 + 0.9212i | 0.3793 + 1.2595i | 0.3474 + 1.0247i | 0.3805 + 0.5765i | 0.3633 + 0.7147i | 0.3133 + 0.5726i | 0.3120 + 0.6868i |
| 18.5 | 0.4244 + 1.5436i | 0.3639 + 0.9208i | 0.3774 + 1.2582i | 0.3430 + 1.0368i | 0.3915 + 0.5705i | 0.3623 + 0.7269i | 0.3080 + 0.5673i | 0.3034 + 0.6934i |
| 19 | 0.7690 + 1.4112i | 0.6649 + 1.1380i | 0.4761 + 1.4765i | 0.4596 + 1.1970i | 0.4764 + 0.7356i | 0.5686 + 0.9186i | 0.3592 + 0.7734i | 0.4125 + 0.9576i |
| 19.5 | 0.4619 + 1.4871i | 0.4964 + 0.9866i | 0.3490 + 1.2589i | 0.3490 + 1.0371i | 0.4558 + 0.6134i | 0.4773 + 0.7891i | 0.3323 + 0.6177i | 0.3411 + 0.8066i |
| 20 | 0.3324 + 1.2294i | 0.3300 + 1.0062i | 0.3879 + 1.4978i | 0.2451 + 0.8999i | 0.4353 + 0.5950i | 0.4122 + 0.7607i | 0.3109 + 0.5751i | 0.2807 + 0.7485i |
| 20.5 | 0.3324 + 1.2302i | 0.3334 + 1.0155i | 0.3846 + 1.4868i | 0.2478 + 0.9074i | 0.4435 + 0.6045i | 0.4193 + 0.7714i | 0.3125 + 0.5857i | 0.2831 + 0.7571i |
| 21 | 0.3284 + 1.2285i | 0.3320 + 1.0206i | 0.3786 + 1.4755i | 0.2471 + 0.9090i | 0.4494 + 0.6106i | 0.4225 + 0.7777i | 0.3144 + 0.5907i | 0.2838 + 0.7596i |

-continued

| SNR/w | w48 | w49 | w50 | w51 | w52 | w53 | w54 | w55 |
|---|---|---|---|---|---|---|---|---|
| 21.5 | | 0.3261 + 1.0269i | 0.3716 + 1.4663i | 0.2470 + 0.9085i | 0.4549 + 0.6160i | 0.4247 + 0.7818i | 0.3170 + 0.5938i | 0.2850 + 0.7600i |
| 22 | | 0.3058 + 1.0469i | 0.3607 + 1.4682i | 0.2567 + 0.9079i | 0.4631 + 0.6208i | 0.4319 + 0.7788i | 0.3205 + 0.5962i | 0.2904 + 0.7595i |
| 22.5 | | 0.3002 + 1.0568i | 0.3505 + 1.4648i | 0.2617 + 0.9117i | 0.4705 + 0.6290i | 0.4380 + 0.7857i | 0.3259 + 0.6027i | 0.2955 + 0.7625i |
| 23 | | 0.3044 + 1.1540i | 0.3125 + 1.3457i | 0.2563 + 0.9501i | 0.4782 + 0.6393i | 0.4531 + 0.8051i | 0.3394 + 0.6131i | 0.3093 + 0.7816i |
| 23.5 | | 0.2906 + 1.0772i | 0.3403 + 1.4686i | 0.2690 + 0.9234i | 0.4846 + 0.6443i | 0.4495 + 0.7999i | 0.3381 + 0.6175i | 0.3079 + 0.7726i |
| 24 | | 0.4408 + 0.9883i | 0.2990 + 1.3047i | 0.3098 + 1.1123i | 0.5034 + 0.6582i | 0.5007 + 0.8232i | 0.3521 + 0.6461i | 0.3534 + 0.7992i |
| 24.5 | | 0.4361 + 0.9895i | 0.2934 + 1.3012i | 0.3024 + 1.1113i | 0.5119 + 0.6637i | 0.5063 + 0.8279i | 0.3591 + 0.6480i | 0.3581 + 0.8012i |
| 25 | | 0.4318 + 0.9909i | 0.2896 + 1.2989i | 0.2959 + 1.1112i | 0.5190 + 0.6693i | 0.5110 + 0.8331i | 0.3652 + 0.6503i | 0.3620 + 0.8038i |
| 25.5 | | 0.4279 + 0.9924i | 0.2865 + 1.2969i | 0.2905 + 1.1114i | 0.5249 + 0.6752i | 0.5140 + 0.8384i | 0.3704 + 0.6529i | 0.3647 + 0.8068i |
| 26 | | 0.4242 + 0.9942i | 0.2836 + 1.2952i | 0.2860 + 1.1119i | 0.5308 + 0.6813i | 0.5155 + 0.8438i | 0.3755 + 0.6565i | 0.3664 + 0.8105i |

| SNR/w | w48 | w49 | w50 | w51 | w52 | w53 | w54 | w55 |
|---|---|---|---|---|---|---|---|---|
| 5 | 0.2696 + 0.4521i | 0.2696 + 0.4521i | 0.5170 + 1.2065i | 0.5169 + 1.2065i | 0.2696 + 0.4521i | 0.2696 + 0.4521i | 0.5169 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2553 + 0.4543i | 0.2553 + 0.4543i | 0.2553 + 0.4543i | 0.2553 + 0.4543i | 0.2699 + 0.4632i | 0.2699 + 0.4632i | 0.2699 + 0.4632i | 0.2699 + 0.4632i |
| 7 | 0.2570 + 0.4231i | 0.2737 + 0.4610i | 0.2407 + 0.3854i | 0.2570 + 0.4231i | 0.2424 + 0.4005i | 0.2551 + 0.4393i | 0.2293 + 0.3637i | 0.2424 + 0.4005i |
| 7.5 | 0.2297 + 0.4213i | 0.2153 + 0.3744i | 0.3279 + 1.2665i | 0.3690 + 1.7569i | 0.2435 + 0.4714i | 0.2297 + 0.4213i | 0.3175 + 1.1489i | 0.3279 + 1.2665i |
| 8 | 0.3708 + 0.2078i | 0.4230 + 0.2228i | 0.4230 + 0.2228i | 0.4792 + 0.2369i | 0.3788 + 0.2257i | 0.4288 + 0.2485i | 0.4288 + 0.2485i | 0.4799 + 0.2729i |
| 8.5 | 0.3693 + 0.1998i | 0.4280 + 0.2156i | 0.4280 + 0.2156i | 0.4909 + 0.2299i | 0.3747 + 0.2178i | 0.4300 + 0.2432i | 0.4300 + 0.2432i | 0.4861 + 0.2708i |
| 9 | 0.2427 + 0.2263i | 0.2838 + 0.2486i | 0.2831 + 0.2190i | 0.3278 + 0.2440i | 0.2459 + 0.2248i | 0.2871 + 0.2468i | 0.2869 + 0.2171i | 0.3312 + 0.2418i |
| 9.5 | 0.2335 + 0.2229i | 0.2775 + 0.2471i | 0.2850 + 0.2115i | 0.3342 + 0.2392i | 0.2370 + 0.2213i | 0.2813 + 0.2455i | 0.2895 + 0.2096i | 0.3382 + 0.2371i |
| 10 | 0.1636 − 0.3155i | 0.1635 − 0.3150i | 0.2161 − 0.6148i | 0.2169 − 0.6216i | 0.1635 − 0.3150i | 0.1634 − 0.3145i | 0.2169 − 0.6216i | 0.2176 − 0.6290i |
| 10.5 | 0.1570 − 0.3085i | 0.1564 − 0.3061i | 0.2066 − 0.6354i | 0.2071 − 0.6404i | 0.1564 − 0.3061i | 0.1557 − 0.3037i | 0.2071 − 0.6404i | 0.2075 − 0.6460i |
| 11 | 0.3051 + 0.1518i | 0.3018 + 0.1510i | 0.3018 + 0.1510i | 0.2985 + 0.1501i | 0.3037 + 0.1699i | 0.3007 + 0.1685i | 0.3007 + 0.1685i | 0.2977 + 0.1671i |
| 11.5 | 0.2979 + 0.1464i | 0.3017 + 0.1473i | 0.2941 + 0.1456i | 0.2979 + 0.1465i | 0.2972 + 0.1662i | 0.3006 + 0.1678i | 0.2937 + 0.1646i | 0.2971 + 0.1662i |
| 12 | 0.2697 + 0.1443i | 0.2704 + 0.1433i | 0.2644 + 0.1442i | 0.2650 + 0.1432i | 0.2763 + 0.1638i | 0.2768 + 0.1626i | 0.2715 + 0.1630i | 0.2719 + 0.1618i |
| 12.5 | 0.2423 + 0.1395i | 0.2424 + 0.1389i | 0.2387 + 0.1394i | 0.2388 + 0.1389i | 0.2516 + 0.1583i | 0.2517 + 0.1576i | 0.2482 + 0.1578i | 0.2483 + 0.1571i |
| 13 | 0.2256 + 0.1346i | 0.2253 + 0.1344i | 0.2241 + 0.1346i | 0.2237 + 0.1345i | 0.2350 + 0.1552i | 0.2347 + 0.1549i | 0.2335 + 0.1550i | 0.2331 + 0.1547i |
| 13.5 | 0.2177 + 0.1304i | 0.2168 + 0.1304i | 0.2184 + 0.1305i | 0.2174 + 0.1306i | 0.2264 + 0.1539i | 0.2255 + 0.1538i | 0.2269 + 0.1539i | 0.2260 + 0.1541i |
| 14 | 0.2139 + 0.1264i | 0.2129 + 0.1265i | 0.2177 + 0.1267i | 0.2167 + 0.1268i | 0.2205 + 0.1529i | 0.2194 + 0.1529i | 0.2239 + 0.1539i | 0.2230 + 0.1539i |
| 14.5 | 0.2048 + 0.1245i | 0.2036 + 0.1246i | 0.2137 + 0.1246i | 0.2125 + 0.1253i | 0.2114 + 0.1549i | 0.2104 + 0.1549i | 0.2194 + 0.1573i | 0.2184 + 0.1573i |
| 15 | 0.1245 + 0.1187i | 0.1244 + 0.1173i | 0.1239 + 0.1191i | 0.1238 + 0.1176i | 0.1179 + 0.3687i | 0.1194 + 0.3492i | 0.1158 + 0.3713i | 0.1175 + 0.3517i |
| 15.5 | 0.1162 + 0.1238i | 0.1165 + 0.1240i | 0.1164 + 0.1235i | 0.1167 + 0.1236i | 0.1232 + 0.3743i | 0.1224 + 0.3681i | 0.1248 + 0.3757i | 0.1240 + 0.3695i |
| 16 | 0.1246 + 0.1126i | 0.1236 + 0.1126i | 0.1260 + 0.1137i | 0.1249 + 0.1137i | 0.1145 + 0.3722i | 0.1158 + 0.3451i | 0.1155 + 0.3659i | 0.1168 + 0.3397i |
| 16.5 | 0.1108 + 0.1164i | 0.1102 + 0.1224i | 0.1146 + 0.1160i | 0.1140 + 0.1221i | 0.1117 + 0.3822i | 0.1114 + 0.3519i | 0.1161 + 0.3836i | 0.1157 + 0.3531i |
| 17 | 0.1115 + 0.1115i | 0.1120 + 0.1205i | 0.1194 + 0.1109i | 0.1199 + 0.1199i | 0.1072 + 0.3744i | 0.1092 + 0.3378i | 0.1154 + 0.3802i | 0.1176 + 0.3422i |
| 17.5 | 0.1091 + 0.1073i | 0.1100 + 0.1219i | 0.1238 + 0.1068i | 0.1247 + 0.1214i | 0.1034 + 0.3767i | 0.1065 + 0.3301i | 0.1187 + 0.3819i | 0.1221 + 0.3339i |
| 18 | 0.1029 + 0.1005i | 0.1036 + 0.1205i | 0.1336 + 0.1000i | 0.1343 + 0.1201i | 0.0984 + 0.3716i | 0.1017 + 0.3147i | 0.1253 + 0.3759i | 0.1301 + 0.3177i |
| 18.5 | 0.0939 + 0.0943i | 0.0946 + 0.1241i | 0.1446 + 0.0939i | 0.1449 + 0.1242i | 0.0911 + 0.3755i | 0.0942 + 0.3061i | 0.1336 + 0.3799i | 0.1399 + 0.3092i |
| 19 | 0.0784 + 0.0928i | 0.0827 + 0.2753i | 0.0788 + 0.0929i | 0.0872 + 0.2754i | 0.0877 + 0.6350i | 0.0879 + 0.4564i | 0.1446 + 0.6281i | 0.1074 + 0.4545i |
| 19.5 | 0.0788 + 0.0768i | 0.0782 + 0.2154i | 0.1113 + 0.0765i | 0.1213 + 0.2125i | 0.0760 + 0.5036i | 0.0772 + 0.3648i | 0.1642 + 0.4957i | 0.1421 + 0.3594i |
| 20 | 0.0713 + 0.0697i | 0.0711 + 0.1478i | 0.2060 + 0.0687i | 0.2046 + 0.1520i | 0.0715 + 0.3878i | 0.0710 + 0.2879i | 0.1957 + 0.3967i | 0.2012 + 0.2903i |
| 20.5 | 0.0696 + 0.0636i | 0.0695 + 0.1639i | 0.2051 + 0.0633i | 0.2044 + 0.1665i | 0.0700 + 0.4057i | 0.0696 + 0.2929i | 0.1995 + 0.4139i | 0.2029 + 0.2955i |
| 21 | 0.0696 + 0.0610i | 0.0696 + 0.1698i | 0.2077 + 0.0610i | 0.2073 + 0.1721i | 0.0698 + 0.4114i | 0.0697 + 0.2939i | 0.2034 + 0.4201i | 0.2063 + 0.2971i |
| 21.5 | 0.0707 + 0.0595i | 0.0706 + 0.1722i | 0.2119 + 0.0599i | 0.2114 + 0.1748i | 0.0701 + 0.4134i | 0.0705 + 0.2935i | 0.2066 + 0.4231i | 0.2100 + 0.2979i |
| 22 | 0.0723 + 0.0588i | 0.0719 + 0.1737i | 0.2166 + 0.0598i | 0.2155 + 0.1775i | 0.0704 + 0.4157i | 0.0713 + 0.2939i | 0.2086 + 0.4265i | 0.2132 + 0.3001i |
| 22.5 | 0.0730 + 0.0592i | 0.0727 + 0.1768i | 0.2188 + 0.0604i | 0.2178 + 0.1809i | 0.0710 + 0.4212i | 0.0721 + 0.2976i | 0.2107 + 0.4330i | 0.2155 + 0.3047i |
| 23 | 0.0720 + 0.0615i | 0.0717 + 0.1851i | 0.2162 + 0.0625i | 0.2153 + 0.1881i | 0.0692 + 0.4430i | 0.0709 + 0.3116i | 0.2088 + 0.4508i | 0.2131 + 0.3169i |
| 23.5 | 0.0735 + 0.0614i | 0.0734 + 0.1846i | 0.2204 + 0.0628i | 0.2198 + 0.1888i | 0.0720 + 0.4369i | 0.0730 + 0.3094i | 0.2145 + 0.4495i | 0.2184 + 0.3170i |
| 24 | 0.0668 + 0.0698i | 0.0669 + 0.2101i | 0.2012 + 0.0697i | 0.2017 + 0.2100i | 0.0675 + 0.5066i | 0.0672 + 0.3530i | 0.2047 + 0.4981i | 0.2028 + 0.3524i |
| 24.5 | 0.0679 + 0.0704i | 0.0679 + 0.2120i | 0.2045 + 0.0702i | 0.2048 + 0.2113i | 0.0689 + 0.5043i | 0.0683 + 0.3561i | 0.2088 + 0.4995i | 0.2060 + 0.3542i |

| | w56 | w57 | w58 | w59 | w60 | w61 | w62 | w63 |
|---|---|---|---|---|---|---|---|---|
| 25 | 0.0687 + 0.0711i | 0.0686 + 0.2143i | 0.2073 + 0.0705i | 0.2070 + 0.2122i | 0.0701 + 0.5091i | 0.0690 + 0.3598i | 0.2121 + 0.5000i | 0.2083 + 0.3552i |
| 25.5 | 0.0699 + 0.0718i | 0.0690 + 0.2167i | 0.2111 + 0.0703i | 0.2080 + 0.2118i | 0.0711 + 0.5149i | 0.0694 + 0.3642i | 0.2146 + 0.4990i | 0.2095 + 0.3547i |
| 26 | 0.0711 + 0.0728i | 0.0687 + 0.2202i | 0.2153 + 0.0697i | 0.2074 + 0.2103i | 0.0722 + 0.5215i | 0.0699 + 0.3698i | 0.2171 + 0.4970i | 0.2104 + 0.3528i |

| SNR/w | w56 | w57 | w58 | w59 | w60 | w61 | w62 | w63 |
|---|---|---|---|---|---|---|---|---|
| 5 | 0.2696 + 0.4521i | 0.2696 + 0.4521i | 0.5170 + 1.2065i | 0.5170 + 1.2065i | 0.2696 + 0.4521i | 0.2696 + 0.4521i | 0.5170 + 1.2065i | 0.5169 + 1.2065i |
| 5.5 | 0.2663 + 0.4530i | 0.2663 + 0.4530i | 0.5115 + 1.2092i | 0.5115 + 1.2092i | 0.2663 + 0.4530i | 0.2663 + 0.4530i | 0.5115 + 1.2092i | 0.5115 + 1.2092i |
| 6 | 0.5067 + 1.2102i | 0.5067 + 1.2102i | 0.5067 + 1.2102i | 0.5067 + 1.2102i | 0.2642 + 0.4570i | 0.2642 + 0.4570i | 0.2642 + 0.4570i | 0.2642 + 0.4570i |
| 6.5 | 0.2553 + 0.4543i | 0.2553 + 0.4543i | 0.2553 + 0.4543i | 0.2553 + 0.4543i | 0.2699 + 0.4632i | 0.2699 + 0.4632i | 0.2699 + 0.4632i | 0.2699 + 0.4632i |
| 7 | 0.2737 + 0.4610i | 0.2897 + 0.4968i | 0.2571 + 0.4610i | 0.2737 + 0.4610i | 0.2668 + 0.4777i | 0.2668 + 0.4777i | 0.2424 + 0.4005i | 0.2551 + 0.4393i |
| 7.5 | 0.3744 + 0.2153i | 0.3744 + 0.2153i | 1.2665 + 0.3279i | 1.7569 + 0.3690i | 0.4714 + 0.2435i | 0.4213 + 0.2297i | 1.1489 + 0.3175i | 1.2665 + 0.3279i |
| 8 | 0.4213 + 0.2297i | 0.4213 + 0.2297i | 0.4792 + 0.2369i | 0.5341 + 0.2486i | 0.4288 + 0.2485i | 0.4213 + 0.2297i | 0.4799 + 0.2729i | 0.5272 + 0.2969i |
| 8.5 | 0.4230 + 0.2228i | 0.4792 + 0.2369i | 0.4909 + 0.2299i | 0.5508 + 0.2411i | 0.4300 + 0.2432i | 0.4799 + 0.2708i | 0.4861 + 0.2708i | 0.5370 + 0.2980i |
| 9 | 0.4280 + 0.2156i | 0.4909 + 0.2299i | 0.2959 + 0.2299i | 0.3401 + 0.2408i | 0.2568 + 0.2226i | 0.4861 + 0.2708i | 0.2999 + 0.2142i | 0.3435 + 0.2384i |
| 9.5 | 0.2535 + 0.2242i | 0.2958 + 0.2464i | 0.3019 + 0.2162i | 0.3505 + 0.2369i | 0.2504 + 0.2203i | 0.2992 + 0.2445i | 0.3066 + 0.2074i | 0.3545 + 0.2345i |
| 10 | 0.2466 + 0.2220i | 0.2928 + 0.2463i | 0.3019 + 0.2094i | 0.3505 + 0.2369i | 0.2504 + 0.2203i | 0.2968 + 0.2446i | 0.3066 + 0.2074i | 0.3545 + 0.2345i |
| 10.5 | 0.1777 − 0.3146i | 0.1775 − 0.3142i | 0.3118 − 0.5742i | 0.3157 − 0.5798i | 0.1775 − 0.3142i | 0.1773 − 0.3138i | 0.3157 − 0.5798i | 0.3199 − 0.5859i |
| 11 | 0.1726 − 0.3073i | 0.1716 − 0.3050i | 0.3219 − 0.5854i | 0.3250 − 0.5893i | 0.1716 − 0.3050i | 0.1707 − 0.3028i | 0.3250 − 0.5893i | 0.3285 − 0.5937i |
| 11.5 | 0.6517 + 0.1968i | 0.6629 + 0.1867i | 0.6553 + 0.1970i | 0.6593 + 0.1971i | 0.5926 + 0.3323i | 0.5953 + 0.3347i | 0.5953 + 0.3347i | 0.5983 + 0.3373i |
| 12 | 0.6651 + 0.1874i | 0.6629 + 0.1867i | 0.6676 + 0.1867i | 0.6652 + 0.1860i | 0.5987 + 0.3415i | 0.5967 + 0.3408i | 0.5999 + 0.3441i | 0.5977 + 0.3433i |
| 12.5 | 0.6488 + 0.1696i | 0.6462 + 0.1706i | 0.6456 + 0.1745i | 0.6431 + 0.1753i | 0.5854 + 0.3186i | 0.5862 + 0.3167i | 0.5864 + 0.3275i | 0.5873 + 0.3254i |
| 13 | 0.6316 + 0.1560i | 0.6315 + 0.1561i | 0.6247 + 0.1611i | 0.6248 + 0.1604i | 0.5783 + 0.3024i | 0.5798 + 0.3002i | 0.5773 + 0.3109i | 0.5787 + 0.3085i |
| 13.5 | 0.6170 + 0.1462i | 0.6194 + 0.1456i | 0.6069 + 0.1499i | 0.6096 + 0.1493i | 0.5711 + 0.2953i | 0.5733 + 0.2925i | 0.5681 + 0.3029i | 0.5702 + 0.3000i |
| 14 | 0.6100 + 0.1390i | 0.6146 + 0.1379i | 0.5973 + 0.1418i | 0.6021 + 0.1407i | 0.5671 + 0.2989i | 0.5699 + 0.2952i | 0.5622 + 0.3050i | 0.5648 + 0.3012i |
| 14.5 | 0.6083 + 0.1348i | 0.6131 + 0.1340i | 0.5937 + 0.1359i | 0.5986 + 0.1351i | 0.5634 + 0.3136i | 0.5659 + 0.3081i | 0.5560 + 0.3149i | 0.5581 + 0.3094i |
| 15 | 0.6021 + 0.1286i | 0.6083 + 0.1281i | 0.5829 + 0.1281i | 0.5889 + 0.1287i | 0.5602 + 0.3179i | 0.5630 + 0.3124i | 0.5492 + 0.3184i | 0.5514 + 0.3131i |
| 15.5 | 0.3704 + 0.1254i | 0.3712 + 0.1251i | 0.3655 + 0.1247i | 0.3663 + 0.1243i | 0.3507 + 0.3864i | 0.3567 + 0.3730i | 0.3413 + 0.3842i | 0.3479 + 0.3703i |
| 16 | 0.3691 + 0.1161i | 0.3726 + 0.1149i | 0.3462 + 0.1176i | 0.3495 + 0.1166i | 0.3880 + 0.3542i | 0.3859 + 0.3426i | 0.3721 + 0.3619i | 0.3694 + 0.3510i |
| 16.5 | 0.3798 + 0.1221i | 0.3814 + 0.1262i | 0.3718 + 0.1223i | 0.3734 + 0.1263i | 0.3551 + 0.3930i | 0.3657 + 0.3748i | 0.3422 + 0.3818i | 0.3526 + 0.3629i |
| 17 | 0.3595 + 0.1122i | 0.3649 + 0.1166i | 0.3317 + 0.1131i | 0.3362 + 0.1181i | 0.3658 + 0.3713i | 0.3698 + 0.3435i | 0.3402 + 0.3754i | 0.3436 + 0.3473i |
| 17.5 | 0.3728 + 0.1147i | 0.3680 + 0.1240i | 0.3411 + 0.1128i | 0.3369 + 0.1221i | 0.3747 + 0.3766i | 0.3717 + 0.3453i | 0.3348 + 0.3800i | 0.3339 + 0.3472i |
| 18 | 0.3820 + 0.1125i | 0.3761 + 0.1125i | 0.3399 + 0.1094i | 0.3352 + 0.1094i | 0.3834 + 0.3812i | 0.3805 + 0.3166i | 0.3287 + 0.3836i | 0.3290 + 0.3417i |
| 18.5 | 0.4034 + 0.1051i | 0.3990 + 0.1128i | 0.3351 + 0.1268i | 0.3324 + 0.1227i | 0.3940 + 0.3783i | 0.3941 + 0.3266i | 0.3224 + 0.3797i | 0.3242 + 0.3257i |
| 19 | 0.4172 + 0.0983i | 0.4129 + 0.1333i | 0.3295 + 0.0948i | 0.3269 + 0.1276i | 0.4055 + 0.3867i | 0.4070 + 0.3192i | 0.3165 + 0.3859i | 0.3192 + 0.3168i |
| 19.5 | 0.2459 + 0.0870i | 0.2683 + 0.2411i | 0.2324 + 0.0875i | 0.2491 + 0.2574i | 0.3841 + 0.5544i | 0.3150 + 0.4197i | 0.3139 + 0.6000i | 0.2782 + 0.4299i |
| 20 | 0.3357 + 0.0722i | 0.3554 + 0.1787i | 0.2645 + 0.0759i | 0.2773 + 0.1974i | 0.4211 + 0.4555i | 0.3908 + 0.3235i | 0.3141 + 0.4762i | 0.2975 + 0.3417i |
| 20.5 | 0.4915 + 0.0675i | 0.4864 + 0.1749i | 0.3507 + 0.0674i | 0.3479 + 0.1618i | 0.4601 + 0.4402i | 0.4756 + 0.3132i | 0.3316 + 0.4177i | 0.3417 + 0.2995i |
| 21 | 0.4886 + 0.0646i | 0.4846 + 0.1827i | 0.3469 + 0.0633i | 0.3450 + 0.1729i | 0.4639 + 0.4505i | 0.4766 + 0.3165i | 0.3324 + 0.4313i | 0.3406 + 0.3039i |
| 21.5 | 0.4930 + 0.0636i | 0.4893 + 0.1869i | 0.3495 + 0.0617i | 0.3478 + 0.1777i | 0.4697 + 0.4569i | 0.4820 + 0.3193i | 0.3355 + 0.4373i | 0.3439 + 0.3060i |
| 22 | 0.5002 + 0.0638i | 0.4966 + 0.1905i | 0.3552 + 0.0612i | 0.3533 + 0.1810i | 0.4764 + 0.4630i | 0.4895 + 0.3231i | 0.3397 + 0.4416i | 0.3490 + 0.3083i |
| 22.5 | 0.5063 + 0.0651i | 0.5034 + 0.1956i | 0.3611 + 0.0619i | 0.3592 + 0.1852i | 0.4850 + 0.4713i | 0.4975 + 0.3302i | 0.3439 + 0.4470i | 0.3544 + 0.3131i |
| 23 | 0.5098 + 0.0662i | 0.5076 + 0.1992i | 0.3641 + 0.0628i | 0.3625 + 0.1888i | 0.4912 + 0.4790i | 0.5027 + 0.3358i | 0.3482 + 0.4545i | 0.3582 + 0.3185i |
| 23.5 | 0.5089 + 0.0667i | 0.5074 + 0.2012i | 0.3614 + 0.0643i | 0.3600 + 0.1938i | 0.4951 + 0.4835i | 0.5034 + 0.3391i | 0.3505 + 0.4649i | 0.3566 + 0.3265i |
| 24 | 0.5134 + 0.0686i | 0.5133 + 0.2063i | 0.3668 + 0.0653i | 0.3660 + 0.1965i | 0.5011 + 0.4924i | 0.5105 + 0.3465i | 0.3558 + 0.4698i | 0.3634 + 0.3304i |
| 24.5 | 0.4796 + 0.0697i | 0.4800 + 0.2104i | 0.3382 + 0.0697i | 0.3390 + 0.2100i | 0.4925 + 0.5035i | 0.4833 + 0.3548i | 0.3463 + 0.4979i | 0.3414 + 0.3526i |
| 25 | 0.4861 + 0.0706i | 0.4859 + 0.2131i | 0.3435 + 0.0702i | 0.3439 + 0.2114i | 0.5003 + 0.5082i | 0.4895 + 0.3586i | 0.3523 + 0.4998i | 0.3464 + 0.3545i |
| 25.5 | 0.4922 + 0.0714i | 0.4900 + 0.2154i | 0.3482 + 0.0705i | 0.3474 + 0.2123i | 0.5068 + 0.5129i | 0.4941 + 0.3621i | 0.3574 + 0.5015i | 0.3500 + 0.3558i |
| 25.5 | 0.5014 + 0.0721i | 0.4909 + 0.2174i | 0.3548 + 0.0706i | 0.3488 + 0.2127i | 0.5120 + 0.5180i | 0.4965 + 0.3657i | 0.3613 + 0.5034i | 0.3518 + 0.3569i |
| 26 | 0.5101 + 0.0730i | 0.4897 + 0.2198i | 0.3616 + 0.0709i | 0.3479 + 0.2135i | 0.5175 + 0.5233i | 0.4992 + 0.3698i | 0.3655 + 0.5062i | 0.3537 + 0.3587i | e) 1kQQAM—AWGN Channel

| SNR/w | w0 | w1 | w2 | w3 | w4 | w5 | w6 | w7 |
|---|---|---|---|---|---|---|---|---|
| 7 | 1.2470 + 1.8367i | 0.6834 + 1.2111i | 0.4280 + 2.1615i | 0.3795 + 1.3684i | 0.6833 + 1.2110i | 0.6203 + 1.1269i | 0.3795 + 1.3684i | 0.3664 + 1.2523i |
| 7.5 | 1.2147 + 1.7841i | 0.9775 + 1.4975i | 0.4075 + 2.1185i | 0.3773 + 1.7335i | 0.6878 + 1.1557i | 0.7109 + 1.1847i | 0.3342 + 1.3132i | 0.3396 + 1.3456i |
| 8 | 0.3978 + 2.0885i | 0.3528 + 1.7466i | 0.3367 + 1.5749i | 0.3329 + 1.5346i | 1.1912 + 1.7585i | 0.9886 + 1.4907i | 0.8852 + 1.3630i | 0.8567 + 1.3285i |
| 8.5 | 0.3944 + 2.0732i | 0.3348 + 1.7139i | 0.3252 + 1.6265i | 0.3149 + 1.5557i | 1.1771 + 1.7502i | 0.9699 + 1.4579i | 0.9225 + 1.3957i | 0.8771 + 1.3353i |
| 9 | 2.0688 + 0.3931i | 1.5220 + 0.3040i | 1.5225 + 0.3041i | 1.4127 + 0.2910i | 1.5231 + 0.3042i | 1.4130 + 0.2910i | 1.4132 + 0.2910i | 1.3607 + 0.2857i |
| 9.5 | 2.0659 + 0.4001i | 1.5258 + 0.3016i | 1.5256 + 0.3015i | 1.4332 + 0.2910i | 1.5259 + 0.3016i | 1.4334 + 0.2875i | 1.4333 + 0.2875i | 1.3888 + 0.2812i |
| 10 | 2.0614 + 0.4082i | 1.5254 + 0.3009i | 1.5258 + 0.3010i | 1.4439 + 0.2854i | 1.5264 + 0.3011i | 1.4443 + 0.2855i | 1.4445 + 0.2855i | 1.4049 + 0.2778i |
| 10.5 | 2.0377 + 0.4082i | 1.4175 + 0.2985i | 1.8845 + 0.2992i | 1.4546 + 0.2734i | 1.5221 + 0.3248i | 1.4068 + 0.2875i | 1.4462 + 0.2673i | 1.4462 + 0.2673i |
| 11 | 2.0390 + 0.5892i | 1.9449 + 0.9829i | 2.1322 + 0.2257i | 1.6928 + 1.3984i | 1.6643 + 1.9975i | 1.4068 + 1.8902i | 1.5822 + 1.2985i | 1.3588 + 1.7046i |
| 11.5 | 2.0197 + 0.5915i | 1.9273 + 0.9738i | 2.1141 + 0.2170i | 1.6778 + 1.3854i | 0.6565 + 1.9726i | 0.9379 + 1.8778i | 0.2768 + 2.1985i | 1.3509 + 1.6828i |
| 12 | 1.9956 + 0.5790i | 1.9068 + 0.9328i | 2.0896 + 0.2054i | 1.6925 + 1.3344i | 0.6557 + 1.9767i | 0.9827 + 1.8677i | 0.2618 + 2.1756i | 1.3795 + 1.6301i |
| 12.5 | 2.1158 + 0.2555i | 1.9736 + 0.7598i | 1.2067 + 1.7622i | 1.7509 + 1.2633i | 0.4696 + 1.4431i | 0.4534 + 1.4338i | 0.2501 + 2.1554i | 0.5550 + 1.4555i |
| 13 | 1.1348 + 1.8042i | 1.5056 + 1.4947i | 1.8256 + 0.9213i | 1.6326 + 1.1112i | 1.6003 + 1.1353i | 1.6516 + 1.1238i | 0.5999 + 1.4947i | 2.0128 + 0.1983i |
| 13.5 | 2.1871 + 0.3000i | 1.8533 + 1.3098i | 1.1098 + 1.7333i | 1.5930 + 1.5042i | 0.5540 + 1.3961i | 0.5317 + 1.3797i | 2.0062 + 0.5266i | 0.6040 + 1.4250i |
| 14 | 2.1483 + 1.5217i | 0.1461 + 1.4775i | 1.0118 + 1.6410i | 0.7721 + 1.8992i | 0.5249 + 1.3438i | 0.4741 + 1.3776i | 0.6814 + 1.4935i | 0.6040 + 1.4423i |
| 14.5 | 1.3062 + 1.5059i | 0.1503 + 1.4749i | 1.0464 + 1.6055i | 0.8162 + 1.8855i | 0.5385 + 1.3224i | 0.4757 + 1.3733i | 0.6571 + 1.4190i | 0.6369 + 1.4730i |
| 15 | 1.4903 + 1.1383i | 0.9110 + 1.4935i | 1.4109 + 1.4171i | 1.1243 + 1.6910i | 1.0821 + 1.1204i | 0.9502 + 1.2140i | 1.0380 + 1.0923i | 0.9559 + 1.1435i |
| 15.5 | 1.3441 + 1.0864i | 1.6500 + 1.0447i | 1.3102 + 1.2118i | 1.5763 + 1.4126i | 0.9982 + 1.0732i | 0.9271 + 1.0465i | 0.9966 + 1.0776i | 0.9241 + 1.0486i |
| 16 | 1.3350 + 1.1084i | 1.4475 + 0.9747i | 1.5607 + 1.3993i | 1.7541 + 1.0489i | 1.0500 + 0.9792i | 1.0135 + 0.9798i | 0.9647 + 0.9464i | 0.9496 + 0.9596i |
| 16.5 | 1.2147 + 1.5219i | 1.5401 + 1.3313i | 1.1978 + 1.2058i | 1.2559 + 1.1577i | 1.8450 + 0.9334i | 1.5494 + 0.9965i | 1.1978 + 0.9549i | 1.2537 + 0.9642i |
| 17 | 1.2118 + 1.5215i | 1.5329 + 1.3209i | 1.1917 + 1.2081i | 1.2559 + 1.1617i | 1.8374 + 0.9409i | 1.5357 + 0.9911i | 1.1881 + 0.9512i | 1.2485 + 0.9597i |
| 17.5 | 1.2108 + 1.5244i | 1.5290 + 1.3088i | 1.1858 + 1.2120i | 1.2645 + 1.1672i | 1.8238 + 0.9430i | 1.5237 + 0.9832i | 1.1800 + 0.9524i | 1.2475 + 0.9593i |
| 18 | 1.2082 + 1.5168i | 1.5240 + 1.3020i | 1.1811 + 1.2092i | 1.2761 + 1.1672i | 1.8137 + 0.9371i | 1.5194 + 0.9786i | 1.1750 + 0.9549i | 1.2506 + 0.9591i |
| 18.5 | 1.7580 + 0.8556i | 1.4723 + 0.8642i | 1.6081 + 1.1548i | 1.3616 + 0.9559i | 1.6322 + 0.6294i | 1.4250 + 0.6945i | 1.1917 + 0.7017i | 1.2482 + 0.7340i |
| 19 | 1.7624 + 0.8434i | 1.4961 + 0.8499i | 1.5901 + 1.1466i | 1.3710 + 0.9545i | 1.6320 + 0.6089i | 1.4335 + 0.6810i | 1.2009 + 0.7014i | 1.2596 + 0.7328i |
| 19.5 | 1.7721 + 0.9602i | 1.5439 + 0.8692i | 1.5357 + 1.2087i | 1.3865 + 0.9588i | 1.4330 + 0.5782i | 1.4962 + 0.6937i | 1.2677 + 0.6543i | 1.2934 + 0.7411i |
| 20 | 1.1090 + 1.6424i | 1.3041 + 1.4291i | 0.8414 + 1.7420i | 1.0620 + 1.3420i | 1.3469 + 1.1420i | 1.6140 + 1.1270i | 1.1259 + 1.0802i | 1.0687 + 1.1589i |
| 20.5 | 1.5361 + 1.2929i | 1.7337 + 0.8357i | 1.2780 + 1.4499i | 1.2622 + 1.2031i | 1.4523 + 0.7959i | 1.5055 + 0.9923i | 1.2671 + 0.8392i | 1.2824 + 1.0044i |
| 21 | 1.1920 + 1.4825i | 1.4038 + 1.1579i | 1.4681 + 1.3237i | 1.2120 + 1.1649i | 1.5435 + 0.9938i | 1.3407 + 1.0511i | 1.2086 + 0.8597i | 1.1708 + 0.9914i |
| 21.5 | 1.3352 + 1.3968i | 1.5419 + 1.1171i | 1.1041 + 1.4991i | 1.1453 + 1.2860i | 1.3845 + 0.9402i | 1.3310 + 1.1167i | 1.1841 + 0.8772i | 1.1762 + 1.0540i |
| 22 | 1.1448 + 1.4301i | 1.2314 + 1.2283i | 1.3851 + 1.4301i | 1.1791 + 1.0727i | 1.5570 + 0.9357i | 1.4463 + 1.1297i | 1.1343 + 0.9131i | 1.1581 + 1.0783i |
| 22.5 | 1.3571 + 1.4599i | 1.6063 + 1.1774i | 1.1068 + 1.5873i | 1.2491 + 1.2384i | 1.5617 + 0.8881i | 1.4366 + 1.0501i | 1.2716 + 0.8875i | 1.1627 + 0.9172i |
| 23 | 1.2474 + 1.3969i | 1.4038 + 1.1579i | 0.0418 + 1.5521i | 1.2120 + 1.1649i | 1.3678 + 0.8860i | 1.5336 + 0.9857i | 1.2086 + 0.8597i | 1.2361 + 1.0472i |
| 23.5 | 1.3740 + 1.3412i | 1.5419 + 1.1171i | 1.0721 + 1.4824i | 1.1453 + 1.2860i | 1.3865 + 0.9633i | 1.3170 + 1.1167i | 1.1954 + 0.9088i | 1.2130 + 1.0083i |
| 24 | 1.3790 + 1.2726i | 1.2140 + 1.1908i | 1.1518 + 1.3905i | 1.5627 + 1.0245i | 1.3824 + 0.8840i | 1.3211 + 1.0410i | 1.1686 + 0.8903i | 1.1762 + 1.0540i |
| 24.5 | 1.2961 + 1.3306i | 1.5578 + 1.0359i | 0.8364 + 1.6008i | 1.1053 + 1.1245i | 1.3744 + 0.9233i | 1.3731 + 1.1025i | 1.2130 + 0.9446i | 1.1570 + 1.0107i |
| 25 | 1.2369 + 1.3509i | 1.5739 + 0.9502i | 0.8752 + 1.5743i | 1.0781 + 1.2268i | 1.3726 + 1.0001i | 1.3629 + 1.1723i | 1.2107 + 0.9621i | 1.2096 + 1.1104i |
| 25.5 | 1.1981 + 1.3312i | 1.4448 + 1.0547i | 1.0785 + 1.4777i | 1.3216 + 0.9567i | 1.5082 + 0.8231i | 1.2653 + 1.1488i | 1.1548 + 0.9162i | 1.1961 + 1.1184i |
| 26 | 1.3600 + 1.2363i | 1.4725 + 1.0370i | 0.8236 + 1.5404i | 1.1012 + 1.2158i | 1.3405 + 0.9099i | 1.3085 + 1.0600i | 1.2050 + 0.8913i | 1.1687 + 1.0355i |
| 26.5 | 1.2790 + 1.2022i | 1.4224 + 1.0247i | 0.8336 + 1.4661i | 1.1191 + 1.1349i | 1.3645 + 0.8540i | 1.2671 + 1.0236i | 1.2289 + 0.8713i | 1.1575 + 1.0871i |
| 27 | 1.3272 + 1.2196i | 1.3559 + 1.0732i | 1.0028 + 1.3882i | 1.0375 + 1.2417i | 1.4394 + 0.9027i | 1.0528 + 1.0954i | 1.2910 + 0.9298i | 1.1326 + 0.9925i |
| 27.5 | 1.2847 + 1.1501i | 1.3444 + 1.0100i | 0.9562 + 1.3726i | 0.9853 + 1.2319i | 1.5330 + 0.7517i | 1.0098 + 1.0854i | 1.1767 + 0.9824i | 1.1738 + 1.1370i |
| 28 | 1.2471 + 1.1326i | 1.3598 + 1.0114i | 0.9946 + 1.3891i | 1.0600 + 1.1563i | 1.4990 + 0.7151i | 1.0049 + 1.0334i | 1.2249 + 0.9302i | 1.1234 + 1.0212i |

| SNR/w | w8 | w9 | w10 | w11 | w12 | w13 | w14 | w15 |
|---|---|---|---|---|---|---|---|---|
| 7 | 0.6833 + 1.2110i | 0.6203 + 1.1269i | 0.3795 + 1.3684i | 0.3664 + 1.2523i | 0.6202 + 1.1268i | 0.5879 + 1.0807i | 0.3663 + 1.2523i | 0.3587 + 1.1910i |
| 7.5 | 0.6881 + 1.1562i | 0.7117 + 1.1857i | 0.3341 + 1.3147i | 0.3395 + 1.3465i | 0.6165 + 1.0681i | 0.6321 + 1.0878i | 0.3226 + 1.1998i | 0.3264 + 1.2228i |
| 8 | 0.3037 + 1.2547i | 0.3062 + 1.2795i | 0.3046 + 1.2544i | 0.3068 + 1.1024i | 0.6705 + 1.1024i | 0.6865 + 1.1223i | 0.6710 + 1.1036i | 0.6846 + 1.1206i |
| 8.5 | 0.2754 + 1.1162i | 0.2761 + 1.1289i | 0.2761 + 1.1273i | 0.2768 + 1.1403i | 0.5936 + 0.9870i | 0.6017 + 0.9967i | 0.6005 + 0.9956i | 0.6088 + 1.0055i |

-continued

| SNR | w16 | w17 | w18 | w19 | w20 | w21 | w22 | w23 |
|---|---|---|---|---|---|---|---|---|
| 9 | 1.5227 + 0.3041i | 1.4128 + 0.2910i | 1.4130 + 0.2910i | 1.3605 + 0.2857i | 1.4133 + 0.2910i | 1.3607 + 0.2857i | 1.3609 + 0.2857i | 1.3276 + 0.2826i |
| 9.5 | 1.5257 + 0.3016i | 1.4333 + 0.2875i | 1.4332 + 0.2875i | 1.3887 + 0.2812i | 1.4334 + 0.2875i | 1.3888 + 0.2812i | 1.3887 + 0.2812i | 1.3603 + 0.2772i |
| 10 | 1.5259 + 0.3010i | 1.4440 + 0.2854i | 1.4442 + 0.2855i | 1.4047 + 0.2778i | 1.4446 + 0.2855i | 1.4050 + 0.2778i | 1.4051 + 0.2779i | 1.3798 + 0.2727i |
| 10.5 | 1.4411 + 0.2995i | 1.3746 + 0.2784i | 1.4767 + 0.2749i | 1.3984 + 0.2629i | 1.4219 + 0.2840i | 1.3753 + 0.2744i | 1.4517 + 0.2744i | 1.3959 + 0.2589i |
| 11 | 0.2694 + 1.5131i | 0.2666 + 1.4804i | 0.2206 + 1.5281i | 0.2221 + 1.4905i | 0.3240 + 1.5996i | 0.3139 + 1.5353i | 0.2481 + 1.6183i | 0.2508 + 1.5412i |
| 11.5 | 0.2762 + 1.5039i | 0.2735 + 1.4726i | 0.2175 + 1.5226i | 0.2194 + 1.4854i | 0.3318 + 1.5889i | 0.3211 + 1.5250i | 0.2441 + 1.6117i | 0.2476 + 1.5333i |
| 12 | 0.2854 + 1.4955i | 0.2803 + 1.4638i | 0.2140 + 1.5186i | 0.2152 + 1.4801i | 0.3402 + 1.5829i | 0.3241 + 1.5142i | 0.2375 + 1.6120i | 0.2398 + 1.5271i |
| 12.5 | 0.1259 + 1.6593i | 0.1270 + 1.7379i | 0.7712 + 2.0048i | 0.2871 + 2.1268i | 0.3310 + 1.5330i | 0.3195 + 1.5396i | 0.5495 + 1.5637i | 0.4968 + 1.5173i |
| 13 | 1.4048 + 0.5351i | 1.3890 + 0.5372i | 1.4747 + 0.6396i | 1.4392 + 0.6354i | 1.4978 + 0.3477i | 1.4931 + 0.3477i | 1.5164 + 0.4919i | 1.4763 + 0.4841i |
| 13.5 | 0.1154 + 1.5910i | 0.1145 + 1.6518i | 0.7071 + 2.0121i | 0.2331 + 2.0568i | 0.3287 + 1.5262i | 0.3248 + 1.5317i | 0.5457 + 1.6384i | 0.4754 + 1.5699i |
| 14 | 0.1319 + 1.6053i | 0.1497 + 1.5552i | 0.1917 + 2.0093i | 0.4128 + 1.8626i | 0.4751 + 1.5303i | 0.4232 + 1.4126i | 0.5659 + 1.3830i | 0.5277 + 1.4369i |
| 14.5 | 0.1282 + 1.6456i | 0.1597 + 1.5527i | 0.1959 + 2.0115i | 0.4545 + 1.8615i | 0.5001 + 1.3385i | 0.4346 + 1.4163i | 0.5932 + 1.3889i | 0.5460 + 1.4894i |
| 15 | 0.1724 + 2.0081i | 0.1788 + 1.5257i | 0.5016 + 1.9561i | 0.7186 + 1.7492i | 0.9055 + 1.0616i | 0.8665 + 1.1704i | 0.9034 + 1.0402i | 0.8738 + 1.1071i |
| 15.5 | 1.0823 + 1.6174i | 0.7196 + 1.5112i | 0.8215 + 1.8773i | 0.6957 + 1.5465i | 0.9231 + 1.2709i | 0.8160 + 1.2862i | 0.9126 + 1.2412i | 0.8126 + 1.2668i |
| 16 | 1.1791 + 1.3117i | 0.9549 + 1.3540i | 1.1769 + 1.6347i | 0.9200 + 1.4356i | 0.9718 + 1.0622i | 0.9278 + 1.1107i | 0.9134 + 1.0069i | 0.8947 + 1.0639i |
| 16.5 | 0.9383 + 1.3523i | 0.8697 + 1.2142i | 0.9874 + 1.2241i | 0.9264 + 1.1757i | 0.8953 + 0.9296i | 0.8826 + 0.9589i | 0.9598 + 0.9439i | 0.9383 + 0.9662i |
| 17 | 0.9377 + 1.3662i | 0.8598 + 1.2150i | 0.9907 + 1.2238i | 0.9170 + 1.1772i | 0.8927 + 0.9249i | 0.8786 + 0.9565i | 0.9605 + 0.9419i | 0.9339 + 0.9669i |
| 17.5 | 0.9391 + 1.3812i | 0.8495 + 1.2161i | 0.9970 + 1.2255i | 0.9056 + 1.1802i | 0.8919 + 0.9238i | 0.8751 + 0.9580i | 0.9650 + 0.9445i | 0.9298 + 0.9718i |
| 18 | 0.9438 + 1.3828i | 0.8433 + 1.2138i | 1.0046 + 1.2199i | 0.8973 + 1.1788i | 0.8923 + 0.9236i | 0.8728 + 0.9592i | 0.9729 + 0.9487i | 0.9271 + 0.9762i |
| 18.5 | 1.1693 + 1.2799i | 1.1128 + 1.0948i | 1.3758 + 1.3185i | 1.1973 + 1.0256i | 0.9845 + 0.7965i | 1.0167 + 0.8742i | 1.0414 + 0.7718i | 1.0742 + 0.8464i |
| 19 | 1.1743 + 1.2715i | 1.1163 + 1.0948i | 1.3788 + 1.3352i | 1.2168 + 1.0183i | 0.9937 + 0.7969i | 0.9937 + 0.8742i | 1.0541 + 0.7706i | 1.0917 + 0.8547i |
| 19.5 | 1.2327 + 1.2807i | 1.1357 + 1.0702i | 1.2398 + 1.5594i | 1.2320 + 0.9996i | 1.0121 + 0.9996i | 1.0506 + 0.8804i | 1.0895 + 0.7549i | 1.1392 + 0.8268i |
| 20 | 0.6577 + 1.4430i | 0.7012 + 1.2781i | 0.8212 + 1.5008i | 0.8660 + 1.3198i | 0.8139 + 1.0062i | 0.7661 + 1.1278i | 0.8943 + 1.0255i | 0.8877 + 1.1417i |
| 20.5 | 0.9929 + 1.4515i | 0.9693 + 1.2162i | 0.9174 + 1.6990i | 1.0885 + 1.1841i | 0.9646 + 0.8840i | 0.9671 + 1.0103i | 1.0896 + 0.8706i | 1.0906 + 1.0064i |
| 21 | 0.9434 + 1.4728i | 0.9500 + 1.2899i | 0.9423 + 1.7074i | 0.9504 + 1.1268i | 0.9076 + 0.8486i | 0.8989 + 0.9010i | 1.0276 + 0.8623i | 0.9660 + 0.9752i |
| 21.5 | 0.8934 + 1.0735i | 0.8717 + 1.1114i | 0.9076 + 1.4446i | 0.9079 + 1.2674i | 0.8839 + 0.9212i | 0.8915 + 0.9251i | 1.0506 + 0.9108i | 1.0442 + 0.9272i |
| 22 | 0.9594 + 1.3673i | 0.9220 + 1.1877i | 0.9343 + 1.6326i | 1.0387 + 1.1844i | 0.8615 + 0.8877i | 0.8791 + 1.0284i | 0.9391 + 0.8804i | 1.0097 + 0.9542i |
| 22.5 | 0.8991 + 1.3062i | 0.8949 + 1.1654i | 1.0334 + 1.3983i | 1.0685 + 1.1899i | 0.9101 + 0.9127i | 0.9056 + 1.0351i | 1.0634 + 0.9074i | 1.0737 + 1.0418i |
| 23 | 0.8457 + 1.3352i | 0.8766 + 1.1938i | 1.0182 + 1.3610i | 1.0395 + 1.2129i | 0.9092 + 0.9223i | 0.9092 + 1.0480i | 1.0580 + 0.9038i | 1.0534 + 1.0422i |
| 23.5 | 0.8918 + 1.3385i | 0.8706 + 1.1982i | 0.8699 + 1.5126i | 1.0232 + 1.1858i | 0.8968 + 0.9242i | 0.9015 + 1.0548i | 1.0408 + 0.9107i | 1.0278 + 1.0448i |
| 24 | 0.9437 + 1.3080i | 0.8750 + 1.1648i | 0.9760 + 1.4721i | 1.0245 + 1.1502i | 0.8778 + 0.9006i | 0.8841 + 1.0265i | 1.0051 + 0.8991i | 1.0075 + 1.0190i |
| 24.5 | 0.9028 + 1.2861i | 0.9293 + 1.1520i | 0.8365 + 1.4219i | 1.0395 + 1.4368i | 1.0384 + 1.0219i | 0.9141 + 1.0040i | 1.0712 + 0.9074i | 0.9432 + 0.8972i |
| 25 | 0.8889 + 1.2606i | 0.9138 + 1.1340i | 0.8454 + 1.3942i | 1.0180 + 1.3974i | 1.0318 + 1.0219i | 0.9035 + 0.9954i | 1.0319 + 0.9222i | 0.9395 + 0.8888i |
| 25.5 | 0.7345 + 1.4935i | 0.9225 + 1.1907i | 0.8959 + 1.4840i | 0.9694 + 1.3246i | 0.9279 + 0.9107i | 1.0693 + 1.1756i | 1.1008 + 0.9458i | 1.0107 + 1.0471i |
| 26 | 0.8946 + 1.3595i | 0.9389 + 1.2209i | 1.0235 + 1.4279i | 1.1745 + 1.3460i | 1.0293 + 0.8852i | 0.9361 + 0.9368i | 1.1008 + 0.9458i | 1.0205 + 1.0570i |
| 26.5 | 0.8398 + 1.2923i | 0.9326 + 1.1801i | 0.9612 + 1.3780i | 1.0603 + 1.2681i | 1.0358 + 0.8637i | 0.9582 + 0.9419i | 1.1285 + 0.8265i | 1.0066 + 1.0375i |
| 27 | 0.8712 + 1.2741i | 0.9051 + 1.1465i | 0.8569 + 1.4350i | 1.1634 + 1.3187i | 1.0441 + 0.9494i | 0.9580 + 1.0356i | 1.1718 + 0.9809i | 0.9066 + 0.9385i |
| 27.5 | 0.8145 + 1.3026i | 0.8485 + 1.1849i | 0.7985 + 1.4488i | 1.1193 + 1.2690i | 1.1199 + 0.7168i | 0.8978 + 1.0853i | 1.0728 + 0.9252i | 0.9727 + 0.9570i |
| 28 | 0.9261 + 1.2557i | 0.9064 + 1.1434i | 0.8489 + 1.3711i | 1.1138 + 1.2723i | 1.1308 + 0.8070i | 0.9002 + 1.0336i | 1.1114 + 0.9086i | 0.8336 + 0.9681i |

| SNR/w | w16 | w17 | w18 | w19 | w20 | w21 | w22 | w23 |
|---|---|---|---|---|---|---|---|---|
| 7 | 0.6835 + 1.2112i | 0.6203 + 1.1270i | 0.3795 + 1.3686i | 0.3664 + 1.2524i | 0.6203 + 1.1269i | 0.5879 + 1.0807i | 0.3664 + 1.2524i | 0.3587 + 1.1911i |
| 7.5 | 0.6862 + 1.1539i | 0.7100 + 1.1836i | 0.3339 + 1.3122i | 0.3393 + 1.3443i | 0.6159 + 1.0671i | 0.6314 + 1.0867i | 0.3225 + 1.1985i | 0.3262 + 1.2216i |
| 8 | 0.3037 + 1.2546i | 0.3062 + 1.2794i | 0.3046 + 1.2542i | 0.3068 + 1.2753i | 0.6704 + 1.1023i | 0.6864 + 1.1222i | 0.6710 + 1.1036i | 0.6845 + 1.1205i |
| 8.5 | 0.2955 + 1.3378i | 0.2962 + 1.3513i | 0.2948 + 1.3341i | 0.2954 + 1.3455i | 0.7420 + 1.1682i | 0.7490 + 1.1767i | 0.7383 + 1.1638i | 0.7445 + 1.1712i |
| 9 | 1.0415 + 0.2618i | 1.0473 + 0.2624i | 1.0473 + 0.2624i | 1.0526 + 0.2630i | 1.0473 + 0.2624i | 1.0526 + 0.2630i | 1.0526 + 0.2630i | 1.0574 + 0.2636i |
| 9.5 | 1.0125 + 0.2524i | 1.0217 + 0.2530i | 1.0217 + 0.2530i | 1.0306 + 0.2536i | 1.0217 + 0.2530i | 1.0306 + 0.2536i | 1.0306 + 0.2536i | 1.0391 + 0.2541i |
| 10 | 0.9970 + 0.2433i | 1.0075 + 0.2438i | 1.0075 + 0.2438i | 1.0179 + 0.2442i | 1.0074 + 0.2438i | 1.0178 + 0.2442i | 1.0178 + 0.2442i | 1.0281 + 0.2446i |
| 10.5 | 0.9835 + 0.2342i | 1.0056 + 0.2321i | 0.9853 + 0.2330i | 1.0065 + 0.2308i | 0.9951 + 0.2336i | 1.0160 + 0.2318i | 0.9949 + 0.2332i | 1.0161 + 0.2322i |
| 11 | 0.8209 + 1.1647i | 0.8603 + 1.2018i | 0.8476 + 1.1522i | 0.9045 + 1.1940i | 0.8352 + 1.2130i | 0.8916 + 1.2840i | 0.8658 + 1.1940i | 0.9532 + 1.2725i |
| 11.5 | 0.8190 + 1.1650i | 0.8577 + 1.2049i | 0.8518 + 1.1493i | 0.9105 + 1.1942i | 0.8346 + 1.2137i | 0.8940 + 1.2944i | 0.8724 + 1.1908i | 0.9695 + 1.2795i |
| 12 | 0.8205 + 1.1674i | 0.8616 + 1.2124i | 0.8575 + 1.1454i | 0.9208 + 1.1932i | 0.8423 + 1.2188i | 0.9156 + 1.3204i | 0.8862 + 1.1870i | 1.0082 + 1.2910i |

-continued

| SNR/w | | | | | | | | |
|---|---|---|---|---|---|---|---|---|
| 12.5 | 1.0349 + 1.1222i | 1.0575 + 1.1030i | 1.1779 + 1.3115i | 1.3201 + 1.2209i | 0.8176 + 1.1730i | 0.8075 + 1.1541i | 0.8190 + 1.2572i | 0.7967 + 1.2204i |
| 13 | 1.0757 + 1.1961i | 1.0733 + 1.2014i | 1.0468 + 1.2094i | 1.0453 + 1.2144i | 1.1405 + 1.1564i | 1.1353 + 1.1616i | 1.0857 + 1.1762i | 1.0828 + 1.1811i |
| 13.5 | 1.1489 + 1.1197i | 1.3661 + 1.0778i | 1.1464 + 1.2789i | 1.3152 + 1.1853i | 0.8070 + 1.1957i | 0.7685 + 1.1750i | 0.8426 + 1.1622i | 0.7882 + 1.2129i |
| 14 | 1.1284 + 1.1433i | 1.0592 + 1.0260i | 1.0822 + 1.1063i | 1.0403 + 1.0191i | 0.7919 + 1.1415i | 0.7855 + 1.1087i | 0.8015 + 1.1750i | 0.7901 + 1.1322i |
| 14.5 | 1.1639 + 1.1492i | 1.0902 + 1.0206i | 1.1094 + 1.1262i | 1.0703 + 1.1355i | 0.7869 + 1.1355i | 0.7891 + 1.1018i | 0.8181 + 1.1797i | 0.8094 + 1.1297i |
| 15 | 1.3865 + 0.8444i | 1.3175 + 0.7494i | 1.2334 + 0.7081i | 1.2326 + 0.8590i | 1.1515 + 0.8590i | 1.1372 + 0.8042i | 1.1030 + 0.8243i | 1.1126 + 0.7761i |
| 15.5 | 1.2987 + 0.8102i | 1.2995 + 0.7667i | 1.2080 + 0.7457i | 1.2075 + 0.7166i | 1.0197 + 0.8347i | 0.9995 + 0.8192i | 1.0227 + 0.8236i | 1.0064 + 0.8103i |
| 16 | 1.2983 + 0.7167i | 1.3470 + 0.7459i | 1.2046 + 0.6199i | 1.2079 + 0.6217i | 1.0901 + 0.7575i | 1.0927 + 0.7502i | 1.0615 + 0.7257i | 1.0661 + 0.7173i |
| 16.5 | 1.4231 + 0.5506i | 1.4207 + 0.5606i | 1.2432 + 0.5821i | 1.2493 + 0.5889i | 1.6092 + 0.6778i | 1.5059 + 0.7313i | 1.2179 + 0.7344i | 1.2443 + 0.7444i |
| 17 | 1.4364 + 0.5434i | 1.4296 + 0.5574i | 1.2400 + 0.5753i | 1.2472 + 0.5825i | 1.6365 + 0.6778i | 1.5001 + 0.7492i | 1.2113 + 0.7399i | 1.2434 + 0.7494i |
| 17.5 | 1.4418 + 0.5395i | 1.4326 + 0.5570i | 1.2342 + 0.5705i | 1.2422 + 0.5776i | 1.6542 + 0.6753i | 1.4909 + 0.7585i | 1.2045 + 0.7465i | 1.2417 + 0.7541i |
| 18 | 1.4431 + 0.5367i | 1.4307 + 0.5570i | 1.2285 + 0.5660i | 1.2370 + 0.5724i | 1.6573 + 0.6715i | 1.4814 + 0.7623i | 1.1998 + 0.7521i | 1.2414 + 0.7575i |
| 18.5 | 1.3930 + 0.3640i | 1.3485 + 0.3893i | 1.1570 + 0.4271i | 1.1803 + 0.4223i | 1.5455 + 0.4576i | 1.3962 + 0.5257i | 1.1551 + 0.5306i | 1.1835 + 0.5235i |
| 19 | 1.3739 + 0.3510i | 1.3309 + 0.3746i | 1.1467 + 0.4140i | 1.1679 + 0.4096i | 1.5317 + 0.4427i | 1.3896 + 0.5168i | 1.1598 + 0.5415i | 1.1880 + 0.5295i |
| 19.5 | 1.3536 + 0.3475i | 1.2950 + 0.3231i | 1.1473 + 0.3971i | 1.1516 + 0.3864i | 1.4933 + 0.4426i | 1.7116 + 0.5868i | 1.1818 + 0.5280i | 1.1608 + 0.5011i |
| 20 | 1.7660 + 0.7375i | 1.4962 + 0.6907i | 1.2173 + 0.6961i | 1.2519 + 0.6976i | 1.3547 + 0.9559i | 1.4932 + 0.8746i | 1.1716 + 0.9087i | 1.1490 + 0.8711i |
| 20.5 | 1.4038 + 0.4647i | 1.3690 + 0.4405i | 1.1959 + 0.4712i | 1.2023 + 0.4828i | 1.4531 + 0.6314i | 1.6329 + 0.5542i | 1.2411 + 0.6786i | 1.2092 + 0.6296i |
| 21 | 1.4522 + 0.5679i | 1.6057 + 0.5378i | 1.3175 + 0.5452i | 1.1940 + 0.5550i | 1.4469 + 0.7784i | 1.6981 + 0.7459i | 1.2631 + 0.7452i | 1.1908 + 0.6751i |
| 21.5 | 1.4604 + 0.5935i | 1.7875 + 0.3980i | 1.2674 + 0.5839i | 1.7463 + 0.6216i | 1.4419 + 0.7605i | 1.6376 + 0.8704i | 1.2514 + 0.7312i | 1.1983 + 0.7401i |
| 22 | 1.4439 + 0.5853i | 1.6108 + 0.5303i | 1.3004 + 0.5868i | 1.1846 + 0.5909i | 1.4889 + 0.7419i | 1.7240 + 0.7079i | 1.3086 + 0.7519i | 1.1714 + 0.7584i |
| 22.5 | 1.5607 + 0.5647i | 1.7514 + 0.6378i | 1.1625 + 0.5397i | 1.2356 + 0.5517i | 1.4933 + 0.7257i | 1.3820 + 0.6548i | 1.2027 + 0.7601i | 1.2562 + 0.6724i |
| 23 | 1.6061 + 0.5652i | 1.8194 + 0.5891i | 1.1596 + 0.5779i | 1.2454 + 0.5628i | 1.5850 + 0.7789i | 1.4301 + 0.6629i | 1.1633 + 0.7212i | 1.3024 + 0.6774i |
| 23.5 | 1.2583 + 0.6069i | 1.7469 + 0.5762i | 1.1684 + 0.6129i | 1.5785 + 0.4968i | 1.6073 + 0.8302i | 1.4743 + 0.6934i | 1.1800 + 0.7580i | 1.3289 + 0.7757i |
| 24 | 1.3854 + 0.6727i | 1.2630 + 0.5854i | 1.2543 + 0.7381i | 1.1484 + 0.6129i | 1.5471 + 0.7468i | 1.6867 + 0.5760i | 1.1344 + 0.7766i | 1.1028 + 0.6774i |
| 24.5 | 1.1699 + 0.6085i | 1.6812 + 0.6256i | 1.1989 + 0.6932i | 1.5850 + 0.4763i | 1.5370 + 0.8085i | 4.8383 + 0.6414i | 1.2190 + 0.8012i | 1.3611 + 0.7212i |
| 25 | 1.2811 + 0.6537i | 1.5886 + 0.4923i | 1.1525 + 0.6181i | 1.7297 + 0.3433i | 1.6454 + 0.6927i | 1.4737 + 0.6267i | 1.3158 + 0.8304i | 1.4511 + 0.7770i |
| 25.5 | 1.4469 + 0.5411i | 1.3690 + 0.6538i | 1.3128 + 0.5092i | 1.2090 + 0.5803i | 1.5706 + 0.6441i | 1.3251 + 0.7695i | 1.1678 + 0.8071i | 1.1961 + 0.6963i |
| 26 | 1.4116 + 0.5975i | 1.5736 + 0.6220i | 1.1918 + 0.6209i | 1.5623 + 0.4562i | 1.4419 + 0.7605i | 1.4238 + 0.7455i | 1.1749 + 0.7608i | 1.2959 + 0.7280i |
| 26.5 | 1.5874 + 0.4394i | 1.5767 + 0.6137i | 1.1624 + 0.5760i | 1.2819 + 0.5439i | 1.5158 + 0.8040i | 1.4253 + 0.6800i | 1.2447 + 0.7358i | 1.3051 + 0.6448i |
| 27 | 1.5345 + 0.4449i | 1.5144 + 0.5973i | 1.2543 + 0.5426i | 1.3709 + 0.5896i | 1.4385 + 0.7521i | 1.1966 + 0.7287i | 1.3082 + 0.8079i | 1.2925 + 0.6791i |
| 27.5 | 1.4370 + 0.4627i | 1.4958 + 0.5797i | 1.2388 + 0.5368i | 1.3470 + 0.5780i | 1.4133 + 0.8583i | 1.2565 + 0.6932i | 1.2710 + 0.8408i | 1.3720 + 0.7047i |
| 28 | 1.5172 + 0.4779i | 1.4228 + 0.5698i | 1.2002 + 0.5259i | 1.2996 + 0.5704i | 1.4031 + 0.8380i | 1.2168 + 0.6822i | 1.2773 + 0.8086i | 1.3336 + 0.6909i |

| SNR/w | w24 | w25 | w26 | w27 | w28 | w29 | w30 | w31 |
|---|---|---|---|---|---|---|---|---|
| 7 | 0.6203 + 1.1269i | 0.5879 + 1.0807i | 0.3664 + 1.2524i | 0.3587 + 1.1911i | 0.5879 + 1.0807i | 0.5665 + 1.0491i | 0.3587 + 1.1911i | 0.3534 + 1.1499i |
| 7.5 | 0.6161 + 1.0675i | 0.6316 + 1.0872i | 0.3224 + 1.1992i | 0.3262 + 1.2222i | 0.5811 + 1.0233i | 0.5919 + 1.0372i | 0.3164 + 1.1415i | 0.3191 + 1.1581i |
| 8 | 0.2943 + 1.1463i | 0.2957 + 1.1611i | 0.2954 + 1.1529i | 0.2968 + 1.1672i | 0.5998 + 1.0173i | 0.6091 + 1.0290i | 0.6043 + 1.0232i | 0.6133 + 1.0346i |
| 8.5 | 0.2747 + 1.0937i | 0.2752 + 1.1032i | 0.2752 + 1.1026i | 0.2758 + 1.1121i | 0.5786 + 0.9704i | 0.5847 + 0.9777i | 0.5841 + 0.9773i | 0.5903 + 0.9847i |
| 9 | 0.0473 + 0.2624i | 0.0526 + 0.2630i | 0.0526 + 0.2630i | 0.0574 + 0.2630i | 0.0526 + 0.2630i | 0.0574 + 0.2636i | 0.0574 + 0.2636i | 0.0618 + 0.2642i |
| 9.5 | 0.1027 + 0.2530i | 0.0526 + 0.2536i | 0.0306 + 0.2536i | 0.1039 + 0.2541i | 0.0391 + 0.2541i | 0.0391 + 0.2541i | 0.1039 + 0.2541i | 0.1047 + 0.2546i |
| 10 | 0.0074 + 0.2438i | 0.0179 + 0.2443i | 0.0178 + 0.2442i | 0.0281 + 0.2447i | 0.1306 + 0.2536i | 0.1306 + 0.2536i | 0.0281 + 0.2446i | 0.0382 + 0.2450i |
| 10.5 | 0.0035 + 0.2319i | 0.0243 + 0.2306i | 0.0034 + 0.2330i | 0.0238 + 0.2316i | 0.1940 + 0.2325i | 0.0349 + 0.2311i | 0.0139 + 0.2333i | 0.0345 + 0.2320i |
| 11 | 0.7236 + 1.1946i | 0.7368 + 1.2150i | 0.7488 + 1.1658i | 0.7657 + 1.1852i | 0.7253 + 1.2394i | 0.7446 + 1.2677i | 0.7523 + 1.2006i | 0.7753 + 1.2277i |
| 11.5 | 0.7137 + 1.2023i | 0.7230 + 1.2254i | 0.7457 + 1.1655i | 0.7590 + 1.1870i | 0.7144 + 1.2482i | 0.7308 + 1.2798i | 0.7482 + 1.1998i | 0.7681 + 1.2301i |
| 12 | 0.6924 + 1.2241i | 0.6967 + 1.2498i | 0.7306 + 1.1738i | 0.7368 + 1.1977i | 0.6938 + 1.2732i | 0.7079 + 1.3065i | 0.7325 + 1.2081i | 0.7461 + 1.2415i |
| 12.5 | 0.9585 + 1.0486i | 0.9622 + 1.0407i | 0.9787 + 1.0880i | 0.9834 + 1.0723i | 0.8332 + 1.1067i | 0.8292 + 1.0953i | 0.8160 + 1.1675i | 0.8087 + 1.1462i |
| 13 | 0.1046 + 0.2758i | 0.1041 + 0.2823i | 0.0739 + 0.2844i | 0.0744 + 0.2902i | 0.1641 + 0.2297i | 0.1603 + 0.2373i | 0.1096 + 0.2493i | 0.1082 + 0.2560i |
| 13.5 | 0.9780 + 0.9801i | 0.9712 + 0.9730i | 0.9732 + 0.9900i | 0.9637 + 0.9805i | 0.8612 + 1.0447i | 0.8398 + 1.0427i | 0.8592 + 1.0665i | 0.8375 + 1.0599i |
| 14 | 0.9627 + 0.9228i | 0.9667 + 0.9088i | 0.9602 + 0.9256i | 0.9644 + 0.9108i | 0.7667 + 1.0764i | 0.7757 + 1.0506i | 0.7690 + 1.0941i | 0.7759 + 1.0639i |
| 14.5 | 0.9714 + 0.8889i | 0.9815 + 0.8847i | 0.9715 + 0.8930i | 0.9810 + 0.8879i | 0.7653 + 1.0721i | 0.7807 + 1.0426i | 0.7779 + 1.0881i | 0.7904 + 1.0522i |
| 15 | 0.9930 + 0.6070i | 1.0020 + 0.5999i | 1.0210 + 0.6066i | 1.0325 + 0.5993i | 0.9718 + 0.7195i | 0.9818 + 0.6853i | 0.9820 + 0.7216i | 0.9964 + 0.6847i |
| 15.5 | 0.9954 + 0.5712i | 0.9969 + 0.5716i | 1.0264 + 0.5733i | 1.0286 + 0.5735i | 0.9712 + 0.6227i | 0.9712 + 0.6221i | 0.9887 + 0.6211i | 0.9891 + 0.6199i |

| SNR/w | w32 | w33 | w34 | w35 | w36 | w37 | w38 | w39 |
|---|---|---|---|---|---|---|---|---|
| 16 | 0.9558 + 0.5317i | 0.9547 + 0.5287i | 0.9929 + 0.5319i | 0.9916 + 0.5292i | 0.9525 + 0.6047i | 0.9525 + 0.5950i | 0.9717 + 0.6040i | 0.9728 + 0.5948i |
| 16.5 | 0.9300 + 0.5951i | 0.9284 + 0.5905i | 0.9961 + 0.5965i | 0.9931 + 0.5919i | 0.9214 + 0.6902i | 0.9208 + 0.6784i | 0.9850 + 0.6987i | 0.9826 + 0.6866i |
| 17 | 0.9254 + 0.5912i | 0.9234 + 0.5868i | 0.9977 + 0.5914i | 0.9934 + 0.5868i | 0.9169 + 0.6986i | 0.9156 + 0.6852i | 0.9863 + 0.7059i | 0.9820 + 0.6917i |
| 17.5 | 0.9238 + 0.5863i | 0.9213 + 0.5829i | 1.0012 + 0.5858i | 0.9957 + 0.5819i | 0.9146 + 0.7116i | 0.9125 + 0.6977i | 0.9893 + 0.7180i | 0.9827 + 0.7022i |
| 18 | 0.9230 + 0.5805i | 0.9203 + 0.5792i | 1.0065 + 0.5798i | 1.0003 + 0.5772i | 0.9135 + 0.7246i | 0.9105 + 0.7117i | 0.9949 + 0.7304i | 0.9857 + 0.7145i |
| 18.5 | 0.8704 + 0.5043i | 0.8654 + 0.5000i | 1.0065 + 0.4878i | 1.0003 + 0.4846i | 0.9128 + 0.6119i | 0.9005 + 0.5846i | 0.9747 + 0.5858i | 0.9613 + 0.5607i |
| 19 | 0.8765 + 0.4892i | 0.8730 + 0.4887i | 0.9349 + 0.4870i | 0.9235 + 0.4705i | 0.9282 + 0.6231i | 0.9148 + 0.5935i | 0.9892 + 0.5958i | 0.9748 + 0.5681i |
| 19.5 | 0.8808 + 0.4836i | 0.8815 + 0.4863i | 0.9433 + 0.4700i | 0.9333 + 0.4705i | 0.9477 + 0.6399i | 0.9358 + 0.6096i | 1.0163 + 0.6040i | 1.0042 + 0.5748i |
| 20 | 0.9244 + 0.6479i | 0.9228 + 0.6565i | 0.9430 + 0.4595i | 0.9439 + 0.4628i | 0.8720 + 0.8422i | 0.8881 + 0.8007i | 0.9559 + 0.8772i | 0.9855 + 0.8360i |
| 20.5 | 0.9209 + 0.5357i | 0.9236 + 0.5467i | 1.0425 + 0.6633i | 1.0275 + 0.6768i | 0.9508 + 0.7322i | 0.9459 + 0.6833i | 1.0638 + 0.7179i | 1.0587 + 0.6626i |
| 21 | 0.8951 + 0.5626i | 0.8918 + 0.5686i | 1.0273 + 0.5058i | 1.0294 + 0.5208i | 0.9006 + 0.7223i | 0.8935 + 0.7037i | 1.0274 + 0.7211i | 1.0515 + 0.6813i |
| 21.5 | 0.9072 + 0.5886i | 0.9097 + 0.5885i | 0.9979 + 0.5557i | 1.0380 + 0.5582i | 0.9006 + 0.7408i | 0.8935 + 0.7037i | 1.0274 + 0.7211i | 1.0526 + 0.7376i |
| 22 | 0.8945 + 0.5666i | 0.8829 + 0.5760i | 1.0628 + 0.5901i | 1.0458 + 0.5901i | 0.8985 + 0.7503i | 0.9006 + 0.7408i | 1.0446 + 0.7454i | 1.0444 + 0.7361i |
| 22.5 | 0.8932 + 0.5737i | 0.9001 + 0.5987i | 1.0106 + 0.5766i | 1.0532 + 0.5907i | 0.8774 + 0.7307i | 0.8698 + 0.6919i | 0.9792 + 0.7557i | 1.0312 + 0.7129i |
| 23 | 0.8951 + 0.5381i | 0.9020 + 0.5765i | 1.0483 + 0.5684i | 1.0223 + 0.6001i | 0.9017 + 0.7879i | 0.9044 + 0.7215i | 1.0636 + 0.7751i | 1.0312 + 0.7129i |
| 23.5 | 0.8979 + 0.5389i | 0.9021 + 0.5899i | 1.0480 + 0.5500i | 1.0052 + 0.5823i | 0.9122 + 0.8113i | 0.8977 + 0.7054i | 1.0333 + 0.7739i | 0.9929 + 0.6944i |
| 24 | 0.8946 + 0.5174i | 0.8865 + 0.5769i | 1.0570 + 0.5654i | 1.0095 + 0.5968i | 0.8981 + 0.7978i | 0.9002 + 0.7040i | 1.0453 + 0.7856i | 1.0004 + 0.7110i |
| 24.5 | 1.0545 + 0.6208i | 0.8992 + 0.5849i | 0.9939 + 0.5769i | 1.0334 + 0.5527i | 0.8883 + 0.7796i | 0.8934 + 0.6762i | 0.9999 + 0.7892i | 1.0024 + 0.6743i |
| 25 | 0.8835 + 0.5791i | 0.8749 + 0.6592i | 1.0410 + 0.5398i | 0.9570 + 0.5335i | 1.0118 + 0.6978i | 0.9039 + 0.7061i | 1.0649 + 0.7904i | 0.9378 + 0.8081i |
| 25.5 | 0.9398 + 0.5123i | 0.9446 + 0.5967i | 1.0400 + 0.6364i | 0.9662 + 0.6804i | 1.1689 + 0.7806i | 0.8574 + 0.7588i | 1.0682 + 0.7758i | 0.9493 + 0.7863i |
| 26 | 1.0266 + 0.5732i | 0.9271 + 0.6038i | 1.0491 + 0.4947i | 1.0814 + 0.5792i | 0.9376 + 0.7957i | 0.9469 + 0.6888i | 1.0478 + 0.7966i | 1.0645 + 0.6841i |
| 26.5 | 1.0181 + 0.6445i | 0.9222 + 0.6468i | 1.0759 + 0.6038i | 1.0128 + 0.6524i | 1.0128 + 0.7985i | 0.9004 + 0.8291i | 1.0612 + 0.7235i | 0.9050 + 0.7337i |
| 27 | 1.0119 + 0.5802i | 0.9632 + 0.6574i | 1.0522 + 0.5581i | 1.0366 + 0.5502i | 1.0179 + 0.7432i | 0.9097 + 0.7340i | 1.1323 + 0.7123i | 0.9024 + 0.8172i |
| 27.5 | 1.1048 + 0.5047i | 0.9732 + 0.6687i | 1.1374 + 0.5920i | 1.0660 + 0.6825i | 1.0530 + 0.8275i | 0.9525 + 0.7602i | 1.1564 + 0.8642i | 0.9247 + 0.8497i |
| 28 | 1.0788 + 0.4957i | 0.9727 + 0.6831i | 1.1360 + 0.5830i | 1.0261 + 0.6028i | 1.0261 + 0.7823i | 0.9559 + 0.7668i | 1.1523 + 0.8406i | 0.9478 + 0.8579i |
| | | | 1.1083 + 0.5853i | 1.0158 + 0.6073i | 1.0912 + 0.7187i | 0.9908 + 0.7740i | 1.0145 + 0.8889i | 0.9211 + 0.9015i |

| SNR/w | w32 | w33 | w34 | w35 | w36 | w37 | w38 | w39 |
|---|---|---|---|---|---|---|---|---|
| 7 | 0.6835 + 1.2113i | 0.6204 + 1.1270i | 0.3795 + 1.3687i | 0.3664 + 1.2525i | 0.6203 + 1.1270i | 0.5879 + 1.0808i | 0.3664 + 1.2525i | 0.3587 + 1.1911i |
| 7.5 | 0.6864 + 1.1545i | 0.7102 + 1.1841i | 0.3338 + 1.3127i | 0.3392 + 1.3453i | 0.6159 + 1.0673i | 0.6313 + 1.0869i | 0.3224 + 1.1989i | 0.3261 + 1.2220i |
| 8 | 0.3037 + 1.2548i | 0.3062 + 1.2797i | 0.3046 + 1.2545i | 0.3069 + 1.2755i | 0.6706 + 1.1025i | 0.6866 + 1.1224i | 0.6711 + 1.1037i | 0.6847 + 1.1207i |
| 8.5 | 0.2954 + 1.3376i | 0.2962 + 1.3512i | 0.2948 + 1.3339i | 0.2954 + 1.3453i | 0.7418 + 1.1680i | 0.7489 + 1.1636i | 0.7382 + 1.1636i | 0.7444 + 1.1710i |
| 9 | 1.7494 + 1.1716i | 1.3082 + 0.8629i | 1.3087 + 0.8633i | 1.2187 + 0.7952i | 1.3091 + 0.8635i | 1.2189 + 0.7953i | 1.2192 + 0.7955i | 1.1765 + 0.7622i |
| 9.5 | 1.7496 + 1.1695i | 1.3032 + 0.8657i | 1.3031 + 0.8657i | 1.2261 + 0.8104i | 1.3033 + 0.8658i | 1.2262 + 0.8104i | 1.2262 + 0.8104i | 1.1893 + 0.7835i |
| 10 | 1.7476 + 1.1668i | 1.2961 + 0.8646i | 1.2969 + 0.8652i | 1.2275 + 0.8181i | 1.2975 + 0.8657i | 1.2278 + 0.8184i | 1.2281 + 0.8186i | 1.1943 + 0.7959i |
| 10.5 | 1.6826 + 1.1762i | 1.2429 + 0.8264i | 1.3288 + 0.9046i | 1.2059 + 0.8177i | 1.2989 + 0.8614i | 1.2092 + 0.8003i | 1.2414 + 0.8429i | 1.1844 + 0.8008i |
| 11 | 2.0079 + 0.9846i | 0.2028 + 0.9887i | 0.2046 + 0.9839i | 0.1995 + 0.9882i | 1.2089 + 0.9774i | 0.2039 + 0.9814i | 0.2058 + 0.9768i | 0.2007 + 0.9808i |
| 11.5 | 0.1983 + 0.9853i | 0.1940 + 0.9896i | 0.1941 + 0.9849i | 0.1898 + 0.9894i | 0.1989 + 0.9775i | 0.1948 + 0.9815i | 0.1949 + 0.9770i | 0.1907 + 0.9812i |
| 12 | 0.1883 + 0.9853i | 0.1849 + 0.9901i | 0.1835 + 0.9853i | 0.1800 + 0.9903i | 0.1884 + 0.9766i | 0.1851 + 0.9765i | 0.1838 + 0.9765i | 0.1805 + 0.9811i |
| 12.5 | 0.1864 + 0.9764i | 0.1864 + 1.0756i | 0.2003 + 1.0451i | 0.2041 + 1.0451i | 0.2395 + 1.1251i | 0.2451 + 1.0860i | 0.2534 + 1.0860i | 0.2585 + 1.0875i |
| 13 | 1.0982 + 1.2299i | 0.1903 + 1.2296i | 0.1143 + 1.0869i | 0.1260 + 1.1004i | 0.9778 + 0.9583i | 0.9878 + 0.9497i | 0.9914 + 0.9513i | 1.0052 + 0.9448i |
| 13.5 | 0.2030 + 1.0880i | 0.2154 + 1.0859i | 0.2138 + 1.0537i | 0.2250 + 1.0529i | 0.2944 + 1.1170i | 0.3111 + 1.1204i | 0.2945 + 1.0775i | 0.3096 + 1.0814i |
| 14 | 0.1507 + 1.1097i | 0.1370 + 1.1488i | 0.1650 + 1.0556i | 0.1555 + 1.0747i | 0.3110 + 1.0766i | 0.2991 + 1.0944i | 0.3119 + 1.0405i | 0.3040 + 1.0500i |
| 14.5 | 0.1438 + 1.1317i | 0.1293 + 1.1850i | 0.1497 + 1.0731i | 0.1409 + 1.0970i | 0.3432 + 1.0802i | 0.3308 + 1.0965i | 0.3314 + 1.0407i | 0.3232 + 1.0484i |
| 15 | 0.1591 + 1.5394i | 0.4955 + 1.3775i | 0.2019 + 1.5174i | 0.4551 + 1.3944i | 0.6287 + 0.9915i | 0.6163 + 1.0795i | 0.6331 + 0.9823i | 0.6182 + 1.0532i |
| 15.5 | 0.1274 + 1.6424i | 0.2983 + 1.5080i | 0.1465 + 1.6140i | 0.3069 + 1.5179i | 0.6479 + 0.9759i | 0.6526 + 0.9954i | 0.6489 + 0.9761i | 0.6538 + 0.9966i |
| 16 | 0.3712 + 1.7894i | 0.5775 + 1.3833i | 0.5311 + 1.7286i | 0.5825 + 1.4596i | 0.6562 + 0.9352i | 0.6470 + 0.9934i | 0.6707 + 0.9278i | 0.6627 + 0.9719i |
| 16.5 | 0.9790 + 1.7611i | 0.5672 + 1.2054i | 0.6550 + 1.8625i | 0.5592 + 1.2030i | 0.5766 + 0.9151i | 0.5741 + 0.9762i | 0.5687 + 0.9166i | 0.5658 + 0.9799i |
| 17 | 0.9719 + 1.7576i | 0.5678 + 1.2044i | 0.6484 + 1.8669i | 0.5586 + 1.2028i | 0.5747 + 0.9113i | 0.5737 + 0.9748i | 0.5668 + 0.9128i | 0.5650 + 0.9788i |
| 17.5 | 0.9596 + 1.7576i | 0.5677 + 1.2015i | 0.6359 + 1.8638i | 0.5578 + 1.2010i | 0.5718 + 0.9078i | 0.5724 + 0.9746i | 0.5647 + 0.9090i | 0.5640 + 0.9785i |
| 18 | 0.9565 + 1.7467i | 0.5644 + 1.1965i | 0.6376 + 1.8550i | 0.5550 + 1.1981i | 0.5651 + 0.9077i | 0.5671 + 0.9783i | 0.5602 + 0.9083i | 0.5605 + 0.9806i |
| 18.5 | 0.8180 + 1.4853i | 0.7467 + 1.2574i | 0.8969 + 1.7495i | 0.7299 + 1.1971i | 0.6477 + 0.9216i | 0.6665 + 0.9821i | 0.6516 + 0.9280i | 0.6737 + 1.0037i |
| 19 | 0.8131 + 1.4757i | 0.7498 + 1.2637i | 0.8853 + 1.7279i | 0.7348 + 1.1948i | 0.6599 + 0.9186i | 0.6785 + 0.9845i | 0.6650 + 0.9244i | 0.6873 + 1.0091i |

-continued

| SNR/w | w40 | w41 | w42 | w43 | w44 | w45 | w46 | w47 |
|---|---|---|---|---|---|---|---|---|
| 19.5 | 0.8222 + 1.7689i | 0.7329 + 1.2092i | 0.7753 + 1.4943i | 0.7495 + 1.2497i | 0.6731 + 0.9265i | 0.6933 + 1.0214i | 0.6787 + 0.9226i | 0.7019 + 1.0061i |
| 20 | 0.5491 + 1.7035i | 0.4164 + 1.1274i | 0.3416 + 1.3191i | 0.4000 + 1.1739i | 0.4975 + 0.8965i | 0.4710 + 0.9777i | 0.5048 + 0.8943i | 0.4812 + 0.9644i |
| 20.5 | 0.5496 + 1.8328i | 0.5969 + 1.1973iu | 0.5741 + 1.4423i | 0.6003 + 1.2412i | 0.6091 + 0.9159i | 0.6053 + 1.0278i | 0.6219 + 0.9146i | 0.6226 + 1.0166i |
| 21 | 0.5908 + 1.4191i | 0.6104 + 1.2522i | 0.4486 + 1.8391i | 0.6140 + 1.1673i | 0.5750 + 0.8994i | 0.5844 + 1.0085i | 0.5807 + 0.8966i | 0.5989 + 1.0386i |
| 21.5 | 0.5651 + 1.6424i | 0.5819 + 1.1504i | 0.5713 + 1.4458i | 0.5849 + 1.2696i | 0.5230 + 0.8818i | 0.5536 + 1.0212i | 0.5383 + 0.8832i | 0.5512 + 0.9689i |
| 22 | 0.6243 + 1.4649i | 0.5939 + 1.3037i | 0.4047 + 1.8156i | 0.5830 + 1.2010i | 0.5615 + 0.9026i | 0.5564 + 1.0225i | 0.5767 + 0.8978i | 0.5732 + 1.0495i |
| 22.5 | 0.6526 + 1.7382i | 0.5201 + 1.1584i | 0.5875 + 1.5167i | 0.5606 + 1.2579i | 0.5384 + 0.8854i | 0.5343 + 1.0408i | 0.5671 + 0.8932i | 0.5685 + 1.0088i |
| 23 | 0.6244 + 1.6853i | 0.5396 + 1.1646i | 0.5897 + 1.4912i | 0.5627 + 1.2896i | 0.5300 + 0.8893i | 0.5385 + 1.0557i | 0.5662 + 0.9004i | 0.5719 + 1.0071i |
| 23.5 | 0.5088 + 1.7163i | 0.5473 + 1.1551i | 0.5636 + 1.4803i | 0.5544 + 1.2433i | 0.5327 + 0.8892i | 0.5348 + 1.0466i | 0.5758 + 0.8987i | 0.5771 + 1.0111i |
| 24 | 0.6364 + 1.6355i | 0.5959 + 1.1661i | 0.6239 + 1.4562i | 0.6065 + 1.3009i | 0.5237 + 0.8675i | 0.5685 + 1.0623i | 0.5644 + 0.8873i | 0.5725 + 0.9911i |
| 24.5 | 0.6032 + 1.6635i | 0.5024 + 1.1613i | 0.6020 + 1.2960i | 0.5939 + 1.1667i | 0.5099 + 0.9139i | 0.5036 + 1.0359i | 0.5855 + 0.9120i | 0.5903 + 1.0334i |
| 25 | 0.6389 + 1.6446i | 0.4853 + 1.1426i | 0.5804 + 1.3364i | 0.5604 + 1.2030i | 0.4874 + 0.9257i | 0.4845 + 1.0420i | 0.5645 + 0.9258i | 0.5744 + 1.0392i |
| 25.5 | 0.5812 + 1.5932i | 0.5105 + 1.2487i | 0.5473 + 1.4117i | 0.5765 + 1.1450i | 0.5751 + 0.8885i | 0.5696 + 0.9833i | 0.6604 + 0.8996i | 0.6267 + 1.0328i |
| 26 | 0.4991 + 1.5686i | 0.5486 + 1.1925i | 0.6897 + 1.1182i | 0.6481 + 1.2195i | 0.6050 + 0.9119i | 0.5370 + 0.9447i | 0.6526 + 1.0254i | 0.5772 + 1.0462i |
| 26.5 | 0.5345 + 1.6138i | 0.5130 + 1.1337i | 0.6387 + 1.0936i | 0.5568 + 1.2390i | 0.6269 + 0.8981i | 0.4851 + 1.0350i | 0.6143 + 0.9936i | 0.5184 + 0.9539i |
| 27 | 0.4015 + 1.5842i | 0.5558 + 1.2016i | 0.6111 + 1.3403i | 0.6382 + 1.1360i | 0.5330 + 0.8941i | 0.4820 + 1.1330i | 0.6037 + 0.9226i | 0.6160 + 1.0341i |
| 27.5 | 0.4096 + 1.5974i | 0.5213 + 1.2084i | 0.5614 + 1.3474i | 0.6135 + 1.1429i | 0.5637 + 0.8891i | 0.4831 + 1.1158i | 0.6283 + 0.9257i | 0.6504 + 1.0330i |
| 28 | 0.4374 + 1.5965i | 0.6091 + 1.1608i | 0.5915 + 1.3566i | 0.6593 + 1.2473i | 0.5376 + 0.9041i | 0.6008 + 1.0615i | 0.6254 + 0.8954i | 0.6315 + 0.9789i |

| SNR/w | w40 | w41 | w42 | w43 | w44 | w45 | w46 | w47 |
|---|---|---|---|---|---|---|---|---|
| 7 | 0.6203 + 1.1270i | 0.5879 + 1.0808i | 0.3664 + 1.2525i | 0.3587 + 1.1912i | 0.5879 + 1.0807i | 0.5665 + 1.0491i | 0.3587 + 1.1911i | 0.3534 + 1.1500i |
| 7.5 | 0.6160 + 1.0677i | 0.6315 + 1.0874i | 0.3223 + 1.1997i | 0.3260 + 1.2229i | 0.5810 + 1.0235i | 0.5919 + 1.0373i | 0.3162 + 1.1419i | 0.3190 + 1.1584i |
| 8 | 0.2943 + 1.1465i | 0.2957 + 1.1612i | 0.2954 + 1.1530i | 0.2968 + 1.1673i | 0.5999 + 1.0174i | 0.6092 + 1.0233i | 0.6043 + 1.0233i | 0.6134 + 1.0347i |
| 8.5 | 0.2747 + 1.0937i | 0.2752 + 1.1032i | 0.2752 + 1.1025i | 0.2758 + 1.1122i | 0.5786 + 0.9704i | 0.5847 + 0.9776i | 0.5841 + 0.9772i | 0.5903 + 0.9846i |
| 9 | 1.3089 + 0.8634i | 1.2188 + 0.7952i | 1.2191 + 0.7955i | 1.1764 + 0.7622i | 1.2192 + 0.7956i | 1.1765 + 0.7622i | 1.1767 + 0.7624i | 1.1499 + 0.7411i |
| 9.5 | 1.3032 + 0.8658i | 1.2262 + 0.8104i | 1.2261 + 0.8104i | 1.1892 + 0.7834i | 1.2262 + 0.8104i | 1.1893 + 0.7835i | 1.1893 + 0.7835i | 1.1658 + 0.7663i |
| 10 | 1.2966 + 0.8649i | 1.2274 + 0.8180i | 1.2277 + 0.8183i | 1.1940 + 0.7957i | 1.1940 + 0.7957i | 1.1893 + 0.7960i | 1.1945 + 0.7960i | 1.1727 + 0.7818i |
| 10.5 | 1.2665 + 0.8425i | 1.1992 + 0.7876i | 1.2229 + 0.8291i | 1.2229 + 0.8291i | 1.2229 + 0.8074i | 1.1824 + 0.7747i | 1.1947 + 0.8072i | 1.1643 + 0.7799i |
| 11 | 0.1971 + 1.0824i | 0.1920 + 1.0893i | 0.1912 + 1.0832i | 0.1860 + 1.0904i | 0.2002 + 1.0699i | 0.1951 + 1.0767i | 0.1946 + 1.0701i | 0.1895 + 1.0773i |
| 11.5 | 0.1936 + 1.0812i | 0.1890 + 1.0890i | 0.1859 + 1.0826i | 0.1812 + 1.0908i | 0.1962 + 1.0666i | 0.1917 + 1.0742i | 0.1891 + 1.0672i | 0.1845 + 1.0752i |
| 12 | 0.1904 + 1.0795i | 0.1862 + 1.0890i | 0.1813 + 1.0815i | 0.1769 + 1.0917i | 0.1919 + 1.0626i | 0.1879 + 1.0716i | 0.1837 + 1.0637i | 0.1795 + 1.0733i |
| 12.5 | 0.1643 + 1.0711i | 0.1682 + 1.1053i | 0.1824 + 1.0628i | 0.1862 + 1.0620i | 0.2100 + 1.1615i | 0.2160 + 1.1605i | 0.2315 + 1.1050i | 0.2369 + 1.1057i |
| 13 | 1.1162 + 0.8112i | 1.1363 + 0.8076i | 1.1613 + 0.8196i | 1.1853 + 0.8237i | 1.0174 + 0.8429i | 1.0343 + 0.8324i | 1.0414 + 0.8399i | 1.0615 + 0.8309i |
| 13.5 | 0.1433 + 1.1627i | 0.1554 + 1.1547i | 0.1635 + 1.0951i | 0.1741 + 1.0907i | 0.2210 + 1.1755i | 0.2398 + 1.1721i | 0.2368 + 1.1062i | 0.2536 + 1.1058i |
| 14 | 0.1510 + 1.1811i | 0.1370 + 1.1616i | 0.1653 + 1.0597i | 0.1557 + 1.0801i | 0.3126 + 1.0849i | 0.2999 + 1.1047i | 0.3139 + 1.0462i | 0.3057 + 1.0565i |
| 14.5 | 0.1460 + 1.1337i | 0.1319 + 1.1905i | 0.1508 + 1.0737i | 0.1424 + 1.0978i | 0.3453 + 1.0858i | 0.3322 + 1.1034i | 0.3333 + 1.0446i | 0.3248 + 1.0526i |
| 15 | 0.1729 + 1.6258i | 0.5301 + 1.4133i | 0.2360 + 1.5834i | 0.4835 + 1.4383i | 0.6562 + 0.9931i | 0.6402 + 1.0789i | 0.6619 + 0.9836i | 0.6440 + 1.0511i |
| 15.5 | 0.1783 + 2.0138i | 0.4786 + 1.4270i | 0.4591 + 1.9026i | 0.4793 + 1.4490i | 0.6139 + 1.0570i | 0.6090 + 1.1376i | 0.6160 + 1.0557i | 0.6117 + 1.1323i |
| 16 | 0.1615 + 1.9642i | 0.6491 + 1.3361i | 0.8166 + 1.8585i | 0.6677 + 1.3884i | 0.6678 + 0.9640i | 0.6648 + 1.0542i | 0.6824 + 0.9524i | 0.6765 + 1.0248i |
| 16.5 | 0.7602 + 1.4834i | 0.6457 + 1.2464i | 0.6704 + 1.5226i | 0.6234 + 1.2436i | 0.6648 + 0.9147i | 0.6592 + 0.9690i | 0.6474 + 0.9162i | 0.6428 + 0.9734i |
| 17 | 0.7674 + 1.4916i | 0.6480 + 1.2445i | 0.6589 + 1.5275i | 0.6222 + 1.2437i | 0.6691 + 0.9104i | 0.6658 + 0.9655i | 0.6484 + 0.9120i | 0.6467 + 0.9704i |
| 17.5 | 0.7728 + 1.4984i | 0.6519 + 1.2427i | 0.6465 + 1.5284i | 0.6233 + 1.2445i | 0.6755 + 0.9070i | 0.6746 + 0.9631i | 0.6527 + 0.9083i | 0.6539 + 0.9681i |
| 18 | 0.7831 + 1.4978i | 0.6594 + 1.2395i | 0.6418 + 1.5205i | 0.6278 + 1.2472i | 0.6851 + 0.9061i | 0.6860 + 0.9628i | 0.6615 + 0.9070i | 0.6657 + 0.9671i |
| 18.5 | 1.0099 + 1.3939i | 0.9240 + 1.1657i | 1.1966 + 1.6143i | 0.8847 + 1.1340i | 0.8271 + 0.8592i | 0.8521 + 0.9294i | 0.8128 + 0.8692i | 0.8357 + 0.9478i |
| 19 | 1.0089 + 1.3854i | 0.9317 + 1.1639i | 1.1714 + 1.6030i | 0.8884 + 1.1335i | 0.8416 + 0.8560i | 0.8693 + 0.9355i | 0.8242 + 0.8659i | 0.8475 + 0.9550i |
| 19.5 | 1.0472 + 1.3158i | 0.9601 + 1.1483i | 0.9672 + 1.4659i | 0.9033 + 1.1563i | 0.8620 + 0.8605i | 0.8955 + 0.9529i | 0.8317 + 0.8718i | 0.8608 + 0.9652i |
| 20 | 0.5008 + 1.4978i | 0.5599 + 1.2077i | 0.4017 + 1.3861i | 0.4910 + 1.2146i | 0.6741 + 0.9583i | 0.6244 + 1.0551i | 0.6448 + 0.9428i | 0.6008 + 1.0207i |
| 20.5 | 0.8136 + 1.4139i | 0.8016 + 1.2232i | 0.6965 + 1.5705i | 0.7525 + 1.2015i | 0.8142 + 0.9002i | 0.8183 + 1.0236i | 0.7650 + 0.9052i | 0.7689 + 1.0279i |
| 21 | 0.7412 + 1.4650i | 0.7761 + 1.2729i | 0.6892 + 1.6914i | 0.7846 + 1.1451i | 0.7382 + 0.8775i | 0.7685 + 0.9477i | 0.7062 + 0.8840i | 0.7561 + 1.0136i |
| 21.5 | 0.7899 + 1.6946i | 0.7179 + 1.3320i | 0.7344 + 1.4506i | 0.7296 + 1.2738i | 0.7376 + 0.9029i | 0.7043 + 0.9821i | 0.6765 + 0.8832i | 0.6698 + 0.9341i |
| 22 | 0.7843 + 1.4333i | 0.7705 + 1.2498i | 0.7026 + 1.7278i | 0.7003 + 1.1772i | 0.7420 + 0.8972i | 0.7590 + 1.0320i | 0.7021 + 0.8941i | 0.7000 + 1.0561i |
| 22.5 | 0.7634 + 1.3802i | 0.7514 + 1.1770i | 0.8230 + 1.5535i | 0.6680 + 1.2094i | 0.7721 + 0.9026i | 0.7530 + 1.0356i | 0.6926 + 0.8983i | 0.6827 + 1.0183i |

-continued

| SNR | w48 | w49 | w50 | w51 | w52 | w53 | w54 | w55 |
|---|---|---|---|---|---|---|---|---|
| 23 | 0.7407 + 1.4100i | 0.7168 + 1.1622i | 0.8274 + 1.5617i | 0.6629 + 1.2434i | 0.7852 + 0.9095i | 0.7666 + 1.0370i | 0.6839 + 0.9095i | 0.6837 + 1.0019i |
| 23.5 | 0.6960 + 1.6848i | 0.7272 + 1.1865i | 0.7086 + 1.4468i | 0.6649 + 1.2963i | 0.7845 + 0.9168i | 0.7512 + 1.0593i | 0.6918 + 0.9051i | 0.6794 + 1.0148i |
| 24 | 0.8824 + 1.6271i | 0.7310 + 1.1523i | 0.7840 + 1.4334i | 0.7347 + 1.2858i | 0.7779 + 0.8837i | 0.7423 + 1.0272i | 0.6821 + 0.8793i | 0.6766 + 0.9745i |
| 24.5 | 0.6380 + 1.4769i | 0.8075 + 1.1341i | 0.7223 + 1.3126i | 0.7056 + 1.1575i | 0.7675 + 0.8980i | 0.7992 + 1.0027i | 0.6777 + 0.9081i | 0.6881 + 1.0255i |
| 25 | 0.6810 + 1.4782i | 0.7864 + 1.1315i | 0.7113 + 1.3095i | 0.6760 + 1.1703i | 0.7607 + 0.9150i | 0.7845 + 1.0125i | 0.6564 + 0.9256i | 0.6660 + 1.0394i |
| 25.5 | 0.7834 + 1.3291i | 0.7989 + 1.1836i | 0.6886 + 1.3212i | 0.6790 + 1.1822i | 0.8334 + 0.9240i | 0.8389 + 1.0490i | 0.7408 + 0.9196i | 0.7235 + 1.0449i |
| 26 | 0.6326 + 1.5030i | 0.8468 + 1.1407i | 0.7209 + 1.3784i | 0.7653 + 1.2445i | 0.6935 + 0.8959i | 0.8740 + 1.0322i | 0.7256 + 0.9768i | 0.8038 + 0.9722i |
| 26.5 | 0.6623 + 1.5103i | 0.7938 + 1.1419i | 0.6742 + 1.3558i | 0.6837 + 1.2238i | 0.7039 + 0.8883i | 0.8594 + 1.0384i | 0.7255 + 0.9867i | 0.8205 + 0.9417i |
| 27 | 0.6819 + 1.4965i | 0.7875 + 1.1320i | 0.7367 + 1.3484i | 0.7100 + 1.2226i | 0.7563 + 0.9153i | 0.7455 + 1.0248i | 0.6815 + 0.9082i | 0.8338 + 1.0015i |
| 27.5 | 0.6106 + 1.5039i | 0.7463 + 1.1465i | 0.6780 + 1.3719i | 0.6672 + 1.2405i | 0.7683 + 0.9391i | 0.7867 + 1.0395i | 0.7004 + 0.9076i | 0.8788 + 0.9640i |
| 28 | 0.6738 + 1.4981i | 0.7958 + 1.1175i | 0.7244 + 1.3669i | 0.7701 + 1.2287i | 0.7924 + 0.8491i | 0.7061 + 1.0819i | 0.7163 + 0.8855i | 0.7346 + 0.9830i |

| SNR/w | w48 | w49 | w50 | w51 | w52 | w53 | w54 | w55 |
|---|---|---|---|---|---|---|---|---|
| 7 | 0.6204 + 1.1271i | 0.5879 + 1.0808i | 0.3664 + 1.2526i | 0.3587 + 1.1912i | 0.5879 + 1.0808i | 0.5666 + 1.0491i | 0.3587 + 1.1912i | 0.3534 + 1.1500i |
| 7.5 | 0.6153 + 1.0667i | 0.6308 + 1.0863i | 0.3222 + 1.1984i | 0.3259 + 1.2214i | 0.5806 + 1.0228i | 0.5914 + 1.0366i | 0.3162 + 1.1410i | 0.3190 + 1.1575i |
| 8 | 0.2943 + 1.1464i | 0.2957 + 1.1611i | 0.2954 + 1.1529i | 0.2968 + 1.1672i | 0.5998 + 1.0173i | 0.6092 + 1.0290i | 0.6043 + 1.0233i | 0.6134 + 1.0346i |
| 8.5 | 0.2867 + 1.2312i | 0.2877 + 1.2451i | 0.2872 + 1.2391i | 0.2881 + 1.2518i | 0.6707 + 1.0818i | 0.6793 + 1.0922i | 0.6753 + 1.0878i | 0.6832 + 1.0973i |
| 9 | 0.9244 + 0.5517i | 0.9293 + 0.5555i | 0.9293 + 0.5555i | 0.9338 + 0.5590i | 0.9293 + 0.5555i | 0.9338 + 0.5590i | 0.9338 + 0.5590i | 0.9380 + 0.5622i |
| 9.5 | 0.8986 + 0.5373i | 0.9058 + 0.5435i | 0.9058 + 0.5435i | 0.9128 + 0.5495i | 0.9058 + 0.5435i | 0.9128 + 0.5495i | 0.9128 + 0.5495i | 0.9194 + 0.5553i |
| 10 | 0.8822 + 0.5326i | 0.8901 + 0.5398i | 0.8900 + 0.5397i | 0.8979 + 0.5470i | 0.8900 + 0.5397i | 0.8978 + 0.5469i | 0.8978 + 0.5469i | 0.9055 + 0.5540i |
| 10.5 | 0.8706 + 0.5312i | 0.8842 + 0.5378i | 0.8702 + 0.5417i | 0.8835 + 0.5489i | 0.8769 + 0.5397i | 0.8907 + 0.5465i | 0.8765 + 0.5507i | 0.8899 + 0.5579i |
| 11 | 0.5026 + 0.8978i | 0.4941 + 0.8976i | 0.5065 + 0.8934i | 0.4979 + 0.8932i | 0.4989 + 0.8945i | 0.4904 + 0.8943i | 0.5028 + 0.8903i | 0.4942 + 0.8900i |
| 11.5 | 0.5122 + 0.8890i | 0.5030 + 0.8878i | 0.5184 + 0.8786i | 0.5090 + 0.8825i | 0.5072 + 0.8849i | 0.4980 + 0.8837i | 0.5133 + 0.8799i | 0.5039 + 0.8786i |
| 12 | 0.5187 + 0.8834i | 0.5076 + 0.8808i | 0.5284 + 0.8755i | 0.5170 + 0.8757i | 0.5120 + 0.8775i | 0.5012 + 0.8751i | 0.5215 + 0.8728i | 0.5103 + 0.8702i |
| 12.5 | 0.5847 + 0.8321i | 0.5825 + 0.8352i | 0.5697 + 0.8346i | 0.5676 + 0.8377i | 0.5817 + 0.8811i | 0.5796 + 0.8851i | 0.5673 + 0.8844i | 0.5656 + 0.8885i |
| 13 | 0.7955 + 0.5977i | 0.7985 + 0.5932i | 0.7986 + 0.5927i | 0.8018 + 0.5881i | 0.7895 + 0.6341i | 0.7914 + 0.6290i | 0.7914 + 0.6296i | 0.7935 + 0.6244i |
| 13.5 | 0.5958 + 0.7962i | 0.5893 + 0.8058i | 0.5891 + 0.7978i | 0.5826 + 0.8075i | 0.5823 + 0.8654i | 0.5773 + 0.8812i | 0.5755 + 0.8650i | 0.5708 + 0.8796i |
| 14 | 0.6515 + 0.7293i | 0.6581 + 0.7301i | 0.6487 + 0.7301i | 0.6554 + 0.7307i | 0.5957 + 0.8221i | 0.6027 + 0.8184i | 0.5914 + 0.8240i | 0.5985 + 0.8202i |
| 14.5 | 0.6587 + 0.7155i | 0.6637 + 0.7163i | 0.6571 + 0.7139i | 0.6620 + 0.7147i | 0.5931 + 0.8332i | 0.5997 + 0.8272i | 0.5902 + 0.8270i | 0.5968 + 0.8214i |
| 15 | 0.6531 + 0.5959i | 0.6533 + 0.5868i | 0.6502 + 0.5989i | 0.6502 + 0.5896i | 0.6562 + 0.6802i | 0.6542 + 0.6594i | 0.6557 + 0.6872i | 0.6530 + 0.6659i |
| 15.5 | 0.6542 + 0.6077i | 0.6559 + 0.6047i | 0.6499 + 0.6083i | 0.6513 + 0.6053i | 0.6764 + 0.7184i | 0.6806 + 0.7137i | 0.6731 + 0.7191i | 0.6772 + 0.7144i |
| 16 | 0.6307 + 0.5825i | 0.6305 + 0.5747i | 0.6274 + 0.5867i | 0.6268 + 0.5784i | 0.6495 + 0.6734i | 0.6474 + 0.6572i | 0.6513 + 0.6860i | 0.6482 + 0.6672i |
| 16.5 | 0.5909 + 0.5917i | 0.5916 + 0.5842i | 0.5820 + 0.5912i | 0.5827 + 0.5836i | 0.5877 + 0.6823i | 0.5895 + 0.6640i | 0.5792 + 0.6809i | 0.5808 + 0.6625i |
| 17 | 0.5877 + 0.5886i | 0.5884 + 0.5811i | 0.5791 + 0.5880i | 0.5796 + 0.5806i | 0.5843 + 0.6880i | 0.5864 + 0.6670i | 0.5761 + 0.6862i | 0.5778 + 0.6651i |
| 17.5 | 0.5824 + 0.5832i | 0.5829 + 0.5768i | 0.5759 + 0.5827i | 0.5762 + 0.5764i | 0.5789 + 0.6948i | 0.5810 + 0.6720i | 0.5725 + 0.6928i | 0.5743 + 0.6699i |
| 18 | 0.5734 + 0.5756i | 0.5735 + 0.5717i | 0.5703 + 0.5755i | 0.5703 + 0.5716i | 0.5699 + 0.7062i | 0.5716 + 0.6838i | 0.5664 + 0.7047i | 0.5682 + 0.6825i |
| 18.5 | 0.5566 + 0.5936i | 0.5568 + 0.5935i | 0.5545 + 0.5939i | 0.5548 + 0.5938i | 0.5982 + 0.7556i | 0.5920 + 0.7348i | 0.5976 + 0.7525i | 0.5911 + 0.7320i |
| 19 | 0.5628 + 0.5887i | 0.5635 + 0.5906i | 0.5627 + 0.5866i | 0.5635 + 0.5904i | 0.6120 + 0.7579i | 0.6043 + 0.7344i | 0.6128 + 0.7543i | 0.6049 + 0.7314i |
| 19.5 | 0.5692 + 0.5900i | 0.5707 + 0.5939i | 0.5712 + 0.5892i | 0.5727 + 0.5931i | 0.6245 + 0.7629i | 0.6152 + 0.7353i | 0.6285 + 0.7642i | 0.6188 + 0.7360i |
| 20 | 0.5790 + 0.5737i | 0.5786 + 0.5781i | 0.5859 + 0.5748i | 0.5854 + 0.5793i | 0.5393 + 0.7435i | 0.5457 + 0.7195i | 0.5448 + 0.7480i | 0.5513 + 0.7232i |
| 20.5 | 0.5770 + 0.5784i | 0.5781 + 0.5863i | 0.5862 + 0.5779i | 0.5875 + 0.5859i | 0.5961 + 0.7637i | 0.5917 + 0.7377i | 0.6075 + 0.7644i | 0.6027 + 0.7266i |
| 21 | 0.5562 + 0.5582i | 0.5558 + 0.5683i | 0.5675 + 0.5585i | 0.5669 + 0.5684i | 0.5616 + 0.7484i | 0.5584 + 0.7484i | 0.5704 + 0.7456i | 0.5682 + 0.7028i |
| 21.5 | 0.5500 + 0.5685i | 0.5490 + 0.5779i | 0.5697 + 0.5701i | 0.5688 + 0.5792i | 0.5331 + 0.7428i | 0.5381 + 0.7428i | 0.5541 + 0.7458i | 0.5596 + 0.7108i |
| 22 | 0.5521 + 0.5488i | 0.5521 + 0.5579i | 0.5703 + 0.5486i | 0.5694 + 0.5705i | 0.5562 + 0.7635i | 0.5539 + 0.6983i | 0.5715 + 0.7633i | 0.5693 + 0.6980i |
| 22.5 | 0.5470 + 0.5571i | 0.5476 + 0.5709i | 0.5738 + 0.5571i | 0.5742 + 0.5796i | 0.5425 + 0.7656i | 0.5443 + 0.7009i | 0.5719 + 0.7641i | 0.5718 + 0.7017i |
| 23 | 0.5438 + 0.5498i | 0.5380 + 0.5928i | 0.5956 + 0.5500i | 0.5895 + 0.5949i | 0.5352 + 0.7741i | 0.5370 + 0.6971i | 0.5807 + 0.7810i | 0.5873 + 0.6984i |
| 23.5 | 0.5420 + 0.5404i | 0.5426 + 0.5844i | 0.5959 + 0.5394i | 0.5992 + 0.5866i | 0.5405 + 0.7778i | 0.5435 + 0.7360i | 0.5859 + 0.7808i | 0.5973 + 0.6934i |
| 24 | 0.5255 + 0.5297i | 0.5242 + 0.5894i | 0.5852 + 0.5291i | 0.5854 + 0.5881i | 0.5232 + 0.7731i | 0.5221 + 0.6867i | 0.5850 + 0.7703i | 0.5860 + 0.6850i |
| 24.5 | 0.5320 + 0.5316i | 0.5261 + 0.6108i | 0.5951 + 0.5356i | 0.5905 + 0.6148i | 0.5146 + 0.8039i | 0.5192 + 0.6825i | 0.5858 + 0.8006i | 0.5865 + 0.7049i |
| 25 | 0.5351 + 0.5313i | 0.5235 + 0.6126i | 0.6088 + 0.5413i | 0.5929 + 0.6237i | 0.4978 + 0.8117i | 0.5101 + 0.7078i | 0.5655 + 0.8168i | 0.5769 + 0.7155i |
| 25.5 | 0.5530 + 0.5469i | 0.5591 + 0.6248i | 0.6363 + 0.5402i | 0.6435 + 0.6188i | 0.5711 + 0.7972i | 0.5652 + 0.7099i | 0.6605 + 0.7964i | 0.6520 + 0.7038i |
| 26 | 0.5591 + 0.5670i | 0.5177 + 0.6201i | 0.6098 + 0.6293i | 0.5253 + 0.6674i | 0.6050 + 0.8173i | 0.5282 + 0.8173i | 0.6187 + 0.7290i | 0.5315 + 0.7314i |

| SNR | w56 | w57 | w58 | w59 | w60 | w61 | w62 | w63 |
|---|---|---|---|---|---|---|---|---|
| 26.5 | 0.5260 + 1.0808i | 0.4902 + 0.6512i | 0.5918 + 0.6233i | 0.5219 + 0.6802i | 0.6218 + 0.8082i | 0.5542 + 0.8063i | 0.6169 + 0.7217i | 0.5205 + 0.7582i |
| 27 | 0.5743 + 0.5517i | 0.6712 + 0.5573i | 0.5951 + 0.5922i | 0.6584 + 0.6238i | 0.5523 + 0.8038i | 0.5626 + 0.7109i | 0.6275 + 0.8020i | 0.6357 + 0.7064i |
| 27.5 | 0.5592 + 0.5829i | 0.7089 + 0.5603i | 0.6120 + 0.5818i | 0.6742 + 0.6278i | 0.5700 + 0.8032i | 0.5742 + 0.7097i | 0.6450 + 0.8012i | 0.6522 + 0.7089i |
| 28 | 0.5735 + 0.5443i | 0.6544 + 0.5617i | 0.5761 + 0.6045i | 0.6223 + 0.6342i | 0.5404 + 0.8158i | 0.5418 + 0.7248i | 0.6162 + 0.8123i | 0.6016 + 0.7162i |

| SNR/w | w56 | w57 | w58 | w59 | w60 | w61 | w62 | w63 |
|---|---|---|---|---|---|---|---|---|
| 7 | 0.5879 + 1.0808i | 0.5666 + 1.0491i | 0.3587 + 1.1912i | 0.3534 + 1.1500i | 0.5665 + 1.0491i | 0.5510 + 1.0255i | 0.3534 + 1.1500i | 0.3494 + 1.1195i |
| 7.5 | 0.5807 + 1.0231i | 0.5915 + 1.0369i | 0.3161 + 1.1415i | 0.3189 + 1.1580i | 0.5583 + 0.9946i | 0.5665 + 1.0051i | 0.3121 + 1.1042i | 0.3143 + 1.1169i |
| 8 | 0.2899 + 1.0940i | 0.2909 + 1.1040i | 0.2908 + 1.1001i | 0.2918 + 1.1101i | 0.5660 + 0.9770i | 0.5723 + 0.9849i | 0.5699 + 0.9822i | 0.5762 + 0.9901i |
| 8.5 | 0.2744 + 1.0784i | 0.2749 + 1.0861i | 0.2748 + 1.0858i | 0.2753 + 1.0936i | 0.5682 + 0.9593i | 0.5732 + 0.9652i | 0.5728 + 0.9651i | 0.5778 + 0.9711i |
| 9 | 0.9293 + 0.5555i | 0.9338 + 0.5590i | 0.9338 + 0.5590i | 0.9380 + 0.5622i | 0.9338 + 0.5590i | 0.9379 + 0.5622i | 0.9380 + 0.5622i | 0.9417 + 0.5651i |
| 9.5 | 0.9058 + 0.5435i | 0.9128 + 0.5495i | 0.9128 + 0.5495i | 0.9194 + 0.5553i | 0.9128 + 0.5495i | 0.9194 + 0.5553i | 0.9194 + 0.5553i | 0.9257 + 0.5609i |
| 10 | 0.8900 + 0.5398i | 0.8979 + 0.5470i | 0.8978 + 0.5469i | 0.9055 + 0.5541i | 0.8978 + 0.5469i | 0.9055 + 0.5540i | 0.9055 + 0.5540i | 0.9130 + 0.5610i |
| 10.5 | 0.8823 + 0.5370i | 0.8962 + 0.5430i | 0.8816 + 0.5479i | 0.8952 + 0.5445i | 0.8888 + 0.5454i | 0.9028 + 0.5515i | 0.8881 + 0.5566i | 0.9016 + 0.5633i |
| 11 | 0.4950 + 0.9372i | 0.4865 + 0.9388i | 0.4990 + 0.9303i | 0.4903 + 0.9317i | 0.4922 + 0.9340i | 0.4836 + 0.9354i | 0.4961 + 0.9271i | 0.4873 + 0.9284i |
| 11.5 | 0.5073 + 0.9274i | 0.4982 + 0.9278i | 0.5136 + 0.9189i | 0.5042 + 0.9189i | 0.5030 + 0.9230i | 0.4939 + 0.9232i | 0.5091 + 0.9146i | 0.4998 + 0.9146i |
| 12 | 0.5134 + 0.9245i | 0.5027 + 0.9234i | 0.5231 + 0.9151i | 0.5120 + 0.9136i | 0.5076 + 0.9175i | 0.4971 + 0.9162i | 0.5170 + 0.9085i | 0.5061 + 0.9069i |
| 12.5 | 0.6120 + 0.8293i | 0.6094 + 0.8320i | 0.5955 + 0.8300i | 0.5930 + 0.8329i | 0.6082 + 0.8737i | 0.6058 + 0.8773i | 0.5922 + 0.8762i | 0.5900 + 0.8800i |
| 13 | 0.8506 + 0.5924i | 0.8558 + 0.5880i | 0.8545 + 0.5876i | 0.8597 + 0.5833i | 0.8353 + 0.6297i | 0.8393 + 0.6244i | 0.8386 + 0.6250i | 0.8427 + 0.6197i |
| 13.5 | 0.6456 + 0.7877i | 0.6381 + 0.7946i | 0.6390 + 0.7872i | 0.6314 + 0.7943i | 0.6332 + 0.8403i | 0.6259 + 0.8523i | 0.6259 + 0.8396i | 0.6187 + 0.8514i |
| 14 | 0.6927 + 0.7417i | 0.7024 + 0.7436i | 0.6898 + 0.7419i | 0.6997 + 0.7436i | 0.6192 + 0.8296i | 0.6280 + 0.8259i | 0.6146 + 0.8311i | 0.6236 + 0.8272i |
| 14.5 | 0.7077 + 0.7312i | 0.7158 + 0.7336i | 0.7059 + 0.7292i | 0.7140 + 0.7315i | 0.6180 + 0.8427i | 0.6269 + 0.8370i | 0.6154 + 0.8364i | 0.6243 + 0.8312i |
| 15 | 0.7180 + 0.5951i | 0.7201 + 0.5858i | 0.7136 + 0.6001i | 0.7153 + 0.5903i | 0.7153 + 0.6820i | 0.7132 + 0.6820i | 0.7120 + 0.6914i | 0.7124 + 0.6683i |
| 15.5 | 0.7069 + 0.5759i | 0.7093 + 0.5744i | 0.6986 + 0.5785i | 0.7011 + 0.5769i | 0.7125 + 0.6432i | 0.7168 + 0.6389i | 0.7063 + 0.6467i | 0.7107 + 0.6424i |
| 16 | 0.6932 + 0.5639i | 0.6946 + 0.5574i | 0.6860 + 0.5707i | 0.6871 + 0.5636i | 0.7000 + 0.6432i | 0.7027 + 0.6248i | 0.6979 + 0.6575i | 0.6996 + 0.6382i |
| 16.5 | 0.6874 + 0.5936i | 0.6890 + 0.5869i | 0.6644 + 0.5933i | 0.6659 + 0.5862i | 0.6823 + 0.6852i | 0.6861 + 0.6689i | 0.6601 + 0.6848i | 0.6638 + 0.6679i |
| 17 | 0.6960 + 0.5906i | 0.6978 + 0.5842i | 0.6692 + 0.5901i | 0.6711 + 0.5834i | 0.6893 + 0.6917i | 0.6941 + 0.6735i | 0.6633 + 0.6909i | 0.6679 + 0.6719i |
| 17.5 | 0.7096 + 0.5857i | 0.7114 + 0.5806i | 0.6816 + 0.5851i | 0.6835 + 0.5797i | 0.6999 + 0.7005i | 0.7059 + 0.6818i | 0.6721 + 0.6991i | 0.6780 + 0.6793i |
| 18 | 0.7224 + 0.5789i | 0.7238 + 0.5763i | 0.6944 + 0.5781i | 0.6957 + 0.5751i | 0.7106 + 0.7122i | 0.7172 + 0.6953i | 0.6817 + 0.7109i | 0.6885 + 0.6928i |
| 18.5 | 0.6934 + 0.5559i | 0.6939 + 0.5539i | 0.6742 + 0.5616i | 0.6748 + 0.5598i | 0.7529 + 0.6939i | 0.7419 + 0.6708i | 0.7368 + 0.6966i | 0.7257 + 0.6775i |
| 19 | 0.7130 + 0.5419i | 0.7146 + 0.5422i | 0.6952 + 0.5481i | 0.6969 + 0.5487i | 0.7762 + 0.6961i | 0.7646 + 0.6708i | 0.7596 + 0.7017i | 0.7481 + 0.6761i |
| 19.5 | 0.7301 + 0.5375i | 0.7318 + 0.5409i | 0.7114 + 0.5438i | 0.7132 + 0.5472i | 0.7983 + 0.7050i | 0.7854 + 0.6754i | 0.7757 + 0.7137i | 0.7639 + 0.6838i |
| 20 | 0.7649 + 0.6161i | 0.7647 + 0.6224i | 0.7285 + 0.6074i | 0.7279 + 0.6136i | 0.7212 + 0.7993i | 0.7274 + 0.7651i | 0.6876 + 0.7938i | 0.6932 + 0.7604i |
| 20.5 | 0.7701 + 0.5595i | 0.7716 + 0.5686i | 0.7311 + 0.5644i | 0.7325 + 0.5733i | 0.7986 + 0.7490i | 0.7922 + 0.7061i | 0.7530 + 0.7531i | 0.7483 + 0.7113i |
| 21 | 0.7488 + 0.5601i | 0.7471 + 0.5674i | 0.7025 + 0.5594i | 0.7018 + 0.5670i | 0.7422 + 0.7346i | 0.7472 + 0.7039i | 0.6990 + 0.7343i | 0.7011 + 0.7066i |
| 21.5 | 0.7654 + 0.5836i | 0.7634 + 0.5894i | 0.7024 + 0.5802i | 0.7010 + 0.5870i | 0.7565 + 0.7484i | 0.7593 + 0.7277i | 0.6893 + 0.7521i | 0.6917 + 0.7266i |
| 22 | 0.7478 + 0.5524i | 0.7477 + 0.5686i | 0.6931 + 0.5490i | 0.6930 + 0.5671i | 0.7418 + 0.7491i | 0.7413 + 0.6938i | 0.6950 + 0.7561i | 0.6917 + 0.6959i |
| 22.5 | 0.7671 + 0.5696i | 0.7648 + 0.5926i | 0.6970 + 0.5663i | 0.6951 + 0.5891i | 0.7699 + 0.7757i | 0.7684 + 0.7133i | 0.6931 + 0.7729i | 0.6933 + 0.7088i |
| 23 | 0.7870 + 0.5451i | 0.7912 + 0.6039i | 0.7025 + 0.5494i | 0.7033 + 0.6027i | 0.7851 + 0.8112i | 0.7935 + 0.7088i | 0.6966 + 0.7929i | 0.7030 + 0.7082i |
| 23.5 | 0.7963 + 0.5341i | 0.7903 + 0.5944i | 0.7035 + 0.5353i | 0.7033 + 0.5871i | 0.7903 + 0.7972i | 0.7922 + 0.6992i | 0.6998 + 0.7924i | 0.7016 + 0.6975i |
| 24 | 0.7772 + 0.5242i | 0.7811 + 0.5804i | 0.6843 + 0.5275i | 0.6854 + 0.5855i | 0.7824 + 0.7742i | 0.7823 + 0.6813i | 0.6846 + 0.7745i | 0.6870 + 0.6835i |
| 24.5 | 0.7677 + 0.5362i | 0.7985 + 0.5994i | 0.6876 + 0.5405i | 0.6898 + 0.6182i | 0.7690 + 0.8026i | 0.8002 + 0.7097i | 0.6815 + 0.7942i | 0.6898 + 0.7018i |
| 25 | 0.7836 + 0.5649i | 0.7723 + 0.6495i | 0.6941 + 0.5537i | 0.6818 + 0.6387i | 0.7471 + 0.8318i | 0.7654 + 0.7459i | 0.6548 + 0.8214i | 0.6666 + 0.7271i |
| 25.5 | 0.8260 + 0.5243i | 0.8354 + 0.6026i | 0.7272 + 0.5323i | 0.7357 + 0.6102i | 0.6363 + 0.7982i | 0.8396 + 0.6938i | 0.7479 + 0.7978i | 0.7438 + 0.6972i |
| 26 | 0.7207 + 0.5888i | 0.8167 + 0.5761i | 0.6922 + 0.6311i | 0.8130 + 0.6488i | 0.7083 + 0.8179i | 0.8062 + 0.8263i | 0.7032 + 0.7252i | 0.8007 + 0.7286i |
| 26.5 | 0.7502 + 0.6146i | 0.8241 + 0.6346i | 0.6717 + 0.6243i | 0.8549 + 0.5585i | 0.7192 + 0.7846i | 0.8042 + 0.7367i | 0.6819 + 0.7074i | 0.8326 + 0.8445i |
| 27 | 0.8564 + 0.5757i | 0.8744 + 0.6584i | 0.7873 + 0.6025i | 0.7483 + 0.6489i | 0.7885 + 0.8284i | 0.8377 + 0.7472i | 0.7063 + 0.8058i | 0.7323 + 0.7227i |
| 27.5 | 0.8715 + 0.5878i | 0.8831 + 0.6759i | 0.8064 + 0.6168i | 0.7632 + 0.6612i | 0.8096 + 0.8448i | 0.8499 + 0.7616i | 0.7229 + 0.8172i | 0.7483 + 0.7350i |
| 28 | 0.8185 + 0.6598i | 0.8890 + 0.6878i | 0.7513 + 0.6619i | 0.6922 + 0.6583i | 0.7947 + 0.7648i | 0.8894 + 0.7813i | 0.7012 + 0.7888i | 0.6735 + 0.7261i |

| SNR/w | w64 | w65 | w66 | w67 | w68 | w69 | w70 | w71 |
|---|---|---|---|---|---|---|---|---|
| 7 | 1.8365 + 1.2473i | 1.2111 + 0.6837i | 2.1615 + 0.4280i | 1.3685 + 0.3795i | 1.2110 + 0.6836i | 1.1269 + 0.6205i | 1.3684 + 0.3795i | 1.2524 + 0.3664i |
| 7.5 | 1.7843 + 1.2148i | 1.5010 + 0.9781i | 2.1191 + 0.4071i | 1.7374 + 0.3777i | 1.1551 + 0.6836i | 1.1857 + 0.7105i | 1.3123 + 0.3338i | 1.3468 + 0.3393i |
| 8 | 2.0885 + 0.3978i | 1.7466 + 0.3528i | 1.5750 + 0.3367i | 1.5346 + 0.3328i | 1.7585 + 1.1911i | 1.4907 + 0.9885i | 1.3631 + 0.8851i | 1.3286 + 0.8566i |
| 8.5 | 2.0732 + 0.3944i | 1.7141 + 0.3348i | 1.6263 + 0.3252i | 1.5557 + 0.3149i | 1.7503 + 1.1777i | 1.4580 + 0.9699i | 1.3957 + 0.9225i | 1.3353 + 0.8771i |
| 9 | 0.3393 + 0.1828i | 0.3435 + 0.1840i | 0.3434 + 0.1840i | 0.3477 + 0.1852i | 0.3434 + 0.1840i | 0.3477 + 0.1852i | 0.3477 + 0.1852i | 0.3521 + 0.1865i |
| 9.5 | 0.3232 + 0.1714i | 0.3242 + 0.1717i | 0.3242 + 0.1717i | 0.3253 + 0.1720i | 0.3242 + 0.1717i | 0.3253 + 0.1720i | 0.3253 + 0.1720i | 0.3264 + 0.1723i |
| 10 | 0.3119 + 0.1627i | 0.3115 + 0.1626i | 0.3115 + 0.1626i | 0.3111 + 0.1625i | 0.3115 + 0.1626i | 0.3111 + 0.1625i | 0.3111 + 0.1625i | 0.3107 + 0.1624i |
| 10.5 | 0.3081 + 0.1565i | 0.3068 + 0.1561i | 0.3066 + 0.1565i | 0.3051 + 0.1556i | 0.3075 + 0.1562i | 0.3065 + 0.1558i | 0.3064 + 0.1561i | 0.3050 + 0.1557i |
| 11 | 1.5407 + 0.3455i | 1.4255 + 0.3224i | 1.5424 + 0.2759i | 1.4191 + 0.2826i | 1.3869 + 0.2896i | 1.3389 + 0.2861i | 1.3874 + 0.2600i | 1.3389 + 0.2606i |
| 11.5 | 1.5505 + 0.3458i | 1.4293 + 0.3268i | 1.5574 + 0.2658i | 1.4239 + 0.2730i | 1.3871 + 0.2915i | 1.3422 + 0.2869i | 1.3930 + 0.2500i | 1.3441 + 0.2507i |
| 12 | 1.5615 + 0.3581i | 1.4382 + 0.3463i | 1.5777 + 0.2407i | 1.4295 + 0.2590i | 1.3838 + 0.2941i | 1.3406 + 0.2915i | 1.3933 + 0.2286i | 1.3447 + 0.2356i |
| 12.5 | 1.6796 + 0.2609i | 1.6231 + 0.3777i | 1.4866 + 0.2567i | 1.4695 + 0.3056i | 1.3481 + 0.2491i | 1.3458 + 0.2730i | 1.3263 + 0.2454i | 1.3245 + 0.2658i |
| 13 | 0.4312 + 0.1209i | 0.4312 + 0.1209i | 0.4321 + 0.1208i | 0.4322 + 0.1208i | 0.4295 + 0.1204i | 0.4296 + 0.1205i | 0.4304 + 0.1203i | 0.4304 + 0.1203i |
| 13.5 | 1.7821 + 0.2022i | 1.7069 + 0.6226i | 1.6649 + 0.2207i | 1.6075 + 0.4960i | 1.5379 + 0.2267i | 1.4666 + 0.3660i | 1.5187 + 0.2429i | 1.4635 + 0.3635i |
| 14 | 1.5804 + 1.3865i | 2.1260 + 0.2205i | 1.8405 + 1.0633i | 2.0446 + 0.6571i | 1.6304 + 0.2123i | 1.7090 + 0.2082i | 1.6062 + 0.2504i | 1.6575 + 0.2608i |
| 14.5 | 1.6382 + 1.3165i | 2.0902 + 0.1960i | 1.8765 + 0.9757i | 2.0346 + 0.5849i | 1.6080 + 0.1998i | 1.6865 + 0.1947i | 1.5872 + 0.2316i | 1.6395 + 0.2404i |
| 15 | 1.8736 + 0.9301i | 2.1142 + 0.3056i | 1.3516 + 0.1178i | 1.3478 + 0.1198i | 1.7111 + 0.1507i | 1.7593 + 0.1621i | 1.4171 + 0.1208i | 1.4104 + 0.1240i |
| 15.5 | 1.6897 + 0.1409i | 1.7447 + 0.1440i | 1.4161 + 0.1190i | 1.4047 + 0.1209i | 1.9715 + 0.6222i | 2.0540 + 0.2400i | 1.3595 + 0.1257i | 1.3555 + 0.1262i |
| 16 | 1.6775 + 0.1331i | 1.6321 + 0.1195i | 1.3544 + 0.1155i | 1.3591 + 0.1095i | 1.9896 + 0.2026i | 1.9730 + 0.5695i | 1.3003 + 0.1165i | 1.3024 + 0.1130i |
| 16.5 | 1.4483 + 0.1058i | 1.5082 + 0.1076i | 1.2544 + 0.1058i | 1.2478 + 0.1068i | 2.0481 + 0.1978i | 1.7457 + 0.1177i | 1.1917 + 0.1085i | 1.1866 + 0.1090i |
| 17 | 1.4531 + 0.1045i | 1.5085 + 0.1072i | 1.2532 + 0.1043i | 1.2435 + 0.1050i | 2.0518 + 0.1917i | 1.7527 + 0.1170i | 1.1902 + 0.1093i | 1.1846 + 0.1094i |
| 17.5 | 1.4543 + 0.1049i | 1.5074 + 0.1080i | 1.2540 + 0.1026i | 1.2417 + 0.1029i | 2.0450 + 0.1840i | 1.7515 + 0.1165i | 1.1897 + 0.1107i | 1.1837 + 0.1105i |
| 18 | 1.4513 + 0.1053i | 1.5036 + 0.1079i | 1.2538 + 0.1005i | 1.2393 + 0.1002i | 2.0343 + 0.1821i | 1.7462 + 0.1147i | 1.1882 + 0.1127i | 1.1817 + 0.1122i |
| 18.5 | 1.4335 + 0.0772i | 1.3407 + 0.0725i | 1.1059 + 0.0808i | 1.1384 + 0.0788i | 1.6706 + 0.1002i | 1.9444 + 0.1347i | 1.0600 + 0.0831i | 1.0732 + 0.0827i |
| 19 | 1.4268 + 0.0758i | 1.3215 + 0.0692i | 1.0950 + 0.0758i | 1.1342 + 0.0740i | 1.6492 + 0.0990i | 1.9145 + 0.1300i | 1.0436 + 0.0779i | 1.0576 + 0.0782i |
| 19.5 | 1.4256 + 0.0701i | 1.2941 + 0.0652i | 1.0723 + 0.0704i | 1.1247 + 0.0692i | 1.6348 + 0.0961i | 1.8944 + 0.1321i | 1.0183 + 0.0729i | 1.0342 + 0.0744i |
| 20 | 1.9230 + 0.1724i | 1.4387 + 0.0640i | 1.2248 + 0.0751i | 1.2729 + 0.0732i | 1.6851 + 0.1131i | 1.4739 + 0.1321i | 1.2330 + 0.2173i | 1.2857 + 0.2110i |
| 20.5 | 1.4461 + 0.0954i | 1.3740 + 0.1022i | 1.2110 + 0.0728i | 1.2392 + 0.0857i | 1.6304 + 0.0979i | 1.8780 + 0.1229i | 1.1024 + 0.0845i | 1.1048 + 0.0914i |
| 21 | 1.3631 + 0.0520i | 1.8339 + 0.1330i | 1.1991 + 0.0634i | 1.1476 + 0.0664i | 1.4080 + 0.1199i | 1.6121 + 0.0933i | 1.2253 + 0.1727i | 1.1607 + 0.1854i |
| 21.5 | 1.6991 + 0.0948i | 1.9089 + 0.1361i | 1.1209 + 0.0616i | 1.1513 + 0.0504i | 1.5161 + 0.0821i | 1.3698 + 0.0855i | 1.1545 + 0.1540i | 1.2377 + 0.1156i |
| 22 | 1.5037 + 0.0710i | 1.3591 + 0.0502i | 1.1808 + 0.0443i | 1.2467 + 0.0983i | 1.5451 + 0.2150i | 1.7164 + 0.1072i | 1.3895 + 0.2257i | 1.2198 + 0.1964i |
| 22.5 | 1.5376 + 0.0755i | 1.7254 + 0.0875i | 1.3836 + 0.0522i | 1.1598 + 0.0644i | 1.4249 + 0.1170i | 1.6056 + 0.0877i | 1.2333 + 0.1806i | 1.1693 + 0.1944i |
| 23 | 1.6912 + 0.0798i | 1.4055 + 0.0597i | 1.1376 + 0.0597i | 1.2506 + 0.0551i | 1.5794 + 0.1910i | 1.4051 + 0.1749i | 1.1445 + 0.1725i | 1.2429 + 0.1635i |
| 23.5 | 1.7275 + 0.0857i | 1.4188 + 0.0423i | 1.1857 + 0.0423i | 1.2751 + 0.0595i | 1.5834 + 0.1747i | 1.4232 + 0.1559i | 1.1749 + 0.1749i | 1.2918 + 0.1822i |
| 24 | 1.4664 + 0.0626i | 1.6566 + 0.0991i | 1.3043 + 0.0474i | 1.1711 + 0.0454i | 1.4135 + 0.1717i | 1.5496 + 0.2888i | 1.2755 + 0.1587i | 1.1759 + 0.1394i |
| 24.5 | 1.5037 + 0.0710i | 1.3591 + 0.0502i | 1.1808 + 0.0443i | 1.2467 + 0.0983i | 1.5451 + 0.2150i | 1.7164 + 0.1072i | 1.3895 + 0.2257i | 1.2198 + 0.1964i |
| 25 | 1.5306 + 0.0744i | 1.6915 + 0.1083i | 1.3846 + 0.0555i | 1.2679 + 0.0610i | 1.5831 + 0.2354i | 1.4320 + 0.2269i | 1.1755 + 0.2097i | 1.2871 + 0.1867i |
| 25.5 | 1.5775 + 0.2201i | 1.6203 + 0.0729i | 1.3822 + 0.0559i | 1.2916 + 0.0458i | 1.4621 + 0.1953i | 1.3400 + 0.2355i | 1.1762 + 0.2323i | 1.2439 + 0.1711i |
| 26 | 1.4357 + 0.0696i | 1.5824 + 0.0779i | 1.3020 + 0.0505i | 1.1807 + 0.0541i | 1.4605 + 0.1876i | 1.4494 + 0.0655i | 1.1852 + 0.1643i | 1.3065 + 0.1507i |
| 26.5 | 1.4441 + 0.0577i | 1.5851 + 0.0770i | 1.3160 + 0.0502i | 1.2061 + 0.0559i | 1.3893 + 0.1877i | 1.2727 + 0.2084i | 1.1282 + 0.2339i | 1.1761 + 0.1587i |
| 27 | 4179 + 0.0644i | 1.5639 + 0.0718i | 1.2943 + 0.0443i | 1.1861 + 0.0531i | 1.4166 + 0.1663i | 1.3051 + 0.2007i | 1.1730 + 0.2374i | 1.2080 + 0.1543i |
| 27.5 | 1.4359 + 0.0589i | 1.5791 + 0.0680i | 1.3202 + 0.0508i | 1.2143 + 0.0516i | 1.4462 + 0.1886i | 1.3139 + 0.1830i | 1.5847 + 0.2617i | 1.2070 + 0.1573i |
| 28 | 1.3893 + 0.0618i | 1.5163 + 0.0570i | 1.2840 + 0.0506i | 1.1933 + 0.0574i | 1.4329 + 0.1769i | 1.3157 + 0.1870i | 1.5739 + 0.1994i | 1.2085 + 0.1678i |

| SNR/w | w72 | w73 | w74 | w75 | w76 | w77 | w78 | w79 |
|---|---|---|---|---|---|---|---|---|
| 7 | 1.2111 + 0.6836i | 1.1269 + 0.6205i | 1.3684 + 0.3795i | 1.2524 + 0.3664i | 1.1268 + 0.6204i | 1.0807 + 0.5880i | 1.2523 + 0.3664i | 1.1911 + 0.3587i |
| 7.5 | 1.1558 + 0.6868i | 1.1863 + 0.7110i | 1.3133 + 0.3339i | 1.3473 + 0.3395i | 1.0681 + 0.6156i | 1.0882 + 0.6314i | 1.1993 + 0.3223i | 1.2233 + 0.3261i |
| 8 | 1.2547 + 0.3037i | 1.2795 + 0.3062i | 1.2543 + 0.3046i | 1.2754 + 0.3068i | 1.1024 + 0.6704i | 1.1223 + 0.6864i | 1.0370 + 0.6709i | 1.1206 + 0.6845i |
| 8.5 | 1.1162 + 0.2754i | 1.1288 + 0.2761i | 1.1273 + 0.2760i | 1.1402 + 0.2768i | 0.9870 + 0.5936i | 0.9966 + 0.6017i | 0.9956 + 0.6005i | 1.0055 + 0.6087i |
| 9 | 0.3434 + 0.1840i | 0.3477 + 0.1852i | 0.3477 + 0.1852i | 0.3521 + 0.1865i | 0.3477 + 0.1852i | 0.3521 + 0.1865i | 0.3520 + 0.1865i | 0.3566 + 0.1877i |

| SNR/w | w80 | w81 | w82 | w83 | w84 | w85 | w86 | w87 |
|---|---|---|---|---|---|---|---|---|
| 9.5 | 0.3242 + 0.1717i | 0.3253 + 0.1720i | 0.3253 + 0.1720i | 0.3264 + 0.1723i | 0.3253 + 0.1720i | 0.3264 + 0.1723i | 0.3264 + 0.1723i | 0.3275 + 0.1726i |
| 10 | 0.3115 + 0.1626i | 0.3111 + 0.1625i | 0.3111 + 0.1625i | 0.3107 + 0.1624i | 0.3111 + 0.1625i | 0.3107 + 0.1624i | 0.3107 + 0.1624i | 0.3103 + 0.1623i |
| 10.5 | 0.3058 + 0.1562i | 0.3045 + 0.1557i | 0.3057 + 0.1561i | 0.3044 + 0.1556i | 0.3058 + 0.1558i | 0.3045 + 0.1554i | 0.3055 + 0.1557i | 0.3042 + 0.1553i |
| 11 | 1.3786 + 0.2935i | 1.3336 + 0.2903i | 1.3794 + 0.2647i | 1.3333 + 0.2653i | 1.3147 + 0.2720i | 1.2897 + 0.2502i | 1.3168 + 0.2502i | 1.2911 + 0.2499i |
| 11.5 | 1.3807 + 0.3017i | 1.3368 + 0.2973i | 1.3830 + 0.2608i | 1.3374 + 0.2612i | 1.3182 + 0.2771i | 1.2950 + 0.2471i | 1.3221 + 0.2450i | 1.2978 + 0.2447i |
| 12 | 1.3733 + 0.3193i | 1.3344 + 0.3196i | 1.3766 + 0.2535i | 1.3339 + 0.2600i | 1.3111 + 0.2892i | 1.2920 + 0.2912i | 1.3178 + 0.2359i | 1.2962 + 0.2407i |
| 12.5 | 1.3712 + 0.2039i | 1.3574 + 0.2268i | 1.3430 + 0.2021i | 1.3340 + 0.2218i | 1.2905 + 0.2058i | 1.2856 + 0.2215i | 1.2847 + 0.2047i | 1.2805 + 0.2196i |
| 13 | 0.4291 + 0.1208i | 0.4291 + 0.1208i | 0.4300 + 0.1208i | 0.4300 + 0.1207i | 0.4275 + 0.1203i | 0.4275 + 0.1203i | 0.4283 + 0.1202i | 0.4283 + 0.1202i |
| 13.5 | 1.2716 + 0.1419i | 1.2458 + 0.1681i | 1.2778 + 0.1479i | 1.2512 + 0.1766i | 1.2928 + 0.1696i | 1.2681 + 0.2053i | 1.2984 + 0.1774i | 1.2741 + 0.2155i |
| 14 | 1.2396 + 0.1416i | 1.2342 + 0.1407i | 1.2401 + 0.1435i | 1.2347 + 0.1425i | 1.3045 + 0.1827i | 1.2951 + 0.1824i | 1.3060 + 0.1863i | 1.2966 + 0.1858i |
| 14.5 | 1.2237 + 0.1364i | 1.2177 + 0.1365i | 1.2248 + 0.1374i | 1.2187 + 0.1366i | 1.2847 + 0.1815i | 1.2737 + 0.1817i | 1.2872 + 0.1835i | 1.2762 + 0.1835i |
| 15 | 1.0170 + 0.1179i | 1.0171 + 0.1182i | 1.0177 + 0.1182i | 1.0189 + 0.1189i | 1.0120 + 0.1157i | 1.0121 + 0.1160i | 1.0803 + 0.1174i | 1.0805 + 0.1177i |
| 15.5 | 0.9990 + 0.1123i | 0.9991 + 0.1122i | 1.0672 + 0.1136i | 1.0681 + 0.1135i | 1.0046 + 0.1091i | 1.0046 + 0.1091i | 1.0792 + 0.1117i | 1.0800 + 0.1115i |
| 16 | 0.9452 + 0.1049i | 0.9453 + 0.1052i | 1.0143 + 0.1060i | 1.0147 + 0.1062i | 1.0039 + 0.1091i | 1.0046 + 0.1091i | 1.0297 + 0.1035i | 1.0303 + 0.1037i |
| 16.5 | 0.9085 + 0.1102i | 0.9089 + 0.1100i | 0.9664 + 0.1097i | 0.9669 + 0.1095i | 0.9514 + 0.1032i | 0.9516 + 0.1034i | 0.9778 + 0.1127i | 0.9781 + 0.1125i |
| 17 | 0.9028 + 0.1080i | 0.9035 + 0.1076i | 0.9604 + 0.1071i | 0.9617 + 0.1067i | 0.9152 + 0.1139i | 0.9156 + 0.1138i | 0.9751 + 0.1137i | 0.9764 + 0.1132i |
| 17.5 | 0.9001 + 0.1048i | 0.9010 + 0.1043i | 0.9577 + 0.1034i | 0.9598 + 0.1028i | 0.9102 + 0.1155i | 0.9109 + 0.1151i | 0.9756 + 0.1149i | 0.9777 + 0.1143i |
| 18 | 0.9000 + 0.1003i | 0.9010 + 0.0998i | 0.9575 + 0.0980i | 0.9606 + 0.0975i | 0.9081 + 0.1028i | 0.9091 + 0.1170i | 0.9779 + 0.1175i | 0.9807 + 0.1167i |
| 18.5 | 0.8857 + 0.0977i | 0.7889 + 0.0927i | 0.8496 + 0.0890i | 0.8430 + 0.0892i | 0.9094 + 0.1215i | 0.9094 + 0.1211i | 0.9779 + 0.1175i | 0.9807 + 0.1167i |
| 19 | 0.7724 + 0.0835i | 0.7700 + 0.0834i | 0.8322 + 0.0796i | 0.8250 + 0.0797i | 0.7999 + 0.1087i | 0.7971 + 0.1089i | 0.8696 + 0.0989i | 0.8628 + 0.0997i |
| 19.5 | 0.7527 + 0.0751i | 0.7500 + 0.0750i | 0.8104 + 0.0712i | 0.8013 + 0.0714i | 0.7839 + 0.1087i | 0.7811 + 0.1089i | 0.8606 + 0.0944i | 0.8526 + 0.0955i |
| 20 | 0.9964 + 0.0740i | 0.9909 + 0.0742i | 1.0744 + 0.0748i | 1.0572 + 0.0744i | 0.7677 + 0.1126i | 0.7644 + 0.1130i | 0.8454 + 0.0933i | 0.8352 + 0.0955i |
| 20.5 | 0.8415 + 0.0674i | 0.8389 + 0.0684i | 0.8827 + 0.0568i | 0.8780 + 0.0568i | 0.9898 + 0.2146i | 0.9846 + 0.2182i | 1.0768 + 0.2182i | 1.0565 + 0.2169i |
| 21 | 0.8975 + 0.0634i | 0.8976 + 0.0631i | 0.9963 + 0.0649i | 0.9963 + 0.0658i | 0.8615 + 0.1532i | 0.8605 + 0.1540i | 0.9520 + 0.1131i | 0.9463 + 0.1173i |
| 21.5 | 0.8989 + 0.0684i | 0.8974 + 0.0684i | 0.9890 + 0.0680i | 0.9749 + 0.0663i | 0.8959 + 0.1797i | 0.8954 + 0.1791i | 0.9955 + 0.1822i | 0.9463 + 0.1845i |
| 22 | 0.9059 + 0.0627i | 0.9025 + 0.0622i | 1.0170 + 0.0646i | 1.0368 + 0.0643i | 0.9038 + 0.2028i | 0.9029 + 0.2030i | 0.9985 + 0.1899i | 0.9885 + 0.1918i |
| 22.5 | 0.8910 + 0.0610i | 0.8914 + 0.0639i | 1.0235 + 0.0603i | 0.9860 + 0.0649i | 0.9044 + 0.1860i | 0.8999 + 0.1853i | 1.0172 + 0.1896i | 1.0422 + 0.1915i |
| 23 | 0.8910 + 0.0618i | 0.8953 + 0.0512i | 1.0522 + 0.0581i | 1.0206 + 0.0501i | 0.8871 + 0.1882i | 0.8926 + 0.1822i | 1.0287 + 0.1810i | 0.9915 + 0.1807i |
| 23.5 | 0.9043 + 0.0601i | 0.8964 + 0.0606i | 1.0088 + 0.0553i | 1.0088 + 0.0537i | 0.8864 + 0.1655i | 0.8952 + 0.1705i | 1.0456 + 0.1748i | 1.0122 + 0.1779i |
| 24 | 0.9258 + 0.0608i | 0.9254 + 0.0602i | 1.0609 + 0.0650i | 1.0449 + 0.0537i | 0.9138 + 0.1795i | 0.9045 + 0.1793i | 1.0295 + 0.1733i | 1.0590 + 0.1616i |
| 24.5 | 0.9591 + 0.0547i | 0.9357 + 0.0599i | 1.0686 + 0.0690i | 1.0478 + 0.0699i | 0.9252 + 0.1819i | 0.9088 + 0.1757i | 1.0378 + 0.1928i | 1.0895 + 0.1956i |
| 25 | 0.9630 + 0.0520i | 0.9218 + 0.0598i | 1.0488 + 0.0488i | 1.1345 + 0.0491i | 0.9170 + 0.1742i | 0.9298 + 0.1782i | 1.0723 + 0.1843i | 1.0268 + 0.2010i |
| 25.5 | 0.8699 + 0.0500i | 0.9203 + 0.0513i | 1.0902 + 0.0567i | 1.1469 + 0.0461i | 0.8680 + 0.1530i | 0.9240 + 0.1503i | 1.0655 + 0.1717i | 1.1358 + 0.1228i |
| 26 | 0.9159 + 0.0417i | 0.9301 + 0.0926i | 1.0176 + 0.0319i | 1.0070 + 0.0499i | 0.9294 + 0.2082i | 0.9206 + 0.1491i | 1.0838 + 0.1610i | 1.0009 + 0.1570i |
| 26.5 | 0.9403 + 0.0431i | 0.9115 + 0.0762i | 1.0179 + 0.0326i | 1.0715 + 0.0679i | 0.9539 + 0.2438i | 0.9297 + 0.1559i | 1.0424 + 0.2248i | 1.0467 + 0.1461i |
| 27 | 0.9113 + 0.0415i | 0.8658 + 0.0784i | 0.9957 + 0.0565i | 1.1072 + 0.0445i | 0.9122 + 0.1735i | 0.9401 + 0.1658i | 1.0737 + 0.2562i | 1.0389 + 0.1570i |
| 27.5 | 0.9440 + 0.0418i | 0.8706 + 0.0464i | 1.0192 + 0.0503i | 1.0840 + 0.0474i | 0.9170 + 0.1714i | 0.8662 + 0.1466i | 1.0072 + 0.1528i | 1.1002 + 0.1441i |
| 28 | 0.8988 + 0.0380i | 0.9745 + 0.0468i | 1.0860 + 0.0321i | 1.1107 + 0.0449i | 0.9289 + 0.1655i | 0.8878 + 0.1234i | 1.0092 + 0.1421i | 1.1104 + 0.1311i |

| SNR/w | w80 | w81 | w82 | w83 | w84 | w85 | w86 | w87 |
|---|---|---|---|---|---|---|---|---|
| 7 | 1.2112 + 0.6837i | 1.1269 + 0.6205i | 1.3686 + 0.3795i | 1.2525 + 0.3644i | 1.1269 + 0.6205i | 1.0807 + 0.5881i | 1.2525 + 0.3664i | 1.1912 + 0.3587i |
| 7.5 | 1.1540 + 0.6854i | 1.1846 + 0.7097i | 1.3105 + 0.3337i | 1.3450 + 0.3393i | 1.0672 + 0.6149i | 1.0871 + 0.6306i | 1.1980 + 0.3222i | 1.2219 + 0.3260i |
| 8 | 1.2545 + 0.3037i | 1.2793 + 0.3062i | 1.2542 + 0.3046i | 1.2753 + 0.3068i | 1.1023 + 0.6703i | 1.1222 + 0.6864i | 1.1036 + 0.6709i | 1.1205 + 0.6844i |
| 8.5 | 1.3379 + 0.2955i | 1.3514 + 0.2963i | 1.3341 + 0.2948i | 1.3456 + 0.2954i | 1.1682 + 0.7419i | 1.1767 + 0.7490i | 1.1638 + 0.7383i | 1.1712 + 0.7445i |
| 9 | 0.5567 + 0.2312i | 0.5636 + 0.2323i | 0.5636 + 0.2323i | 0.5708 + 0.2334i | 0.5636 + 0.2323i | 0.5707 + 0.2334i | 0.5707 + 0.2334i | 0.5780 + 0.2344i |
| 9.5 | 0.5925 + 0.2250i | 0.5968 + 0.2255i | 0.5968 + 0.2255i | 0.6012 + 0.2255i | 0.5968 + 0.2255i | 0.6012 + 0.2261i | 0.6012 + 0.2261i | 0.6058 + 0.2267i |
| 10 | 0.6197 + 0.2165i | 0.6228 + 0.2168i | 0.6227 + 0.2168i | 0.6259 + 0.2172i | 0.6227 + 0.2168i | 0.6259 + 0.2172i | 0.6259 + 0.2172i | 0.6292 + 0.2175i |
| 10.5 | 0.6392 + 0.2077i | 0.6460 + 0.2057i | 0.6370 + 0.2089i | 0.6423 + 0.2087i | 0.6409 + 0.2072i | 0.6466 + 0.2063i | 0.6378 + 0.2092i | 0.6431 + 0.2090i |
| 11 | 1.1624 + 0.7818i | 1.1959 + 0.8017i | 1.1462 + 0.8018i | 1.1797 + 0.8257i | 1.1351 + 0.7695i | 1.1585 + 0.7844i | 1.1230 + 0.7887i | 1.1472 + 0.8071i |
| 11.5 | 1.1690 + 0.7842i | 1.2056 + 0.8024i | 1.1458 + 0.8117i | 1.1823 + 0.8348i | 1.1427 + 0.7717i | 1.1681 + 0.7847i | 1.1251 + 0.7984i | 1.1513 + 0.8158i |
| 12 | 1.1652 + 0.7852i | 1.2122 + 0.7997i | 1.1325 + 0.8255i | 1.1781 + 0.8474i | 1.1413 + 0.7745i | 1.1741 + 0.7847i | 1.1163 + 0.8146i | 1.1499 + 0.8320i |
| 12.5 | 1.2227 + 0.7247i | 1.3007 + 0.7448i | 1.2398 + 0.7205i | 1.3131 + 0.7557i | 1.1658 + 0.6445i | 1.1970 + 0.6499i | 1.1757 + 0.6324i | 1.2063 + 0.6398i |

-continued

| SNR/w | w88 | w89 | w90 | w91 | w92 | w93 | w94 | w95 |
|---|---|---|---|---|---|---|---|---|
| 13 | 0.7634 + 0.1673i | 0.7634 + 0.1682i | 0.7674 + 0.1676i | 0.7674 + 0.1686i | 0.7602 + 0.1620i | 0.7600 + 0.1629i | 0.7643 + 0.1622i | 0.7642 + 0.1631i |
| 13.5 | 1.1992 + 0.6151i | 1.3555 + 0.7570i | 1.1832 + 0.6735i | 1.3044 + 0.7014i | 1.1692 + 0.6038i | 1.2469 + 0.6074i | 1.1704 + 0.5902i | 1.2419 + 0.5888i |
| 14 | 1.3895 + 0.9370i | 1.3184 + 0.8344i | 1.4268 + 0.9110i | 1.3348 + 0.8289i | 1.3348 + 0.5825i | 1.4725 + 0.5840i | 1.5066 + 0.5883i | 1.5099 + 0.5849i |
| 14.5 | 1.4191 + 0.9375i | 1.3358 + 0.8331i | 1.4455 + 0.8881i | 1.3474 + 0.8198i | 1.4831 + 0.5552i | 1.4786 + 0.5586i | 1.5097 + 0.5625i | 1.5087 + 0.5607i |
| 15 | 1.6166 + 0.6733i | 1.5327 + 0.5881i | 1.3344 + 0.4056i | 1.3372 + 0.4255i | 1.6440 + 0.4469i | 1.6360 + 0.4324i | 1.3806 + 0.3499i | 1.3795 + 0.3645i |
| 15.5 | 1.4949 + 0.5621i | 1.4771 + 0.5677i | 1.3463 + 0.3922i | 1.3447 + 0.4029i | 1.6403 + 0.5309i | 1.5852 + 0.5183i | 1.3436 + 0.3520i | 1.3426 + 0.3587i |
| 16 | 1.4894 + 0.4824i | 1.5041 + 0.5324i | 1.3116 + 0.3681i | 1.3023 + 0.3650i | 1.5903 + 0.4444i | 1.6566 + 0.5241i | 1.2913 + 0.3268i | 1.2837 + 0.3227i |
| 16.5 | 1.4385 + 0.3455i | 1.4852 + 0.3323i | 1.2415 + 0.3376i | 1.2372 + 0.3386i | 1.8518 + 0.4951i | 1.6966 + 0.3427i | 1.1890 + 0.3054i | 1.1851 + 0.3056i |
| 17 | 1.4458 + 0.3440i | 1.4918 + 0.3307i | 1.2384 + 0.3408i | 1.2321 + 0.3419i | 1.8705 + 0.5044i | 1.7104 + 0.3345i | 1.1873 + 0.3028i | 1.1830 + 0.3028i |
| 17.5 | 1.4472 + 0.3429i | 1.4936 + 0.3303i | 1.2359 + 0.3440i | 1.2280 + 0.3454i | 1.8868 + 0.5097i | 1.7156 + 0.3328i | 1.1862 + 0.2999i | 1.1816 + 0.2996i |
| 18 | 1.4449 + 0.3401i | 1.4915 + 0.3280i | 1.2340 + 0.3464i | 1.2248 + 0.3483i | 1.8862 + 0.5096i | 1.7314 + 0.3314i | 1.1846 + 0.2958i | 1.1796 + 0.2954i |
| 18.5 | 1.4077 + 0.2179i | 1.3384 + 0.2148i | 1.1187 + 0.2595i | 1.1404 + 0.2530i | 1.6531 + 0.2935i | 1.9151 + 0.4196i | 1.0757 + 0.2398i | 1.0862 + 0.2381i |
| 19 | 1.3931 + 0.2132i | 1.3188 + 0.2086i | 1.1044 + 0.2532i | 1.1283 + 0.2456i | 1.6349 + 0.2879i | 1.8304 + 0.4067i | 1.0577 + 0.2202i | 1.0688 + 0.2192i |
| 19.5 | 1.3981 + 0.2090i | 1.2948 + 0.1953i | 1.0785 + 0.2426i | 1.1091 + 0.2350i | 1.5971 + 0.2809i | 1.8304 + 0.3832i | 1.0314 + 0.2037i | 1.0450 + 0.2053i |
| 20 | 1.7815 + 0.4751i | 1.4947 + 0.5250i | 1.2330 + 0.5211i | 1.2924 + 0.5254i | 1.6486 + 0.3169i | 1.4854 + 0.3471i | 1.2402 + 0.3648i | 1.3024 + 0.3616i |
| 20.5 | 1.4528 + 0.2817i | 1.3601 + 0.2817i | 1.1691 + 0.3120i | 1.2009 + 0.2917i | 1.6350 + 0.2881i | 1.8444 + 0.4201i | 1.1076 + 0.2296i | 1.1141 + 0.2274i |
| 21 | 1.9010 + 0.4585i | 1.6938 + 0.3559i | 1.2752 + 0.4149i | 1.1803 + 0.4240i | 1.4242 + 0.2749i | 1.5512 + 0.2768i | 1.2791 + 0.3004i | 1.1734 + 0.3075i |
| 21.5 | 1.5210 + 0.4295i | 1.3922 + 0.3763i | 1.2275 + 0.4595i | 1.2578 + 0.4012i | 1.5387 + 0.2494i | 1.3855 + 0.2443i | 1.1759 + 0.2690i | 1.2344 + 0.2704i |
| 22 | 1.8348 + 0.3993i | 1.5329 + 0.3997i | 1.3013 + 0.4349i | 1.1899 + 0.4442i | 1.4158 + 0.2489i | 1.5984 + 0.2593i | 1.2925 + 0.3015i | 1.1810 + 0.3192i |
| 22.5 | 1.5888 + 0.4053i | 1.4083 + 0.4183i | 1.1560 + 0.4261i | 1.2651 + 0.4195i | 1.2651 + 0.3093i | 1.3843 + 0.3093i | 1.1504 + 0.2971i | 1.2457 + 0.2926i |
| 23 | 1.6211 + 0.3847i | 1.4209 + 0.4485i | 1.1797 + 0.4135i | 1.2791 + 0.4462i | 1.7497 + 0.3033i | 1.4218 + 0.3117i | 1.1757 + 0.2963i | 1.2821 + 0.2953i |
| 23.5 | 1.3219 + 0.5378i | 1.3808 + 0.4436i | 1.1930 + 0.4695i | 1.2166 + 0.4068i | 1.7837 + 0.3062i | 1.3978 + 0.3365i | 1.2218 + 0.2650i | 1.2151 + 0.3021i |
| 24 | 1.4544 + 0.5247i | 1.2839 + 0.5031i | 1.3919 + 0.3970i | 1.2020 + 0.4350i | 1.5721 + 0.3834i | 1.7484 + 0.3285i | 1.3331 + 0.3099i | 1.2153 + 0.3093i |
| 24.5 | 1.2528 + 0.5442i | 1.3771 + 0.4900i | 1.1779 + 0.4401i | 1.2795 + 0.4047i | 1.5543 + 0.3201i | 1.4294 + 0.3521i | 1.1682 + 0.3125i | 1.2881 + 0.3079i |
| 25 | 1.2983 + 0.5282i | 1.4160 + 0.4599i | 1.1643 + 0.5224i | 1.1475 + 0.4397i | 1.5155 + 0.3070i | 1.3432 + 0.3541i | 1.2191 + 0.2989i | 1.2191 + 0.3646i |
| 25.5 | 1.2159 + 0.4133i | 1.5064 + 0.3808i | 1.1497 + 0.3852i | 1.3705 + 0.3603i | 1.7393 + 0.2807i | 1.6490 + 0.4561i | 1.1846 + 0.2701i | 1.3033 + 0.2639i |
| 26 | 1.2978 + 0.5029i | 1.3930 + 0.4106i | 1.1805 + 0.5049i | 1.1527 + 0.4078i | 1.6859 + 0.2482i | 1.3072 + 0.3236i | 1.5221 + 0.2723i | 1.1975 + 0.3375i |
| 26.5 | 1.4481 + 0.5040i | 1.3970 + 0.4028i | 1.1626 + 0.4656i | 1.2689 + 0.4386i | 1.6732 + 0.2462i | 1.3551 + 0.3008i | 1.5213 + 0.2743i | 1.2473 + 0.3399i |
| 27 | 1.3902 + 0.4354i | 1.2902 + 0.3800i | 1.1890 + 0.4695i | 1.1811 + 0.3714i | 1.4284 + 0.3107i | 1.2970 + 0.2793i | 1.0892 + 0.2786i | 1.1782 + 0.2634i |
| 27.5 | 1.3263 + 0.4151i | 1.4095 + 0.3204i | 1.2199 + 0.4281i | 1.1604 + 0.3543i | 1.5775 + 0.4006i | 1.2854 + 0.2866i | 1.0929 + 0.2569i | 1.1834 + 0.2541i |
| 28 | 1.3867 + 0.4311i | 1.4607 + 0.3299i | 1.2745 + 0.4347i | 1.1818 + 0.3938i | 1.6162 + 0.3509i | 1.3455 + 0.2946i | 1.1478 + 0.2771i | 1.2386 + 0.2982i |

| SNR/w | w88 | w89 | w90 | w91 | w92 | w93 | w94 | w95 |
|---|---|---|---|---|---|---|---|---|
| 7 | 1.1269 + 0.6205i | 1.0807 + 0.5881i | 1.2525 + 0.3664i | 1.1912 + 0.3588i | 1.0807 + 0.5880i | 1.0491 + 0.5667i | 1.1911 + 0.3587i | 1.1500 + 0.3534i |
| 7.5 | 1.0675 + 0.6151i | 1.0875 + 0.6309i | 1.1983 + 0.3223i | 1.2222 + 0.3261i | 1.0234 + 0.5801i | 1.0375 + 0.5912i | 1.1411 + 0.3161i | 1.1582 + 0.3189i |
| 8 | 1.1463 + 0.2942i | 1.1610 + 0.2957i | 1.1529 + 0.2954i | 1.1671 + 0.2968i | 1.0173 + 0.5997i | 1.0290 + 0.6091i | 1.0232 + 0.6042i | 1.0346 + 0.6133i |
| 8.5 | 1.0937 + 0.2747i | 1.1032 + 0.2752i | 1.1025 + 0.2752i | 1.1122 + 0.2758i | 0.9704 + 0.5786i | 0.9777 + 0.5847i | 0.9773 + 0.5841i | 0.9847 + 0.5903i |
| 9 | 0.5636 + 0.2323i | 0.5707 + 0.2334i | 0.5707 + 0.2334i | 0.5780 + 0.2344i | 0.5707 + 0.2334i | 0.5780 + 0.2344i | 0.5780 + 0.2344i | 0.5854 + 0.2355i |
| 9.5 | 0.5968 + 0.2255i | 0.6012 + 0.2261i | 0.6012 + 0.2261i | 0.6059 + 0.2267i | 0.6012 + 0.2261i | 0.6058 + 0.2267i | 0.6059 + 0.2267i | 0.6106 + 0.2273i |
| 10 | 0.6227 + 0.2168i | 0.6259 + 0.2172i | 0.6259 + 0.2172i | 0.6292 + 0.2175i | 0.6259 + 0.2172i | 0.6291 + 0.2175i | 0.6291 + 0.2175i | 0.6326 + 0.2179i |
| 10.5 | 0.6418 + 0.2077i | 0.6476 + 0.2072i | 0.6404 + 0.2072i | 0.6456 + 0.2089i | 0.6433 + 0.2075i | 0.6481 + 0.2077i | 0.6414 + 0.2091i | 0.6468 + 0.2089i |
| 11 | 1.1247 + 0.7404i | 1.1447 + 0.7487i | 1.1110 + 0.7560i | 1.1310 + 0.7655i | 1.1082 + 0.7292i | 1.1241 + 0.7352i | 1.0969 + 0.7444i | 1.1130 + 0.7516i |
| 11.5 | 1.1362 + 0.7382i | 1.1578 + 0.7444i | 1.1157 + 0.7599i | 1.1373 + 0.7672i | 1.1202 + 0.7271i | 1.1373 + 0.7309i | 1.1031 + 0.7481i | 1.1204 + 0.7530i |
| 12 | 1.1426 + 0.7277i | 1.1700 + 0.7305i | 1.1110 + 0.7594i | 1.1381 + 0.7627i | 1.1269 + 0.7178i | 1.1484 + 0.7184i | 1.1005 + 0.7487i | 1.1223 + 0.7499i |
| 12.5 | 1.1331 + 0.7163i | 1.1603 + 0.7237i | 1.1464 + 0.7012i | 1.1764 + 0.7112i | 1.1144 + 0.6491i | 1.1309 + 0.6495i | 1.1250 + 0.6328i | 1.1419 + 0.6337i |
| 13 | 0.7550 + 0.1791i | 0.7551 + 0.1800i | 0.7594 + 0.1796i | 0.7596 + 0.1805i | 0.7504 + 0.1738i | 0.7504 + 0.1746i | 0.7550 + 0.1740i | 0.7551 + 0.1749i |
| 13.5 | 1.0890 + 0.6867i | 1.1207 + 0.6838i | 0.8879 + 0.6679i | 1.1180 + 0.6598i | 1.0962 + 0.6051i | 1.1285 + 0.5871i | 1.1014 + 0.5902i | 1.1343 + 0.5717i |
| 14 | 1.1381 + 0.6297i | 1.1391 + 0.6502i | 1.1375 + 0.6274i | 1.1383 + 0.6482i | 1.2261 + 0.5016i | 1.2261 + 0.5141i | 1.2286 + 0.4990i | 1.2246 + 0.5114i |
| 14.5 | 1.1288 + 0.6188i | 1.1336 + 0.6433i | 1.1285 + 0.6183i | 1.1333 + 0.6428i | 1.2165 + 0.4859i | 1.2154 + 0.4980i | 1.2180 + 0.4847i | 1.2167 + 0.4968i |
| 15 | 1.0127 + 0.3520i | 1.0146 + 0.3584i | 1.0749 + 0.3554i | 1.0778 + 0.3633i | 1.0077 + 0.3323i | 1.0090 + 0.3383i | 1.0679 + 0.3346i | 1.0700 + 0.3417i |
| 15.5 | 0.9997 + 0.3446i | 1.0005 + 0.3460i | 1.0642 + 0.3496i | 1.0660 + 0.3516i | 0.9998 + 0.3318i | 1.0005 + 0.3331i | 1.0648 + 0.3319i | 1.0659 + 0.3335i |
| 16 | 0.9503 + 0.3178i | 0.9501 + 0.3193i | 1.0163 + 0.3211i | 1.0157 + 0.3221i | 0.9533 + 0.3041i | 0.9531 + 0.3056i | 1.0230 + 0.3042i | 1.0224 + 0.3053i |

-continued

| SNR/w | w96 | w97 | w98 | w99 | w100 | w101 | w102 | w103 |
|---|---|---|---|---|---|---|---|---|
| 16.5 | 0.9220 + 0.3698i | 0.9216 + 0.3715i | 0.9844 + 0.3653i | 0.9832 + 0.3663i | 0.9233 + 0.3407i | 0.9230 + 0.3422i | 0.9860 + 0.3329i | 0.9852 + 0.3338i |
| 17 | 0.9165 + 0.3725i | 0.9163 + 0.3747i | 0.9819 + 0.3690i | 0.9811 + 0.3702i | 0.9180 + 0.3366i | 0.9180 + 0.3383i | 0.9850 + 0.3293i | 0.9848 + 0.3302i |
| 17.5 | 0.9142 + 0.3757i | 0.9141 + 0.3781i | 0.9817 + 0.3734i | 0.9813 + 0.3746i | 0.9154 + 0.3298i | 0.9157 + 0.3313i | 0.9858 + 0.3233i | 0.9863 + 0.3240i |
| 18 | 0.9138 + 0.3822i | 0.9144 + 0.3842i | 0.9841 + 0.3804i | 0.9845 + 0.3809i | 0.9148 + 0.3221i | 0.9154 + 0.3230i | 0.9879 + 0.3164i | 0.9893 + 0.3166i |
| 18.5 | 0.8251 + 0.3261i | 0.8233 + 0.3295i | 0.8905 + 0.3124i | 0.8840 + 0.3165i | 0.8225 + 0.2848i | 0.8203 + 0.2870i | 0.8966 + 0.2737i | 0.8904 + 0.2767i |
| 19 | 0.8222 + 0.3229i | 0.8207 + 0.3256i | 0.8900 + 0.3084i | 0.8836 + 0.3122i | 0.8120 + 0.2675i | 0.8097 + 0.2688i | 0.8901 + 0.2542i | 0.8837 + 0.2565i |
| 19.5 | 0.8206 + 0.3293i | 0.8193 + 0.3306i | 0.8858 + 0.3108i | 0.8812 + 0.3143i | 0.8003 + 0.2579i | 0.7978 + 0.2583i | 0.8767 + 0.2412i | 0.8701 + 0.2436i |
| 20 | 0.9539 + 0.5011i | 0.9519 + 0.4998i | 1.0693 + 0.5130i | 1.0495 + 0.5116i | 0.9756 + 0.3596i | 0.9716 + 0.3593i | 1.0786 + 0.3657i | 1.0560 + 0.3643i |
| 20.5 | 0.8948 + 0.3945i | 0.8934 + 0.3928i | 0.9902 + 0.3771i | 0.9832 + 0.3777i | 0.8770 + 0.2774i | 0.8761 + 0.2767i | 0.9740 + 0.2604i | 0.9693 + 0.2595i |
| 21 | 0.8935 + 0.4269i | 0.8908 + 0.4260i | 0.9966 + 0.4264i | 1.0364 + 0.4264i | 0.8943 + 0.3054i | 0.8927 + 0.3044i | 0.9947 + 0.3071i | 1.0286 + 0.3083i |
| 21.5 | 0.9090 + 0.4531i | 0.9132 + 0.4519i | 1.0760 + 0.4480i | 1.0566 + 0.4440i | 0.9090 + 0.3316i | 0.9115 + 0.3320i | 1.0507 + 0.3110i | 1.0342 + 0.3202i |
| 22 | 0.8987 + 0.4376i | 0.8903 + 0.4347i | 1.0147 + 0.4454i | 1.0560 + 0.4440i | 0.9023 + 0.3107i | 0.9090 + 0.3097i | 1.0146 + 0.3155i | 1.0502 + 0.3176i |
| 22.5 | 0.8899 + 0.4514i | 0.8957 + 0.4429i | 1.0333 + 0.4413i | 0.9986 + 0.4359i | 0.8881 + 0.3104i | 0.8946 + 0.3136i | 1.0329 + 0.3081i | 0.9965 + 0.3137i |
| 23 | 0.9020 + 0.4280i | 0.9107 + 0.4169i | 1.0477 + 0.4197i | 1.0225 + 0.4080i | 0.8871 + 0.2956i | 0.8975 + 0.2912i | 1.0507 + 0.2866i | 1.0098 + 0.2870i |
| 23.5 | 0.9127 + 0.4335i | 0.9265 + 0.4155i | 1.0590 + 0.4526i | 1.0475 + 0.4190i | 0.9211 + 0.2931i | 0.9205 + 0.3010i | 1.0587 + 0.2866i | 1.0664 + 0.3012i |
| 24 | 0.8972 + 0.4131i | 0.8745 + 0.3937i | 1.0109 + 0.4143i | 1.0972 + 0.4234i | 0.9184 + 0.2920i | 0.8887 + 0.2934i | 1.0221 + 0.3073i | 1.1006 + 0.3080i |
| 24.5 | 0.8620 + 0.4205i | 0.8885 + 0.4188i | 1.0696 + 0.4404i | 0.9798 + 0.4306i | 0.8874 + 0.2941i | 0.9092 + 0.3033i | 1.0686 + 0.3238i | 1.0059 + 0.3162i |
| 25 | 0.9102 + 0.5075i | 0.9170 + 0.4303i | 1.0241 + 0.5303i | 1.0328 + 0.4412i | 0.9443 + 0.2680i | 0.9308 + 0.3404i | 1.0467 + 0.2771i | 1.0251 + 0.3580i |
| 25.5 | 0.9146 + 0.4349i | 0.9045 + 0.3595i | 1.0466 + 0.3967i | 0.9891 + 0.3453i | 0.8628 + 0.2351i | 0.8976 + 0.2659i | 1.0804 + 0.2637i | 0.9941 + 0.2617i |
| 26 | 1.0272 + 0.4905i | 1.0257 + 0.4280i | 0.9434 + 0.4788i | 0.9114 + 0.4552i | 0.9236 + 0.2785i | 0.9236 + 0.3421i | 1.0143 + 0.3002i | 0.9068 + 0.3854i |
| 26.5 | 0.9902 + 0.3600i | 0.9588 + 0.3951i | 1.0628 + 0.4448i | 0.9496 + 0.4697i | 0.8975 + 0.2987i | 0.8675 + 0.3774i | 1.1092 + 0.3451i | 0.8734 + 0.4346i |
| 27 | 1.0478 + 0.5049i | 1.0616 + 0.4245i | 0.9563 + 0.4822i | 0.9741 + 0.4130i | 0.9128 + 0.2490i | 0.9100 + 0.3284i | 1.0094 + 0.2429i | 0.9848 + 0.3374i |
| 27.5 | 1.0559 + 0.4504i | 1.0285 + 0.3785i | 0.9708 + 0.5009i | 0.9399 + 0.4335i | 0.9282 + 0.2534i | 0.9606 + 0.3233i | 1.0203 + 0.2262i | 0.9167 + 0.3776i |
| 28 | 0.9950 + 0.4764i | 0.9740 + 0.4084i | 0.9094 + 0.5124i | 0.9401 + 0.5713i | 1.0045 + 0.2913i | 1.0508 + 0.3677i | 1.0666 + 0.2494i | 0.8323 + 0.4476i |

| SNR/w | w96 | w97 | w98 | w99 | w100 | w101 | w102 | w103 |
|---|---|---|---|---|---|---|---|---|
| 7 | 1.2113 + 0.6838i | 1.1270 + 0.6205i | 1.3688 + 0.3795i | 1.2525 + 0.3664i | 1.1270 + 0.6205i | 1.0807 + 0.5881i | 1.2525 + 0.3664i | 1.1912 + 0.3588i |
| 7.5 | 1.1537 + 0.6849i | 1.1842 + 0.7091i | 1.3107 + 0.3335i | 1.3451 + 0.3391i | 1.0671 + 0.6146i | 1.0871 + 0.6303i | 1.1980 + 0.3220i | 1.2219 + 0.3258i |
| 8 | 1.2548 + 0.3037i | 1.2796 + 0.3062i | 1.2544 + 0.3046i | 1.2755 + 0.3068i | 1.1025 + 0.6705i | 1.1224 + 0.6865i | 1.1038 + 0.6710i | 1.1207 + 0.6846i |
| 8.5 | 1.3377 + 0.2954i | 1.3512 + 0.2962i | 1.3339 + 0.2948i | 1.3454 + 0.2954i | 1.1680 + 0.7418i | 1.1765 + 0.7488i | 1.1636 + 0.7382i | 1.1711 + 0.7444i |
| 9 | 0.3407 + 0.1966i | 0.3447 + 0.1984i | 0.3447 + 0.1984i | 0.3489 + 0.2002i | 0.3489 + 0.2002i | 0.3489 + 0.2002i | 0.3488 + 0.2002i | 0.3531 + 0.2020i |
| 9.5 | 0.3232 + 0.1845i | 0.3242 + 0.1850i | 0.3242 + 0.1850i | 0.3253 + 0.1854i | 0.3242 + 0.1850i | 0.3252 + 0.1854i | 0.3252 + 0.1854i | 0.3263 + 0.1859i |
| 10 | 0.3111 + 0.1764i | 0.3108 + 0.1762i | 0.3108 + 0.1762i | 0.3104 + 0.1761i | 0.3108 + 0.1762i | 0.3104 + 0.1761i | 0.3104 + 0.1761i | 0.3101 + 0.1759i |
| 10.5 | 0.3055 + 0.1723i | 0.3041 + 0.1716i | 0.3056 + 0.1722i | 0.3042 + 0.1715i | 0.3054 + 0.1719i | 0.3038 + 0.1712i | 0.3054 + 0.1718i | 0.3040 + 0.1712i |
| 11 | 0.9598 + 0.2292i | 0.9656 + 0.2252i | 0.9614 + 0.2245i | 0.9673 + 0.2204i | 0.9696 + 0.2243i | 0.9752 + 0.2204i | 0.9714 + 0.2194i | 0.9770 + 0.2155i |
| 11.5 | 0.9515 + 0.2186i | 0.9582 + 0.2186i | 0.9703 + 0.2119i | 0.9606 + 0.2086i | 0.9634 + 0.2146i | 0.9701 + 0.2114i | 0.9660 + 0.2076i | 0.9729 + 0.2044i |
| 12 | 0.9462 + 0.2105i | 0.9527 + 0.2092i | 0.9503 + 0.1993i | 0.9570 + 0.1979i | 0.9602 + 0.2070i | 0.9670 + 0.2057i | 0.9651 + 0.1952i | 0.9720 + 0.1938i |
| 12.5 | 0.9013 + 0.1778i | 0.9002 + 0.1778i | 0.9065 + 0.1772i | 0.9054 + 0.1773i | 0.9243 + 0.1814i | 0.9232 + 0.1816i | 0.9303 + 0.1809i | 0.9291 + 0.1811i |
| 13 | 0.4068 + 0.1632i | 0.4068 + 0.1632i | 0.4072 + 0.1631i | 0.4073 + 0.1631i | 0.4055 + 0.1622i | 0.4056 + 0.1622i | 0.4060 + 0.1621i | 0.4060 + 0.1621i |
| 13.5 | 0.8701 + 0.1562i | 0.8708 + 0.1567i | 0.8703 + 0.1581i | 0.8710 + 0.1586i | 0.8731 + 0.1651i | 0.8735 + 0.1667i | 0.8735 + 0.1667i | 0.8744 + 0.1672i |
| 14 | 0.8548 + 0.1513i | 0.8553 + 0.1508i | 0.8548 + 0.1514i | 0.8553 + 0.1508i | 0.8507 + 0.1570i | 0.8511 + 0.1563i | 0.8507 + 0.1572i | 0.8511 + 0.1565i |
| 14.5 | 0.8431 + 0.1434i | 0.8436 + 0.1427i | 0.8429 + 0.1435i | 0.8433 + 0.1427i | 0.8388 + 0.1513i | 0.8392 + 0.1506i | 0.8386 + 0.1513i | 0.8390 + 0.1506i |
| 15 | 0.6429 + 0.1455i | 0.6427 + 0.1449i | 0.6341 + 0.1143i | 0.6339 + 0.1146i | 0.6442 + 0.1116i | 0.6440 + 0.1120i | 0.6353 + 0.1114i | 0.6350 + 0.1118i |
| 15.5 | 0.6326 + 0.1105i | 0.6325 + 0.1105i | 0.6224 + 0.1102i | 0.6223 + 0.1102i | 0.6324 + 0.1086i | 0.6322 + 0.1086i | 0.6223 + 0.1083i | 0.6221 + 0.1083i |
| 16 | 0.5920 + 0.1104i | 0.5921 + 0.1104i | 0.5817 + 0.1103i | 0.5817 + 0.1103i | 0.5909 + 0.1099i | 0.5909 + 0.1100i | 0.5807 + 0.1099i | 0.5808 + 0.1100i |
| 16.5 | 0.5940 + 0.1142i | 0.5940 + 0.1139i | 0.5859 + 0.1144i | 0.5860 + 0.1141i | 0.5933 + 0.1173i | 0.5934 + 0.1170i | 0.5853 + 0.1175i | 0.5855 + 0.1172i |
| 17 | 0.5899 + 0.1125i | 0.5899 + 0.1118i | 0.5822 + 0.1127i | 0.5822 + 0.1120i | 0.5890 + 0.1191i | 0.5890 + 0.1185i | 0.5815 + 0.1193i | 0.5815 + 0.1187i |
| 17.5 | 0.5844 + 0.1101i | 0.5843 + 0.1092i | 0.5782 + 0.1103i | 0.5781 + 0.1094i | 0.5836 + 0.1220i | 0.5835 + 0.1210i | 0.5775 + 0.1222i | 0.5774 + 0.1212i |
| 18 | 0.5770 + 0.1046i | 0.5769 + 0.1040i | 0.5735 + 0.1049i | 0.5734 + 0.1042i | 0.5765 + 0.1256i | 0.5764 + 0.1247i | 0.5731 + 0.1257i | 0.5730 + 0.1248i |
| 18.5 | 0.5025 + 0.0926i | 0.5029 + 0.0925i | 0.4964 + 0.0926i | 0.4968 + 0.0924i | 0.5031 + 0.1450i | 0.5034 + 0.1446i | 0.4973 + 0.1458i | 0.4976 + 0.1454i |
| 19 | 0.4815 + 0.0819i | 0.4818 + 0.0819i | 0.4772 + 0.0818i | 0.4774 + 0.0818i | 0.4859 + 0.1636i | 0.4861 + 0.1635i | 0.4819 + 0.1642i | 0.4821 + 0.1641i |
| 19.5 | 0.4664 + 0.0749i | 0.4666 + 0.0749i | 0.4638 + 0.0749i | 0.4640 + 0.0749i | 0.4747 + 0.1798i | 0.4749 + 0.1797i | 0.4726 + 0.1802i | 0.4727 + 0.1801i |

-continued

| SNR/w | w104 | w105 | w106 | w107 | w108 | w109 | w110 | w111 |
|---|---|---|---|---|---|---|---|---|
| 20 | | | | 0.6635 + 0.0695i | 0.6508 + 0.1706i | 0.6504 + 0.1706i | 0.6560 + 0.1719i | 0.6557 + 0.1718i |
| 20.5 | | | | 0.5386 + 0.0652i | 0.5408 + 0.1813i | 0.5406 + 0.1813i | 0.5439 + 0.1821i | 0.5436 + 0.1821i |
| 21 | | | | 0.5716 + 0.0610i | 0.5593 + 0.1727i | 0.5595 + 0.1728i | 0.5706 + 0.1727i | 0.5708 + 0.1728i |
| 21.5 | | | | 0.5955 + 0.0622i | 0.5791 + 0.1814i | 0.5790 + 0.1815i | 0.5914 + 0.1828i | 0.5912 + 0.1828i |
| 22 | | | | 0.5835 + 0.0582i | 0.5575 + 0.1732i | 0.5576 + 0.1733i | 0.5809 + 0.1737i | 0.5810 + 0.1737i |
| 22.5 | | | | 0.5855 + 0.0608i | 0.5599 + 0.1812i | 0.5595 + 0.1803i | 0.5837 + 0.1811i | 0.5834 + 0.1802i |
| 23 | | | | 0.5795 + 0.0554i | 0.5463 + 0.1728i | 0.5490 + 0.1726i | 0.5844 + 0.1763i | 0.5868 + 0.1740i |
| 23.5 | | | | 0.5974 + 0.0585i | 0.5452 + 0.1752i | 0.5450 + 0.1739i | 0.5956 + 0.1765i | 0.5951 + 0.1749i |
| 24 | | | | 0.5980 + 0.0551i | 0.5321 + 0.1688i | 0.5320 + 0.1658i | 0.5958 + 0.1679i | 0.5958 + 0.1648i |
| 24.5 | | | | 0.6138 + 0.0536i | 0.5352 + 0.1645i | 0.5350 + 0.1572i | 0.6122 + 0.1635i | 0.6124 + 0.1559i |
| 25 | | | | 0.6376 + 0.0621i | 0.5575 + 0.1766i | 0.5575 + 0.1624i | 0.6391 + 0.1800i | 0.6390 + 0.1629i |
| 25.5 | | | | 0.5870 + 0.0655i | 0.5211 + 0.1908i | 0.5175 + 0.1547i | 0.5970 + 0.1831i | 0.5993 + 0.1507i |
| 26 | | | | 0.6310 + 0.0929i | 0.5798 + 0.2126i | 0.5801 + 0.1655i | 0.6572 + 0.2101i | 0.6463 + 0.1533i |
| 26.5 | | | | 0.6376 + 0.0755i | 0.5674 + 0.2153i | 0.5589 + 0.1584i | 0.6549 + 0.1897i | 0.6259 + 0.1463i |
| 27 | | | | 0.6367 + 0.1004i | 0.5594 + 0.2218i | 0.5685 + 0.1676i | 0.6391 + 0.2359i | 0.6415 + 0.1699i |
| 27.5 | | | | 0.6371 + 0.1067i | 0.5690 + 0.2288i | 0.5706 + 0.1684i | 0.6484 + 0.2299i | 0.6440 + 0.1694i |
| 28 | | | | 0.6505 + 0.1199i | 0.5646 + 0.2390i | 0.5722 + 0.1799i | 0.6434 + 0.2525i | 0.6497 + 0.1851i |

| SNR/w | w104 | w105 | w106 | w107 | w108 | w109 | w110 | w111 |
|---|---|---|---|---|---|---|---|---|
| 7 | 1.1270 + 0.6205i | 1.0807 + 0.5881i | 1.2525 + 0.3664i | 1.1912 + 0.3588i | 1.0807 + 0.5880i | 1.0491 + 0.5667i | 1.1912 + 0.3587i | 1.1500 + 0.3534i |
| 7.5 | 1.0674 + 0.6149i | 1.0875 + 0.6306i | 1.1983 + 0.3222i | 1.2222 + 0.3259i | 1.0234 + 0.5799i | 1.0375 + 0.5910i | 1.1411 + 0.3160i | 1.1582 + 0.3188i |
| 8 | 1.1464 + 0.2943i | 1.1612 + 0.2957i | 1.1530 + 0.2954i | 1.1673 + 0.2968i | 1.0174 + 0.5998i | 1.0291 + 0.6091i | 1.0233 + 0.6043i | 1.0347 + 0.6133i |
| 8.5 | 1.0937 + 0.2747i | 1.1031 + 0.2752i | 1.1025 + 0.2758i | 1.1122 + 0.2758i | 0.9704 + 0.5786i | 0.9776 + 0.5847i | 0.9772 + 0.5840i | 0.9846 + 0.5902i |
| 9 | 0.3447 + 0.1984i | 0.3489 + 0.2002i | 0.3488 + 0.2002i | 0.3531 + 0.2020i | 0.3488 + 0.2002i | 0.3531 + 0.2020i | 0.3531 + 0.2020i | 0.3575 + 0.2040i |
| 9.5 | 0.3242 + 0.1850i | 0.3252 + 0.1854i | 0.3253 + 0.1854i | 0.3263 + 0.1859i | 0.3252 + 0.1854i | 0.3263 + 0.1859i | 0.3263 + 0.1859i | 0.3274 + 0.1863i |
| 10 | 0.3108 + 0.1762i | 0.3104 + 0.1761i | 0.3104 + 0.1761i | 0.3101 + 0.1759i | 0.3104 + 0.1761i | 0.3101 + 0.1759i | 0.3101 + 0.1759i | 0.3097 + 0.1758i |
| 10.5 | 0.3048 + 0.1718i | 0.3035 + 0.1712i | 0.3048 + 0.1717i | 0.3034 + 0.1711i | 0.3047 + 0.1715i | 0.3031 + 0.1708i | 0.3046 + 0.1714i | 0.3031 + 0.1707i |
| 11 | 0.9706 + 0.2266i | 0.9761 + 0.2266i | 0.9723 + 0.2218i | 0.9778 + 0.2218i | 0.9799 + 0.2217i | 0.9851 + 0.2179i | 0.9817 + 0.2167i | 0.9870 + 0.2129i |
| 11.5 | 0.9644 + 0.2189i | 0.9711 + 0.2157i | 0.9668 + 0.2118i | 0.9736 + 0.2086i | 0.9761 + 0.2148i | 0.9827 + 0.2116i | 0.9788 + 0.2074i | 0.9854 + 0.2043i |
| 12 | 0.9610 + 0.2154i | 0.9677 + 0.2142i | 0.9651 + 0.2034i | 0.9720 + 0.2020i | 0.9751 + 0.2118i | 0.9819 + 0.2105i | 0.9800 + 0.1991i | 0.9869 + 0.1978i |
| 12.5 | 0.9229 + 0.1736i | 0.9217 + 0.1739i | 0.9290 + 0.1728i | 0.9277 + 0.1732i | 0.9483 + 0.1765i | 0.9470 + 0.1770i | 0.9551 + 0.1758i | 0.9537 + 0.1764i |
| 13 | 0.4055 + 0.1623i | 0.4055 + 0.1623i | 0.4059 + 0.1623i | 0.4059 + 0.1623i | 0.4042 + 0.1614i | 0.4043 + 0.1614i | 0.4046 + 0.1613i | 0.4047 + 0.1613i |
| 13.5 | 0.9359 + 0.1466i | 0.9362 + 0.1480i | 0.9360 + 0.1491i | 0.9364 + 0.1505i | 0.9403 + 0.1581i | 0.9409 + 0.1596i | 0.9409 + 0.1609i | 0.9416 + 0.1624i |
| 14 | 0.9466 + 0.1514i | 0.9473 + 0.1504i | 0.9465 + 0.1518i | 0.9472 + 0.1507i | 0.9398 + 0.1633i | 0.9404 + 0.1623i | 0.9399 + 0.1637i | 0.9405 + 0.1627i |
| 14.5 | 0.9378 + 0.1450i | 0.9385 + 0.1438i | 0.9372 + 0.1452i | 0.9380 + 0.1440i | 0.9293 + 0.1599i | 0.9300 + 0.1587i | 0.9288 + 0.1600i | 0.9295 + 0.1588i |
| 15 | 0.7372 + 0.1154i | 0.7366 + 0.1158i | 0.7172 + 0.1156i | 0.7167 + 0.1160i | 0.7394 + 0.1123i | 0.7388 + 0.1127i | 0.7195 + 0.1125i | 0.7190 + 0.1129i |
| 15.5 | 0.7319 + 0.1116i | 0.7314 + 0.1117i | 0.7068 + 0.1121i | 0.7063 + 0.1122i | 0.7308 + 0.1101i | 0.7303 + 0.1102i | 0.7057 + 0.1104i | 0.7052 + 0.1105i |
| 16 | 0.6884 + 0.1083i | 0.6886 + 0.1084i | 0.6616 + 0.1092i | 0.6618 + 0.1093i | 0.6855 + 0.1077i | 0.6857 + 0.1079i | 0.6588 + 0.1086i | 0.6590 + 0.1088i |
| 16.5 | 0.6864 + 0.1137i | 0.6864 + 0.1134i | 0.6676 + 0.1138i | 0.6677 + 0.1136i | 0.6853 + 0.1171i | 0.6854 + 0.1169i | 0.6663 + 0.1172i | 0.6664 + 0.1170i |
| 17 | 0.6923 + 0.1121i | 0.6922 + 0.1115i | 0.6712 + 0.1121i | 0.6711 + 0.1115i | 0.6905 + 0.1192i | 0.6904 + 0.1186i | 0.6691 + 0.1190i | 0.6690 + 0.1185i |
| 17.5 | 0.7012 + 0.1095i | 0.7009 + 0.1087i | 0.6792 + 0.1095i | 0.6788 + 0.1087i | 0.6990 + 0.1220i | 0.6987 + 0.1212i | 0.6767 + 0.1218i | 0.6764 + 0.1210i |
| 18 | 0.7129 + 0.1045i | 0.7123 + 0.1039i | 0.6923 + 0.1045i | 0.6917 + 0.1037i | 0.7111 + 0.1264i | 0.7106 + 0.1258i | 0.6902 + 0.1260i | 0.6895 + 0.1252i |
| 18.5 | 0.6075 + 0.0947i | 0.6088 + 0.0945i | 0.5844 + 0.0941i | 0.5859 + 0.0939i | 0.6059 + 0.1341i | 0.6074 + 0.1336i | 0.5826 + 0.1363i | 0.5841 + 0.1358i |
| 19 | 0.5966 + 0.0838i | 0.5980 + 0.0837i | 0.5718 + 0.0828i | 0.5731 + 0.0828i | 0.5998 + 0.1438i | 0.6010 + 0.1434i | 0.5752 + 0.1475i | 0.5764 + 0.1471i |
| 19.5 | 0.5846 + 0.0749i | 0.5864 + 0.0749i | 0.5618 + 0.0743i | 0.5635 + 0.0743i | 0.5946 + 0.1547i | 0.5961 + 0.1542i | 0.5720 + 0.1591i | 0.5734 + 0.1586i |
| 20 | 0.8384 + 0.0712i | 0.8412 + 0.0712i | 0.8149 + 0.0705i | 0.8173 + 0.0705i | 0.8311 + 0.1975i | 0.8339 + 0.1979i | 0.8052 + 0.1934i | 0.8073 + 0.1937i |
| 20.5 | 0.6890 + 0.0662i | 0.6902 + 0.0664i | 0.6754 + 0.0651i | 0.6764 + 0.0652i | 0.6972 + 0.1729i | 0.6985 + 0.1730i | 0.6793 + 0.1737i | 0.6803 + 0.1738i |
| 21 | 0.7544 + 0.0616i | 0.7531 + 0.0616i | 0.7101 + 0.0612i | 0.7097 + 0.0613i | 0.7525 + 0.1748i | 0.7511 + 0.1748i | 0.7084 + 0.1738i | 0.7079 + 0.1738i |
| 21.5 | 0.7653 + 0.0663i | 0.7669 + 0.0663i | 0.7308 + 0.0656i | 0.7317 + 0.0656i | 0.7665 + 0.1950i | 0.7678 + 0.1949i | 0.7256 + 0.1919i | 0.7261 + 0.1919i |
| 22 | 0.7744 + 0.0603i | 0.7754 + 0.0604i | 0.7103 + 0.0595i | 0.7107 + 0.0598i | 0.7712 + 0.1790i | 0.7719 + 0.1794i | 0.7081 + 0.1766i | 0.7086 + 0.1768i |
| 22.5 | 0.7679 + 0.0612i | 0.7657 + 0.0612i | 0.7064 + 0.0606i | 0.7057 + 0.0614i | 0.7654 + 0.1868i | 0.7644 + 0.1843i | 0.7049 + 0.1846i | 0.7033 + 0.1833i |
| 23 | 0.7657 + 0.0597i | 0.7696 + 0.0557i | 0.6939 + 0.0621i | 0.7016 + 0.0587i | 0.7756 + 0.1807i | 0.7749 + 0.1807i | 0.6970 + 0.1762i | 0.6982 + 0.1790i |

-continued

| SNR/w | w112 | w113 | w114 | w115 | w116 | w117 | w118 | w119 |
|---|---|---|---|---|---|---|---|---|
| 23.5 | 0.7900 + 0.0597i | 0.7910 + 0.0603i | 0.7021 + 0.0593i | 0.7027 + 0.0598i | 0.7914 + 0.1813i | 0.7928 + 0.1803i | 0.7010 + 0.1787i | 0.7013 + 0.1778i |
| 24 | 0.8051 + 0.0552i | 0.8065 + 0.0566i | 0.7009 + 0.0542i | 0.7004 + 0.0547i | 0.7953 + 0.1687i | 0.8004 + 0.1678i | 0.6967 + 0.1661i | 0.6962 + 0.1632i |
| 24.5 | 0.8200 + 0.0532i | 0.8255 + 0.0540i | 0.7143 + 0.0511i | 0.7132 + 0.0536i | 0.8118 + 0.1686i | 0.8115 + 0.1610i | 0.8093 + 0.1637i | 0.7099 + 0.1570i |
| 25 | 0.8167 + 0.0476i | 0.8301 + 0.0596i | 0.7280 + 0.0514i | 0.7263 + 0.0640i | 0.8267 + 0.1863i | 0.8324 + 0.1581i | 0.7321 + 0.1829i | 0.7299 + 0.1621i |
| 25.5 | 0.7861 + 0.0463i | 0.7641 + 0.0537i | 0.6712 + 0.0428i | 0.6775 + 0.0570i | 0.7796 + 0.1574i | 0.7610 + 0.1390i | 0.6803 + 0.1757i | 0.6806 + 0.1462i |
| 26 | 0.8256 + 0.0420i | 0.6508 + 0.0265i | 0.7670 + 0.0378i | 0.7001 + 0.0587i | 0.8174 + 0.1879i | 0.8223 + 0.1559i | 0.7337 + 0.1934i | 0.7270 + 0.1387i |
| 26.5 | 0.8065 + 0.0845i | 0.8269 + 0.0473i | 0.7329 + 0.0868i | 0.7278 + 0.0424i | 0.8099 + 0.1836i | 0.8587 + 0.1711i | 0.7310 + 0.1812i | 1.0723 + 0.1473i |
| 27 | 0.7854 + 0.0273i | 0.7838 + 0.0820i | 0.6971 + 0.0473i | 0.6977 + 0.0837i | 0.7918 + 0.2254i | 0.7850 + 0.1575i | 0.8587 + 0.2418i | 0.7115 + 0.1638i |
| 27.5 | 0.7633 + 0.0268i | 0.7892 + 0.0699i | 0.6869 + 0.0252i | 0.6979 + 0.0911i | 0.8189 + 0.2114i | 0.8022 + 0.1410i | 0.7337 + 0.2230i | 0.7228 + 0.1574i |
| 28 | 0.8172 + 0.0455i | 0.7772 + 0.1040i | 0.7246 + 0.0275i | 0.7114 + 0.0993i | 0.8716 + 0.1301i | 0.8012 + 0.1702i | 0.7245 + 0.2595i | 0.7276 + 0.1914i |

| SNR/w | w112 | w113 | w114 | w115 | w116 | w117 | w118 | w119 |
|---|---|---|---|---|---|---|---|---|
| 7 | 1.1271 + 0.6205i | 1.0808 + 0.5881i | 1.2526 + 0.3664i | 1.1913 + 0.3588i | 1.0808 + 0.5881i | 1.0491 + 0.5667i | 1.1913 + 0.3587i | 1.1501 + 0.3534i |
| 7.5 | 1.0665 + 0.6142i | 1.0864 + 0.6299i | 1.1971 + 0.3221i | 1.2209 + 0.3258i | 1.0228 + 0.5795i | 1.0298 + 0.5905i | 1.1403 + 0.3159i | 1.1573 + 0.3187i |
| 8 | 1.1464 + 0.2943i | 1.1611 + 0.2957i | 1.1529 + 0.2954i | 1.1672 + 0.2968i | 1.0173 + 0.5998i | 1.0268 + 0.6091i | 1.0233 + 0.6042i | 1.0347 + 0.6135i |
| 8.5 | 1.2312 + 0.2867i | 1.2451 + 0.2877i | 1.2391 + 0.2872i | 1.2519 + 0.2881i | 1.0818 + 0.6707i | 1.0923 + 0.6793i | 1.0878 + 0.6753i | 1.0973 + 0.6832i |
| 9 | 0.5353 + 0.2922i | 0.5413 + 0.2956i | 0.5413 + 0.2956i | 0.5474 + 0.2991i | 0.5413 + 0.2956i | 0.5473 + 0.2991i | 0.5473 + 0.2991i | 0.5535 + 0.3027i |
| 9.5 | 0.5607 + 0.3037i | 0.5644 + 0.3060i | 0.5644 + 0.3060i | 0.5681 + 0.3084i | 0.5644 + 0.3060i | 0.5681 + 0.3084i | 0.5681 + 0.3084i | 0.5720 + 0.3109i |
| 10 | 0.5781 + 0.3144i | 0.5806 + 0.3161i | 0.5806 + 0.3161i | 0.5832 + 0.3180i | 0.5805 + 0.3161i | 0.5831 + 0.3180i | 0.5831 + 0.3179i | 0.5858 + 0.3199i |
| 10.5 | 0.5888 + 0.3260i | 0.5924 + 0.3278i | 0.5887 + 0.3284i | 0.5924 + 0.3304i | 0.5897 + 0.3267i | 0.5933 + 0.3287i | 0.5896 + 0.3292i | 0.5933 + 0.3313i |
| 11 | 0.8362 + 0.5682i | 0.8396 + 0.5605i | 0.8338 + 0.5733i | 0.8370 + 0.5656i | 0.8407 + 0.5616i | 0.8443 + 0.5539i | 0.8380 + 0.5665i | 0.8415 + 0.5587i |
| 11.5 | 0.8262 + 0.5716i | 0.8288 + 0.5633i | 0.8228 + 0.5791i | 0.8251 + 0.5706i | 0.8312 + 0.5658i | 0.8340 + 0.5575i | 0.8274 + 0.5731i | 0.8301 + 0.5647i |
| 12 | 0.8158 + 0.5811i | 0.8175 + 0.5773i | 0.8109 + 0.5929i | 0.8120 + 0.5827i | 0.8208 + 0.5758i | 0.8228 + 0.5662i | 0.8153 + 0.5873i | 0.8168 + 0.5773i |
| 12.5 | 0.8160 + 0.5091i | 0.8140 + 0.5060i | 0.8170 + 0.5003i | 0.8151 + 0.5003i | 0.8328 + 0.5009i | 0.8310 + 0.4977i | 0.8348 + 0.4922i | 0.8331 + 0.4891i |
| 13 | 0.6223 + 0.3855i | 0.6230 + 0.3847i | 0.6258 + 0.3838i | 0.6266 + 0.3830i | 0.6167 + 0.3885i | 0.6174 + 0.3877i | 0.6199 + 0.3868i | 0.6207 + 0.3860i |
| 13.5 | 0.8010 + 0.4716i | 0.7981 + 0.4631i | 0.8032 + 0.4694i | 0.8004 + 0.4609i | 0.8150 + 0.4579i | 0.8124 + 0.4496i | 0.8178 + 0.4560i | 0.8152 + 0.4479i |
| 14 | 0.7899 + 0.4426i | 0.7994 + 0.4500i | 0.7989 + 0.4460i | 0.7995 + 0.4492i | 0.8002 + 0.4139i | 0.8004 + 0.4156i | 0.8004 + 0.4133i | 0.8007 + 0.4156i |
| 14.5 | 0.7899 + 0.4426i | 0.7897 + 0.4445i | 0.7895 + 0.4425i | 0.7894 + 0.4444i | 0.7939 + 0.4038i | 0.7936 + 0.4049i | 0.7937 + 0.4038i | 0.7933 + 0.4049i |
| 15 | 0.6482 + 0.3385i | 0.6485 + 0.3406i | 0.6408 + 0.3379i | 0.6411 + 0.3399i | 0.6471 + 0.3248i | 0.6473 + 0.3270i | 0.6396 + 0.3242i | 0.6398 + 0.3264i |
| 15.5 | 0.6364 + 0.3307i | 0.6364 + 0.3312i | 0.6280 + 0.3306i | 0.6280 + 0.3310i | 0.6363 + 0.3155i | 0.6363 + 0.3160i | 0.6276 + 0.3154i | 0.6276 + 0.3158i |
| 16 | 0.6024 + 0.3411i | 0.6029 + 0.3433i | 0.5938 + 0.3407i | 0.5943 + 0.3429i | 0.6008 + 0.3226i | 0.6013 + 0.3247i | 0.5920 + 0.3221i | 0.5925 + 0.3242i |
| 16.5 | 0.5946 + 0.3627i | 0.5945 + 0.3655i | 0.5859 + 0.3627i | 0.5859 + 0.3655i | 0.5942 + 0.3404i | 0.5942 + 0.3430i | 0.5857 + 0.3404i | 0.5857 + 0.3430i |
| 17 | 0.5905 + 0.3659i | 0.5905 + 0.3693i | 0.5822 + 0.3661i | 0.5821 + 0.3695i | 0.5900 + 0.3378i | 0.5899 + 0.3407i | 0.5819 + 0.3380i | 0.5818 + 0.3409i |
| 17.5 | 0.5844 + 0.3706i | 0.5843 + 0.3741i | 0.5781 + 0.3710i | 0.5780 + 0.3745i | 0.5839 + 0.3342i | 0.5838 + 0.3368i | 0.5778 + 0.3346i | 0.5777 + 0.3372i |
| 18 | 0.5758 + 0.3767i | 0.5758 + 0.3795i | 0.5729 + 0.3774i | 0.5727 + 0.3801i | 0.5761 + 0.3265i | 0.5759 + 0.3281i | 0.5730 + 0.3269i | 0.5729 + 0.3284i |
| 18.5 | 0.5265 + 0.4134i | 0.5272 + 0.4184i | 0.5224 + 0.4146i | 0.5232 + 0.4196i | 0.5135 + 0.3275i | 0.5139 + 0.3278i | 0.5088 + 0.3282i | 0.5092 + 0.3285i |
| 19 | 0.5245 + 0.4303i | 0.5250 + 0.4311i | 0.5231 + 0.4307i | 0.5235 + 0.4315i | 0.5030 + 0.3275i | 0.5031 + 0.3257i | 0.5006 + 0.3262i | 0.5007 + 0.3262i |
| 19.5 | 0.5260 + 0.4439i | 0.5262 + 0.4443i | 0.5265 + 0.4436i | 0.5267 + 0.4440i | 0.4975 + 0.3267i | 0.4974 + 0.3265i | 0.4968 + 0.3268i | 0.4967 + 0.3266i |
| 20 | 0.6102 + 0.4287i | 0.6098 + 0.4287i | 0.6168 + 0.4307i | 0.6164 + 0.4307i | 0.6323 + 0.3097i | 0.6321 + 0.3096i | 0.6383 + 0.3111i | 0.6381 + 0.3109i |
| 20.5 | 0.5630 + 0.4391i | 0.5628 + 0.4386i | 0.5703 + 0.4388i | 0.5701 + 0.4383i | 0.5506 + 0.3133i | 0.5504 + 0.3132i | 0.5559 + 0.3138i | 0.5557 + 0.3137i |
| 21 | 0.5566 + 0.4235i | 0.5569 + 0.4223i | 0.5678 + 0.4236i | 0.5682 + 0.4224i | 0.5580 + 0.2987i | 0.5581 + 0.2985i | 0.5692 + 0.2987i | 0.5694 + 0.2985i |
| 21.5 | 0.5599 + 0.4356i | 0.5604 + 0.4340i | 0.5771 + 0.4373i | 0.5776 + 0.4358i | 0.5700 + 0.3071i | 0.5700 + 0.3072i | 0.5846 + 0.3087i | 0.5845 + 0.3087i |
| 22 | 0.5524 + 0.4223i | 0.5523 + 0.4171i | 0.5726 + 0.4218i | 0.5725 + 0.4167i | 0.5552 + 0.2931i | 0.5549 + 0.2938i | 0.5770 + 0.2941i | 0.5765 + 0.2947i |
| 22.5 | 0.5501 + 0.4327i | 0.5505 + 0.4273i | 0.5776 + 0.4340i | 0.5797 + 0.4290i | 0.5554 + 0.3038i | 0.5546 + 0.3048i | 0.5808 + 0.3053i | 0.5808 + 0.3059i |
| 23 | 0.5419 + 0.4334i | 0.5491 + 0.4208i | 0.5902 + 0.4367i | 0.5845 + 0.4207i | 0.5479 + 0.2974i | 0.5495 + 0.3006i | 0.5887 + 0.2964i | 0.5873 + 0.2996i |
| 23.5 | 0.5420 + 0.4303i | 0.5423 + 0.4132i | 0.5947 + 0.4316i | 0.5945 + 0.4140i | 0.5432 + 0.2928i | 0.5435 + 0.2980i | 0.5939 + 0.2937i | 0.5940 + 0.2990i |
| 24 | 0.5281 + 0.4273i | 0.5287 + 0.3983i | 0.5871 + 0.4265i | 0.5877 + 0.3978i | 0.5370 + 0.2798i | 0.5310 + 0.2903i | 0.5922 + 0.2794i | 0.5917 + 0.2898i |
| 24.5 | 0.5365 + 0.4381i | 0.5382 + 0.3853i | 0.5982 + 0.4418i | 0.6015 + 0.3864i | 0.5370 + 0.2654i | 0.5375 + 0.2877i | 0.6082 + 0.2642i | 0.6073 + 0.2878i |
| 25 | 0.5453 + 0.4454i | 0.5502 + 0.3898i | 0.6234 + 0.4539i | 0.6307 + 0.3941i | 0.5562 + 0.2716i | 0.5549 + 0.3013i | 0.6389 + 0.2737i | 0.6372 + 0.3073i |
| 25.5 | 0.5461 + 0.4689i | 0.5406 + 0.4028i | 0.6279 + 0.4619i | 0.6209 + 0.3959i | 0.5286 + 0.2713i | 0.5338 + 0.3241i | 0.6051 + 0.2663i | 0.6111 + 0.3180i |
| 26 | 0.5698 + 0.4829i | 0.5665 + 0.4039i | 0.6267 + 0.4766i | 0.6435 + 0.4035i | 0.5791 + 0.2819i | 0.5732 + 0.3319i | 0.6629 + 0.2838i | 0.6557 + 0.3430i |
| 26.5 | 0.5542 + 0.5035i | 0.5680 + 0.4220i | 0.6136 + 0.5202i | 0.6338 + 0.4274i | 0.5765 + 0.2788i | 0.5763 + 0.3431i | 0.6576 + 0.2694i | 0.6479 + 0.3478i |

-continued

| SNR/w | w120 | w121 | w122 | w123 | w124 | w125 | w126 | w127 |
|---|---|---|---|---|---|---|---|---|
| 27 | 0.5772 + 0.4729i | 0.6966 + 0.5064i | 0.6313 + 0.4262i | 0.6900 + 0.4641i | 0.5461 + 0.2809i | 0.5401 + 0.3444i | 0.6216 + 0.3057i | 0.5842 + 0.3465i |
| 27.5 | 0.5441 + 0.4997i | 0.7312 + 0.5058i | 0.6103 + 0.4784i | 0.6785 + 0.4286i | 0.5678 + 0.2914i | 0.5691 + 0.3548i | 0.6493 + 0.2928i | 0.6423 + 0.3564i |
| 28 | 0.5732 + 0.4753i | 0.7131 + 0.5308i | 0.6412 + 0.4359i | 0.6970 + 0.4732i | 0.5488 + 0.2953i | 0.5454 + 0.3628i | 0.6317 + 0.3194i | 0.5938 + 0.3612i |

| SNR/w | w120 | w121 | w122 | w123 | w124 | w125 | w126 | w127 |
|---|---|---|---|---|---|---|---|---|
| 7 | 1.0808 + 0.5881i | 1.0491 + 0.5667i | 1.1913 + 0.3587i | 1.1501 + 0.3534i | 1.0491 + 0.5667i | 1.0254 + 0.5511i | 1.1501 + 0.3534i | 1.1196 + 0.3494i |
| 7.5 | 1.0230 + 0.5797i | 1.0371 + 0.5907i | 1.1405 + 0.3160i | 1.1576 + 0.3188i | 0.9947 + 0.5573i | 1.0053 + 0.5656i | 1.1037 + 0.3118i | 1.1167 + 0.3141i |
| 8 | 1.0940 + 0.2899i | 1.1040 + 0.2908i | 1.1001 + 0.2908i | 1.1101 + 0.2918i | 0.9770 + 0.5659i | 0.9849 + 0.5722i | 0.9822 + 0.5699i | 0.9902 + 0.5761i |
| 8.5 | 1.0784 + 0.2744i | 1.0861 + 0.2749i | 1.0858 + 0.2748i | 1.0936 + 0.2753i | 0.9593 + 0.5682i | 0.9652 + 0.5731i | 0.9651 + 0.5727i | 0.9711 + 0.5778i |
| 9 | 0.5413 + 0.2956i | 0.5474 + 0.2991i | 0.5473 + 0.2991i | 0.5535 + 0.3027i | 0.5473 + 0.2991i | 0.5535 + 0.3027i | 0.5535 + 0.3027i | 0.5598 + 0.3064i |
| 9.5 | 0.5644 + 0.3060i | 0.5681 + 0.3084i | 0.5681 + 0.3084i | 0.5720 + 0.3109i | 0.5681 + 0.3084i | 0.5720 + 0.3108i | 0.5720 + 0.3108i | 0.5760 + 0.3134i |
| 10 | 0.5806 + 0.3161i | 0.5832 + 0.3180i | 0.5831 + 0.3180i | 0.5859 + 0.3199i | 0.5831 + 0.3179i | 0.5858 + 0.3199i | 0.5858 + 0.3199i | 0.5887 + 0.3219i |
| 10.5 | 0.5193 + 0.3270i | 0.5950 + 0.3290i | 0.5911 + 0.3295i | 0.5950 + 0.3315i | 0.5920 + 0.3278i | 0.5959 + 0.3298i | 0.5920 + 0.3303i | 0.5958 + 0.3324i |
| 11 | 0.8443 + 0.5601i | 0.8480 + 0.5524i | 0.8415 + 0.5651i | 0.8452 + 0.5572i | 0.8489 + 0.5533i | 0.8529 + 0.5456i | 0.8460 + 0.5582i | 0.8499 + 0.5503i |
| 11.5 | 0.8363 + 0.5641i | 0.8394 + 0.5559i | 0.8323 + 0.5715i | 0.8352 + 0.5630i | 0.8416 + 0.5583i | 0.8450 + 0.5501i | 0.8374 + 0.5654i | 0.8405 + 0.5570i |
| 12 | 0.8293 + 0.5710i | 0.8318 + 0.5615i | 0.8231 + 0.5824i | 0.8251 + 0.5725i | 0.8349 + 0.5657i | 0.8377 + 0.5564i | 0.8282 + 0.5769i | 0.8306 + 0.5671i |
| 12.5 | 0.8267 + 0.5267i | 0.8246 + 0.5236i | 0.8275 + 0.5167i | 0.8255 + 0.5135i | 0.8430 + 0.5170i | 0.8413 + 0.5138i | 0.8450 + 0.5071i | 0.8434 + 0.5039i |
| 13 | 0.6274 + 0.3840i | 0.6283 + 0.3833i | 0.6312 + 0.3825i | 0.6321 + 0.3817i | 0.6214 + 0.3868i | 0.6222 + 0.3860i | 0.6249 + 0.3853i | 0.6257 + 0.3845i |
| 13.5 | 0.8224 + 0.5023i | 0.8205 + 0.4921i | 0.8269 + 0.4990i | 0.8233 + 0.4889i | 0.8404 + 0.4843i | 0.8376 + 0.4743i | 0.8438 + 0.4813i | 0.8413 + 0.4715i |
| 14 | 0.8712 + 0.4811i | 0.8729 + 0.4867i | 0.8713 + 0.4801i | 0.8730 + 0.4856i | 0.8755 + 0.4382i | 0.8763 + 0.4418i | 0.8758 + 0.4374i | 0.8766 + 0.4409i |
| 14.5 | 0.8682 + 0.4800i | 0.8686 + 0.4839i | 0.8676 + 0.4796i | 0.8679 + 0.4835i | 0.8762 + 0.4289i | 0.8756 + 0.4308i | 0.8755 + 0.4287i | 0.8749 + 0.4306i |
| 15 | 0.7345 + 0.3408i | 0.7347 + 0.3433i | 0.7199 + 0.3420i | 0.7202 + 0.3445i | 0.7346 + 0.3257i | 0.7346 + 0.3283i | 0.7193 + 0.3270i | 0.7195 + 0.3297i |
| 15.5 | 0.7191 + 0.3378i | 0.7191 + 0.3385i | 0.7002 + 0.3402i | 0.7002 + 0.3409i | 0.7226 + 0.3239i | 0.7225 + 0.3246i | 0.7028 + 0.3259i | 0.7028 + 0.3266i |
| 16 | 0.6878 + 0.3344i | 0.6881 + 0.3366i | 0.6675 + 0.3375i | 0.6681 + 0.3398i | 0.6876 + 0.3177i | 0.6880 + 0.3200i | 0.6666 + 0.3203i | 0.6672 + 0.3226i |
| 16.5 | 0.6909 + 0.3639i | 0.6910 + 0.3666i | 0.6696 + 0.3629i | 0.6697 + 0.3657i | 0.6898 + 0.3412i | 0.6898 + 0.3437i | 0.6688 + 0.3403i | 0.6688 + 0.3429i |
| 17 | 0.6985 + 0.3671i | 0.6986 + 0.3705i | 0.6741 + 0.3660i | 0.6741 + 0.3694i | 0.6963 + 0.3383i | 0.6964 + 0.3411i | 0.6723 + 0.3376i | 0.6724 + 0.3404i |
| 17.5 | 0.7101 + 0.3713i | 0.7102 + 0.3748i | 0.6848 + 0.3703i | 0.6848 + 0.3739i | 0.7068 + 0.3336i | 0.7068 + 0.3362i | 0.6820 + 0.3332i | 0.6819 + 0.3358i |
| 18 | 0.7225 + 0.3783i | 0.7224 + 0.3812i | 0.6978 + 0.3773i | 0.6976 + 0.3802i | 0.7190 + 0.3261i | 0.7188 + 0.3279i | 0.6952 + 0.3258i | 0.6949 + 0.3275i |
| 18.5 | 0.6455 + 0.3772i | 0.6481 + 0.3787i | 0.6230 + 0.3842i | 0.6255 + 0.3855i | 0.6262 + 0.3121i | 0.6283 + 0.3127i | 0.6018 + 0.3152i | 0.6039 + 0.3156i |
| 19 | 0.6603 + 0.3804i | 0.6622 + 0.3812i | 0.6392 + 0.3891i | 0.6412 + 0.3899i | 0.6291 + 0.3011i | 0.6306 + 0.3011i | 0.6052 + 0.3058i | 0.6065 + 0.3057i |
| 19.5 | 0.6720 + 0.3896i | 0.6730 + 0.3895i | 0.6528 + 0.3983i | 0.6538 + 0.3984i | 0.6318 + 0.2959i | 0.6327 + 0.2955i | 0.6099 + 0.3013i | 0.6107 + 0.3008i |
| 20 | 0.7951 + 0.4711i | 0.7968 + 0.4708i | 0.7604 + 0.4631i | 0.7614 + 0.4629i | 0.8152 + 0.3382i | 0.8178 + 0.3382i | 0.7845 + 0.3329i | 0.7862 + 0.3328i |
| 20.5 | 0.7474 + 0.4196i | 0.7475 + 0.4185i | 0.7127 + 0.4246i | 0.7128 + 0.4238i | 0.7230 + 0.2996i | 0.7239 + 0.2992i | 0.6939 + 0.3019i | 0.6944 + 0.3016i |
| 21 | 0.7489 + 0.4249i | 0.7477 + 0.4241i | 0.7038 + 0.4243i | 0.7036 + 0.4235i | 0.7501 + 0.3007i | 0.7486 + 0.3006i | 0.7057 + 0.2998i | 0.7053 + 0.2996i |
| 21.5 | 0.7659 + 0.4492i | 0.7653 + 0.4481i | 0.7088 + 0.4469i | 0.7087 + 0.4459i | 0.7665 + 0.3225i | 0.7666 + 0.3222i | 0.7166 + 0.3187i | 0.7166 + 0.3187i |
| 22 | 0.7592 + 0.4279i | 0.7613 + 0.4253i | 0.6981 + 0.4242i | 0.6993 + 0.4208i | 0.7662 + 0.3017i | 0.7669 + 0.3019i | 0.7039 + 0.2985i | 0.7043 + 0.2987i |
| 22.5 | 0.7685 + 0.4465i | 0.7656 + 0.4385i | 0.7007 + 0.4413i | 0.6994 + 0.4354i | 0.7660 + 0.3091i | 0.7667 + 0.3123i | 0.7023 + 0.3090i | 0.7027 + 0.3113i |
| 23 | 0.7782 + 0.4301i | 0.7839 + 0.4157i | 0.6975 + 0.4436i | 0.7082 + 0.4208i | 0.7769 + 0.2994i | 0.7743 + 0.2977i | 0.7007 + 0.2978i | 0.6927 + 0.2994i |
| 23.5 | 0.7984 + 0.4234i | 0.7931 + 0.4034i | 0.7006 + 0.4317i | 0.7002 + 0.4120i | 0.7957 + 0.2964i | 0.7948 + 0.3000i | 0.6978 + 0.2933i | 0.6983 + 0.2990i |
| 24 | 0.7750 + 0.4250i | 0.7798 + 0.3969i | 0.6858 + 0.4247i | 0.6867 + 0.3966i | 0.7814 + 0.2774i | 0.7870 + 0.2866i | 0.6913 + 0.2777i | 0.6908 + 0.2880i |
| 24.5 | 0.7755 + 0.4408i | 0.7713 + 0.3997i | 0.6867 + 0.4431i | 0.6891 + 0.3906i | 0.7962 + 0.2783i | 0.7862 + 0.2937i | 0.7010 + 0.2666i | 0.6990 + 0.2890i |
| 25 | 0.7995 + 0.4820i | 0.8171 + 0.4128i | 0.7102 + 0.4660i | 0.7219 + 0.4003i | 0.8339 + 0.2736i | 0.8318 + 0.3245i | 0.7325 + 0.2751i | 0.7307 + 0.3150i |
| 25.5 | 0.8154 + 0.4444i | 0.8041 + 0.3748i | 0.7181 + 0.4538i | 0.7090 + 0.3874i | 0.7836 + 0.2479i | 0.7852 + 0.2984i | 0.6906 + 0.2579i | 0.6979 + 0.3074i |
| 26 | 0.7109 + 0.5267i | 0.7933 + 0.4911i | 0.6853 + 0.4989i | 0.7434 + 0.4295i | 0.8119 + 0.2687i | 0.8144 + 0.3360i | 0.7394 + 0.2759i | 0.7571 + 0.3617i |
| 26.5 | 0.7330 + 0.5364i | 0.7626 + 0.4705i | 0.6735 + 0.5353i | 0.7029 + 0.4406i | 0.8089 + 0.2759i | 0.7900 + 0.3695i | 0.7325 + 0.2706i | 0.7251 + 0.3586i |
| 27 | 0.8413 + 0.5029i | 0.8110 + 0.4476i | 0.6888 + 0.3768i | 0.7429 + 0.4148i | 0.8225 + 0.2737i | 0.8412 + 0.3609i | 0.7112 + 0.3146i | 0.7703 + 0.3556i |
| 27.5 | 0.8444 + 0.5124i | 0.7991 + 0.4492i | 0.6182 + 0.4719i | 0.7216 + 0.4137i | 0.8351 + 0.2795i | 0.8172 + 0.3610i | 0.7372 + 0.2864i | 0.7394 + 0.3488i |
| 28 | 0.8115 + 0.5747i | 0.9164 + 0.3766i | 0.7047 + 0.3807i | 0.7428 + 0.4237i | 0.9347 + 0.2772i | 0.8627 + 0.3189i | 0.7327 + 0.3199i | 0.8033 + 0.3671i |

-continued

| SNR/w | w128 | w129 | w130 | w131 | w132 | w133 | w134 | w135 |
|---|---|---|---|---|---|---|---|---|
| 7 | 0.2432 + 0.4011i | 0.2525 + 0.4221i | 0.2272 + 0.3910i | 0.2342 + 0.4126i | 0.2525 + 0.4221i | 0.2619 + 0.4435i | 0.2342 + 0.4126i | 0.2412 + 0.4349i |
| 7.5 | 0.2367 + 0.3922i | 0.2339 + 0.3863i | 0.2184 + 0.3826i | 0.2164 + 0.3766i | 0.2511 + 0.4241i | 0.2483 + 0.4180i | 0.2285 + 0.4157i | 0.2265 + 0.4092i |
| 8 | 0.2099 + 0.3771i | 0.2085 + 0.3725i | 0.2104 + 0.3787i | 0.2090 + 0.3740i | 0.2288 + 0.3849i | 0.2268 + 0.3805i | 0.2295 + 0.3865i | 0.2275 + 0.3821i |
| 8.5 | 0.1990 + 0.3669i | 0.1982 + 0.3643i | 0.1989 + 0.3665i | 0.1981 + 0.3639i | 0.2164 + 0.3714i | 0.2153 + 0.3689i | 0.2162 + 0.3711i | 0.2151 + 0.3686i |
| 9 | 0.3931 + 2.0687i | 0.3040 + 1.5215i | 0.3041 + 1.5229i | 0.2910 + 1.4126i | 0.3041 + 1.5228i | 0.2910 + 1.4125i | 0.2910 + 1.4132i | 0.2856 + 1.3605i |
| 9.5 | 0.4001 + 2.0659i | 0.3016 + 1.5257i | 0.3016 + 1.5258i | 0.2875 + 1.4126i | 0.3041 + 1.5258i | 0.2875 + 1.4133i | 0.2875 + 1.4133i | 0.2812 + 1.3887i |
| 10 | 0.4076 + 2.0613i | 0.3008 + 1.5251i | 0.3009 + 1.5260i | 0.2854 + 1.4439i | 0.3016 + 1.5264i | 0.2854 + 1.4441i | 0.2855 + 1.4446i | 0.2778 + 1.4049i |
| 10.5 | 0.4367 + 2.0633i | 0.3005 + 1.5094i | 0.3029 + 1.5315i | 0.2844 + 1.4439i | 0.3010 + 1.5269i | 0.2846 + 1.4477i | 0.2859 + 1.4594i | 0.2751 + 1.4187i |
| 11 | 0.1494 + 0.2794i | 0.1491 + 0.2783i | 0.1494 + 0.2796i | 0.1492 + 0.2795i | 0.1491 + 0.2800i | 0.1489 + 0.2799i | 0.1492 + 0.2802i | 0.1489 + 0.2801i |
| 11.5 | 0.1448 + 0.2782i | 0.1446 + 0.2782i | 0.1448 + 0.2784i | 0.1446 + 0.2784i | 0.1444 + 0.2788i | 0.1443 + 0.2788i | 0.1445 + 0.2790i | 0.1443 + 0.2790i |
| 12 | 0.1409 + 0.2742i | 0.1408 + 0.2741i | 0.1409 + 0.2742i | 0.1409 + 0.2743i | 0.1406 + 0.2747i | 0.1405 + 0.2747i | 0.1406 + 0.2747i | 0.1405 + 0.2748i |
| 12.5 | 0.1266 + 0.3806i | 0.1266 + 0.3807i | 0.1265 + 0.3813i | 0.1265 + 0.3816i | 0.1262 + 0.3776i | 0.1263 + 0.3776i | 0.1261 + 0.3785i | 0.1262 + 0.3785i |
| 13 | 0.7072 + 1.7916i | 0.3938 + 1.5314i | 0.5480 + 1.7046i | 0.3789 + 1.5583i | 0.1788 + 1.2746i | 0.2019 + 1.3171i | 0.1788 + 1.2821i | 0.2017 + 1.3295i |
| 13.5 | 0.1168 + 0.4372i | 0.1167 + 0.4372i | 0.1167 + 0.4370i | 0.1167 + 0.4371i | 0.1170 + 0.4368i | 0.1169 + 0.4369i | 0.1169 + 0.4369i | 0.1167 + 0.4372i |
| 14 | 0.1145 + 0.4656i | 0.1144 + 0.4656i | 0.1144 + 0.4659i | 0.1144 + 0.4659i | 0.1159 + 0.4649i | 0.1158 + 0.4647i | 0.1158 + 0.4652i | 0.1158 + 0.4650i |
| 14.5 | 0.1109 + 0.4810i | 0.1109 + 0.4814i | 0.1108 + 0.4802i | 0.1108 + 0.4806i | 0.1131 + 0.4803i | 0.1131 + 0.4806i | 0.1130 + 0.4795i | 0.1130 + 0.4799i |
| 15 | 0.1056 + 0.9315i | 0.1124 + 0.9319i | 0.1059 + 0.9343i | 0.1126 + 0.9306i | 0.1535 + 0.8799i | 0.1588 + 0.8825i | 0.1539 + 0.8792i | 0.1591 + 0.8822i |
| 15.5 | 0.1056 + 0.9359i | 0.1084 + 0.9228i | 0.1058 + 0.9328i | 0.1081 + 0.9234i | 0.1623 + 0.8851i | 0.1624 + 0.8825i | 0.1617 + 0.8855i | 0.1619 + 0.8828i |
| 16 | 0.1058 + 1.1536i | 0.1425 + 1.1390i | 0.1046 + 1.1774i | 0.1441 + 1.1547i | 0.1505 + 0.9551i | 0.1644 + 0.9651i | 0.1525 + 0.9539i | 0.1662 + 0.9643i |
| 16.5 | 0.0972 + 1.5539i | 0.1106 + 1.2543i | 0.1342 + 1.2544i | 0.1133 + 1.2044i | 0.1131 + 0.9179i | 0.1140 + 0.9832i | 0.1125 + 0.9230i | 0.1130 + 0.9917i |
| 17 | 0.0983 + 1.5325i | 0.1103 + 1.2481i | 0.1311 + 1.7892i | 0.1113 + 1.1977i | 0.1114 + 0.9132i | 0.1127 + 0.9800i | 0.1106 + 0.9189i | 0.1114 + 0.9914i |
| 17.5 | 0.0987 + 1.5247i | 0.110 + 1.2413i | 0.1257 + 1.7839i | 0.1102 + 1.1944i | 0.1094 + 0.9108i | 0.113 + 0.9793i | 0.1084 + 0.9168i | 0.1100 + 0.9928i |
| 18 | 0.1006 + 1.5247i | 0.1086 + 1.2380i | 0.1242 + 1.7780i | 0.1086 + 1.1943i | 0.1047 + 0.9115i | 0.1072 + 0.9814i | 0.1036 + 0.9168i | 0.1055 + 0.9946i |
| 18.5 | 0.0767 + 1.5118i | 0.0870 + 1.3422i | 0.1944 + 2.0287i | 0.0901 + 1.2929i | 0.0882 + 1.0338i | 0.0871 + 1.1051i | 0.0880 + 1.0401i | 0.0878 + 1.1201i |
| 19 | 0.0744 + 1.4981i | 0.0851 + 1.3326i | 0.1794 + 2.0056i | 0.0874 + 1.2840i | 0.0808 + 1.0377i | 0.0815 + 1.1045i | 0.0808 + 1.0442i | 0.0824 + 1.1207i |
| 19.5 | 0.0752 + 1.5337i | 0.0911 + 1.3077i | 0.1184 + 1.4863i | 0.0999 + 1.3236i | 0.0762 + 1.0493i | 0.0807 + 1.1327i | 0.0762 + 1.0466i | 0.0799 + 1.1251i |
| 20 | 0.1316 + 1.8965i | 0.0695 + 1.0750i | 0.0714 + 1.3185i | 0.0721 + 1.1636i | 0.0702 + 0.7887i | 0.0676 + 0.8645i | 0.0704 + 0.7833i | 0.0683 + 0.8425i |
| 20.5 | 0.0626 + 1.4912i | 0.0683 + 1.1894i | 0.0906 + 1.3933i | 0.0705 + 1.2277i | 0.0649 + 0.9392i | 0.0669 + 1.0314i | 0.0652 + 0.9365i | 0.0665 + 1.0198i |
| 21 | 0.0566 + 1.3765i | 0.0634 + 1.2157i | 0.1312 + 1.8435i | 0.0646 + 1.1619i | 0.0641 + 0.9098i | 0.0643 + 1.0069i | 0.0640 + 0.9105i | 0.0645 + 1.0250i |
| 21.5 | 0.0769 + 1.6079i | 0.0600 + 1.1808i | 0.0696 + 1.4311i | 0.0605 + 1.2664i | 0.0589 + 0.9332i | 0.0594 + 1.0467i | 0.0589 + 0.8984i | 0.0594 + 1.0150i |
| 22 | 0.0510 + 1.3552i | 0.0609 + 1.2217i | 0.1064 + 1.8045i | 0.0551 + 1.1486i | 0.0635 + 0.8941i | 0.0605 + 0.9972i | 0.0633 + 0.8921i | 0.0583 + 1.0193i |
| 22.5 | 0.0791 + 1.6235i | 0.0595 + 1.1619i | 0.0601 + 1.4463i | 0.0547 + 1.2748i | 0.0584 + 0.8865i | 0.0596 + 1.0378i | 0.0616 + 0.8930i | 0.0611 + 0.9993i |
| 23 | 0.0749 + 1.6355i | 0.0569 + 1.1877i | 0.0706 + 1.4379i | 0.0637 + 1.3045i | 0.0532 + 0.8809i | 0.0510 + 1.0772i | 0.0502 + 0.9016i | 0.0557 + 1.0136i |
| 23.5 | 0.0477 + 1.8317i | 0.0474 + 1.1599i | 0.0728 + 1.4375i | 0.0610 + 1.3181i | 0.0574 + 0.8705i | 0.0537 + 1.0431i | 0.0579 + 0.8886i | 0.0564 + 0.9856i |
| 24 | 0.0878 + 1.7221i | 0.0632 + 1.2393i | 0.0735 + 1.5241i | 0.0421 + 1.3702i | 0.0570 + 0.9140i | 0.0611 + 1.1293i | 0.0580 + 0.9491i | 0.0593 + 1.0507i |
| 24.5 | 0.0895 + 1.7536i | 0.0613 + 1.3638i | 0.0760 + 1.5470i | 0.0501 + 1.2243i | 0.0488 + 0.9067i | 0.0467 + 1.0086i | 0.0503 + 0.8690i | 0.0466 + 1.1053i |
| 25 | 0.0931 + 1.7166i | 0.0566 + 1.3482i | 0.0751 + 1.5225i | 0.0462 + 1.2117i | 0.0474 + 0.9022i | 0.0455 + 0.9995i | 0.0493 + 0.8602i | 0.0444 + 1.0970i |
| 25.5 | 0.0758 + 1.6507i | 0.0505 + 1.3310i | 0.0710 + 1.4902i | 0.0549 + 1.2097i | 0.0438 + 0.9415i | 0.0377 + 1.0346i | 0.0846 + 0.9291i | 0.0622 + 1.1023i |
| 26 | 0.0601 + 1.4639i | 0.0558 + 1.3274i | 0.1068 + 1.6195i | 0.0328 + 1.1706i | 0.0577 + 0.8856i | 0.0286 + 0.8791i | 0.0642 + 0.9670i | 0.0431 + 1.0429i |
| 26.5 | 0.0683 + 1.5203i | 0.0701 + 1.3841i | 0.0850 + 1.6726i | 0.0362 + 1.2588i | 0.0544 + 0.9100i | 0.0513 + 0.9841i | 0.0324 + 1.1232i | 0.0576 + 1.0610i |
| 27 | 0.0637 + 1.4870i | 0.0530 + 1.3497i | 0.0764 + 1.6418i | 0.0536 + 1.2353i | 0.0420 + 0.9016i | 0.0378 + 0.9756i | 0.0444 + 1.1113i | 0.0805 + 1.0397i |
| 27.5 | 0.0628 + 1.3974i | 0.0561 + 1.2894i | 0.0641 + 1.5359i | 0.1283 + 1.2196i | 0.0408 + 0.9054i | 0.0369 + 0.9810i | 0.0341 + 1.1435i | 0.0589 + 1.0577i |
| 28 | 0.0586 + 1.3727i | 0.1555 + 1.3034i | 0.0663 + 1.5122i | 0.1473 + 1.1900i | 0.0359 + 0.9236i | 0.0375 + 1.0235i | 0.0402 + 1.2339i | 0.0477 + 1.1266i |

| SNR/w | w136 | w137 | w138 | w139 | w140 | w141 | w142 | w143 |
|---|---|---|---|---|---|---|---|---|
| 7 | 0.2525 + 0.4221i | 0.2619 + 0.4435i | 0.2342 + 0.4126i | 0.2412 + 0.4349i | 0.2619 + 0.4435i | 0.2713 + 0.4647i | 0.2412 + 0.4349i | 0.2480 + 0.4575i |
| 7.5 | 0.2511 + 0.4239i | 0.2483 + 0.4178i | 0.2284 + 0.4154i | 0.2265 + 0.4091i | 0.2660 + 0.4564i | 0.2632 + 0.4504i | 0.2382 + 0.4502i | 0.2364 + 0.4437i |
| 8 | 0.2240 + 0.4267i | 0.2227 + 0.4217i | 0.2245 + 0.4286i | 0.2232 + 0.4237i | 0.2505 + 0.4321i | 0.2484 + 0.4275i | 0.2514 + 0.4340i | 0.2493 + 0.4294i |
| 8.5 | 0.2304 + 0.4931i | 0.2299 + 0.4905i | 0.2304 + 0.4932i | 0.2299 + 0.4907i | 0.2713 + 0.4866i | 0.2703 + 0.4845i | 0.2715 + 0.4869i | 0.2704 + 0.4847i |
| 9 | 0.3041 + 1.5230i | 0.2910 + 1.4126i | 0.2910 + 1.4133i | 0.2856 + 1.3605i | 0.2910 + 1.4133i | 0.2856 + 1.3605i | 0.2857 + 1.3610i | 0.2826 + 1.3275i |

-continued

| SNR/w | w144 | w145 | w146 | w147 | w148 | w149 | w150 | w151 |
|---|---|---|---|---|---|---|---|---|
| 9.5 | 0.3016 + 1.5258i | 0.2875 + 1.4333i | 0.2875 + 1.4333i | 0.2812 + 1.3887i | 0.2875 + 1.4334i | 0.2812 + 1.3887i | 0.2812 + 1.3888i | 0.2772 + 1.3604i |
| 10 | 0.3009 + 1.5258i | 0.2854 + 1.4438i | 0.2854 + 1.4442i | 0.2778 + 1.4046i | 0.2855 + 1.4445i | 0.2778 + 1.4048i | 0.2778 + 1.4051i | 0.2727 + 1.3797i |
| 10.5 | 0.3088 + 1.5285i | 0.2879 + 1.4482i | 0.2887 + 1.4599i | 0.2777 + 1.4184i | 0.2897 + 1.4565i | 0.2785 + 1.4165i | 0.2789 + 1.4242i | 0.2710 + 1.3975i |
| 11 | 0.1491 + 0.2739i | 0.1489 + 0.2738i | 0.1492 + 0.2741i | 0.1489 + 0.2739i | 0.1489 + 0.2745i | 0.1487 + 0.2743i | 0.1489 + 0.2746i | 0.1487 + 0.2745i |
| 11.5 | 0.1444 + 0.2735i | 0.1443 + 0.2735i | 0.1445 + 0.2736i | 0.1443 + 0.2736i | 0.1441 + 0.2740i | 0.1439 + 0.2741i | 0.1442 + 0.2742i | 0.1440 + 0.2742i |
| 12 | 0.1405 + 0.2707i | 0.1404 + 0.2708i | 0.1405 + 0.2707i | 0.1405 + 0.2708i | 0.1402 + 0.2711i | 0.1401 + 0.2713i | 0.1402 + 0.2711i | 0.1401 + 0.2713i |
| 12.5 | 0.1262 + 0.3796i | 0.1262 + 0.3797i | 0.1263 + 0.3804i | 0.1261 + 0.3806i | 0.1257 + 0.3766i | 0.1258 + 0.3767i | 0.1256 + 0.3775i | 0.1258 + 0.3775i |
| 13 | 0.2783 + 2.0929i | 0.2668 + 1.5463i | 0.2047 + 1.8160i | 0.2333 + 1.6150i | 0.1672 + 1.2855i | 0.1823 + 1.3309i | 0.1657 + 1.2954i | 0.1790 + 1.3480i |
| 13.5 | 0.1163 + 0.4358i | 0.1164 + 0.4362i | 0.1163 + 0.4360i | 0.1161 + 0.4363i | 0.1165 + 0.4359i | 0.1164 + 0.4362i | 0.1166 + 0.4360i | 0.1164 + 0.4362i |
| 14 | 0.1149 + 0.4656i | 0.1147 + 0.4660i | 0.1147 + 0.4660i | 0.1145 + 0.4663i | 0.1161 + 0.4654i | 0.1160 + 0.4652i | 0.1160 + 0.4657i | 0.1160 + 0.4655i |
| 14.5 | 0.1119 + 0.4818i | 0.1118 + 0.4822i | 0.1118 + 0.4811i | 0.1117 + 0.4815i | 0.1141 + 0.4811i | 0.1141 + 0.4815i | 0.1140 + 0.4804i | 0.1140 + 0.4807i |
| 15 | 0.1053 + 0.9370i | 0.1119 + 0.9327i | 0.1054 + 0.9355i | 0.1115 + 0.9316i | 0.1523 + 0.8806i | 0.1575 + 0.8834i | 0.1526 + 0.8799i | 0.1578 + 0.8827i |
| 15.5 | 0.1090 + 0.9477i | 0.1117 + 0.9380i | 0.1081 + 0.9489i | 0.1115 + 0.9387i | 0.1648 + 0.8964i | 0.1651 + 0.8938i | 0.1642 + 0.8964i | 0.1648 + 0.8940i |
| 16 | 0.1060 + 1.1603i | 0.1451 + 1.1426i | 0.1035 + 1.1864i | 0.1458 + 1.1581i | 0.1532 + 0.9560i | 0.1675 + 0.9668i | 0.1551 + 0.9549i | 0.1692 + 0.9660i |
| 16.5 | 0.1003 + 1.4730i | 0.1093 + 1.2631i | 0.2016 + 2.0694i | 0.1121 + 1.2100i | 0.1144 + 0.9622i | 0.1144 + 0.9798i | 0.1137 + 0.9212i | 0.1134 + 0.9885i |
| 17 | 0.0998 + 1.4730i | 0.1102 + 1.2591i | 0.2013 + 2.0723i | 0.1118 + 1.2060i | 0.1155 + 0.9112i | 0.1159 + 0.9756i | 0.1146 + 0.9168i | 0.1146 + 0.9873i |
| 17.5 | 0.0988 + 1.4659i | 0.1118 + 1.2543i | 0.1973 + 2.0632i | 0.1132 + 1.2013i | 0.1179 + 0.9087i | 0.1187 + 0.9742i | 0.1168 + 0.9145i | 0.1171 + 0.9879i |
| 18 | 0.0991 + 1.4625i | 0.1137 + 1.2538i | 0.1977 + 2.0538i | 0.1157 + 1.2020i | 0.1198 + 0.9092i | 0.1211 + 0.9760i | 0.1187 + 0.9144i | 0.1191 + 0.9891i |
| 18.5 | 0.1910 + 1.5579i | 0.2343 + 1.3492i | 0.1431 + 1.7701i | 0.2372 + 1.2959i | 0.1903 + 1.0249i | 0.2028 + 1.0935i | 0.1913 + 1.0317i | 0.2073 + 1.1122i |
| 19 | 0.2005 + 1.5419i | 0.2412 + 1.3402i | 0.1377 + 1.7502i | 0.2448 + 1.2861i | 0.2102 + 1.0261i | 0.2201 + 1.0924i | 0.2112 + 1.0332i | 0.2243 + 1.1127i |
| 19.5 | 0.1545 + 1.7181i | 0.2624 + 1.2819i | 0.2850 + 1.5423i | 0.2677 + 1.3192i | 0.2188 + 1.0340i | 0.2341 + 1.1147i | 0.2183 + 1.0300i | 0.2300 + 1.1024i |
| 20 | 0.0990 + 1.6597i | 0.0805 + 1.0463i | 0.0744 + 1.4636i | 0.0837 + 1.0822i | 0.1213 + 0.7996i | 0.1017 + 0.8881i | 0.1224 + 0.7937i | 0.1070 + 0.8657i |
| 20.5 | 0.1248 + 1.6210i | 0.1954 + 1.1793i | 0.2104 + 1.4066i | 0.1960 + 1.2212i | 0.1870 + 0.9091i | 0.1923 + 1.0261i | 0.1871 + 0.9310i | 0.1910 + 1.0110i |
| 21 | 0.1464 + 1.4108i | 0.1799 + 1.2274i | 0.0916 + 1.6132i | 0.1856 + 1.1690i | 0.1854 + 0.9091i | 0.1864 + 1.0088i | 0.1851 + 0.9093i | 0.1871 + 1.0292i |
| 21.5 | 0.1329 + 1.8110i | 0.1785 + 1.1792i | 0.1881 + 1.4135i | 0.1836 + 1.2632i | 0.1683 + 0.8921i | 0.1728 + 1.0462i | 0.1686 + 0.8974i | 0.1721 + 1.0147i |
| 22 | 0.0760 + 1.4947i | 0.1660 + 1.1960i | 0.1932 + 1.6270i | 0.1685 + 1.1538i | 0.1859 + 0.8977i | 0.1821 + 1.0141i | 0.1865 + 0.8951i | 0.1795 + 1.0305i |
| 22.5 | 0.1993 + 1.7519i | 0.1777 + 1.1663i | 0.1733 + 1.4310i | 0.1704 + 1.2820i | 0.1786 + 0.8829i | 0.1775 + 1.0391i | 0.1776 + 0.8916i | 0.1776 + 0.9980i |
| 23 | 0.0964 + 1.7936i | 0.1763 + 1.1862i | 0.1993 + 1.4336i | 0.1869 + 1.2936i | 0.1572 + 0.8847i | 0.1678 + 1.0712i | 0.1582 + 0.9015i | 0.1592 + 1.0127i |
| 23.5 | 0.2224 + 1.7477i | 0.1587 + 1.1598i | 0.0786 + 1.6259i | 0.1644 + 1.2701i | 0.1723 + 0.8716i | 0.1654 + 1.0555i | 0.1712 + 0.8911i | 0.1690 + 0.9911i |
| 24 | 0.2059 + 1.3214i | 0.1962 + 1.2278i | 0.2073 + 1.4403i | 0.2541 + 1.5814i | 0.1734 + 0.9105i | 0.1853 + 1.1204i | 0.1736 + 0.9440i | 0.1790 + 1.0453i |
| 24.5 | 0.3255 + 1.7591i | 0.1702 + 1.3294i | 0.2212 + 1.6117i | 0.1562 + 1.2055i | 0.1514 + 0.9059i | 1.398 + 1.0100i | 0.1508 + 0.8749i | 0.1427 + 1.0977i |
| 25 | 0.3472 + 1.7040i | 0.1573 + 1.3131i | 0.2161 + 1.5886i | 0.1468 + 1.1983i | 0.1475 + 0.9016i | 0.1353 + 1.0028i | 0.1463 + 0.8662i | 0.1358 + 1.0939i |
| 25.5 | 0.2337 + 1.6652i | 0.2321 + 1.1730i | 0.2083 + 1.5062i | 0.2051 + 1.2132i | 0.2051 + 0.9488i | 0.2157 + 1.0645i | 0.1608 + 0.9436i | 0.1497 + 1.0697i |
| 26 | 0.3076 + 1.5930i | 0.1352 + 1.2642i | 0.2100 + 1.4742i | 0.1117 + 1.1707i | 0.1697 + 0.9111i | 0.1855 + 1.0511i | 0.1491 + 0.9425i | 0.1223 + 1.0684i |
| 26.5 | 0.2675 + 1.6286i | 0.1335 + 1.3004i | 0.2245 + 1.4893i | 0.1429 + 1.2032i | 0.1579 + 0.9322i | 0.1592 + 1.0119i | 0.1815 + 0.8811i | 0.1547 + 1.1064i |
| 27 | 0.2178 + 1.5591i | 0.1947 + 1.1461i | 0.1887 + 1.4107i | 0.1532 + 1.2458i | 0.2220 + 1.0710i | 0.2132 + 1.0386i | 0.1577 + 0.9120i | 0.1514 + 1.0025i |
| 27.5 | 0.2076 + 1.6180i | 0.2354 + 1.1287i | 0.1770 + 1.4782i | 0.1619 + 1.1353i | 0.2094 + 0.9195i | 0.2160 + 1.0223i | 0.1473 + 0.9211i | 0.1402 + 1.0282i |
| 28 | 0.2491 + 1.5678i | 0.2319 + 1.0829i | 0.1797 + 1.4545i | 0.1551 + 1.0959i | 0.2134 + 0.9134i | 0.2284 + 0.9984i | 0.1399 + 0.9185i | 0.1422 + 1.0060i |

| SNR/w | w144 | w145 | w146 | w147 | w148 | w149 | w150 | w151 |
|---|---|---|---|---|---|---|---|---|
| 7 | 0.2525 + 0.4221i | 0.2619 + 0.4435i | 0.2342 + 0.4126i | 0.2412 + 0.4348i | 0.2619 + 0.4435i | 0.2713 + 0.4647i | 0.2412 + 0.4348i | 0.2479 + 0.4574i |
| 7.5 | 0.2513 + 0.4244i | 0.2484 + 0.4183i | 0.2286 + 0.4160i | 0.2266 + 0.4095i | 0.2662 + 0.4568i | 0.2634 + 0.4509i | 0.2383 + 0.4507i | 0.2365 + 0.4442i |
| 8 | 0.2240 + 0.4267i | 0.2227 + 0.4218i | 0.2245 + 0.4287i | 0.2232 + 0.4237i | 0.2505 + 0.4321i | 0.2484 + 0.4276i | 0.2514 + 0.4340i | 0.2493 + 0.4295i |
| 8.5 | 0.2064 + 0.3933i | 0.2057 + 0.3906i | 0.2064 + 0.3930i | 0.2056 + 0.3903i | 0.2278 + 0.3968i | 0.2267 + 0.3942i | 0.2277 + 0.3965i | 0.2266 + 0.3939i |
| 9 | 0.2618 + 1.0415i | 0.2624 + 1.0473i | 0.2624 + 1.0473i | 0.2630 + 1.0525i | 0.2624 + 1.0473i | 0.2630 + 1.0525i | 0.2630 + 1.0525i | 0.2636 + 1.0574i |
| 9.5 | 0.2524 + 1.0125i | 0.2530 + 1.0217i | 0.2530 + 1.0217i | 0.2536 + 1.0306i | 0.2530 + 1.0217i | 0.2536 + 1.0306i | 0.2536 + 1.0306i | 0.2541 + 1.0391i |
| 10 | 0.2433 + 0.9970i | 0.2438 + 1.0074i | 0.2438 + 1.0074i | 0.2442 + 1.0178i | 0.2437 + 1.0074i | 0.2442 + 1.0178i | 0.2442 + 1.0177i | 0.2446 + 1.0280i |
| 10.5 | 0.2311 + 0.9897i | 0.2322 + 1.0020i | 0.2318 + 0.9994i | 0.2329 + 1.0119i | 0.2311 + 1.0009i | 0.2323 + 1.0133i | 0.2318 + 1.0108i | 0.2329 + 1.0234i |
| 11 | 0.1607 + 0.2901i | 0.1604 + 0.2899i | 0.1608 + 0.2903i | 0.1605 + 0.2901i | 0.1605 + 0.2906i | 0.1602 + 0.2904i | 0.1605 + 0.2908i | 0.1602 + 0.2906i |
| 11.5 | 0.1583 + 0.2884i | 0.1581 + 0.2884i | 0.1584 + 0.2886i | 0.1581 + 0.2886i | 0.1580 + 0.2889i | 0.1577 + 0.2889i | 0.1580 + 0.2891i | 0.1578 + 0.2891i |
| 12 | 0.1562 + 0.2844i | 0.1561 + 0.2845i | 0.1562 + 0.2844i | 0.1562 + 0.2845i | 0.1559 + 0.2848i | 0.1558 + 0.2848i | 0.1559 + 0.2848i | 0.1558 + 0.2849i |
| 12.5 | 0.1580 + 0.3710i | 0.1581 + 0.3711i | 0.1580 + 0.3717i | 0.1581 + 0.3718i | 0.1567 + 0.3687i | 0.1569 + 0.3688i | 0.1567 + 0.3694i | 0.1569 + 0.3694i |

-continued

| SNR/w | w152 | w153 | w154 | w155 | w156 | w157 | w158 | w159 |
|---|---|---|---|---|---|---|---|---|
| 13 | 0.1601 + 0.8827i | 0.1636 + 0.8806i | 0.1610 + 0.8820i | 0.1644 + 0.8799i | 0.1512 + 0.9526i | 0.1562 + 0.9507i | 0.1525 + 0.9512i | 0.1575 + 0.9493i |
| 13.5 | 0.1620 + 0.4566i | 0.1620 + 0.4112i | 0.1619 + 0.4113i | 0.1619 + 0.4112i | 0.1612 + 0.4108i | 0.1611 + 0.4108i | 0.1611 + 0.4108i | 0.1610 + 0.4107i |
| 14 | 0.1673 + 0.4231i | 0.1673 + 0.4233i | 0.1671 + 0.4231i | 0.1671 + 0.4232i | 0.1678 + 0.4238i | 0.1678 + 0.4238i | 0.1676 + 0.4238i | 0.1676 + 0.4239i |
| 14.5 | 0.1680 + 0.4311i | 0.1681 + 0.4314i | 0.1676 + 0.4303i | 0.1678 + 0.4306i | 0.1689 + 0.4325i | 0.1690 + 0.4328i | 0.1685 + 0.4317i | 0.1686 + 0.4320i |
| 15 | 0.1381 + 0.6099i | 0.1379 + 0.6086i | 0.1381 + 0.6103i | 0.1380 + 0.6090i | 0.1481 + 0.6282i | 0.1476 + 0.6267i | 0.1482 + 0.6286i | 0.1478 + 0.6271i |
| 15.5 | 0.1372 + 0.6177i | 0.1367 + 0.6175i | 0.1370 + 0.6175i | 0.1365 + 0.6173i | 0.1488 + 0.6354i | 0.1480 + 0.6350i | 0.1486 + 0.6352i | 0.1478 + 0.6347i |
| 16 | 0.1223 + 0.6329i | 0.1225 + 0.6298i | 0.1224 + 0.6329i | 0.1226 + 0.6297i | 0.1296 + 0.7103i | 0.1294 + 0.7052i | 0.1301 + 0.7098i | 0.1299 + 0.7047i |
| 16.5 | 0.1108 + 0.5909i | 0.1107 + 0.5818i | 0.1105 + 0.5901i | 0.1104 + 0.5812i | 0.1109 + 0.6863i | 0.1109 + 0.6635i | 0.1106 + 0.6847i | 0.1106 + 0.6619i |
| 17 | 0.1091 + 0.5877i | 0.1090 + 0.5791i | 0.1083 + 0.5868i | 0.1083 + 0.5784i | 0.1090 + 0.6939i | 0.1092 + 0.6686i | 0.1084 + 0.6916i | 0.1085 + 0.6661i |
| 17.5 | 0.1062 + 0.5825i | 0.1062 + 0.5758i | 0.1053 + 0.5817i | 0.1053 + 0.5752i | 0.1064 + 0.7053i | 0.1065 + 0.6793i | 0.1055 + 0.7026i | 0.1056 + 0.6765i |
| 18 | 0.1019 + 0.5736i | 0.1018 + 0.5702i | 0.1010 + 0.5737i | 0.1011 + 0.5699i | 0.1017 + 0.7168i | 0.1020 + 0.6919i | 0.1011 + 0.7146i | 0.1013 + 0.6897i |
| 18.5 | 0.0947 + 0.6528i | 0.0946 + 0.6558i | 0.0943 + 0.6532i | 0.0942 + 0.6561i | 0.0922 + 0.8295i | 0.0923 + 0.8295i | 0.0917 + 0.8499i | 0.0918 + 0.8270i |
| 19 | 0.0847 + 0.6717i | 0.0847 + 0.6751i | 0.0845 + 0.6722i | 0.0845 + 0.6756i | 0.0813 + 0.8687i | 0.0813 + 0.8470i | 0.0812 + 0.8654i | 0.0812 + 0.8441i |
| 19.5 | 0.0757 + 0.6851i | 0.0756 + 0.6901i | 0.0757 + 0.6848i | 0.0756 + 0.6898i | 0.0735 + 0.8794i | 0.0737 + 0.8534i | 0.0737 + 0.8809i | 0.0738 + 0.8547i |
| 20 | 0.0686 + 0.4781i | 0.0686 + 0.4794i | 0.0686 + 0.4778i | 0.0686 + 0.4791i | 0.0682 + 0.6251i | 0.0678 + 0.6177i | 0.0683 + 0.6286i | 0.0678 + 0.6045i |
| 20.5 | 0.0632 + 0.6066i | 0.0633 + 0.6066i | 0.0633 + 0.6007i | 0.0634 + 0.6067i | 0.0637 + 0.7844i | 0.0634 + 0.7545i | 0.0639 + 0.7852i | 0.0636 + 0.7551i |
| 21 | 0.0611 + 0.5724i | 0.0612 + 0.5842i | 0.0611 + 0.5727i | 0.0613 + 0.5845i | 0.0626 + 0.7680i | 0.0622 + 0.7244i | 0.0626 + 0.7665i | 0.0622 + 0.7238i |
| 21.5 | 0.0581 + 0.5423i | 0.0579 + 0.5609i | 0.0581 + 0.5424i | 0.0579 + 0.5612i | 0.0579 + 0.7552i | 0.0575 + 0.6953i | 0.0579 + 0.7545i | 0.0575 + 0.6947i |
| 22 | 0.0596 + 0.5614i | 0.0598 + 0.5810i | 0.0590 + 0.5615i | 0.0592 + 0.5812i | 0.0620 + 0.7657i | 0.0612 + 0.7080i | 0.0614 + 0.7649i | 0.0606 + 0.7080i |
| 22.5 | 0.0584 + 0.5488i | 0.0584 + 0.5743i | 0.0591 + 0.5489i | 0.0586 + 0.5732i | 0.0587 + 0.7669i | 0.0581 + 0.6974i | 0.0607 + 0.7647i | 0.0597 + 0.6962i |
| 23 | 0.0586 + 0.5292i | 0.0581 + 0.5612i | 0.0598 + 0.5274i | 0.0563 + 0.5591i | 0.0536 + 0.7603i | 0.0550 + 0.6782i | 0.0510 + 0.7607i | 0.0511 + 0.6758i |
| 23.5 | 0.0581 + 0.5297i | 0.0584 + 0.5731i | 0.0577 + 0.5298i | 0.0580 + 0.5727i | 0.0574 + 0.7665i | 0.0573 + 0.6810i | 0.0572 + 0.7620i | 0.0569 + 0.6795i |
| 24 | 0.0547 + 0.5332i | 0.0548 + 0.6013i | 0.0555 + 0.5329i | 0.0556 + 0.6011i | 0.0559 + 0.8129i | 0.0551 + 0.7019i | 0.0566 + 0.8015i | 0.0559 + 0.7038i |
| 24.5 | 0.0572 + 0.5231i | 0.0570 + 0.5849i | 0.0605 + 0.5230i | 0.0600 + 0.5847i | 0.0535 + 0.7638i | 0.0565 + 0.6783i | 0.0545 + 0.7749i | 0.0591 + 0.6771i |
| 25 | 0.0525 + 0.5122i | 0.0529 + 0.5825i | 0.0624 + 0.5123i | 0.0612 + 0.5826i | 0.0515 + 0.7571i | 0.0540 + 0.6722i | 0.0541 + 0.7704i | 0.0600 + 0.6700i |
| 25.5 | 0.0438 + 0.5661i | 0.0416 + 0.6480i | 0.0669 + 0.5658i | 0.0677 + 0.6466i | 0.0422 + 0.8329i | 0.0420 + 0.7408i | 0.0806 + 0.8359i | 0.0735 + 0.7378i |
| 26 | 0.0362 + 0.5516i | 0.0352 + 0.6211i | 0.0930 + 0.5503i | 0.0944 + 0.6214i | 0.0501 + 0.7778i | 0.0501 + 0.7025i | 0.0941 + 0.7686i | 0.0950 + 0.6968i |
| 26.5 | 0.0319 + 0.5344i | 0.0328 + 0.6243i | 0.0702 + 0.5348i | 0.0709 + 0.6199i | 0.0401 + 0.8246i | 0.0354 + 0.7183i | 0.0928 + 0.7983i | 0.0787 + 0.7149i |
| 27 | 0.0308 + 0.5613i | 0.0315 + 0.6418i | 0.0874 + 0.5600i | 0.0899 + 0.6395i | 0.0368 + 0.8194i | 0.0334 + 0.7259i | 0.0953 + 0.8062i | 0.0929 + 0.7245i |
| 27.5 | 0.0313 + 0.5647i | 0.0315 + 0.6436i | 0.0920 + 0.5643i | 0.0922 + 0.6441i | 0.0347 + 0.8220i | 0.0314 + 0.7280i | 0.0933 + 0.8100i | 0.0920 + 0.7282i |
| 28 | 0.0301 + 0.5655i | 0.0298 + 0.6462i | 0.0886 + 0.5661i | 0.0881 + 0.6466i | 0.0319 + 0.8305i | 0.0282 + 0.7314i | 0.0870 + 0.8145i | 0.0878 + 0.7235i |

| SNR/w | w152 | w153 | w154 | w155 | w156 | w157 | w158 | w159 |
|---|---|---|---|---|---|---|---|---|
| 7 | 0.2619 + 0.4435i | 0.2713 + 0.4647i | 0.2412 + 0.4348i | 0.2479 + 0.4574i | 0.2713 + 0.4647i | 0.2806 + 0.4854i | 0.2480 + 0.4574i | 0.2544 + 0.4799i |
| 7.5 | 0.2662 + 0.4566i | 0.2633 + 0.4507i | 0.2383 + 0.4505i | 0.2365 + 0.4440i | 0.2811 + 0.4883i | 0.2784 + 0.4828i | 0.2473 + 0.4856i | 0.2457 + 0.4793i |
| 8 | 0.2370 + 0.4793i | 0.2359 + 0.4745i | 0.2376 + 0.4816i | 0.2365 + 0.4767i | 0.2733 + 0.4797i | 0.2713 + 0.4755i | 0.2744 + 0.4818i | 0.2724 + 0.4776i |
| 8.5 | 0.2361 + 0.5224i | 0.2357 + 0.5201i | 0.2362 + 0.5228i | 0.2358 + 0.5204i | 0.2846 + 0.5120i | 0.2837 + 0.5101i | 0.2849 + 0.5124i | 0.2839 + 0.5105i |
| 9 | 0.2624 + 1.0473i | 0.2630 + 1.0525i | 0.2630 + 1.0525i | 0.2636 + 1.0574i | 0.2630 + 1.0525i | 0.2636 + 1.0574i | 0.2636 + 1.0574i | 0.2641 + 1.0618i |
| 9.5 | 0.2530 + 1.0217i | 0.2536 + 1.0306i | 0.2536 + 1.0306i | 0.2541 + 1.0391i | 0.2536 + 1.0525i | 0.2541 + 1.0391i | 0.2541 + 1.0391i | 0.2546 + 1.0473i |
| 10 | 0.2438 + 1.0008i | 0.2442 + 1.0178i | 0.2442 + 1.0178i | 0.2446 + 1.0280i | 0.2442 + 1.0177i | 0.2446 + 1.0280i | 0.2446 + 1.0280i | 0.2450 + 1.0381i |
| 10.5 | 0.2319 + 1.0008i | 0.2332 + 1.0132i | 0.2327 + 1.0107i | 0.2338 + 1.0223i | 0.2320 + 1.0123i | 0.2332 + 1.0248i | 0.2327 + 1.0223i | 0.2338 + 1.0348i |
| 11 | 0.1599 + 0.2848i | 0.1596 + 0.2846i | 0.1599 + 0.2849i | 0.1596 + 0.2848i | 0.1596 + 0.2853i | 0.1594 + 0.2851i | 0.1597 + 0.2854i | 0.1594 + 0.2853i |
| 11.5 | 0.1573 + 0.2839i | 0.1571 + 0.2839i | 0.1574 + 0.2840i | 0.1572 + 0.2840i | 0.1570 + 0.2844i | 0.1568 + 0.2844i | 0.1571 + 0.2845i | 0.1569 + 0.2845i |
| 12 | 0.1553 + 0.2810i | 0.1552 + 0.2811i | 0.1553 + 0.2810i | 0.1552 + 0.2811i | 0.1549 + 0.2814i | 0.1548 + 0.2815i | 0.1550 + 0.2814i | 0.1549 + 0.2815i |
| 12.5 | 0.1571 + 0.3702i | 0.1573 + 0.3702i | 0.1571 + 0.3709i | 0.1573 + 0.3709i | 0.1559 + 0.3679i | 0.1560 + 0.3679i | 0.1559 + 0.3685i | 0.1560 + 0.3686i |
| 13 | 0.1633 + 0.8858i | 0.1669 + 0.8838i | 0.1642 + 0.8851i | 0.1678 + 0.8832i | 0.1550 + 0.9567i | 0.1603 + 0.9551i | 0.1563 + 0.9553i | 0.1616 + 0.9537i |
| 13.5 | 0.1615 + 0.4108i | 0.1615 + 0.4106i | 0.1614 + 0.4107i | 0.1614 + 0.4106i | 0.1607 + 0.4102i | 0.1606 + 0.4102i | 0.1606 + 0.4102i | 0.1605 + 0.4101i |
| 14 | 0.1678 + 0.4230i | 0.1678 + 0.4231i | 0.1676 + 0.4230i | 0.1676 + 0.4231i | 0.1683 + 0.4237i | 0.1682 + 0.4238i | 0.1681 + 0.4236i | 0.1680 + 0.4237i |
| 14.5 | 0.1701 + 0.4313i | 0.1702 + 0.4316i | 0.1698 + 0.4306i | 0.1699 + 0.4308i | 0.1709 + 0.4328i | 0.1710 + 0.4331i | 0.1706 + 0.4320i | 0.1707 + 0.4323i |
| 15 | 0.1373 + 0.6092i | 0.1372 + 0.6080i | 0.1373 + 0.6096i | 0.1372 + 0.6083i | 0.1469 + 0.6274i | 0.1465 + 0.6259i | 0.1471 + 0.6278i | 0.1466 + 0.6263i |
| 15.5 | 0.1384 + 0.6125i | 0.1380 + 0.6123i | 0.1382 + 0.6123i | 0.1378 + 0.6121i | 0.1489 + 0.6298i | 0.1482 + 0.6293i | 0.1487 + 0.6295i | 0.1480 + 0.6291i |
| 16 | 0.1241 + 0.6313i | 0.1243 + 0.6282i | 0.1242 + 0.6313i | 0.1244 + 0.6282i | 0.1312 + 0.7076i | 0.1310 + 0.7024i | 0.1317 + 0.7071i | 0.1315 + 0.7020i |

| SNR/w | w160 | w161 | w162 | w163 | w164 | w165 | w166 | w167 |
|---|---|---|---|---|---|---|---|---|
| 16.5 | | 0.1133 + 0.5821i | 0.1131 + 0.5905i | 0.1131 + 0.5815i | 0.1133 + 0.6869i | 0.1135 + 0.6643i | 0.1130 + 0.6855i | 0.1132 + 0.6626i |
| 17 | | 0.1148 + 0.5794i | 0.1142 + 0.5871i | 0.1142 + 0.5787i | 0.1146 + 0.6946i | 0.1149 + 0.6695i | 0.1140 + 0.6924i | 0.1142 + 0.6670i |
| 17.5 | | 0.1169 + 0.5761i | 0.1160 + 0.5819i | 0.1160 + 0.5754i | 0.1168 + 0.7059i | 0.1170 + 0.6801i | 0.1159 + 0.7033i | 0.1161 + 0.6773i |
| 18 | | 0.1203 + 0.5704i | 0.1194 + 0.5733i | 0.1194 + 0.5701i | 0.1194 + 0.7174i | 0.1198 + 0.6926i | 0.1185 + 0.7151i | 0.1190 + 0.6905i |
| 18.5 | | 0.1263 + 0.6542i | 0.1257 + 0.6518i | 0.1258 + 0.6545i | 0.1534 + 0.8468i | 0.1490 + 0.8240i | 0.1522 + 0.8438i | 0.1480 + 0.8214i |
| 19 | | 0.1419 + 0.6706i | 0.1411 + 0.6679i | 0.1417 + 0.6711i | 0.1774 + 0.8589i | 0.1727 + 0.8373i | 0.1765 + 0.8556i | 0.1719 + 0.8344i |
| 19.5 | | 0.1576 + 0.6830i | 0.1566 + 0.6780i | 0.1574 + 0.6828i | 0.1909 + 0.8673i | 0.1867 + 0.8427i | 0.1916 + 0.8693i | 0.1872 + 0.8443i |
| 20 | | 0.1755 + 0.4889i | 0.1759 + 0.4872i | 0.1755 + 0.4887i | 0.1519 + 0.6347i | 0.1556 + 0.6115i | 0.1513 + 0.6382i | 0.1552 + 0.6142i |
| 20.5 | | 0.1742 + 0.6054i | 0.1739 + 0.5993i | 0.1742 + 0.6055i | 0.1808 + 0.7804i | 0.1800 + 0.7512i | 0.1811 + 0.7818i | 0.1802 + 0.7521i |
| 21 | | 0.1731 + 0.5822i | 0.1727 + 0.5704i | 0.1731 + 0.5824i | 0.1790 + 0.7664i | 0.1772 + 0.7218i | 0.1791 + 0.7650i | 0.1773 + 0.7213i |
| 21.5 | | 0.1675 + 0.5618i | 0.1684 + 0.5444i | 0.1676 + 0.5620i | 0.1651 + 0.7531i | 0.1644 + 0.6953i | 0.1652 + 0.7523i | 0.1645 + 0.6947i |
| 22 | | 0.1768 + 0.5788i | 0.1767 + 0.5582i | 0.1772 + 0.5786i | 0.1816 + 0.7648i | 0.1800 + 0.7050i | 0.1821 + 0.7650i | 0.1803 + 0.7052i |
| 22.5 | | 0.1731 + 0.5689i | 0.1726 + 0.5474i | 0.1727 + 0.5693i | 0.1751 + 0.7579i | 0.1723 + 0.6943i | 0.1733 + 0.7570i | 0.1705 + 0.6941i |
| 23 | | 0.1685 + 0.5741i | 0.1700 + 0.5329i | 0.1707 + 0.5712i | 0.1661 + 0.7700i | 0.1682 + 0.6855i | 0.1665 + 0.7688i | 0.1708 + 0.6849i |
| 23.5 | | 0.1757 + 0.5752i | 0.1749 + 0.5326i | 0.1740 + 0.5733i | 0.1734 + 0.7666i | 0.1748 + 0.6823i | 0.1720 + 0.7634i | 0.1728 + 0.6825i |
| 24 | | 0.1679 + 0.5984i | 0.1651 + 0.5324i | 0.1652 + 0.5983i | 0.1701 + 0.8091i | 0.1686 + 0.6995i | 0.1680 + 0.7998i | 0.1663 + 0.7015i |
| 24.5 | | 0.1785 + 0.5882i | 0.1734 + 0.5229i | 0.1723 + 0.5880i | 0.1686 + 0.7746i | 0.1738 + 0.6831i | 0.1623 + 0.7828i | 0.1688 + 0.6814i |
| 25 | | 0.1789 + 0.5856i | 0.1653 + 0.5129i | 0.1653 + 0.5854i | 0.1672 + 0.7680i | 0.1731 + 0.6769i | 0.1580 + 0.7784i | 0.1632 + 0.6743i |
| 25.5 | | 0.1899 + 0.6415i | 0.1514 + 0.5651i | 0.1527 + 0.6436i | 0.1527 + 0.8274i | 0.1939 + 0.7293i | 0.1615 + 0.8311i | 0.1553 + 0.7315i |
| 26 | | 0.2245 + 0.6191i | 0.1645 + 0.5475i | 0.1657 + 0.6192i | 0.1857 + 0.8191i | 0.2004 + 0.7001i | 0.1638 + 0.7891i | 0.1706 + 0.6989i |
| 26.5 | | 0.1889 + 0.6067i | 0.1371 + 0.5320i | 0.1410 + 0.6135i | 0.2034 + 0.7668i | 0.1936 + 0.6930i | 0.1697 + 0.8030i | 0.1474 + 0.6948i |
| 27 | | 0.2127 + 0.6337i | 0.1515 + 0.5573i | 0.1534 + 0.6358i | 0.2191 + 0.8143i | 0.2146 + 0.7189i | 0.1560 + 0.8180i | 0.1570 + 0.7210i |
| 27.5 | | 0.2174 + 0.6442i | 0.1553 + 0.5644i | 0.1553 + 0.6440i | 0.2141 + 0.8228i | 0.2166 + 0.7312i | 0.2166 + 0.8243i | 0.1561 + 0.7276i |
| 28 | | 0.2108 + 0.6469i | 0.1492 + 0.5671i | 0.1491 + 0.6469i | 0.2083 + 0.8201i | 0.2103 + 0.7318i | 0.1448 + 0.8276i | 0.1494 + 0.7302i |

| SNR/w | w160 | w161 | w162 | w163 | w164 | w165 | w166 | w167 |
|---|---|---|---|---|---|---|---|---|
| 7 | 0.2525 + 0.4221i | 0.2619 + 0.4435i | 0.2342 + 0.4126i | 0.2412 + 0.4348i | 0.2619 + 0.4435i | 0.2713 + 0.4647i | 0.2412 + 0.4348i | 0.2479 + 0.4574i |
| 7.5 | 0.2513 + 0.4243i | 0.2485 + 0.4182i | 0.2286 + 0.4159i | 0.2266 + 0.4094i | 0.2663 + 0.4567i | 0.2634 + 0.4508i | 0.2384 + 0.4506i | 0.2365 + 0.4440i |
| 8 | 0.2240 + 0.4267i | 0.2227 + 0.4217i | 0.2245 + 0.4286i | 0.2232 + 0.4236i | 0.2505 + 0.4321i | 0.2483 + 0.4275i | 0.2514 + 0.4340i | 0.2492 + 0.4294i |
| 8.5 | 0.2065 + 0.3934i | 0.2057 + 0.3906i | 0.2064 + 0.3931i | 0.2057 + 0.3905i | 0.2278 + 0.3968i | 0.2267 + 0.3942i | 0.2277 + 0.3966i | 0.2266 + 0.3940i |
| 9 | 1.1715 + 1.7496i | 0.8627 + 1.3080i | 0.8633 + 1.3089i | 0.7951 + 1.2187i | 0.8634 + 1.3090i | 0.7952 + 1.2188i | 0.7955 + 1.2192i | 0.7621 + 1.1765i |
| 9.5 | 1.1695 + 1.7479i | 0.8657 + 1.3031i | 0.8657 + 1.3031i | 0.8103 + 1.2261i | 0.8658 + 1.3033i | 0.8104 + 1.2262i | 0.8104 + 1.2262i | 0.7834 + 1.1893i |
| 10 | 1.1664 + 1.7479i | 0.8645 + 1.2962i | 0.8650 + 1.2969i | 0.8180 + 1.2275i | 0.8656 + 1.2977i | 0.8182 + 1.2279i | 0.8185 + 1.2282i | 0.7958 + 1.1944i |
| 10.5 | 1.1809 + 1.7123i | 0.8481 + 1.2650i | 0.8882 + 1.3009i | 0.8207 + 1.2141i | 0.8705 + 1.2926i | 0.8124 + 1.2139i | 0.8339 + 1.2290i | 0.8014 + 1.1879i |
| 11 | 1.1849 + 0.6438i | 0.1832 + 0.6445i | 0.1851 + 0.6436i | 0.1834 + 0.6443i | 0.1840 + 0.6437i | 0.1823 + 0.6444i | 0.1842 + 0.6435i | 0.1825 + 0.6442i |
| 11.5 | 0.1751 + 0.6584i | 0.1739 + 0.6589i | 0.1753 + 0.6580i | 0.1741 + 0.6585i | 0.1742 + 0.6587i | 0.1730 + 0.6593i | 0.1744 + 0.6584i | 0.1732 + 0.6589i |
| 12 | 0.1650 + 0.6665i | 0.1645 + 0.6667i | 0.1653 + 0.6660i | 0.1647 + 0.6663i | 0.1642 + 0.6674i | 0.1637 + 0.6677i | 0.1645 + 0.6670i | 0.1639 + 0.6673i |
| 12.5 | 0.1657 + 0.7373i | 0.1664 + 0.7371i | 0.1659 + 0.7415i | 0.1665 + 0.7414i | 0.1730 + 0.7293i | 0.1734 + 0.7294i | 0.1731 + 0.7342i | 0.1736 + 0.7342i |
| 13 | 0.7692 + 1.3337i | 0.6988 + 1.2828i | 0.7182 + 1.2796i | 0.6679 + 1.2607i | 0.6659 + 1.1379i | 0.6326 + 1.1480i | 0.6532 + 1.1323i | 0.6218 + 1.1450i |
| 13.5 | 0.1622 + 0.7731i | 0.1641 + 0.7721i | 0.1622 + 0.7780i | 0.1641 + 0.7792i | 0.1748 + 0.7628i | 0.1766 + 0.7625i | 0.1752 + 0.7705i | 0.1770 + 0.7704i |
| 14 | 0.1586 + 0.7792i | 0.1581 + 0.7762i | 0.1577 + 0.7868i | 0.1570 + 0.7842i | 0.1972 + 0.7688i | 0.1959 + 0.7655i | 0.1972 + 0.7766i | 0.1959 + 0.7735i |
| 14.5 | 0.1510 + 0.7940i | 0.1511 + 0.7895i | 0.1476 + 0.8065i | 0.1477 + 0.8022i | 0.2035 + 0.7802i | 0.2025 + 0.7758i | 0.2024 + 0.7910i | 0.2013 + 0.7866i |
| 15 | 0.1501 + 1.2522i | 0.2587 + 1.1907i | 0.1554 + 1.2559i | 0.2589 + 1.1981i | 0.4017 + 0.9534i | 0.3990 + 0.9943i | 0.4031 + 0.9503i | 0.3992 + 0.9902i |
| 15.5 | 0.1257 + 1.2731i | 0.1875 + 1.2747i | 0.1228 + 1.2749i | 0.1841 + 1.2766i | 0.4128 + 0.9511i | 0.4095 + 0.9686i | 0.4134 + 0.9504i | 0.4102 + 0.9676i |
| 16 | 0.1921 + 1.5489i | 0.3864 + 1.3049i | 0.2042 + 1.4748i | 0.3684 + 1.3253i | 0.4254 + 0.9408i | 0.4268 + 0.9886i | 0.4252 + 0.9355i | 0.4242 + 0.9783i |
| 16.5 | 0.2958 + 1.5189i | 0.3464 + 1.2494i | 0.3869 + 1.6973i | 0.3623 + 1.2204i | 0.3504 + 0.9145i | 0.3515 + 0.9774i | 0.3525 + 0.9180i | 0.3529 + 0.9844i |
| 17 | 0.2880 + 1.5187i | 0.3469 + 1.2449i | 0.3847 + 1.1713i | 0.3630 + 1.2154i | 0.3535 + 0.9107i | 0.3537 + 0.9752i | 0.3564 + 0.9146i | 0.3557 + 0.9841i |
| 17.5 | 0.2810 + 1.5145i | 0.3489 + 1.2391i | 0.3774 + 1.1718i | 0.3651 + 1.2097i | 0.3588 + 0.9078i | 0.3578 + 0.9748i | 0.3622 + 0.9120i | 0.3599 + 0.9853i |
| 18 | 0.2793 + 1.5139i | 0.3515 + 1.2341i | 0.3797 + 1.7225i | 0.3661 + 1.2067i | 0.3630 + 0.9083i | 0.3612 + 0.9766i | 0.3661 + 0.9121i | 0.3631 + 0.9861i |
| 18.5 | 0.6224 + 1.5379i | 0.5759 + 1.3142i | 0.6038 + 1.8517i | 0.5605 + 1.2517i | 0.4794 + 0.9742i | 0.5006 + 1.0392i | 0.4827 + 0.9819i | 0.5083 + 1.0631i |
| 19 | 0.6136 + 1.5287i | 0.5785 + 1.3124i | 0.6082 + 1.8229i | 0.5656 + 1.2442i | 0.5024 + 0.9694i | 0.5206 + 1.0374i | 0.5048 + 0.9772i | 0.5276 + 1.0642i |
| 19.5 | 0.5093 + 1.8272i | 0.5718 + 1.2403i | 0.5904 + 1.5365i | 0.5797 + 1.3019i | 0.5194 + 0.9720i | 0.5389 + 1.0616i | 0.5176 + 0.9666i | 0.5341 + 1.0394i |

| SNR/w | w168 | w169 | w170 | w171 | w172 | w173 | w174 | w175 |
|---|---|---|---|---|---|---|---|---|
| 20 | 0.3901 + 1.8592i | 0.2655 + 1.0853i | 0.2151 + 1.3209i | 0.2464 + 1.1466i | 0.3479 + 0.8465i | 0.3266 + 0.9221i | 0.3489 + 0.8418i | 0.3316 + 0.9053i |
| 20.5 | 0.3779 + 1.6732i | 0.4566 + 1.1811i | 0.4323 + 1.4599i | 0.4335 + 1.2331i | 0.4626 + 0.9226i | 0.4625 + 1.0226i | 0.4602 + 0.9198i | 0.4607 + 1.0041i |
| 21 | 0.4425 + 1.4246i | 0.4497 + 1.2508i | 0.4339 + 1.6179i | 0.4486 + 1.1809i | 0.4409 + 0.9051i | 0.4459 + 1.0172i | 0.4398 + 0.9033i | 0.4455 + 1.0429i |
| 21.5 | 0.4335 + 1.8289i | 0.4421 + 1.1662i | 0.4338 + 1.4210i | 0.4422 + 1.2638i | 0.4036 + 0.8851i | 0.4226 + 1.0373i | 0.4030 + 0.8909i | 0.4137 + 1.0009i |
| 22 | 0.4811 + 1.5692i | 0.4285 + 1.2414i | 0.4113 + 1.4351i | 0.4373 + 1.2159i | 0.4323 + 0.9018i | 0.4341 + 1.0375i | 0.4284 + 0.8977i | 0.4339 + 1.0572i |
| 22.5 | 0.4404 + 1.7644i | 0.4091 + 1.1667i | 0.4579 + 1.4331i | 0.4310 + 1.2944i | 0.4199 + 0.8806i | 0.4141 + 1.0322i | 0.4123 + 0.8894i | 0.4086 + 0.9927i |
| 23 | 0.4242 + 1.7554i | 0.4248 + 1.1691i | 0.4472 + 1.4475i | 0.4330 + 1.2938i | 0.4215 + 0.8941i | 0.4122 + 1.0484i | 0.4042 + 0.9066i | 0.3988 + 1.0072i |
| 23.5 | 0.3933 + 1.5893i | 0.4100 + 1.1638i | 0.4356 + 1.4074i | 0.4278 + 1.2731i | 0.4283 + 0.8857i | 0.4150 + 1.0457i | 0.4074 + 0.8987i | 0.3988 + 1.0007i |
| 24 | 0.4643 + 1.6633i | 0.4653 + 1.1815i | 0.4746 + 1.4795i | 0.4874 + 1.3073i | 0.4237 + 0.8868i | 0.4439 + 1.0768i | 0.4137 + 0.9183i | 0.4296 + 1.0142i |
| 24.5 | 0.4614 + 1.3869i | 0.4192 + 1.2422i | 0.4295 + 1.5513i | 0.3583 + 1.1597i | 0.4108 + 0.9173i | 0.4097 + 1.0235i | 0.3699 + 0.9056i | 0.3567 + 1.0552i |
| 25 | 0.5062 + 1.5466i | 0.3909 + 1.1806i | 0.4561 + 1.3999i | 0.4328 + 1.2778i | 0.3985 + 0.9191i | 0.3847 + 1.0408i | 0.3554 + 0.9098i | 0.3375 + 1.0392i |
| 25.5 | 0.4109 + 1.6215i | 0.4201 + 1.1814i | 0.4176 + 1.4698i | 0.4725 + 1.1135i | 0.4845 + 0.8904i | 0.4948 + 0.9831i | 0.4139 + 0.8984i | 0.4391 + 1.0220i |
| 26 | 0.5441 + 1.5886i | 0.4659 + 1.1498i | 0.4319 + 1.4062i | 0.4167 + 1.2626i | 0.4195 + 0.9309i | 0.4592 + 1.0189i | 0.3573 + 0.9441i | 0.3828 + 1.0426i |
| 26.5 | 0.5122 + 1.4464i | 0.4081 + 1.1447i | 0.4495 + 1.3429i | 0.4100 + 1.2413i | 0.3605 + 0.9756i | 0.3812 + 1.0530i | 0.3762 + 0.9043i | 0.4593 + 0.9010i |
| 27 | 0.5155 + 1.4738i | 0.4056 + 1.2349i | 0.4154 + 1.4035i | 0.4713 + 1.3098i | 0.4513 + 0.9439i | 0.4491 + 1.0353i | 0.4185 + 0.8835i | 0.5363 + 1.0313i |
| 27.5 | 0.4528 + 1.4608i | 0.3983 + 1.2179i | 0.3506 + 1.3699i | 0.4330 + 1.3116i | 0.4947 + 0.9196i | 0.4801 + 1.0177i | 0.4268 + 0.9033i | 0.5624 + 1.0275i |
| 28 | 0.5059 + 1.4670i | 0.5266 + 1.2312i | 0.4108 + 1.2036i | 0.4382 + 1.3162i | 0.4826 + 1.1077i | 0.5122 + 1.0210i | 0.4263 + 0.9068i | 0.4319 + 0.9952i |

| SNR/w | w168 | w169 | w170 | w171 | w172 | w173 | w174 | w175 |
|---|---|---|---|---|---|---|---|---|
| 7 | 0.2619 + 0.4435i | 0.2713 + 0.4647i | 0.2412 + 0.4348i | 0.2479 + 0.4574i | 0.2713 + 0.4647i | 0.2806 + 0.4854i | 0.2479 + 0.4574i | 0.2544 + 0.4799i |
| 7.5 | 0.2662 + 0.4565i | 0.2634 + 0.4506i | 0.2383 + 0.4503i | 0.2365 + 0.4438i | 0.2811 + 0.4882i | 0.2784 + 0.4827i | 0.2474 + 0.4854i | 0.2458 + 0.4791i |
| 8 | 0.2370 + 0.4792i | 0.2359 + 0.4744i | 0.2375 + 0.4815i | 0.2364 + 0.4766i | 0.2733 + 0.4796i | 0.2713 + 0.4754i | 0.2744 + 0.4817i | 0.2723 + 0.4775i |
| 8.5 | 0.2361 + 0.5225i | 0.2357 + 0.5201i | 0.2362 + 0.5228i | 0.2358 + 0.5205i | 0.2847 + 0.5120i | 0.2837 + 0.5101i | 0.2849 + 0.5124i | 0.2839 + 0.5105i |
| 9 | 0.8634 + 1.3090i | 0.7952 + 1.2188i | 0.7955 + 1.2192i | 0.7621 + 1.1765i | 0.7955 + 1.2192i | 0.7622 + 1.1765i | 0.7624 + 1.1768i | 0.7410 + 1.1499i |
| 9.5 | 0.8658 + 1.3032i | 0.8104 + 1.2262i | 0.8104 + 1.2262i | 0.7834 + 1.1893i | 0.8104 + 1.2262i | 0.7834 + 1.1893i | 0.7834 + 1.1893i | 0.7662 + 1.1658i |
| 10 | 0.8648 + 1.2967i | 0.8179 + 1.2274i | 0.8181 + 1.2277i | 0.7956 + 1.1941i | 0.8184 + 1.2281i | 0.7957 + 1.1943i | 0.7959 + 1.1946i | 0.7816 + 1.1728i |
| 10.5 | 0.8665 + 1.2966i | 0.8085 + 1.2166i | 0.8296 + 1.2319i | 0.7976 + 1.1890i | 0.8193 + 1.2303i | 0.7910 + 1.1899i | 0.8065 + 1.1994i | 0.7855 + 1.1714i |
| 11 | 0.1861 + 0.6426i | 0.1844 + 0.6434i | 0.1863 + 0.6424i | 0.1846 + 0.6431i | 0.1852 + 0.6425i | 0.1835 + 0.6433i | 0.1854 + 0.6423i | 0.1837 + 0.6430i |
| 11.5 | 0.1771 + 0.6550i | 0.1759 + 0.6555i | 0.1774 + 0.6546i | 0.1762 + 0.6551i | 0.1762 + 0.6554i | 0.1750 + 0.6559i | 0.1764 + 0.6550i | 0.1752 + 0.6556i |
| 12 | 0.1675 + 0.6603i | 0.1670 + 0.6606i | 0.1678 + 0.6598i | 0.1673 + 0.6601i | 0.1667 + 0.6614i | 0.1662 + 0.6617i | 0.1670 + 0.6609i | 0.1664 + 0.6612i |
| 12.5 | 0.1643 + 0.7338i | 0.1643 + 0.7348i | 0.1639 + 0.7391i | 0.1644 + 0.7391i | 0.1710 + 0.7264i | 0.1715 + 0.7264i | 0.1710 + 0.7313i | 0.1715 + 0.7314i |
| 13 | 0.6468 + 1.1775i | 0.6200 + 1.1863i | 0.6352 + 1.1684i | 0.6111 + 1.1803i | 0.6175 + 1.1079i | 0.5934 + 1.1223i | 0.6106 + 1.1071i | 0.5875 + 1.1220i |
| 13.5 | 0.1517 + 0.7725i | 0.1545 + 0.7698i | 0.1520 + 0.7790i | 0.1540 + 0.7775i | 0.1651 + 0.7592i | 0.1668 + 0.7587i | 0.1651 + 0.7670i | 0.1669 + 0.7665i |
| 14 | 0.1569 + 0.7776i | 0.1563 + 0.7748i | 0.1558 + 0.7856i | 0.1552 + 0.7829i | 0.1944 + 0.7671i | 0.1932 + 0.7638i | 0.1944 + 0.7750i | 0.1931 + 0.7719i |
| 14.5 | 0.1491 + 0.7930i | 0.1493 + 0.7855i | 0.1458 + 0.8056i | 0.1459 + 0.8012i | 0.2002 + 0.7788i | 0.1992 + 0.7743i | 0.1992 + 0.7896i | 0.1982 + 0.7852i |
| 15 | 0.1550 + 1.2356i | 0.2548 + 1.1786i | 0.1590 + 1.2356i | 0.2552 + 1.1854i | 0.3986 + 0.9545i | 0.3965 + 0.9938i | 0.4000 + 0.9515i | 0.3967 + 0.9989i |
| 15.5 | 0.1953 + 1.1916i | 0.2559 + 1.2146i | 0.1919 + 1.1913i | 0.2529 + 1.2144i | 0.3968 + 0.9983i | 0.3991 + 1.0306i | 0.3971 + 0.9972i | 0.3993 + 1.0293i |
| 16 | 0.1202 + 1.5524i | 0.3902 + 1.2699i | 0.1458 + 1.4668i | 0.3679 + 1.2863i | 0.4206 + 0.9517i | 0.4279 + 1.0067i | 0.4195 + 0.9457i | 0.4236 + 0.9953i |
| 16.5 | 0.3396 + 1.4835i | 0.3411 + 1.2758i | 0.4480 + 1.5575i | 0.3577 + 1.2417i | 0.3299 + 0.9123i | 0.3314 + 0.9729i | 0.3319 + 0.9159i | 0.3329 + 0.9801i |
| 17 | 0.3338 + 1.4825i | 0.3376 + 1.2735i | 0.4573 + 1.5560i | 0.3554 + 1.2359i | 0.3285 + 0.9084i | 0.3294 + 0.9696i | 0.3312 + 0.9124i | 0.3314 + 0.9788i |
| 17.5 | 0.3287 + 1.4767i | 0.3347 + 1.2698i | 0.4622 + 1.5494i | 0.3496 + 1.2297i | 0.3271 + 0.9055i | 0.3274 + 0.9683i | 0.3299 + 0.9098i | 0.3294 + 0.9792i |
| 18 | 0.3273 + 1.4723i | 0.3301 + 1.2672i | 0.4716 + 1.5416i | 0.3419 + 1.2255i | 0.3202 + 0.9062i | 0.3203 + 0.9707i | 0.3223 + 0.9102i | 0.3219 + 0.9805i |
| 18.5 | 0.4160 + 1.5551i | 0.4079 + 1.3496i | 0.3930 + 1.7342i | 0.4025 + 1.2867i | 0.3596 + 1.0023i | 0.3708 + 1.0708i | 0.3607 + 1.0104i | 0.3752 + 1.0942i |
| 19 | 0.4096 + 1.5434i | 0.4091 + 1.3422i | 0.3868 + 1.7355i | 0.4051 + 1.2765i | 0.3662 + 1.0014i | 0.3772 + 1.0686i | 0.3672 + 1.0093i | 0.3819 + 1.0940i |
| 19.5 | 0.1896 + 1.9476i | 0.4173 + 1.2630i | 0.4293 + 1.5290i | 0.4215 + 1.3195i | 0.3722 + 1.0063i | 0.3894 + 1.0902i | 0.3712 + 1.0007i | 0.3841 + 1.0703i |
| 20 | 0.2891 + 1.6189i | 0.2191 + 1.0576i | 0.2287 + 1.4492i | 0.2175 + 1.0907i | 0.2614 + 0.8240i | 0.2469 + 0.9073i | 0.2617 + 0.8185i | 0.2501 + 0.8885i |
| 20.5 | 0.1559 + 1.8551i | 0.3285 + 1.1781i | 0.3245 + 1.4116i | 0.3282 + 1.2302i | 0.3234 + 0.9274i | 0.3269 + 1.0213i | 0.3234 + 0.9241i | 0.3259 + 1.0022i |
| 21 | 0.2900 + 1.4178i | 0.3085 + 1.2507i | 0.2645 + 1.6046i | 0.3133 + 1.1795i | 0.3144 + 0.9078i | 0.3155 + 1.0127i | 0.3140 + 0.9070i | 0.3156 + 1.0365i |
| 21.5 | 0.3087 + 1.6359i | 0.3076 + 1.1747i | 0.3096 + 1.4426i | 0.3112 + 1.2557i | 0.2871 + 0.8893i | 0.2967 + 1.0444i | 0.2874 + 0.8949i | 0.2940 + 1.0120i |
| 22 | 0.2306 + 1.3849i | 0.2809 + 1.2390i | 0.2905 + 1.4691i | 0.2945 + 1.1903i | 0.3077 + 0.9017i | 0.3084 + 1.0287i | 0.3077 + 0.8983i | 0.3070 + 1.0448i |
| 22.5 | 0.3278 + 1.6041i | 0.2970 + 1.1686i | 0.3037 + 1.4425i | 0.2970 + 1.2912i | 0.2937 + 0.8770i | 0.2944 + 1.0396i | 0.2950 + 0.8870i | 0.2951 + 0.9957i |
| 23 | 0.2943 + 1.6238i | 0.2952 + 1.1812i | 0.3204 + 1.4563i | 0.3158 + 1.2876i | 0.2767 + 0.8910i | 0.2822 + 1.0584i | 0.2840 + 0.9009i | 0.2794 + 1.0101i |

-continued

| SNR/w | w176 | w177 | w178 | w179 | w180 | w181 | w182 | w183 |
|---|---|---|---|---|---|---|---|---|
| 23.5 | 0.2662 + 1.5264i | 0.2867 + 1.1635i | 0.2847 + 1.3880i | 0.2871 + 1.2790i | 0.2863 + 0.8736i | 0.2818 + 1.0582i | 0.2905 + 0.8919i | 0.2853 + 0.9967i |
| 24 | 0.3157 + 1.8053i | 0.3327 + 1.2080i | 0.3481 + 1.4263i | 0.3796 + 1.3103i | 0.2893 + 0.9032i | 0.3123 + 1.1027i | 0.2959 + 0.9319i | 0.3029 + 1.0334i |
| 24.5 | 0.3338 + 1.4792i | 0.2893 + 1.2934i | 0.2719 + 1.4925i | 0.2628 + 1.1826i | 0.2548 + 0.9166i | 0.2364 + 1.0101i | 0.2759 + 0.8967i | 0.2549 + 1.0649i |
| 25 | 0.2741 + 1.3977i | 0.2823 + 1.3906i | 0.3404 + 1.4960i | 0.2496 + 1.1769i | 0.2423 + 0.9140i | 0.2246 + 1.0063i | 0.2679 + 0.8905i | 0.2459 + 1.0740i |
| 25.5 | 0.3610 + 1.3165i | 0.3191 + 1.2022i | 0.2929 + 1.4100i | 0.2095 + 1.3211i | 0.2809 + 0.9302i | 0.3045 + 1.0609i | 0.3388 + 0.9217i | 0.3581 + 1.0225i |
| 26 | 0.2562 + 1.3168i | 0.2416 + 1.2052i | 0.3169 + 1.4056i | 0.3353 + 1.1847i | 0.2478 + 0.9328i | 0.2466 + 1.0790i | 0.2813 + 0.9406i | 0.3161 + 1.0751i |
| 26.5 | 0.3891 + 0.9866i | 0.2212 + 1.3291i | 0.3380 + 1.3952i | 0.2946 + 1.2451i | 0.2695 + 0.9684i | 0.2704 + 1.0530i | 0.2713 + 0.8960i | 0.2536 + 1.1406i |
| 27 | 0.2908 + 1.3146i | 0.2866 + 1.2128i | 0.3054 + 1.4311i | 0.3265 + 1.1340i | 0.2959 + 0.9159i | 0.3072 + 1.0000i | 0.3513 + 0.8884i | 0.3357 + 1.0591i |
| 27.5 | 0.2183 + 1.3371i | 0.2840 + 1.2244i | 0.2932 + 1.4680i | 0.3445 + 1.1098i | 0.2843 + 0.9156i | 0.2866 + 1.0054i | 0.3594 + 0.9169i | 0.3648 + 1.0180i |
| 28 | 0.2888 + 1.3750i | 0.2811 + 1.1589i | 0.3632 + 1.4529i | 0.3464 + 1.0908i | 0.2807 + 0.8996i | 0.2837 + 1.2544i | 0.3472 + 0.9117i | 0.3452 + 1.0021i |

| SNR/w | w176 | w177 | w178 | w179 | w180 | w181 | w182 | w183 |
|---|---|---|---|---|---|---|---|---|
| 7 | 0.2619 + 0.4434i | 0.2713 + 0.4647i | 0.2412 + 0.4348i | 0.2479 + 0.4574i | 0.2713 + 0.4647i | 0.2806 + 0.4854i | 0.2479 + 0.4574i | 0.2544 + 0.4799i |
| 7.5 | 0.2664 + 0.4570i | 0.2636 + 0.4511i | 0.2384 + 0.4509i | 0.2366 + 0.4443i | 0.2813 + 0.4886i | 0.2786 + 0.4831i | 0.2475 + 0.4859i | 0.2459 + 0.4796i |
| 8 | 0.2370 + 0.4792i | 0.2359 + 0.4744i | 0.2375 + 0.4815i | 0.2365 + 0.4767i | 0.2733 + 0.4796i | 0.2713 + 0.4754i | 0.2744 + 0.4818i | 0.2724 + 0.4776i |
| 8.5 | 0.2140 + 0.4221i | 0.2133 + 0.4192i | 0.2139 + 0.4219i | 0.2132 + 0.4190i | 0.2403 + 0.4237i | 0.2391 + 0.4211i | 0.2402 + 0.4236i | 0.2390 + 0.4210i |
| 9 | 0.5517 + 0.9244i | 0.5555 + 0.9293i | 0.5555 + 0.9293i | 0.5590 + 0.9338i | 0.5555 + 0.9293i | 0.5590 + 0.9338i | 0.5590 + 0.9338i | 0.5622 + 0.9380i |
| 9.5 | 0.5372 + 0.8986i | 0.5435 + 0.9058i | 0.5435 + 0.9058i | 0.5495 + 0.9128i | 0.5435 + 0.9058i | 0.5495 + 0.9128i | 0.5495 + 0.9128i | 0.5553 + 0.9194i |
| 10 | 0.5325 + 0.8822i | 0.5397 + 0.8901i | 0.5397 + 0.8900i | 0.5469 + 0.8979i | 0.5435 + 0.8900i | 0.5468 + 0.8978i | 0.5468 + 0.8978i | 0.5539 + 0.9055i |
| 10.5 | 0.5268 + 0.8717i | 0.5361 + 0.8812i | 0.5351 + 0.8781i | 0.5447 + 0.8876i | 0.5396 + 0.8798i | 0.5435 + 0.8893i | 0.5425 + 0.8862i | 0.5520 + 0.8958i |
| 11 | 0.2981 + 0.6050i | 0.2952 + 0.6044i | 0.2987 + 0.6050i | 0.2959 + 0.6043i | 0.2965 + 0.6047i | 0.2937 + 0.6041i | 0.2972 + 0.6047i | 0.2943 + 0.6040i |
| 11.5 | 0.3089 + 0.6095i | 0.3065 + 0.6088i | 0.3100 + 0.6094i | 0.3076 + 0.6088i | 0.3071 + 0.6096i | 0.3047 + 0.6089i | 0.3082 + 0.6095i | 0.3058 + 0.6088i |
| 12 | 0.3154 + 0.6110i | 0.3136 + 0.6104i | 0.3171 + 0.6110i | 0.3153 + 0.6104i | 0.3137 + 0.6116i | 0.3120 + 0.6109i | 0.3154 + 0.6115i | 0.3136 + 0.6109i |
| 12.5 | 0.3632 + 0.6294i | 0.3630 + 0.6299i | 0.3604 + 0.6334i | 0.3603 + 0.6339i | 0.3630 + 0.6305i | 0.3628 + 0.6309i | 0.3604 + 0.6346i | 0.3602 + 0.6350i |
| 13 | 0.4580 + 0.8115i | 0.4550 + 0.8134i | 0.4568 + 0.8130i | 0.4539 + 0.8150i | 0.4787 + 0.8362i | 0.4747 + 0.8390i | 0.4771 + 0.8381i | 0.4732 + 0.8410i |
| 13.5 | 0.3891 + 0.6244i | 0.3879 + 0.6258i | 0.3877 + 0.6287i | 0.3865 + 0.6302i | 0.3833 + 0.6298i | 0.3823 + 0.6314i | 0.3820 + 0.6347i | 0.3810 + 0.6363i |
| 14 | 0.4177 + 0.5936i | 0.4181 + 0.5920i | 0.4181 + 0.5965i | 0.4172 + 0.5948i | 0.4075 + 0.6169i | 0.4079 + 0.6147i | 0.4066 + 0.6211i | 0.4070 + 0.6188i |
| 14.5 | 0.4264 + 0.5882i | 0.4265 + 0.5869i | 0.4265 + 0.5869i | 0.4271 + 0.5902i | 0.4112 + 0.6193i | 0.4113 + 0.6171i | 0.4115 + 0.6227i | 0.4116 + 0.6203i |
| 15 | 0.4077 + 0.5907i | 0.4064 + 0.5859i | 0.4086 + 0.5913i | 0.4072 + 0.5865i | 0.4151 + 0.6449i | 0.4114 + 0.6359i | 0.4163 + 0.6464i | 0.4125 + 0.6373i |
| 15.5 | 0.4122 + 0.5996i | 0.4107 + 0.5966i | 0.4136 + 0.5990i | 0.4122 + 0.5960i | 0.4190 + 0.6599i | 0.4160 + 0.6534i | 0.4200 + 0.6590i | 0.4171 + 0.6526i |
| 16 | 0.3857 + 0.6045i | 0.3840 + 0.5992i | 0.3870 + 0.6050i | 0.3853 + 0.5996i | 0.3960 + 0.6869i | 0.3914 + 0.6754i | 0.3977 + 0.6883i | 0.3930 + 0.6768i |
| 16.5 | 0.3562 + 0.5904i | 0.3560 + 0.5811i | 0.3597 + 0.5898i | 0.3595 + 0.5814i | 0.3550 + 0.6831i | 0.3556 + 0.6620i | 0.3585 + 0.6815i | 0.3591 + 0.6604i |
| 17 | 0.3592 + 0.5876i | 0.3587 + 0.5794i | 0.3634 + 0.5869i | 0.3630 + 0.5788i | 0.3580 + 0.6900i | 0.3584 + 0.6662i | 0.3624 + 0.6879i | 0.3628 + 0.6641i |
| 17.5 | 0.3633 + 0.5827i | 0.3627 + 0.5759i | 0.3675 + 0.5821i | 0.3668 + 0.5754i | 0.3630 + 0.6989i | 0.3631 + 0.6738i | 0.3674 + 0.6966i | 0.3675 + 0.6715i |
| 18 | 0.3686 + 0.5746i | 0.3680 + 0.5708i | 0.3718 + 0.5743i | 0.3712 + 0.5706i | 0.3678 + 0.7114i | 0.3678 + 0.6873i | 0.3716 + 0.7096i | 0.3712 + 0.6857i |
| 18.5 | 0.3727 + 0.6257i | 0.3729 + 0.6272i | 0.3747 + 0.6253i | 0.3748 + 0.6269i | 0.4213 + 0.8029i | 0.4146 + 0.7814i | 0.4212 + 0.7989i | 0.4146 + 0.7778i |
| 19 | 0.3961 + 0.6291i | 0.3970 + 0.6316i | 0.3972 + 0.6289i | 0.3981 + 0.6314i | 0.4525 + 0.8056i | 0.4452 + 0.7831i | 0.4518 + 0.8016i | 0.4447 + 0.7797i |
| 19.5 | 0.4160 + 0.6331i | 0.4175 + 0.6369i | 0.4163 + 0.6324i | 0.4178 + 0.6363i | 0.4728 + 0.8075i | 0.4647 + 0.7830i | 0.4734 + 0.8100i | 0.4653 + 0.7849i |
| 20 | 0.4347 + 0.5737i | 0.4342 + 0.5398i | 0.4346 + 0.5368i | 0.4340 + 0.5394i | 0.3935 + 0.6954i | 0.4002 + 0.6734i | 0.3922 + 0.6980i | 0.3992 + 0.6756i |
| 20.5 | 0.4336 + 0.5886i | 0.4348 + 0.5955i | 0.4325 + 0.5884i | 0.4337 + 0.5953i | 0.4513 + 0.7703i | 0.4482 + 0.7385i | 0.4494 + 0.7719i | 0.4465 + 0.7396i |
| 21 | 0.4216 + 0.5612i | 0.4219 + 0.5730i | 0.4204 + 0.5615i | 0.4207 + 0.5733i | 0.4300 + 0.7574i | 0.4269 + 0.7104i | 0.4292 + 0.7567i | 0.4261 + 0.7103i |
| 21.5 | 0.4178 + 0.5572i | 0.4161 + 0.5694i | 0.4137 + 0.5565i | 0.4119 + 0.5689i | 0.4055 + 0.7444i | 0.4068 + 0.6986i | 0.4022 + 0.7450i | 0.4027 + 0.6983i |
| 22 | 0.4261 + 0.5507i | 0.4265 + 0.5734i | 0.4221 + 0.5510i | 0.4225 + 0.5738i | 0.4295 + 0.7653i | 0.4287 + 0.6991i | 0.4259 + 0.7659i | 0.4252 + 0.7003i |
| 22.5 | 0.4242 + 0.5509i | 0.4246 + 0.5727i | 0.4159 + 0.5515i | 0.4157 + 0.5732i | 0.4206 + 0.7539i | 0.4231 + 0.6946i | 0.4125 + 0.7506i | 0.4151 + 0.6929i |
| 23 | 0.4301 + 0.5423i | 0.4270 + 0.5846i | 0.4101 + 0.5411i | 0.4102 + 0.5829i | 0.4195 + 0.7786i | 0.4203 + 0.6926i | 0.4015 + 0.7826i | 0.4017 + 0.6936i |
| 23.5 | 0.4342 + 0.5380i | 0.4337 + 0.5823i | 0.4125 + 0.5369i | 0.4121 + 0.5813i | 0.4306 + 0.7737i | 0.4345 + 0.6883i | 0.4114 + 0.7705i | 0.4132 + 0.6878i |
| 24 | 0.4240 + 0.5305i | 0.4224 + 0.5909i | 0.3960 + 0.5305i | 0.3944 + 0.5911i | 0.4145 + 0.7848i | 0.4190 + 0.6960i | 0.3922 + 0.7799i | 0.3915 + 0.6903i |
| 24.5 | 0.4394 + 0.5277i | 0.4335 + 0.6044i | 0.4041 + 0.5255i | 0.3995 + 0.6013i | 0.4210 + 0.8001i | 0.4255 + 0.7005i | 0.3823 + 0.8003i | 0.3916 + 0.6976i |
| 25 | 0.4499 + 0.5230i | 0.4394 + 0.6025i | 0.3970 + 0.5187i | 0.3924 + 0.5977i | 0.4127 + 0.8016i | 0.4248 + 0.6985i | 0.3717 + 0.7989i | 0.3841 + 0.6928i |
| 25.5 | 0.4713 + 0.5531i | 0.4766 + 0.5823i | 0.4019 + 0.5558i | 0.4036 + 0.6329i | 0.4306 + 0.7991i | 0.4345 + 0.7133i | 0.4114 + 0.7705i | 0.4132 + 0.6878i |
| 25.5 | 0.4713 + 0.5531i | 0.4766 + 0.5558i | 0.4019 + 0.5558i | 0.4036 + 0.6329i | 0.4825 + 0.7991i | 0.4804 + 0.7133i | 0.4063 + 0.8041i | 0.4045 + 0.7167i |
| 26 | 0.4704 + 0.5396i | 0.4557 + 0.6111i | 0.4115 + 0.5347i | 0.4241 + 0.6454i | 0.4123 + 0.8520i | 0.4554 + 0.8028i | 0.3640 + 0.8375i | 0.4184 + 0.7393i |
| 26.5 | 0.4616 + 0.5519i | 0.4251 + 0.6479i | 0.3986 + 0.5420i | 0.3877 + 0.6124i | 0.3594 + 0.7678i | 0.3969 + 0.7243i | 0.3707 + 0.8267i | 0.4482 + 0.8030i |

-continued

| | w184 | w185 | w186 | w187 | w188 | w189 | w190 | w191 |
|---|---|---|---|---|---|---|---|---|
| 27 | 0.4932 + 0.5555i | 0.4800 + 0.6280i | 0.4144 + 0.5520i | 0.4124 + 0.6261i | 0.4851 + 0.7848i | 0.4912 + 0.6997i | 0.4214 + 0.7951i | 0.4128 + 0.7066i |
| 27.5 | 0.4887 + 0.5809i | 0.4812 + 0.6491i | 0.4174 + 0.5692i | 0.4122 + 0.6478i | 0.4949 + 0.8030i | 0.4972 + 0.7169i | 0.4243 + 0.8140i | 0.4168 + 0.7278i |
| 28 | 0.4885 + 0.5615i | 0.4738 + 0.6399i | 0.4131 + 0.5615i | 0.4096 + 0.6374i | 0.4750 + 0.8030i | 0.4772 + 0.7164i | 0.4136 + 0.8164i | 0.4073 + 0.7216i |

| SNR/w | w184 | w185 | w186 | w187 | w188 | w189 | w190 | w191 |
|---|---|---|---|---|---|---|---|---|
| 7 | 0.2713 + 0.4647i | 0.2806 + 0.4854i | 0.2479 + 0.4574i | 0.2544 + 0.4799i | 0.2806 + 0.4854i | 0.2896 + 0.5053i | 0.2544 + 0.4799i | 0.2604 + 0.5019i |
| 7.5 | 0.2812 + 0.4884i | 0.2786 + 0.4829i | 0.2474 + 0.4858i | 0.2458 + 0.4794i | 0.2955 + 0.5181i | 0.2931 + 0.5132i | 0.2554 + 0.5197i | 0.2541 + 0.5139i |
| 8 | 0.2479 + 0.5301i | 0.2471 + 0.5259i | 0.2484 + 0.5327i | 0.2476 + 0.5284i | 0.2956 + 0.5235i | 0.2938 + 0.5200i | 0.2968 + 0.5258i | 0.2951 + 0.5223i |
| 8.5 | 0.2413 + 0.5512i | 0.2410 + 0.5491i | 0.2414 + 0.5518i | 0.2411 + 0.5497i | 0.2979 + 0.5364i | 0.2971 + 0.5347i | 0.2983 + 0.5370i | 0.2974 + 0.5353i |
| 9 | 0.5555 + 0.9293i | 0.5590 + 0.9338i | 0.5590 + 0.9338i | 0.5622 + 0.9380i | 0.5590 + 0.9338i | 0.5622 + 0.9380i | 0.5622 + 0.9380i | 0.5650 + 0.9417i |
| 9.5 | 0.5435 + 0.9058i | 0.5495 + 0.9128i | 0.5495 + 0.9128i | 0.5553 + 0.9194i | 0.5495 + 0.9128i | 0.5553 + 0.9194i | 0.5553 + 0.9194i | 0.5608 + 0.9257i |
| 10 | 0.5397 + 0.8900i | 0.5469 + 0.8979i | 0.5468 + 0.8978i | 0.5540 + 0.9055i | 0.5468 + 0.8978i | 0.5539 + 0.9055i | 0.5539 + 0.9055i | 0.5609 + 0.9130i |
| 10.5 | 0.5329 + 0.8801i | 0.5425 + 0.8896i | 0.5416 + 0.8865i | 0.5512 + 0.8961i | 0.5404 + 0.8882i | 0.5497 + 0.8978i | 0.5488 + 0.8947i | 0.5583 + 0.9042i |
| 11 | 0.2998 + 0.6028i | 0.2969 + 0.6020i | 0.3005 + 0.6028i | 0.2976 + 0.6020i | 0.2982 + 0.6025i | 0.2954 + 0.6017i | 0.2989 + 0.6024i | 0.2960 + 0.6017i |
| 11.5 | 0.3108 + 0.6061i | 0.3084 + 0.6054i | 0.3119 + 0.6061i | 0.3095 + 0.6053i | 0.3090 + 0.6062i | 0.3066 + 0.6055i | 0.3101 + 0.6062i | 0.3077 + 0.6054i |
| 12 | 0.3165 + 0.6063i | 0.3147 + 0.6056i | 0.3182 + 0.6064i | 0.3164 + 0.6057i | 0.3149 + 0.6069i | 0.3131 + 0.6062i | 0.3165 + 0.6069i | 0.3147 + 0.6062i |
| 12.5 | 0.3656 + 0.6266i | 0.3654 + 0.6270i | 0.3627 + 0.6305i | 0.3626 + 0.6309i | 0.3652 + 0.6276i | 0.3650 + 0.6280i | 0.3625 + 0.6315i | 0.3624 + 0.6320i |
| 13 | 0.4562 + 0.8224i | 0.4534 + 0.8246i | 0.4551 + 0.8240i | 0.4523 + 0.8262i | 0.4758 + 0.8486i | 0.4719 + 0.8518i | 0.4744 + 0.8506i | 0.4706 + 0.8539i |
| 13.5 | 0.3924 + 0.6164i | 0.3911 + 0.6176i | 0.3910 + 0.6203i | 0.3898 + 0.6216i | 0.3860 + 0.6210i | 0.3849 + 0.6224i | 0.3848 + 0.6254i | 0.3837 + 0.6269i |
| 14 | 0.4111 + 0.5935i | 0.4113 + 0.5918i | 0.4103 + 0.5966i | 0.4106 + 0.5948i | 0.4021 + 0.6167i | 0.4023 + 0.6144i | 0.4013 + 0.6210i | 0.4016 + 0.6186i |
| 14.5 | 0.4171 + 0.5874i | 0.4171 + 0.5860i | 0.4178 + 0.5895i | 0.4178 + 0.5880i | 0.4038 + 0.6183i | 0.4038 + 0.6160i | 0.4042 + 0.6218i | 0.4042 + 0.6194i |
| 15 | 0.3970 + 0.5923i | 0.3955 + 0.5876i | 0.3980 + 0.5929i | 0.3964 + 0.5882i | 0.4065 + 0.6461i | 0.4024 + 0.6373i | 0.4078 + 0.6477i | 0.4036 + 0.6388i |
| 15.5 | 0.4019 + 0.5913i | 0.4006 + 0.5888i | 0.4035 + 0.5907i | 0.4022 + 0.5882i | 0.4046 + 0.6408i | 0.4021 + 0.6356i | 0.4058 + 0.6401i | 0.4034 + 0.6348i |
| 16 | 0.3702 + 0.6049i | 0.3686 + 0.5999i | 0.3715 + 0.6053i | 0.3698 + 0.6003i | 0.3804 + 0.6848i | 0.3759 + 0.6738i | 0.3820 + 0.6862i | 0.3775 + 0.6751i |
| 16.5 | 0.3326 + 0.5909i | 0.3324 + 0.5822i | 0.3358 + 0.5903i | 0.3355 + 0.5817i | 0.3320 + 0.6846i | 0.3324 + 0.6633i | 0.3352 + 0.6830i | 0.3356 + 0.6617i |
| 17 | 0.3296 + 0.5883i | 0.3292 + 0.5798i | 0.3331 + 0.5875i | 0.3327 + 0.5792i | 0.3295 + 0.6921i | 0.3297 + 0.6682i | 0.3332 + 0.6901i | 0.3332 + 0.6661i |
| 17.5 | 0.3243 + 0.5833i | 0.3238 + 0.5764i | 0.3272 + 0.5827i | 0.3267 + 0.5759i | 0.3257 + 0.7021i | 0.3253 + 0.6769i | 0.3289 + 0.6999i | 0.3284 + 0.6747i |
| 18 | 0.3168 + 0.5747i | 0.3166 + 0.5710i | 0.3185 + 0.5745i | 0.3182 + 0.5708i | 0.3185 + 0.7143i | 0.3177 + 0.6904i | 0.3204 + 0.7125i | 0.3198 + 0.6885i |
| 18.5 | 0.3096 + 0.6362i | 0.3097 + 0.6383i | 0.3106 + 0.6363i | 0.3106 + 0.6383i | 0.3321 + 0.8252i | 0.3289 + 0.8027i | 0.3318 + 0.8217i | 0.3287 + 0.7995i |
| 19 | 0.3089 + 0.6488i | 0.3094 + 0.6516i | 0.3092 + 0.6492i | 0.3097 + 0.6519i | 0.3372 + 0.8347i | 0.3330 + 0.8123i | 0.3364 + 0.8311i | 0.3324 + 0.8092i |
| 19.5 | 0.3088 + 0.6585i | 0.3095 + 0.6626i | 0.3087 + 0.6582i | 0.3094 + 0.6623i | 0.3401 + 0.8400i | 0.3354 + 0.8162i | 0.3406 + 0.8427i | 0.3357 + 0.8184i |
| 20 | 0.3129 + 0.5095i | 0.3125 + 0.5114i | 0.3127 + 0.5091i | 0.3123 + 0.5111i | 0.2873 + 0.6626i | 0.2914 + 0.6399i | 0.2864 + 0.6656i | 0.2907 + 0.6423i |
| 20.5 | 0.3059 + 0.5952i | 0.3064 + 0.6016i | 0.3058 + 0.5953i | 0.3063 + 0.6016i | 0.3158 + 0.7752i | 0.3144 + 0.7460i | 0.3158 + 0.7771i | 0.3143 + 0.7472i |
| 21 | 0.2980 + 0.5660i | 0.2985 + 0.5781i | 0.2977 + 0.5661i | 0.2982 + 0.5783i | 0.3059 + 0.7630i | 0.3035 + 0.7167i | 0.3057 + 0.7619i | 0.3032 + 0.7163i |
| 21.5 | 0.2899 + 0.5487i | 0.2888 + 0.5640i | 0.2900 + 0.5488i | 0.2889 + 0.5641i | 0.2841 + 0.7493i | 0.2838 + 0.6960i | 0.2840 + 0.7486i | 0.2837 + 0.6954i |
| 22 | 0.2985 + 0.5443i | 0.2990 + 0.5760i | 0.2988 + 0.5441i | 0.2993 + 0.5756i | 0.3035 + 0.7637i | 0.3022 + 0.7017i | 0.3039 + 0.7644i | 0.3025 + 0.7020i |
| 22.5 | 0.2914 + 0.5479i | 0.2905 + 0.5690i | 0.2946 + 0.5478i | 0.2933 + 0.5687i | 0.2916 + 0.7523i | 0.2897 + 0.6925i | 0.2946 + 0.7487i | 0.2929 + 0.6914i |
| 23 | 0.2886 + 0.5361i | 0.2888 + 0.5750i | 0.2904 + 0.5551i | 0.2906 + 0.5778i | 0.2842 + 0.7776i | 0.2850 + 0.6884i | 0.2860 + 0.7767i | 0.2917 + 0.6899i |
| 23.5 | 0.2930 + 0.5343i | 0.2920 + 0.5790i | 0.2993 + 0.5345i | 0.2986 + 0.5791i | 0.2919 + 0.7703i | 0.2914 + 0.6852i | 0.2982 + 0.7678i | 0.2982 + 0.6845i |
| 24 | 0.2788 + 0.5315i | 0.2779 + 0.5941i | 0.2886 + 0.5314i | 0.2875 + 0.5938i | 0.2824 + 0.8027i | 0.2766 + 0.6945i | 0.2887 + 0.7921i | 0.2849 + 0.6955i |
| 24.5 | 0.2883 + 0.5234i | 0.2856 + 0.5937i | 0.3044 + 0.5238i | 0.3004 + 0.5947i | 0.2707 + 0.7847i | 0.2797 + 0.6898i | 0.2836 + 0.7930i | 0.2941 + 0.6900i |
| 25 | 0.2775 + 0.5141i | 0.2762 + 0.5902i | 0.3082 + 0.5152i | 0.3024 + 0.5920i | 0.2637 + 0.7785i | 0.2724 + 0.6839i | 0.2799 + 0.7900i | 0.2944 + 0.6840i |
| 25.5 | 0.2691 + 0.5602i | 0.2701 + 0.6365i | 0.3232 + 0.5582i | 0.3244 + 0.6346i | 0.2749 + 0.8226i | 0.2718 + 0.7235i | 0.3274 + 0.8149i | 0.3244 + 0.7213i |
| 26 | 0.2972 + 0.5451i | 0.2990 + 0.6252i | 0.3472 + 0.5423i | 0.3491 + 0.6333i | 0.2628 + 0.8162i | 0.2862 + 0.7117i | 0.2961 + 0.8194i | 0.3367 + 0.7232i |
| 26.5 | 0.2596 + 0.5290i | 0.2589 + 0.5985i | 0.3256 + 0.5326i | 0.3154 + 0.6039i | 0.2797 + 0.7660i | 0.2774 + 0.6887i | 0.2816 + 0.8277i | 0.2975 + 0.6671i |
| 27 | 0.2766 + 0.5536i | 0.2777 + 0.6319i | 0.3404 + 0.5532i | 0.3419 + 0.6283i | 0.2818 + 0.8033i | 0.2795 + 0.7152i | 0.3469 + 0.7986i | 0.3449 + 0.7116i |
| 27.5 | 0.2828 + 0.5653i | 0.2811 + 0.6456i | 0.3483 + 0.5665i | 0.3451 + 0.6465i | 0.2821 + 0.8240i | 0.2808 + 0.7321i | 0.3509 + 0.8188i | 0.3469 + 0.7317i |
| 28 | 0.2732 + 0.5668i | 0.2746 + 0.6455i | 0.3392 + 0.5659i | 0.3408 + 0.6410i | 0.2773 + 0.8163i | 0.2760 + 0.7294i | 0.3462 + 0.8141i | 0.3422 + 0.7259i |

-continued

| SNR /w | w192 | w193 | w194 | w195 | w196 | w197 | w198 | w199 |
|---|---|---|---|---|---|---|---|---|
| 7 | 0.4011 + 0.2432i | 0.4222 + 0.2525i | 0.3911 + 0.2271i | 0.4127 + 0.2342i | 0.4222 + 0.2525i | 0.4436 + 0.2619i | 0.4127 + 0.2342i | 0.4350 + 0.2412i |
| 7.5 | 0.3917 + 0.2367i | 0.3856 + 0.2340i | 0.3820 + 0.2185i | 0.3757 + 0.2165i | 0.4236 + 0.2511i | 0.4173 + 0.2484i | 0.4150 + 0.2286i | 0.4083 + 0.2267i |
| 8 | 0.3770 + 0.2099i | 0.3724 + 0.2085i | 0.3786 + 0.2104i | 0.3740 + 0.2090i | 0.3849 + 0.2288i | 0.3805 + 0.2268i | 0.3865 + 0.2295i | 0.3820 + 0.2275i |
| 8.5 | 0.3668 + 0.1990i | 0.3643 + 0.1982i | 0.3665 + 0.1989i | 0.3639 + 0.1981i | 0.3714 + 0.2164i | 0.3689 + 0.2153i | 0.3711 + 0.2162i | 0.3686 + 0.2151i |
| 9 | 0.1828 + 0.3392i | 0.1840 + 0.3434i | 0.1840 + 0.3434i | 0.1852 + 0.3477i | 0.1840 + 0.3434i | 0.1852 + 0.3477i | 0.1852 + 0.3477i | 0.1865 + 0.3521i |
| 9.5 | 0.1714 + 0.3232i | 0.1717 + 0.3242i | 0.1717 + 0.3242i | 0.1720 + 0.3253i | 0.1717 + 0.3242i | 0.1720 + 0.3253i | 0.1720 + 0.3253i | 0.1723 + 0.3263i |
| 10 | 0.1627 + 0.3118i | 0.1626 + 0.3114i | 0.1626 + 0.3114i | 0.1625 + 0.3110i | 0.1626 + 0.3114i | 0.1625 + 0.3110i | 0.1625 + 0.3110i | 0.1624 + 0.3106i |
| 10.5 | 0.1566 + 0.3029i | 0.1561 + 0.3014i | 0.1568 + 0.3020i | 0.1562 + 0.3006i | 0.1565 + 0.3018i | 0.1560 + 0.3002i | 0.1566 + 0.3009i | 0.1561 + 0.2993i |
| 11 | 0.3235 + 0.1537i | 0.3234 + 0.1534i | 0.3234 + 0.1538i | 0.3234 + 0.1535i | 0.3234 + 0.1537i | 0.3234 + 0.1535i | 0.3234 + 0.1538i | 0.3234 + 0.1535i |
| 11.5 | 0.3203 + 0.1485i | 0.3202 + 0.1484i | 0.3203 + 0.1486i | 0.3201 + 0.1484i | 0.3197 + 0.1486i | 0.3196 + 0.1485i | 0.3197 + 0.1487i | 0.3195 + 0.1486i |
| 12 | 0.3266 + 0.1436i | 0.3265 + 0.1437i | 0.3265 + 0.1436i | 0.3263 + 0.1437i | 0.3257 + 0.1438i | 0.3256 + 0.1438i | 0.3255 + 0.1438i | 0.3254 + 0.1438i |
| 12.5 | 0.2503 + 0.1426i | 0.2508 + 0.1426i | 0.2504 + 0.1426i | 0.2509 + 0.1425i | 0.2479 + 0.1423i | 0.2485 + 0.1422i | 0.2480 + 0.1422i | 0.2486 + 0.1421i |
| 13 | 0.1378 + 0.2226i | 0.1377 + 0.2227i | 0.1376 + 0.2226i | 0.1375 + 0.2227i | 0.1380 + 0.2202i | 0.1379 + 0.2203i | 0.1378 + 0.2202i | 0.1378 + 0.2203i |
| 13.5 | 0.2211 + 0.1336i | 0.2211 + 0.1336i | 0.2209 + 0.1334i | 0.2209 + 0.1334i | 0.2210 + 0.1334i | 0.2211 + 0.1334i | 0.2210 + 0.1334i | 0.2209 + 0.1332i |
| 14 | 0.2008 + 0.1322i | 0.2007 + 0.1323i | 0.2006 + 0.1321i | 0.2006 + 0.1321i | 0.2010 + 0.1315i | 0.2009 + 0.1315i | 0.2008 + 0.1313i | 0.2008 + 0.1313i |
| 14.5 | 0.1933 + 0.1307i | 0.1934 + 0.1309i | 0.1928 + 0.1308i | 0.1930 + 0.1309i | 0.1937 + 0.1301i | 0.1939 + 0.1301i | 0.1933 + 0.1300i | 0.1935 + 0.1300i |
| 15 | 0.1209 + 0.1212i | 0.1210 + 0.1213i | 0.1211 + 0.1212i | 0.1211 + 0.1213i | 0.1210 + 0.1202i | 0.1210 + 0.1203i | 0.1212 + 0.1202i | 0.1212 + 0.1203i |
| 15.5 | 0.1171 + 0.1210i | 0.1171 + 0.1210i | 0.1171 + 0.1212i | 0.1171 + 0.1213i | 0.1175 + 0.1210i | 0.1175 + 0.1210i | 0.1175 + 0.1209i | 0.1175 + 0.1211i |
| 16 | 0.1098 + 0.1221i | 0.1098 + 0.1218i | 0.1098 + 0.1221i | 0.1099 + 0.1219i | 0.1099 + 0.1246i | 0.1099 + 0.1244i | 0.1099 + 0.1247i | 0.1099 + 0.1244i |
| 16.5 | 0.1133 + 0.1113i | 0.1133 + 0.1110i | 0.1128 + 0.1113i | 0.1128 + 0.1110i | 0.1132 + 0.1140i | 0.1132 + 0.1137i | 0.1128 + 0.1139i | 0.1128 + 0.1137i |
| 17 | 0.1114 + 0.1096i | 0.1114 + 0.1089i | 0.1107 + 0.1096i | 0.1107 + 0.1088i | 0.1113 + 0.1156i | 0.1113 + 0.1148i | 0.1105 + 0.1155i | 0.1106 + 0.1148i |
| 17.5 | 0.1088 + 0.1069i | 0.1088 + 0.1060i | 0.1078 + 0.1068i | 0.1078 + 0.1058i | 0.1085 + 0.1179i | 0.1085 + 0.1169i | 0.1076 + 0.1177i | 0.1076 + 0.1168i |
| 18 | 0.1035 + 0.1024i | 0.1035 + 0.1014i | 0.1027 + 0.1022i | 0.1028 + 0.1015i | 0.1033 + 0.1213i | 0.1034 + 0.1204i | 0.1026 + 0.1212i | 0.1025 + 0.1204i |
| 18.5 | 0.0924 + 0.0854i | 0.0927 + 0.0854i | 0.0919 + 0.0853i | 0.0920 + 0.0854i | 0.0930 + 0.1782i | 0.0932 + 0.1781i | 0.0924 + 0.1781i | 0.0925 + 0.1780i |
| 19 | 0.0872 + 0.0769i | 0.0873 + 0.0769i | 0.0866 + 0.0769i | 0.0867 + 0.0769i | 0.0878 + 0.2029i | 0.0879 + 0.2029i | 0.0871 + 0.2030i | 0.0872 + 0.2029i |
| 19.5 | 0.0833 + 0.0748i | 0.0833 + 0.0749i | 0.0829 + 0.0748i | 0.0829 + 0.0749i | 0.0835 + 0.2158i | 0.0835 + 0.2159i | 0.0831 + 0.2159i | 0.0831 + 0.2159i |
| 20 | 0.0723 + 0.0768i | 0.0722 + 0.0767i | 0.0722 + 0.0769i | 0.0723 + 0.0766i | 0.0721 + 0.1103i | 0.0721 + 0.1101i | 0.0721 + 0.1103i | 0.0721 + 0.1101i |
| 20.5 | 0.0636 + 0.0660i | 0.0636 + 0.0660i | 0.0636 + 0.0660i | 0.0636 + 0.0661i | 0.0638 + 0.1877i | 0.0637 + 0.1878i | 0.0639 + 0.1877i | 0.0637 + 0.1878i |
| 21 | 0.0606 + 0.0613i | 0.0606 + 0.0613i | 0.0606 + 0.0613i | 0.0606 + 0.0613i | 0.0605 + 0.1754i | 0.0605 + 0.1755i | 0.0605 + 0.1754i | 0.0605 + 0.1755i |
| 21.5 | 0.0624 + 0.0575i | 0.0624 + 0.0575i | 0.0624 + 0.0575i | 0.0624 + 0.0575i | 0.0620 + 0.1650i | 0.0619 + 0.1652i | 0.0619 + 0.1650i | 0.0619 + 0.1652i |
| 22 | 0.0582 + 0.0593i | 0.0583 + 0.0593i | 0.0583 + 0.0593i | 0.0583 + 0.0589i | 0.0584 + 0.1757i | 0.0583 + 0.1760i | 0.0582 + 0.1759i | 0.0582 + 0.1760i |
| 22.5 | 0.0585 + 0.0597i | 0.0588 + 0.0597i | 0.0599 + 0.0592i | 0.0600 + 0.0587i | 0.0601 + 0.1728i | 0.0598 + 0.1745i | 0.0617 + 0.1728i | 0.0628 + 0.1740i |
| 23 | 0.0593 + 0.0508i | 0.0615 + 0.0508i | 0.0577 + 0.0555i | 0.0602 + 0.0560i | 0.0617 + 0.1654i | 0.0617 + 0.1638i | 0.0595 + 0.1630i | 0.0526 + 0.1647i |
| 23.5 | 0.0580 + 0.0576i | 0.0579 + 0.0576i | 0.0579 + 0.0572i | 0.0577 + 0.0553i | 0.0580 + 0.1703i | 0.0581 + 0.1710i | 0.0589 + 0.1708i | 0.0588 + 0.1718i |
| 24 | 0.0562 + 0.0560i | 0.0563 + 0.0560i | 0.0573 + 0.0559i | 0.0574 + 0.0570i | 0.0561 + 0.1720i | 0.0562 + 0.1685i | 0.0571 + 0.1721i | 0.0573 + 0.1687i |
| 24.5 | 0.0546 + 0.0557i | 0.0545 + 0.0558i | 0.0578 + 0.0558i | 0.0577 + 0.0581i | 0.0549 + 0.1741i | 0.0548 + 0.1688i | 0.0582 + 0.1740i | 0.0581 + 0.1688i |
| 25 | 0.0497 + 0.0520i | 0.0497 + 0.0561i | 0.0650 + 0.0521i | 0.0650 + 0.0562i | 0.0500 + 0.1679i | 0.0498 + 0.1590i | 0.0647 + 0.1678i | 0.0646 + 0.1589i |
| 25.5 | 0.0472 + 0.0398i | 0.0463 + 0.0403i | 0.0606 + 0.0403i | 0.0589 + 0.0822i | 0.0479 + 0.2088i | 0.0464 + 0.1618i | 0.0617 + 0.2076i | 0.0602 + 0.1623i |
| 26 | 0.0344 + 0.0341i | 0.0353 + 0.0340i | 0.0901 + 0.0333i | 0.0896 + 0.0834i | 0.0350 + 0.2090i | 0.0359 + 0.1529i | 0.0840 + 0.2107i | 0.0864 + 0.1532i |
| 26.5 | 0.0350 + 0.0336i | 0.0344 + 0.0341i | 0.0994 + 0.0336i | 0.0982 + 0.0745i | 0.0332 + 0.1857i | 0.0337 + 0.1391i | 0.0949 + 0.1879i | 0.0967 + 0.1405i |
| 27 | 0.0312 + 0.0312i | 0.0315 + 0.0312i | 0.0899 + 0.0311i | 0.0893 + 0.0896i | 0.0313 + 0.2132i | 0.0316 + 0.1532i | 0.0877 + 0.2140i | 0.0886 + 0.1536i |
| 27.5 | 0.0321 + 0.0316i | 0.0320 + 0.0316i | 0.0944 + 0.0317i | 0.0944 + 0.0924i | 0.0316 + 0.2186i | 0.0319 + 0.1557i | 0.0930 + 0.2195i | 0.0936 + 0.1565i |
| 28 | 0.0325 + 0.0301i | 0.0319 + 0.0301i | 0.0962 + 0.0306i | 0.0959 + 0.0901i | 0.0317 + 0.2134i | 0.0317 + 0.1511i | 0.0943 + 0.2132i | 0.0949 + 0.1513i |

| SNR/w | w200 | w201 | w202 | w203 | w204 | w205 | w206 | w207 |
|---|---|---|---|---|---|---|---|---|
| 7 | 0.4222 + 0.2525i | 0.4436 + 0.2619i | 0.4127 + 0.2342i | 0.4350 + 0.2412i | 0.4436 + 0.2619i | 0.4648 + 0.2714i | 0.4350 + 0.2412i | 0.4576 + 0.2479i |
| 7.5 | 0.4235 + 0.2511i | 0.4172 + 0.2483i | 0.4149 + 0.2285i | 0.4082 + 0.2266i | 0.4559 + 0.2660i | 0.4498 + 0.2633i | 0.4496 + 0.2383i | 0.4428 + 0.2365i |
| 8 | 0.4267 + 0.2240i | 0.4217 + 0.2227i | 0.4286 + 0.2245i | 0.4236 + 0.2232i | 0.4321 + 0.2505i | 0.4275 + 0.2484i | 0.4340 + 0.2514i | 0.4294 + 0.2493i |
| 8.5 | 0.4931 + 0.2304i | 0.4905 + 0.2299i | 0.4932 + 0.2304i | 0.4907 + 0.2299i | 0.4867 + 0.2713i | 0.4845 + 0.2703i | 0.4869 + 0.2715i | 0.4847 + 0.2704i |
| 9 | 0.1840 + 0.3434i | 0.1852 + 0.3477i | 0.1852 + 0.3476i | 0.1865 + 0.3521i | 0.1852 + 0.3476i | 0.1865 + 0.3520i | 0.1865 + 0.3520i | 0.1877 + 0.3565i |

-continued

| SNR/w | w208 | w209 | w210 | w211 | w212 | w213 | w214 | w215 |
|---|---|---|---|---|---|---|---|---|
| 9.5 | 0.1717 + 0.3242i | 0.1720 + 0.3253i | 0.1720 + 0.3253i | 0.1723 + 0.3263i | 0.1720 + 0.3253i | 0.1723 + 0.3263i | 0.1723 + 0.3263i | 0.1726 + 0.3274i |
| 10 | 0.1626 + 0.3114i | 0.1625 + 0.3110i | 0.1625 + 0.3110i | 0.1624 + 0.3106i | 0.1625 + 0.3106i | 0.1624 + 0.3106i | 0.1624 + 0.3106i | 0.1623 + 0.3102i |
| 10.5 | 0.1564 + 0.3012i | 0.1559 + 0.2998i | 0.1565 + 0.3004i | 0.1560 + 0.2988i | 0.1563 + 0.3003i | 0.1557 + 0.2986i | 0.1564 + 0.2994i | 0.1559 + 0.2977i |
| 11 | 0.3228 + 0.1520i | 0.3228 + 0.1518i | 0.3228 + 0.1521i | 0.3228 + 0.1518i | 0.3228 + 0.1518i | 0.3228 + 0.1522i | 0.3228 + 0.1522i | 0.3228 + 0.1519i |
| 11.5 | 0.3188 + 0.1473i | 0.3187 + 0.1472i | 0.3188 + 0.1474i | 0.3187 + 0.1473i | 0.3182 + 0.1474i | 0.3181 + 0.1473i | 0.3182 + 0.1475i | 0.3180 + 0.1474i |
| 12 | 0.3247 + 0.1430i | 0.3246 + 0.1430i | 0.3246 + 0.1430i | 0.3244 + 0.1430i | 0.3238 + 0.1431i | 0.3236 + 0.1431i | 0.3236 + 0.1431i | 0.3235 + 0.1432i |
| 12.5 | 0.2477 + 0.1427i | 0.2482 + 0.1427i | 0.2479 + 0.1426i | 0.2485 + 0.1426i | 0.2454 + 0.1423i | 0.2459 + 0.1423i | 0.2455 + 0.1422i | 0.2462 + 0.1422i |
| 13 | 0.1374 + 0.2220i | 0.1374 + 0.2220i | 0.1372 + 0.2220i | 0.1372 + 0.2221i | 0.1376 + 0.2196i | 0.1376 + 0.2197i | 0.1374 + 0.2197i | 0.1374 + 0.2197i |
| 13.5 | 0.2200 + 0.1339i | 0.2199 + 0.1339i | 0.2199 + 0.1337i | 0.2199 + 0.1336i | 0.2200 + 0.1337i | 0.2200 + 0.1337i | 0.2199 + 0.1335i | 0.2199 + 0.1335i |
| 14 | 0.2050 + 0.1322i | 0.2050 + 0.1322i | 0.2049 + 0.1320i | 0.2048 + 0.1321i | 0.2052 + 0.1314i | 0.2052 + 0.1314i | 0.2051 + 0.1312i | 0.2050 + 0.1312i |
| 14.5 | 0.2019 + 0.1310i | 0.2020 + 0.1310i | 0.2014 + 0.1309i | 0.2012 + 0.1310i | 0.2026 + 0.1301i | 0.2024 + 0.1301i | 0.2022 + 0.1301i | 0.2022 + 0.1301i |
| 15 | 0.1200 + 0.1211i | 0.1200 + 0.1211i | 0.1202 + 0.1211i | 0.1202 + 0.1212i | 0.1201 + 0.1201i | 0.1201 + 0.1201i | 0.1202 + 0.1201i | 0.1203 + 0.1202i |
| 15.5 | 0.1172 + 0.1207i | 0.1173 + 0.1208i | 0.1172 + 0.1208i | 0.1172 + 0.1210i | 0.1176 + 0.1205i | 0.1176 + 0.1206i | 0.1175 + 0.1206i | 0.1175 + 0.1207i |
| 16 | 0.1098 + 0.1217i | 0.1098 + 0.1215i | 0.1099 + 0.1218i | 0.1099 + 0.1215i | 0.1099 + 0.1243i | 0.1099 + 0.1241i | 0.1099 + 0.1243i | 0.1099 + 0.1241i |
| 16.5 | 0.1164 + 0.1114i | 0.1163 + 0.1111i | 0.1160 + 0.1114i | 0.1160 + 0.1110i | 0.1164 + 0.1140i | 0.1163 + 0.1137i | 0.1159 + 0.1140i | 0.1160 + 0.1137i |
| 17 | 0.1179 + 0.1097i | 0.1180 + 0.1090i | 0.1172 + 0.1097i | 0.1172 + 0.1089i | 0.1178 + 0.1157i | 0.1178 + 0.1150i | 0.1171 + 0.1156i | 0.1171 + 0.1149i |
| 17.5 | 0.1206 + 0.1071i | 0.1206 + 0.1062i | 0.1196 + 0.1070i | 0.1196 + 0.1060i | 0.1203 + 0.1181i | 0.1203 + 0.1171i | 0.1193 + 0.1180i | 0.1193 + 0.1170i |
| 18 | 0.1239 + 0.1024i | 0.1240 + 0.1015i | 0.1233 + 0.1022i | 0.1233 + 0.1014i | 0.1237 + 0.1213i | 0.1237 + 0.1205i | 0.1231 + 0.1213i | 0.1230 + 0.1205i |
| 18.5 | 0.1002 + 0.0855i | 0.1003 + 0.0854i | 0.0996 + 0.0854i | 0.0997 + 0.0854i | 0.1016 + 0.1779i | 0.1018 + 0.1780i | 0.1010 + 0.1780i | 0.1010 + 0.1779i |
| 19 | 0.0976 + 0.0770i | 0.0977 + 0.0770i | 0.0970 + 0.0770i | 0.0970 + 0.0770i | 0.1004 + 0.2026i | 0.1004 + 0.2026i | 0.0997 + 0.2026i | 0.0998 + 0.2027i |
| 19.5 | 0.0980 + 0.0748i | 0.0980 + 0.0748i | 0.0976 + 0.0748i | 0.0975 + 0.0749i | 0.1024 + 0.2155i | 0.1024 + 0.2155i | 0.1019 + 0.2155i | 0.1019 + 0.2155i |
| 20 | 0.2103 + 0.0757i | 0.2103 + 0.0756i | 0.2104 + 0.0757i | 0.2104 + 0.0756i | 0.2094 + 0.1153i | 0.2094 + 0.1156i | 0.2094 + 0.1153i | 0.2094 + 0.1155i |
| 20.5 | 0.1593 + 0.0656i | 0.1593 + 0.0657i | 0.1593 + 0.0657i | 0.1592 + 0.0658i | 0.1613 + 0.1874i | 0.1613 + 0.1875i | 0.1613 + 0.1873i | 0.1613 + 0.1873i |
| 21 | 0.1707 + 0.0613i | 0.1707 + 0.0613i | 0.1708 + 0.0613i | 0.1708 + 0.0613i | 0.1705 + 0.1750i | 0.1705 + 0.1750i | 0.1706 + 0.1750i | 0.1706 + 0.1751i |
| 21.5 | 0.1849 + 0.0578i | 0.1849 + 0.0579i | 0.1850 + 0.0578i | 0.1850 + 0.0578i | 0.1832 + 0.1666i | 0.1832 + 0.1668i | 0.1832 + 0.1666i | 0.1832 + 0.1668i |
| 22 | 0.1739 + 0.0588i | 0.1739 + 0.0587i | 0.1740 + 0.0587i | 0.1740 + 0.0587i | 0.1737 + 0.1750i | 0.1738 + 0.1750i | 0.1739 + 0.1749i | 0.1741 + 0.1749i |
| 22.5 | 0.1798 + 0.0575i | 0.1808 + 0.0574i | 0.1788 + 0.0574i | 0.1798 + 0.0563i | 0.1802 + 0.1731i | 0.1806 + 0.1741i | 0.1789 + 0.1732i | 0.1789 + 0.1743i |
| 23 | 0.1763 + 0.0560i | 0.1727 + 0.0580i | 0.1778 + 0.0580i | 0.1745 + 0.0571i | 0.1733 + 0.1675i | 0.1735 + 0.1675i | 0.1752 + 0.1675i | 0.1765 + 0.1626i |
| 23.5 | 0.1757 + 0.0570i | 0.1760 + 0.0562i | 0.1741 + 0.0572i | 0.1746 + 0.0562i | 0.1766 + 0.1710i | 0.1767 + 0.1708i | 0.1745 + 0.1711i | 0.1745 + 0.1706i |
| 24 | 0.1728 + 0.0561i | 0.1728 + 0.0570i | 0.1694 + 0.0560i | 0.1693 + 0.0570i | 0.1726 + 0.1723i | 0.1726 + 0.1724i | 0.1692 + 0.1724i | 0.1692 + 0.1691i |
| 24.5 | 0.1728 + 0.0555i | 0.1729 + 0.0556i | 0.1656 + 0.0556i | 0.1656 + 0.0556i | 0.1741 + 0.1737i | 0.1740 + 0.1737i | 0.1667 + 0.1737i | 0.1666 + 0.1683i |
| 25 | 0.1877 + 0.0515i | 0.1879 + 0.0516i | 0.1620 + 0.0516i | 0.1621 + 0.0559i | 0.1868 + 0.1673i | 0.1870 + 0.1673i | 0.1622 + 0.1673i | 0.1621 + 0.1579i |
| 25.5 | 0.1715 + 0.0412i | 0.1727 + 0.0410i | 0.1516 + 0.0410i | 0.1518 + 0.0833i | 0.1745 + 0.2087i | 0.1743 + 0.2079i | 0.1532 + 0.2079i | 0.1527 + 0.1612i |
| 26 | 0.2200 + 0.0335i | 0.2157 + 0.0862i | 0.1605 + 0.0862i | 0.1594 + 0.0842i | 0.2057 + 0.2111i | 0.2090 + 0.2109i | 0.1533 + 0.2109i | 0.1556 + 0.1545i |
| 26.5 | 0.2312 + 0.0326i | 0.2301 + 0.0822i | 0.1675 + 0.0822i | 0.1669 + 0.0781i | 0.2213 + 0.2007i | 0.2267 + 0.1480i | 0.1613 + 0.1940i | 0.1643 + 0.1434i |
| 27 | 0.2133 + 0.0321i | 0.2124 + 0.0917i | 0.1539 + 0.0917i | 0.1528 + 0.0907i | 0.2111 + 0.2173i | 0.2112 + 0.1563i | 0.1511 + 0.2158i | 0.1520 + 0.1548i |
| 27.5 | 0.2220 + 0.0325i | 0.2205 + 0.0962i | 0.1593 + 0.0962i | 0.1585 + 0.0936i | 0.2186 + 0.2223i | 0.2194 + 0.1603i | 0.1562 + 0.2208i | 0.1568 + 0.1579i |
| 28 | 0.2272 + 0.0295i | 0.2268 + 0.0890i | 0.1609 + 0.0890i | 0.1613 + 0.0901i | 0.2228 + 0.2150i | 0.2255 + 0.1519i | 0.1587 + 0.2135i | 0.1605 + 0.1517i |

| SNR/w | w208 | w209 | w210 | w211 | w212 | w213 | w214 | w215 |
|---|---|---|---|---|---|---|---|---|
| 7 | 0.4222 + 0.2525i | 0.4435 + 0.2619i | 0.4127 + 0.2619i | 0.4349 + 0.2412i | 0.4435 + 0.2619i | 0.4648 + 0.2713i | 0.4349 + 0.2412i | 0.4575 + 0.2479i |
| 7.5 | 0.4239 + 0.2513i | 0.4176 + 0.2485i | 0.4153 + 0.2268i | 0.4086 + 0.2268i | 0.4563 + 0.2662i | 0.4502 + 0.2635i | 0.4500 + 0.2384i | 0.4432 + 0.2367i |
| 8 | 0.4267 + 0.2240i | 0.4217 + 0.2227i | 0.4286 + 0.2245i | 0.4236 + 0.2232i | 0.4321 + 0.2305i | 0.4276 + 0.2484i | 0.4340 + 0.2514i | 0.4294 + 0.2493i |
| 8.5 | 0.3933 + 0.2064i | 0.3905 + 0.2057i | 0.3930 + 0.2064i | 0.3902 + 0.2056i | 0.3967 + 0.2278i | 0.3941 + 0.2267i | 0.3965 + 0.2277i | 0.3939 + 0.2266i |
| 9 | 0.2312 + 0.5566i | 0.2323 + 0.5636i | 0.2323 + 0.5636i | 0.2334 + 0.5707i | 0.2323 + 0.5636i | 0.2334 + 0.5707i | 0.2334 + 0.5707i | 0.2344 + 0.5780i |
| 9.5 | 0.2250 + 0.5925i | 0.2255 + 0.5968i | 0.2255 + 0.5968i | 0.2261 + 0.6012i | 0.2255 + 0.5968i | 0.2261 + 0.6012i | 0.2261 + 0.6012i | 0.2267 + 0.6058i |
| 10 | 0.2165 + 0.6197i | 0.2168 + 0.6227i | 0.2168 + 0.6227i | 0.2172 + 0.6258i | 0.2168 + 0.6227i | 0.2172 + 0.6258i | 0.2172 + 0.6258i | 0.2175 + 0.6291i |
| 10.5 | 0.2060 + 0.6393i | 0.2063 + 0.6419i | 0.2071 + 0.6405i | 0.2074 + 0.6432i | 0.2064 + 0.6412i | 0.2066 + 0.6438i | 0.2076 + 0.6423i | 0.2078 + 0.6453i |
| 11 | 0.3113 + 0.1772i | 0.3111 + 0.1769i | 0.3113 + 0.1773i | 0.3111 + 0.1770i | 0.3112 + 0.1770i | 0.3110 + 0.1769i | 0.3112 + 0.1774i | 0.3110 + 0.1771i |
| 11.5 | 0.3070 + 0.1749i | 0.3068 + 0.1747i | 0.3070 + 0.1750i | 0.3068 + 0.1748i | 0.3064 + 0.1748i | 0.3062 + 0.1748i | 0.3064 + 0.1751i | 0.3062 + 0.1749i |
| 12 | 0.3102 + 0.1741i | 0.3101 + 0.1741i | 0.3101 + 0.1741i | 0.3100 + 0.1741i | 0.3095 + 0.1742i | 0.3093 + 0.1742i | 0.3094 + 0.1741i | 0.3092 + 0.1742i |
| 12.5 | 0.2470 + 0.1670i | 0.2475 + 0.1670i | 0.2471 + 0.1669i | 0.2475 + 0.1669i | 0.2448 + 0.1669i | 0.2453 + 0.1661i | 0.2448 + 0.1659i | 0.2453 + 0.1660i |

-continued

| SNR/w | w216 | w217 | w218 | w219 | w220 | w221 | w222 | w223 |
|---|---|---|---|---|---|---|---|---|
| 13 | 0.1493 + 0.5930i | 0.1495 + 0.5928i | 0.1491 + 0.5932i | 0.1492 + 0.5930i | 0.1519 + 0.5877i | 0.1520 + 0.5875i | 0.1516 + 0.5879i | 0.1517 + 0.5877i |
| 13.5 | 0.2168 + 0.1598i | 0.2169 + 0.1597i | 0.2167 + 0.1595i | 0.2167 + 0.1594i | 0.2166 + 0.1595i | 0.2166 + 0.1594i | 0.2164 + 0.1591i | 0.2164 + 0.1591i |
| 14 | 0.2020 + 0.1619i | 0.2020 + 0.1619i | 0.2018 + 0.1616i | 0.2018 + 0.1616i | 0.2018 + 0.1608i | 0.2018 + 0.1608i | 0.2016 + 0.1605i | 0.2016 + 0.1605i |
| 14.5 | 0.1918 + 0.1658i | 0.1920 + 0.1658i | 0.1914 + 0.1655i | 0.1915 + 0.1656i | 0.1918 + 0.1647i | 0.1920 + 0.1648i | 0.1914 + 0.1645i | 0.1916 + 0.1646i |
| 15 | 0.1271 + 0.3555i | 0.1274 + 0.3560i | 0.1271 + 0.3555i | 0.1274 + 0.3560i | 0.1261 + 0.3516i | 0.1264 + 0.3521i | 0.1262 + 0.3516i | 0.1264 + 0.3521i |
| 15.5 | 0.1244 + 0.3630i | 0.1245 + 0.3635i | 0.1242 + 0.3632i | 0.1243 + 0.3636i | 0.1237 + 0.3583i | 0.1239 + 0.3588i | 0.1236 + 0.3584i | 0.1238 + 0.3589i |
| 16 | 0.1139 + 0.3858i | 0.1142 + 0.3858i | 0.1137 + 0.3859i | 0.1140 + 0.3859i | 0.1133 + 0.3658i | 0.1136 + 0.3670i | 0.1132 + 0.3658i | 0.1135 + 0.3671i |
| 16.5 | 0.1120 + 0.3565i | 0.1119 + 0.3607i | 0.1116 + 0.3568i | 0.1115 + 0.3605i | 0.1122 + 0.3334i | 0.1121 + 0.3367i | 0.1118 + 0.3337i | 0.1117 + 0.3368i |
| 17 | 0.1101 + 0.3598i | 0.1100 + 0.3640i | 0.1093 + 0.3601i | 0.1093 + 0.3643i | 0.1103 + 0.3308i | 0.1103 + 0.3343i | 0.1095 + 0.3311i | 0.1095 + 0.3346i |
| 17.5 | 0.1071 + 0.3645i | 0.1071 + 0.3687i | 0.1062 + 0.3649i | 0.1062 + 0.3691i | 0.1074 + 0.3263i | 0.1074 + 0.3292i | 0.1064 + 0.3266i | 0.1064 + 0.3295i |
| 18 | 0.1022 + 0.3704i | 0.1023 + 0.3736i | 0.1017 + 0.3706i | 0.1016 + 0.3737i | 0.1025 + 0.3188i | 0.1025 + 0.3204i | 0.1018 + 0.3188i | 0.1018 + 0.3205i |
| 18.5 | 0.0951 + 0.4748i | 0.0953 + 0.4751i | 0.0945 + 0.4750i | 0.0946 + 0.4753i | 0.0939 + 0.3489i | 0.0940 + 0.3487i | 0.0932 + 0.3489i | 0.0933 + 0.3488i |
| 19 | 0.0882 + 0.5037i | 0.0883 + 0.5037i | 0.0877 + 0.5038i | 0.0878 + 0.5038i | 0.0885 + 0.3593i | 0.0886 + 0.3592i | 0.0879 + 0.3594i | 0.0880 + 0.3592i |
| 19.5 | 0.0798 + 0.5210i | 0.0798 + 0.5211i | 0.0796 + 0.5211i | 0.0797 + 0.5207i | 0.0827 + 0.3687i | 0.0827 + 0.3686i | 0.0824 + 0.3688i | 0.0824 + 0.3687i |
| 20 | 0.0700 + 0.3240i | 0.0701 + 0.3249i | 0.0701 + 0.3239i | 0.0700 + 0.3248i | 0.0714 + 0.2589i | 0.0714 + 0.2590i | 0.0714 + 0.2588i | 0.0714 + 0.2591i |
| 20.5 | 0.0632 + 0.4555i | 0.0631 + 0.4548i | 0.0631 + 0.4554i | 0.0632 + 0.4547i | 0.0635 + 0.3221i | 0.0635 + 0.3220i | 0.0634 + 0.3221i | 0.0635 + 0.3221i |
| 21 | 0.0606 + 0.4328i | 0.0606 + 0.4308i | 0.0607 + 0.4328i | 0.0606 + 0.4308i | 0.0605 + 0.3029i | 0.0605 + 0.3028i | 0.0605 + 0.3029i | 0.0605 + 0.3028i |
| 21.5 | 0.0595 + 0.4102i | 0.0596 + 0.4065i | 0.0595 + 0.4101i | 0.0596 + 0.4064i | 0.0610 + 0.2851i | 0.0609 + 0.2852i | 0.0610 + 0.2851i | 0.0609 + 0.2852i |
| 22 | 0.0590 + 0.4306i | 0.0589 + 0.4262i | 0.0586 + 0.4310i | 0.0584 + 0.4265i | 0.0592 + 0.2996i | 0.0591 + 0.3001i | 0.0585 + 0.2994i | 0.0584 + 0.2999i |
| 22.5 | 0.0572 + 0.4222i | 0.0575 + 0.4168i | 0.0573 + 0.4213i | 0.0574 + 0.4181i | 0.0577 + 0.2928i | 0.0589 + 0.2918i | 0.0594 + 0.2935i | 0.0605 + 0.2918i |
| 23 | 0.0568 + 0.4093i | 0.0551 + 0.4031i | 0.0580 + 0.4115i | 0.0509 + 0.4023i | 0.0648 + 0.2789i | 0.0577 + 0.2819i | 0.0598 + 0.2788i | 0.0521 + 0.2840i |
| 23.5 | 0.0583 + 0.4202i | 0.0588 + 0.4056i | 0.0582 + 0.4220i | 0.0586 + 0.4060i | 0.0582 + 0.2873i | 0.0582 + 0.2875i | 0.0592 + 0.2874i | 0.0588 + 0.2913i |
| 24 | 0.0552 + 0.4320i | 0.0553 + 0.3996i | 0.0561 + 0.4321i | 0.0563 + 0.3997i | 0.0558 + 0.2826i | 0.0558 + 0.2824i | 0.0569 + 0.2824i | 0.0569 + 0.2940i |
| 24.5 | 0.0566 + 0.4292i | 0.0563 + 0.3964i | 0.0601 + 0.4291i | 0.0598 + 0.3962i | 0.0554 + 0.2816i | 0.0554 + 0.2816i | 0.0589 + 0.2816i | 0.0589 + 0.2955i |
| 25 | 0.0517 + 0.4253i | 0.0513 + 0.3805i | 0.0633 + 0.4254i | 0.0636 + 0.3805i | 0.0504 + 0.2667i | 0.0503 + 0.2667i | 0.0643 + 0.2665i | 0.0640 + 0.2883i |
| 25.5 | 0.0466 + 0.4869i | 0.0440 + 0.4196i | 0.0662 + 0.4850i | 0.0621 + 0.4191i | 0.0480 + 0.2858i | 0.0460 + 0.3408i | 0.0637 + 0.2864i | 0.0637 + 0.3406i |
| 26 | 0.0351 + 0.4808i | 0.0342 + 0.4146i | 0.0899 + 0.4781i | 0.0857 + 0.4137i | 0.0349 + 0.2807i | 0.0346 + 0.3432i | 0.0827 + 0.2816i | 0.0843 + 0.3431i |
| 26.5 | 0.0318 + 0.4522i | 0.0321 + 0.3789i | 0.0739 + 0.4533i | 0.0796 + 0.3824i | 0.0325 + 0.2516i | 0.0330 + 0.3088i | 0.0908 + 0.2538i | 0.0850 + 0.3119i |
| 27 | 0.0308 + 0.4850i | 0.0311 + 0.4144i | 0.0873 + 0.4850i | 0.0875 + 0.4142i | 0.0307 + 0.2794i | 0.0310 + 0.3456i | 0.0863 + 0.2798i | 0.0866 + 0.3448i |
| 27.5 | 0.0311 + 0.4893i | 0.0313 + 0.4189i | 0.0920 + 0.4897i | 0.0921 + 0.4194i | 0.0314 + 0.2837i | 0.0311 + 0.3499i | 0.0926 + 0.2848i | 0.0919 + 0.3507i |
| 28 | 0.0302 + 0.4887i | 0.0304 + 0.4150i | 0.0892 + 0.4889i | 0.0900 + 0.4155i | 0.0313 + 0.2777i | 0.0307 + 0.3444i | 0.0933 + 0.2782i | 0.0916 + 0.3449i |

| SNR/w | w216 | w217 | w218 | w219 | w220 | w221 | w222 | w223 |
|---|---|---|---|---|---|---|---|---|
| 7 | 0.4435 + 0.2619i | 0.4648 + 0.2713i | 0.4349 + 0.2412i | 0.4575 + 0.2479i | 0.4648 + 0.2713i | 0.4855 + 0.2806i | 0.4575 + 0.2479i | 0.4800 + 0.2544i |
| 7.5 | 0.4562 + 0.2619i | 0.4500 + 0.2634i | 0.4499 + 0.2384i | 0.4431 + 0.2366i | 0.4879 + 0.2810i | 0.4822 + 0.2785i | 0.4849 + 0.2474i | 0.4784 + 0.2459i |
| 8 | 0.4793 + 0.2370i | 0.4744 + 0.2359i | 0.4815 + 0.2376i | 0.4767 + 0.2365i | 0.4796 + 0.2735i | 0.4755 + 0.2713i | 0.4818 + 0.2744i | 0.4776 + 0.2724i |
| 8.5 | 0.5224 + 0.2361i | 0.5201 + 0.2357i | 0.5228 + 0.2362i | 0.5204 + 0.2358i | 0.5120 + 0.2846i | 0.5101 + 0.2836i | 0.5124 + 0.2849i | 0.5105 + 0.2839i |
| 9 | 0.2323 + 0.5636i | 0.2334 + 0.5707i | 0.2334 + 0.5706i | 0.2344 + 0.5780i | 0.2334 + 0.5706i | 0.2344 + 0.5780i | 0.2344 + 0.5779i | 0.2355 + 0.5854i |
| 9.5 | 0.2255 + 0.5968i | 0.2261 + 0.6012i | 0.2261 + 0.6012i | 0.2267 + 0.6058i | 0.2261 + 0.6012i | 0.2267 + 0.6058i | 0.2267 + 0.6058i | 0.2273 + 0.6106i |
| 10 | 0.2168 + 0.6227i | 0.2172 + 0.6258i | 0.2172 + 0.6258i | 0.2175 + 0.6291i | 0.2172 + 0.6258i | 0.2175 + 0.6291i | 0.2175 + 0.6291i | 0.2179 + 0.6325i |
| 10.5 | 0.2064 + 0.6413i | 0.2067 + 0.6440i | 0.2075 + 0.6427i | 0.2078 + 0.6454i | 0.2068 + 0.6431i | 0.2070 + 0.6461i | 0.2078 + 0.6446i | 0.2080 + 0.6479i |
| 11 | 0.3103 + 0.1749i | 0.3101 + 0.1746i | 0.3103 + 0.1751i | 0.3102 + 0.1747i | 0.3102 + 0.1750i | 0.3101 + 0.1747i | 0.3103 + 0.1751i | 0.3101 + 0.1748i |
| 11.5 | 0.3054 + 0.1728i | 0.3052 + 0.1729i | 0.3054 + 0.1732i | 0.3052 + 0.1730i | 0.3049 + 0.1731i | 0.3049 + 0.1730i | 0.3049 + 0.1732i | 0.3047 + 0.1731i |
| 12 | 0.3085 + 0.1728i | 0.3084 + 0.1728i | 0.3084 + 0.1728i | 0.3082 + 0.1728i | 0.3077 + 0.1728i | 0.3076 + 0.1729i | 0.3076 + 0.1728i | 0.3075 + 0.1729i |
| 12.5 | 0.2449 + 0.1666i | 0.2453 + 0.1667i | 0.2450 + 0.1665i | 0.2455 + 0.1666i | 0.2426 + 0.1657i | 0.2431 + 0.1657i | 0.2427 + 0.1656i | 0.2432 + 0.1656i |
| 13 | 0.1482 + 0.5930i | 0.1483 + 0.5927i | 0.1479 + 0.5932i | 0.1481 + 0.5929i | 0.1507 + 0.5877i | 0.1508 + 0.5874i | 0.1504 + 0.5879i | 0.1505 + 0.5876i |
| 13.5 | 0.2160 + 0.1601i | 0.2160 + 0.1600i | 0.2159 + 0.1597i | 0.2159 + 0.1597i | 0.2159 + 0.1597i | 0.2158 + 0.1597i | 0.2157 + 0.1594i | 0.2157 + 0.1593i |
| 14 | 0.2058 + 0.1626i | 0.2057 + 0.1626i | 0.2056 + 0.1623i | 0.2055 + 0.1623i | 0.2056 + 0.1614i | 0.2055 + 0.1615i | 0.2053 + 0.1611i | 0.2053 + 0.1612i |
| 14.5 | 0.1995 + 0.1675i | 0.1997 + 0.1676i | 0.1991 + 0.1673i | 0.1992 + 0.1673i | 0.1995 + 0.1664i | 0.1997 + 0.1664i | 0.1991 + 0.1661i | 0.1993 + 0.1662i |
| 15 | 0.1263 + 0.3550i | 0.1266 + 0.3555i | 0.1263 + 0.3550i | 0.1266 + 0.3555i | 0.1254 + 0.3511i | 0.1256 + 0.3516i | 0.1254 + 0.3511i | 0.1257 + 0.3516i |
| 15.5 | 0.1255 + 0.3637i | 0.1257 + 0.3642i | 0.1254 + 0.3638i | 0.1255 + 0.3643i | 0.1249 + 0.3590i | 0.1251 + 0.3594i | 0.1248 + 0.3591i | 0.1249 + 0.3596i |
| 16 | 0.1149 + 0.3862i | 0.1152 + 0.3875i | 0.1147 + 0.3863i | 0.1151 + 0.3876i | 0.1142 + 0.3661i | 0.1145 + 0.3673i | 0.1141 + 0.3662i | 0.1144 + 0.3674i |

-continued

| SNR/w | | | | | | | |
|---|---|---|---|---|---|---|---|
| 16.5 | 0.1148 + 0.3565i | 0.1148 + 0.3600i | 0.1145 + 0.3567i | 0.1144 + 0.3602i | 0.1151 + 0.3334i | 0.1150 + 0.3366i | 0.1147 + 0.3336i | 0.1147 + 0.3368i |
| 17 | 0.1163 + 0.3597i | 0.1163 + 0.3639i | 0.1156 + 0.3600i | 0.1155 + 0.3642i | 0.1166 + 0.3308i | 0.1166 + 0.3342i | 0.1158 + 0.3311i | 0.1158 + 0.3345i |
| 17.5 | 0.1185 + 0.3644i | 0.1185 + 0.3686i | 0.1176 + 0.3649i | 0.1176 + 0.3690i | 0.1189 + 0.3264i | 0.1189 + 0.3293i | 0.1179 + 0.3267i | 0.1179 + 0.3296i |
| 18 | 0.1220 + 0.3704i | 0.1219 + 0.3737i | 0.1213 + 0.3706i | 0.1213 + 0.3739i | 0.1225 + 0.3189i | 0.1226 + 0.3206i | 0.1218 + 0.3191i | 0.1218 + 0.3208i |
| 18.5 | 0.1120 + 0.4743i | 0.1121 + 0.4747i | 0.1114 + 0.4745i | 0.1115 + 0.4747i | 0.1057 + 0.3488i | 0.1058 + 0.3487i | 0.1051 + 0.3488i | 0.1052 + 0.3487i |
| 19 | 0.1197 + 0.5019i | 0.1198 + 0.5020i | 0.1192 + 0.5020i | 0.1193 + 0.5021i | 0.1078 + 0.3588i | 0.1079 + 0.3587i | 0.1072 + 0.3589i | 0.1072 + 0.3587i |
| 19.5 | 0.1299 + 0.5177i | 0.1299 + 0.5177i | 0.1297 + 0.5177i | 0.1297 + 0.5174i | 0.1128 + 0.3677i | 0.1128 + 0.3676i | 0.1125 + 0.3678i | 0.1125 + 0.3677i |
| 20 | 0.1950 + 0.3350i | 0.1949 + 0.3358i | 0.1951 + 0.3350i | 0.1950 + 0.3358i | 0.2030 + 0.2636i | 0.2030 + 0.2637i | 0.2030 + 0.2637i | 0.2031 + 0.2637i |
| 20.5 | 0.1681 + 0.4548i | 0.1681 + 0.4542i | 0.1682 + 0.4547i | 0.1681 + 0.4540i | 0.1645 + 0.3218i | 0.1644 + 0.3217i | 0.1644 + 0.3218i | 0.1644 + 0.3217i |
| 21 | 0.1707 + 0.4313i | 0.1706 + 0.4294i | 0.1708 + 0.4313i | 0.1707 + 0.4293i | 0.1702 + 0.3021i | 0.1702 + 0.3020i | 0.1703 + 0.3021i | 0.1703 + 0.3020i |
| 21.5 | 0.1739 + 0.4126i | 0.1743 + 0.4093i | 0.1740 + 0.4126i | 0.1744 + 0.4092i | 0.1794 + 0.2874i | 0.1794 + 0.2874i | 0.1795 + 0.2874i | 0.1795 + 0.2874i |
| 22 | 0.1747 + 0.4293i | 0.1747 + 0.4245i | 0.1751 + 0.4295i | 0.1751 + 0.4248i | 0.1735 + 0.2980i | 0.1737 + 0.2985i | 0.1739 + 0.2977i | 0.1741 + 0.2982i |
| 22.5 | 0.1743 + 0.4210i | 0.1747 + 0.4171i | 0.1741 + 0.4202i | 0.1747 + 0.4188i | 0.1787 + 0.2934i | 0.1781 + 0.2923i | 0.1768 + 0.2941i | 0.1771 + 0.2931i |
| 23 | 0.1682 + 0.4147i | 0.1726 + 0.4047i | 0.1736 + 0.4144i | 0.1710 + 0.4071i | 0.1706 + 0.2821i | 0.1744 + 0.2911i | 0.1736 + 0.2853i | 0.1776 + 0.2863i |
| 23.5 | 0.1763 + 0.4224i | 0.1766 + 0.4068i | 0.1747 + 0.4225i | 0.1754 + 0.4067i | 0.1772 + 0.2879i | 0.1772 + 0.2918i | 0.1755 + 0.2877i | 0.1748 + 0.2921i |
| 24 | 0.1699 + 0.4314i | 0.1705 + 0.4002i | 0.1669 + 0.4317i | 0.1674 + 0.4004i | 0.1719 + 0.2832i | 0.1717 + 0.2944i | 0.1686 + 0.2831i | 0.1685 + 0.2943i |
| 24.5 | 0.1798 + 0.4291i | 0.1790 + 0.3946i | 0.1723 + 0.4292i | 0.1713 + 0.3949i | 0.1762 + 0.2805i | 0.1767 + 0.2950i | 0.1685 + 0.2807i | 0.1689 + 0.2951i |
| 25 | 0.1829 + 0.4260i | 0.1836 + 0.3794i | 0.1638 + 0.4261i | 0.1632 + 0.3797i | 0.1852 + 0.2652i | 0.1851 + 0.2880i | 0.1620 + 0.2653i | 0.1622 + 0.2879i |
| 25.5 | 0.1841 + 0.4843i | 0.1829 + 0.4186i | 0.1522 + 0.4849i | 0.1542 + 0.4185i | 0.1779 + 0.2862i | 0.1807 + 0.3418i | 0.1534 + 0.2865i | 0.1548 + 0.3424i |
| 26 | 0.2196 + 0.4716i | 0.2157 + 0.4087i | 0.1610 + 0.4748i | 0.1570 + 0.4196i | 0.2054 + 0.2809i | 0.2094 + 0.3380i | 0.1524 + 0.2824i | 0.1543 + 0.3418i |
| 26.5 | 0.1932 + 0.4577i | 0.1997 + 0.3933i | 0.1389 + 0.4551i | 0.1435 + 0.3873i | 0.2147 + 0.2666i | 0.2083 + 0.3257i | 0.1555 + 0.2607i | 0.1493 + 0.3184i |
| 27 | 0.2118 + 0.4809i | 0.2110 + 0.4119i | 0.1507 + 0.4836i | 0.1502 + 0.4134i | 0.2109 + 0.2819i | 0.2107 + 0.3441i | 0.1498 + 0.2809i | 0.1497 + 0.3442i |
| 27.5 | 0.2186 + 0.4902i | 0.2189 + 0.4202i | 0.1557 + 0.4902i | 0.1557 + 0.4197i | 0.2185 + 0.2872i | 0.2190 + 0.3526i | 0.1559 + 0.2865i | 0.1554 + 0.3519i |
| 28 | 0.2101 + 0.4919i | 0.2114 + 0.4198i | 0.1496 + 0.4906i | 0.1510 + 0.4173i | 0.2183 + 0.2814i | 0.2142 + 0.3497i | 0.1566 + 0.2788i | 0.1537 + 0.3467i |

| SNR/w | w224 | w225 | w226 | w227 | w228 | w229 | w230 | w231 |
|---|---|---|---|---|---|---|---|---|
| 7 | 0.4221 + 0.2525i | 0.4435 + 0.2619i | 0.4127 + 0.2619i | 0.4349 + 0.2412i | 0.4435 + 0.2619i | 0.4647 + 0.2713i | 0.4349 + 0.2412i | 0.4575 + 0.2479i |
| 7.5 | 0.4240 + 0.2512i | 0.4177 + 0.2485i | 0.4154 + 0.2485i | 0.4088 + 0.2267i | 0.4564 + 0.2661i | 0.4503 + 0.2634i | 0.4502 + 0.2383i | 0.4434 + 0.2366i |
| 8 | 0.4266 + 0.2240i | 0.4216 + 0.2227i | 0.4285 + 0.2245i | 0.4235 + 0.2232i | 0.4320 + 0.2504i | 0.4275 + 0.2483i | 0.4339 + 0.2514i | 0.4293 + 0.2492i |
| 8.5 | 0.3934 + 0.2065i | 0.3906 + 0.2057i | 0.3931 + 0.2064i | 0.3903 + 0.2057i | 0.3968 + 0.2278i | 0.3942 + 0.2267i | 0.3965 + 0.2277i | 0.3939 + 0.2266i |
| 9 | 0.1966 + 0.3406i | 0.1984 + 0.3447i | 0.1984 + 0.3447i | 0.2002 + 0.3488i | 0.1984 + 0.3447i | 0.2002 + 0.3488i | 0.2002 + 0.3488i | 0.2020 + 0.3531i |
| 9.5 | 0.1845 + 0.3323i | 0.1850 + 0.3242i | 0.1850 + 0.3242i | 0.1854 + 0.3252i | 0.1850 + 0.3252i | 0.1854 + 0.3252i | 0.1854 + 0.3252i | 0.1859 + 0.3263i |
| 10 | 0.1764 + 0.3110i | 0.1762 + 0.3107i | 0.1762 + 0.3107i | 0.1761 + 0.3103i | 0.1762 + 0.3107i | 0.1761 + 0.3103i | 0.1761 + 0.3103i | 0.1759 + 0.3100i |
| 10.5 | 0.1715 + 0.3011i | 0.1707 + 0.3016i | 0.1716 + 0.3016i | 0.1708 + 0.3021i | 0.1713 + 0.3021i | 0.1704 + 0.3006i | 0.1713 + 0.3013i | 0.1705 + 0.2996i |
| 11 | 0.6250 + 0.2110i | 0.6274 + 0.2088i | 0.6250 + 0.2088i | 0.6274 + 0.2087i | 0.6292 + 0.2096i | 0.6317 + 0.2074i | 0.6292 + 0.2094i | 0.6317 + 0.2072i |
| 11.5 | 0.6416 + 0.1990i | 0.6435 + 0.1976i | 0.6415 + 0.1976i | 0.6435 + 0.1971i | 0.6450 + 0.1982i | 0.6470 + 0.1968i | 0.6450 + 0.1977i | 0.6471 + 0.1963i |
| 12 | 0.6552 + 0.1897i | 0.6565 + 0.1892i | 0.6554 + 0.1892i | 0.6567 + 0.1878i | 0.6580 + 0.1894i | 0.6594 + 0.1890i | 0.6582 + 0.1879i | 0.6596 + 0.1875i |
| 12.5 | 0.6139 + 0.1638i | 0.6138 + 0.1635i | 0.6145 + 0.1635i | 0.6144 + 0.1633i | 0.6155 + 0.1638i | 0.6154 + 0.1636i | 0.6162 + 0.1636i | 0.6161 + 0.1634i |
| 13 | 0.1617 + 0.2233i | 0.1616 + 0.2233i | 0.1614 + 0.2332i | 0.1614 + 0.2233i | 0.1615 + 0.2211i | 0.1615 + 0.2212i | 0.1613 + 0.2211i | 0.1613 + 0.2212i |
| 13.5 | 0.5891 + 0.1455i | 0.5897 + 0.1456i | 0.5892 + 0.1456i | 0.5898 + 0.1455i | 0.5889 + 0.1449i | 0.5895 + 0.1449i | 0.5890 + 0.1448i | 0.5896 + 0.1449i |
| 14 | 0.5761 + 0.1396i | 0.5758 + 0.1395i | 0.5762 + 0.1394i | 0.5759 + 0.1394i | 0.5780 + 0.1376i | 0.5778 + 0.1375i | 0.5781 + 0.1374i | 0.5778 + 0.1373i |
| 14.5 | 0.5668 + 0.1343i | 0.5666 + 0.1343i | 0.5671 + 0.1343i | 0.5669 + 0.1342i | 0.5691 + 0.1325i | 0.5689 + 0.1325i | 0.5694 + 0.1325i | 0.5692 + 0.1324i |
| 15 | 0.3782 + 0.1166i | 0.3782 + 0.1169i | 0.3807 + 0.1169i | 0.3807 + 0.1167i | 0.3781 + 0.1147i | 0.3781 + 0.1149i | 0.3806 + 0.1145i | 0.3806 + 0.1147i |
| 15.5 | 0.3698 + 0.1144i | 0.3700 + 0.1145i | 0.3733 + 0.1142i | 0.3734 + 0.1143i | 0.3700 + 0.1133i | 0.3701 + 0.1134i | 0.3734 + 0.1131i | 0.3735 + 0.1132i |
| 16 | 0.3459 + 0.1168i | 0.3458 + 0.1166i | 0.3495 + 0.1165i | 0.3494 + 0.1164i | 0.3462 + 0.1180i | 0.3460 + 0.1179i | 0.3498 + 0.1177i | 0.3497 + 0.1176i |
| 16.5 | 0.3622 + 0.1129i | 0.3622 + 0.1125i | 0.3653 + 0.1130i | 0.3653 + 0.1126i | 0.3622 + 0.1156i | 0.3623 + 0.1153i | 0.3654 + 0.1157i | 0.3654 + 0.1153i |
| 17 | 0.3648 + 0.1112i | 0.3649 + 0.1104i | 0.3685 + 0.1122i | 0.3686 + 0.1105i | 0.3650 + 0.1173i | 0.3650 + 0.1166i | 0.3687 + 0.1174i | 0.3688 + 0.1166i |
| 17.5 | 0.3692 + 0.1087i | 0.3693 + 0.1077i | 0.3730 + 0.1087i | 0.3730 + 0.1077i | 0.3694 + 0.1200i | 0.3695 + 0.1190i | 0.3732 + 0.1200i | 0.3733 + 0.1190i |
| 18 | 0.3757 + 0.1035i | 0.3756 + 0.1029i | 0.3784 + 0.1036i | 0.3784 + 0.1027i | 0.3754 + 0.1233i | 0.3756 + 0.1224i | 0.3784 + 0.1233i | 0.3784 + 0.1223i |
| 18.5 | 0.3121 + 0.0880i | 0.3118 + 0.0879i | 0.3154 + 0.0880i | 0.3151 + 0.0880i | 0.3154 + 0.1651i | 0.3151 + 0.1650i | 0.3188 + 0.1648i | 0.3184 + 0.1647i |
| 19 | 0.3031 + 0.0779i | 0.3030 + 0.0779i | 0.3064 + 0.0778i | 0.3062 + 0.0779i | 0.3100 + 0.1882i | 0.3098 + 0.1882i | 0.3130 + 0.1877i | 0.3128 + 0.1877i |
| 19.5 | 0.3004 + 0.0738i | 0.3003 + 0.0738i | 0.3028 + 0.0738i | 0.3027 + 0.0738i | 0.3100 + 0.2021i | 0.3099 + 0.2021i | 0.3122 + 0.2017i | 0.3121 + 0.2018i |

-continued

| SNR/w | w232 | w233 | w234 | w235 | w236 | w237 | w238 | w239 |
|---|---|---|---|---|---|---|---|---|
| 20 | | 0.5051 + 0.0708i | | 0.5046 + 0.0708i | 0.4996 + 0.1472i | 0.4995 + 0.1471i | 0.4991 + 0.1471i | 0.4992 + 0.1471i |
| 20.5 | | 0.4002 + 0.0654i | | 0.4001 + 0.0654i | 0.4036 + 0.1848i | 0.4034 + 0.1848i | 0.4035 + 0.1847i | 0.4034 + 0.1848i |
| 21 | | 0.4225 + 0.0611i | | 0.4207 + 0.0611i | 0.4221 + 0.1732i | 0.4220 + 0.1733i | 0.4204 + 0.1732i | 0.4204 + 0.1733i |
| 21.5 | | 0.4472 + 0.0598i | | 0.4448 + 0.0597i | 0.4436 + 0.1749i | 0.4436 + 0.1750i | 0.4411 + 0.1746i | 0.4411 + 0.1747i |
| 22 | | 0.4287 + 0.0584i | | 0.4223 + 0.0584i | 0.4279 + 0.1719i | 0.4278 + 0.1719i | 0.4219 + 0.1722i | 0.4217 + 0.1723i |
| 22.5 | | 0.4355 + 0.0591i | | 0.4267 + 0.0600i | 0.4356 + 0.1770i | 0.4364 + 0.1764i | 0.4281 + 0.1757i | 0.4295 + 0.1756i |
| 23 | | 0.4336 + 0.0555i | | 0.4290 + 0.0527i | 0.4334 + 0.1740i | 0.4299 + 0.1755i | 0.4215 + 0.1769i | 0.4172 + 0.1762i |
| 23.5 | | 0.4368 + 0.0577i | | 0.4156 + 0.0577i | 0.4357 + 0.1732i | 0.4367 + 0.1719i | 0.4151 + 0.1732i | 0.4156 + 0.1718i |
| 24 | | 0.4311 + 0.0566i | | 0.4003 + 0.0568i | 0.4310 + 0.1709i | 0.4309 + 0.1678i | 0.4005 + 0.1714i | 0.4005 + 0.1683i |
| 24.5 | | 0.4391 + 0.0558i | | 0.3937 + 0.0558i | 0.4414 + 0.1678i | 0.4409 + 0.1610i | 0.3966 + 0.1693i | 0.3960 + 0.1627i |
| 25 | | 0.4741 + 0.0522i | | 0.4097 + 0.0523i | 0.4731 + 0.1733i | 0.4733 + 0.1712i | 0.4082 + 0.1712i | 0.4080 + 0.1602i |
| 25.5 | | 0.4336 + 0.0441i | | 0.3744 + 0.0411i | 0.3745 + 0.0772i | 0.4377 + 0.1570i | 0.3822 + 0.2018i | 0.3792 + 0.1581i |
| 26 | | 0.4896 + 0.0884i | | 0.4269 + 0.0476i | 0.4149 + 0.1052i | 0.4981 + 0.1758i | 0.4158 + 0.2122i | 0.4119 + 0.1755i |
| 26.5 | | 0.4857 + 0.0289i | | 0.4205 + 0.0350i | 0.4899 + 0.0961i | 0.4866 + 0.1642i | 0.4194 + 0.2229i | 0.4216 + 0.1624i |
| 27 | | 0.5036 + 0.0438i | | 0.4167 + 0.0434i | 0.4840 + 0.1021i | 0.4940 + 0.1581i | 0.4139 + 0.2120i | 0.4156 + 0.1554i |
| 27.5 | | 0.5049 + 0.1036i | | 0.4231 + 0.1059i | 0.4951 + 0.2135i | 0.4990 + 0.1631i | 0.4241 + 0.2243i | 0.4237 + 0.1622i |
| 28 | | 0.5006 + 0.1245i | | 0.4388 + 0.0377i | 0.4847 + 0.2316i | 0.4930 + 0.1739i | 0.4142 + 0.2270i | 0.4205 + 0.1632i |

| SNR/w | w232 | w233 | w234 | w235 | w236 | w237 | w238 | w239 |
|---|---|---|---|---|---|---|---|---|
| 7 | 0.4435 + 0.2619i | 0.4647 + 0.2713i | 0.4349 + 0.2412i | 0.4575 + 0.2479i | 0.4648 + 0.2713i | 0.4855 + 0.2479i | 0.4575 + 0.2544i | 0.4800 + 0.2544i |
| 7.5 | 0.4563 + 0.2660i | 0.4501 + 0.2633i | 0.4500 + 0.2383i | 0.4432 + 0.2366i | 0.4880 + 0.2809i | 0.4822 + 0.2784i | 0.4851 + 0.2473i | 0.4785 + 0.2458i |
| 8 | 0.4792 + 0.2370i | 0.4743 + 0.2359i | 0.4815 + 0.2375i | 0.4766 + 0.2365i | 0.4796 + 0.2733i | 0.4754 + 0.2744i | 0.4817 + 0.2744i | 0.4775 + 0.2723i |
| 8.5 | 0.5225 + 0.2361i | 0.5201 + 0.2357i | 0.5228 + 0.2362i | 0.5205 + 0.2358i | 0.5120 + 0.2846i | 0.5101 + 0.2837i | 0.5125 + 0.2849i | 0.5105 + 0.2839i |
| 9 | 0.1984 + 0.3447i | 0.2002 + 0.3488i | 0.2002 + 0.3488i | 0.2020 + 0.3531i | 0.2002 + 0.3488i | 0.2020 + 0.3531i | 0.2020 + 0.3531i | 0.2040 + 0.3574i |
| 9.5 | 0.1850 + 0.3242i | 0.1854 + 0.3252i | 0.1854 + 0.3252i | 0.1859 + 0.3263i | 0.1854 + 0.3252i | 0.1859 + 0.3263i | 0.1859 + 0.3263i | 0.1863 + 0.3274i |
| 10 | 0.1762 + 0.3107i | 0.1761 + 0.3103i | 0.1761 + 0.3103i | 0.1759 + 0.3100i | 0.1761 + 0.3103i | 0.1759 + 0.3100i | 0.1759 + 0.3100i | 0.1758 + 0.3096i |
| 10.5 | 0.1710 + 0.3018i | 0.1702 + 0.3004i | 0.1710 + 0.3009i | 0.1702 + 0.2994i | 0.1707 + 0.3010i | 0.1699 + 0.2993i | 0.1708 + 0.2999i | 0.1700 + 0.2984i |
| 11 | 0.6308 + 0.2080i | 0.6332 + 0.2059i | 0.6308 + 0.2078i | 0.6333 + 0.2057i | 0.6352 + 0.2066i | 0.6378 + 0.2045i | 0.6352 + 0.2064i | 0.6378 + 0.2043i |
| 11.5 | 0.6460 + 0.1976i | 0.6480 + 0.1962i | 0.6460 + 0.1970i | 0.6480 + 0.1957i | 0.6496 + 0.1968i | 0.6518 + 0.1954i | 0.6496 + 0.1962i | 0.6518 + 0.1948i |
| 12 | 0.6586 + 0.1898i | 0.6601 + 0.1894i | 0.6589 + 0.1884i | 0.6603 + 0.1879i | 0.6617 + 0.1896i | 0.6631 + 0.1891i | 0.6619 + 0.1881i | 0.6634 + 0.1876i |
| 12.5 | 0.6143 + 0.1644i | 0.6142 + 0.1642i | 0.6150 + 0.1641i | 0.6149 + 0.1640i | 0.6160 + 0.1644i | 0.6159 + 0.1643i | 0.6168 + 0.1642i | 0.6166 + 0.1640i |
| 13 | 0.1611 + 0.2225i | 0.1610 + 0.2222i | 0.1608 + 0.2225i | 0.1608 + 0.2226i | 0.1610 + 0.2204i | 0.1609 + 0.2205i | 0.1607 + 0.2204i | 0.1607 + 0.2204i |
| 13.5 | 0.5821 + 0.1478i | 0.5826 + 0.1478i | 0.5821 + 0.1477i | 0.5827 + 0.1477i | 0.5819 + 0.1470i | 0.5824 + 0.1470i | 0.5820 + 0.1469i | 0.5825 + 0.1469i |
| 14 | 0.5586 + 0.1393i | 0.5583 + 0.1393i | 0.5587 + 0.1391i | 0.5584 + 0.1391i | 0.5607 + 0.1372i | 0.5603 + 0.1371i | 0.5607 + 0.1370i | 0.5604 + 0.1369i |
| 14.5 | 0.5445 + 0.1338i | 0.5443 + 0.1337i | 0.5447 + 0.1337i | 0.5445 + 0.1337i | 0.5468 + 0.1318i | 0.5466 + 0.1317i | 0.5470 + 0.1317i | 0.5468 + 0.1317i |
| 15 | 0.3586 + 0.1172i | 0.3586 + 0.1175i | 0.3611 + 0.1171i | 0.3611 + 0.1173i | 0.3585 + 0.1154i | 0.3585 + 0.1156i | 0.3610 + 0.1152i | 0.3610 + 0.1154i |
| 15.5 | 0.3485 + 0.1157i | 0.3485 + 0.1158i | 0.3518 + 0.1156i | 0.3518 + 0.1157i | 0.3486 + 0.1147i | 0.3487 + 0.1148i | 0.3518 + 0.1146i | 0.3519 + 0.1147i |
| 16 | 0.3254 + 0.1175i | 0.3252 + 0.1174i | 0.3288 + 0.1173i | 0.3287 + 0.1172i | 0.3256 + 0.1189i | 0.3255 + 0.1188i | 0.3291 + 0.1187i | 0.3289 + 0.1186i |
| 16.5 | 0.3391 + 0.1126i | 0.3391 + 0.1122i | 0.3419 + 0.1126i | 0.3420 + 0.1123i | 0.3392 + 0.1153i | 0.3392 + 0.1149i | 0.3420 + 0.1150i | 0.3420 + 0.1150i |
| 17 | 0.3359 + 0.1108i | 0.3359 + 0.1108i | 0.3390 + 0.1101i | 0.3390 + 0.1101i | 0.3360 + 0.1169i | 0.3360 + 0.1169i | 0.3391 + 0.1162i | 0.3391 + 0.1162i |
| 17.5 | 0.3313 + 0.1083i | 0.3314 + 0.1082i | 0.3340 + 0.1082i | 0.3341 + 0.1073i | 0.3314 + 0.1195i | 0.3315 + 0.1185i | 0.3341 + 0.1194i | 0.3342 + 0.1184i |
| 18 | 0.3237 + 0.1032i | 0.3236 + 0.1023i | 0.3252 + 0.1023i | 0.3252 + 0.1023i | 0.3234 + 0.1226i | 0.3234 + 0.1219i | 0.3251 + 0.1226i | 0.3252 + 0.1216i |
| 18.5 | 0.2810 + 0.0875i | 0.2807 + 0.0874i | 0.2835 + 0.0876i | 0.2832 + 0.0875i | 0.2833 + 0.1677i | 0.2830 + 0.1676i | 0.2858 + 0.1675i | 0.2855 + 0.1673i |
| 19 | 0.2671 + 0.0777i | 0.2670 + 0.0777i | 0.2692 + 0.0776i | 0.2690 + 0.0776i | 0.2711 + 0.1923i | 0.2709 + 0.1924i | 0.2729 + 0.1920i | 0.2728 + 0.1920i |
| 19.5 | 0.2592 + 0.0741i | 0.2591 + 0.0742i | 0.2605 + 0.0741i | 0.2604 + 0.0741i | 0.2635 + 0.2071i | 0.2635 + 0.2072i | 0.2647 + 0.2069i | 0.2646 + 0.2069i |
| 20 | 0.3583 + 0.0733i | 0.3584 + 0.0733i | 0.3583 + 0.0733i | 0.3582 + 0.0732i | 0.3557 + 0.1282i | 0.3558 + 0.1281i | 0.3557 + 0.1281i | 0.3556 + 0.1280i |
| 20.5 | 0.2886 + 0.0655i | 0.2886 + 0.0655i | 0.2885 + 0.0656i | 0.2885 + 0.0655i | 0.2903 + 0.1864i | 0.2903 + 0.1864i | 0.2902 + 0.1863i | 0.2902 + 0.1864i |
| 21 | 0.2964 + 0.0612i | 0.2964 + 0.0612i | 0.2963 + 0.0612i | 0.2963 + 0.0612i | 0.2962 + 0.1741i | 0.2962 + 0.1742i | 0.2960 + 0.1741i | 0.2960 + 0.1742i |
| 21.5 | 0.3134 + 0.0587i | 0.3135 + 0.0586i | 0.3136 + 0.0587i | 0.3137 + 0.0587i | 0.3108 + 0.1701i | 0.3108 + 0.1702i | 0.3110 + 0.1701i | 0.3110 + 0.1701i |
| 22 | 0.2962 + 0.0583i | 0.2962 + 0.0582i | 0.2968 + 0.0582i | 0.2968 + 0.0584i | 0.2959 + 0.1738i | 0.2957 + 0.1740i | 0.2964 + 0.1740i | 0.2962 + 0.1741i |
| 22.5 | 0.3032 + 0.0589i | 0.3027 + 0.0582i | 0.3062 + 0.0585i | 0.3053 + 0.0585i | 0.3018 + 0.1745i | 0.3007 + 0.1748i | 0.3038 + 0.1742i | 0.3026 + 0.1738i |
| 23 | 0.3003 + 0.0547i | 0.3008 + 0.0596i | 0.2981 + 0.0518i | 0.3015 + 0.0576i | 0.2974 + 0.1688i | 0.3016 + 0.1636i | 0.3004 + 0.1706i | 0.3038 + 0.1687i |

| SNR/w | w240 | w241 | w242 | w243 | w244 | w245 | w246 | w247 |
|---|---|---|---|---|---|---|---|---|
| 23.5 | | | | 0.3001 + 0.0559i | 0.2938 + 0.1716i | 0.2934 + 0.1709i | 0.3007 + 0.1715i | 0.3004 + 0.1709i |
| 24 | | | | 0.2947 + 0.0570i | 0.2833 + 0.1722i | 0.2834 + 0.1690i | 0.2942 + 0.1722i | 0.2943 + 0.1689i |
| 24.5 | | | | 0.2962 + 0.0574i | 0.2788 + 0.1723i | 0.2784 + 0.1665i | 0.2984 + 0.1718i | 0.2980 + 0.1659i |
| 25 | | | | 0.3242 + 0.0569i | 0.2785 + 0.1682i | 0.2782 + 0.1581i | 0.3224 + 0.1691i | 0.3224 + 0.1588i |
| 25.5 | | | | 0.2942 + 0.0808i | 0.2624 + 0.2089i | 0.2607 + 0.1620i | 0.3016 + 0.2071i | 0.2979 + 0.1608i |
| 26 | | | | 0.3456 + 0.0944i | 0.2776 + 0.2130i | 0.2797 + 0.1616i | 0.3388 + 0.2141i | 0.3395 + 0.1659i |
| 26.5 | | | | 0.3569 + 0.0932i | 0.2863 + 0.2090i | 0.2920 + 0.1540i | 0.3512 + 0.2175i | 0.3553 + 0.1593i |
| 27 | | | | 0.3386 + 0.0968i | 0.2771 + 0.2176i | 0.2758 + 0.1577i | 0.3431 + 0.2153i | 0.3406 + 0.1566i |
| 27.5 | | | | 0.3476 + 0.1015i | 0.2852 + 0.2242i | 0.2849 + 0.1629i | 0.3535 + 0.2247i | 0.3513 + 0.1631i |
| 28 | | | | 0.3621 + 0.0922i | 0.2866 + 0.2178i | 0.2907 + 0.1527i | 0.3496 + 0.2221i | 0.3560 + 0.1554i |

| SNR/w | w240 | w241 | w242 | w243 | w244 | w245 | w246 | w247 |
|---|---|---|---|---|---|---|---|---|
| 7 | 0.4435 + 0.2619i | 0.4647 + 0.2713i | 0.4349 + 0.2412i | 0.4575 + 0.2479i | 0.4647 + 0.2713i | 0.4855 + 0.2806i | 0.4575 + 0.2479i | 0.4800 + 0.2544i |
| 7.5 | 0.4567 + 0.2663i | 0.4506 + 0.2636i | 0.4505 + 0.2384i | 0.4437 + 0.2367i | 0.4883 + 0.2811i | 0.4826 + 0.2786i | 0.4855 + 0.2474i | 0.4789 + 0.2460i |
| 8 | 0.4792 + 0.2370i | 0.4744 + 0.2359i | 0.4815 + 0.2375i | 0.4766 + 0.2365i | 0.4796 + 0.2735i | 0.4754 + 0.2713i | 0.4817 + 0.2744i | 0.4775 + 0.2724i |
| 8.5 | 0.4220 + 0.2140i | 0.4192 + 0.2133i | 0.4218 + 0.2139i | 0.4189 + 0.2132i | 0.4237 + 0.2403i | 0.4211 + 0.2391i | 0.4236 + 0.2402i | 0.4209 + 0.2390i |
| 9 | 0.2922 + 0.5353i | 0.2956 + 0.5413i | 0.2956 + 0.5412i | 0.2991 + 0.5474i | 0.2956 + 0.5412i | 0.2991 + 0.5473i | 0.2991 + 0.5473i | 0.3027 + 0.5535i |
| 9.5 | 0.3037 + 0.5607i | 0.3060 + 0.5644i | 0.3060 + 0.5644i | 0.3084 + 0.5681i | 0.3060 + 0.5644i | 0.3084 + 0.5681i | 0.3084 + 0.5681i | 0.3108 + 0.5720i |
| 10 | 0.3143 + 0.5780i | 0.3161 + 0.5805i | 0.3161 + 0.5805i | 0.3179 + 0.5831i | 0.3161 + 0.5805i | 0.3179 + 0.5831i | 0.3179 + 0.5831i | 0.3198 + 0.5858i |
| 10.5 | 0.3218 + 0.5907i | 0.3233 + 0.5931i | 0.3242 + 0.5920i | 0.3258 + 0.5944i | 0.3233 + 0.5922i | 0.3249 + 0.5947i | 0.3257 + 0.5936i | 0.3275 + 0.5961i |
| 11 | 0.5697 + 0.3592i | 0.5699 + 0.3563i | 0.5695 + 0.3600i | 0.5696 + 0.3571i | 0.5715 + 0.3585i | 0.5717 + 0.3556i | 0.5712 + 0.3593i | 0.5714 + 0.3564i |
| 11.5 | 0.5764 + 0.3696i | 0.5763 + 0.3673i | 0.5759 + 0.3709i | 0.5758 + 0.3685i | 0.5776 + 0.3694i | 0.5776 + 0.3671i | 0.5771 + 0.3707i | 0.5771 + 0.3683i |
| 12 | 0.5799 + 0.3822i | 0.5797 + 0.3804i | 0.5790 + 0.3839i | 0.5787 + 0.3821i | 0.5807 + 0.3825i | 0.5805 + 0.3807i | 0.5797 + 0.3842i | 0.5795 + 0.3824i |
| 12.5 | 0.5683 + 0.3416i | 0.5680 + 0.3406i | 0.5683 + 0.3403i | 0.5679 + 0.3393i | 0.5691 + 0.3390i | 0.5688 + 0.3381i | 0.5690 + 0.3377i | 0.5687 + 0.3368i |
| 13 | 0.3128 + 0.5593i | 0.3121 + 0.5593i | 0.3120 + 0.5594i | 0.3113 + 0.5594i | 0.3184 + 0.5569i | 0.3177 + 0.5568i | 0.3176 + 0.5569i | 0.3169 + 0.5569i |
| 13.5 | 0.5552 + 0.3279i | 0.5551 + 0.3264i | 0.5554 + 0.3272i | 0.5554 + 0.3256i | 0.5543 + 0.3209i | 0.5543 + 0.3195i | 0.5545 + 0.3202i | 0.5545 + 0.3188i |
| 14 | 0.5472 + 0.3116i | 0.5469 + 0.3117i | 0.5472 + 0.3111i | 0.5470 + 0.3112i | 0.5461 + 0.3010i | 0.5458 + 0.3011i | 0.5462 + 0.3005i | 0.5459 + 0.3006i |
| 14.5 | 0.5418 + 0.3194i | 0.5416 + 0.3195i | 0.5422 + 0.3195i | 0.5420 + 0.3196i | 0.5405 + 0.3060i | 0.5402 + 0.3062i | 0.5409 + 0.3060i | 0.5406 + 0.3062i |
| 15 | 0.3909 + 0.3431i | 0.3915 + 0.3441i | 0.3925 + 0.3423i | 0.3930 + 0.3434i | 0.3873 + 0.3355i | 0.3878 + 0.3366i | 0.3889 + 0.3347i | 0.3894 + 0.3358i |
| 15.5 | 0.3878 + 0.3462i | 0.3878 + 0.3467i | 0.3905 + 0.3457i | 0.3904 + 0.3461i | 0.3830 + 0.3483i | 0.3830 + 0.3488i | 0.3858 + 0.3477i | 0.3857 + 0.3481i |
| 16 | 0.3606 + 0.3677i | 0.3608 + 0.3695i | 0.3630 + 0.3666i | 0.3633 + 0.3683i | 0.3581 + 0.3355i | 0.3583 + 0.3500i | 0.3606 + 0.3471i | 0.3609 + 0.3488i |
| 16.5 | 0.3594 + 0.3591i | 0.3592 + 0.3623i | 0.3628 + 0.3623i | 0.3626 + 0.3627i | 0.3600 + 0.3363i | 0.3598 + 0.3396i | 0.3633 + 0.3369i | 0.3631 + 0.3400i |
| 17 | 0.3622 + 0.3624i | 0.3619 + 0.3662i | 0.3662 + 0.3662i | 0.3659 + 0.3667i | 0.3630 + 0.3342i | 0.3629 + 0.3375i | 0.3670 + 0.3347i | 0.3669 + 0.3379i |
| 17.5 | 0.3664 + 0.3711i | 0.3662 + 0.3711i | 0.3703 + 0.3703i | 0.3702 + 0.3716i | 0.3677 + 0.3305i | 0.3676 + 0.3334i | 0.3716 + 0.3308i | 0.3716 + 0.3338i |
| 18 | 0.3726 + 0.3728i | 0.3725 + 0.3758i | 0.3754 + 0.3758i | 0.3753 + 0.3763i | 0.3739 + 0.3225i | 0.3739 + 0.3243i | 0.3769 + 0.3229i | 0.3768 + 0.3245i |
| 18.5 | 0.3399 + 0.4506i | 0.3400 + 0.4512i | 0.3428 + 0.4499i | 0.3428 + 0.4508i | 0.3255 + 0.3402i | 0.3251 + 0.3402i | 0.3286 + 0.3399i | 0.3284 + 0.3399i |
| 19 | 0.3519 + 0.4717i | 0.3520 + 0.4721i | 0.3539 + 0.4711i | 0.3540 + 0.4716i | 0.3273 + 0.3445i | 0.3271 + 0.3444i | 0.3298 + 0.3441i | 0.3296 + 0.3440i |
| 19.5 | 0.3676 + 0.4840i | 0.3676 + 0.4841i | 0.3685 + 0.4835i | 0.3686 + 0.4836i | 0.3338 + 0.3495i | 0.3336 + 0.3494i | 0.3354 + 0.3492i | 0.3353 + 0.3490i |
| 20 | 0.4659 + 0.3915i | 0.4657 + 0.3919i | 0.4658 + 0.3915i | 0.4655 + 0.3918i | 0.4848 + 0.2896i | 0.4848 + 0.2894i | 0.4844 + 0.2895i | 0.4845 + 0.2894i |
| 20.5 | 0.4212 + 0.4475i | 0.4211 + 0.4470i | 0.4205 + 0.4473i | 0.4204 + 0.4467i | 0.4112 + 0.3184i | 0.4110 + 0.3183i | 0.4110 + 0.3182i | 0.4109 + 0.3180i |
| 21 | 0.4205 + 0.4253i | 0.4206 + 0.4237i | 0.4190 + 0.4253i | 0.4191 + 0.4237i | 0.4212 + 0.2993i | 0.4211 + 0.2991i | 0.4196 + 0.2993i | 0.4195 + 0.2991i |
| 21.5 | 0.4276 + 0.4259i | 0.4279 + 0.4238i | 0.4241 + 0.4254i | 0.4245 + 0.4233i | 0.4367 + 0.2987i | 0.4366 + 0.2988i | 0.4338 + 0.2984i | 0.4337 + 0.2984i |
| 22 | 0.4252 + 0.4231i | 0.4255 + 0.4176i | 0.4206 + 0.4230i | 0.4209 + 0.4175i | 0.4262 + 0.2937i | 0.4265 + 0.2943i | 0.4210 + 0.2941i | 0.4214 + 0.2948i |
| 22.5 | 0.4281 + 0.4281i | 0.4277 + 0.4222i | 0.4185 + 0.4281i | 0.4176 + 0.4220i | 0.4313 + 0.2981i | 0.4314 + 0.2994i | 0.4228 + 0.2986i | 0.4235 + 0.2985i |
| 23 | 0.4272 + 0.4284i | 0.4282 + 0.4143i | 0.4136 + 0.4260i | 0.4153 + 0.4120i | 0.4369 + 0.2885i | 0.4323 + 0.2939i | 0.4201 + 0.2884i | 0.4169 + 0.2947i |
| 23.5 | 0.4341 + 0.4277i | 0.4342 + 0.4101i | 0.4135 + 0.4270i | 0.4137 + 0.4098i | 0.4352 + 0.2901i | 0.4351 + 0.2956i | 0.4146 + 0.2895i | 0.4145 + 0.2948i |
| 24 | 0.4266 + 0.4286i | 0.4273 + 0.3997i | 0.3987 + 0.4288i | 0.3992 + 0.3999i | 0.4297 + 0.2819i | 0.4296 + 0.2923i | 0.4004 + 0.2823i | 0.4005 + 0.2927i |
| 24.5 | 0.4441 + 0.4330i | 0.4456 + 0.3871i | 0.4061 + 0.4315i | 0.4061 + 0.3880i | 0.4435 + 0.2703i | 0.4444 + 0.2897i | 0.4008 + 0.2724i | 0.4020 + 0.2908i |
| 25 | 0.4605 + 0.4369i | 0.4656 + 0.3853i | 0.4012 + 0.4314i | 0.4034 + 0.3820i | 0.4711 + 0.2693i | 0.4704 + 0.2957i | 0.4060 + 0.2680i | 0.4057 + 0.2929i |
| 25.5 | 0.4659 + 0.4740i | 0.4613 + 0.4078i | 0.3989 + 0.4774i | 0.3958 + 0.4114i | 0.4488 + 0.2770i | 0.4545 + 0.3309i | 0.3879 + 0.2805i | 0.3914 + 0.3357i |
| 26 | 0.4896 + 0.4720i | 0.4932 + 0.4049i | 0.4193 + 0.4606i | 0.4242 + 0.4025i | 0.4987 + 0.2781i | 0.4969 + 0.3245i | 0.4217 + 0.2807i | 0.4195 + 0.3226i |
| 26.5 | 0.4795 + 0.4819i | 0.4925 + 0.4148i | 0.4080 + 0.4687i | 0.4168 + 0.4091i | 0.4942 + 0.2865i | 0.4967 + 0.3440i | 0.4169 + 0.2892i | 0.4181 + 0.3435i |

| | w248 | w249 | w250 | w251 | w252 | w253 | w254 | w255 |
|---|---|---|---|---|---|---|---|---|
| 27 | | 0.4761 + 0.4203i | 0.4122 + 0.4857i | 0.4125 + 0.4173i | 0.4776 + 0.2777i | 0.4790 + 0.3514i | 0.4145 + 0.2787i | 0.4149 + 0.3453i |
| 27.5 | | 0.4859 + 0.4203i | 0.4207 + 0.4950i | 0.4201 + 0.4209i | 0.4953 + 0.2912i | 0.5006 + 0.3617i | 0.4249 + 0.2903i | 0.4218 + 0.3534i |
| 28 | | 0.4759 + 0.4288i | 0.4092 + 0.4951i | 0.4078 + 0.4275i | 0.4796 + 0.2942i | 0.4808 + 0.3655i | 0.4118 + 0.2932i | 0.4092 + 0.3590i |

| SNR/w | w248 | w249 | w250 | w251 | w252 | w253 | w254 | w255 |
|---|---|---|---|---|---|---|---|---|
| 7 | 0.4647 + 0.2713i | 0.4854 + 0.2806i | 0.4575 + 0.2479i | 0.4800 + 0.2544i | 0.4855 + 0.2806i | 0.5053 + 0.2896i | 0.4800 + 0.2544i | 0.5020 + 0.2604i |
| 7.5 | 0.4882 + 0.2811i | 0.4825 + 0.2785i | 0.4854 + 0.2474i | 0.4788 + 0.2459i | 0.5179 + 0.2954i | 0.5128 + 0.2931i | 0.5193 + 0.2554i | 0.5133 + 0.2542i |
| 8 | 0.5301 + 0.2479i | 0.5259 + 0.2471i | 0.5326 + 0.2484i | 0.5284 + 0.2476i | 0.5235 + 0.2956i | 0.5200 + 0.2938i | 0.5257 + 0.2968i | 0.5223 + 0.2950i |
| 8.5 | 0.5511 + 0.2413i | 0.5491 + 0.2410i | 0.5517 + 0.2414i | 0.5497 + 0.2411i | 0.5364 + 0.2979i | 0.5347 + 0.2971i | 0.5370 + 0.2983i | 0.5353 + 0.2974i |
| 9 | 0.2956 + 0.5412i | 0.2991 + 0.5473i | 0.2991 + 0.5473i | 0.3027 + 0.5535i | 0.2991 + 0.5473i | 0.3027 + 0.5535i | 0.3027 + 0.5535i | 0.3064 + 0.5598i |
| 9.5 | 0.3060 + 0.5644i | 0.3084 + 0.5681i | 0.3084 + 0.5681i | 0.3108 + 0.5720i | 0.3084 + 0.5681i | 0.3108 + 0.5720i | 0.3108 + 0.5720i | 0.3134 + 0.5760i |
| 10 | 0.3161 + 0.5805i | 0.3179 + 0.5831i | 0.3179 + 0.5831i | 0.3199 + 0.5858i | 0.3179 + 0.5831i | 0.3198 + 0.5858i | 0.3198 + 0.5858i | 0.3219 + 0.5886i |
| 10.5 | 0.3232 + 0.5924i | 0.3250 + 0.5949i | 0.3258 + 0.5938i | 0.3275 + 0.5964i | 0.3248 + 0.5940i | 0.3267 + 0.5966i | 0.3274 + 0.5954i | 0.3294 + 0.5981i |
| 11 | 0.5735 + 0.3551i | 0.5737 + 0.3522i | 0.5733 + 0.3559i | 0.5735 + 0.3530i | 0.5754 + 0.3544i | 0.5757 + 0.3515i | 0.5751 + 0.3552i | 0.5754 + 0.3523i |
| 11.5 | 0.5795 + 0.3665i | 0.5795 + 0.3642i | 0.5790 + 0.3677i | 0.5790 + 0.3654i | 0.5808 + 0.3663i | 0.5808 + 0.3640i | 0.5803 + 0.3675i | 0.5803 + 0.3652i |
| 12 | 0.5828 + 0.3792i | 0.5826 + 0.3775i | 0.5818 + 0.3808i | 0.5815 + 0.3791i | 0.5836 + 0.3795i | 0.5834 + 0.3778i | 0.5826 + 0.3811i | 0.5823 + 0.3794i |
| 12.5 | 0.5692 + 0.3454i | 0.5688 + 0.3443i | 0.5690 + 0.3440i | 0.5686 + 0.3430i | 0.5699 + 0.3428i | 0.5696 + 0.3417i | 0.5698 + 0.3414i | 0.5694 + 0.3404i |
| 13 | 0.3084 + 0.5587i | 0.3078 + 0.5587i | 0.3077 + 0.5589i | 0.3070 + 0.5589i | 0.3139 + 0.5611i | 0.3133 + 0.5611i | 0.3132 + 0.5562i | 0.3125 + 0.5562i |
| 13.5 | 0.5519 + 0.3338i | 0.5517 + 0.3322i | 0.5521 + 0.3330i | 0.5519 + 0.3314i | 0.5506 + 0.3264i | 0.5506 + 0.3249i | 0.5508 + 0.3257i | 0.5508 + 0.3242i |
| 14 | 0.5335 + 0.3062i | 0.5332 + 0.3063i | 0.5336 + 0.3056i | 0.5333 + 0.3058i | 0.5321 + 0.2958i | 0.5318 + 0.2960i | 0.5322 + 0.2953i | 0.5319 + 0.2955i |
| 14.5 | 0.5240 + 0.3109i | 0.5238 + 0.3110i | 0.5244 + 0.3109i | 0.5241 + 0.3110i | 0.5222 + 0.2982i | 0.5219 + 0.2983i | 0.5225 + 0.2982i | 0.5223 + 0.2983i |
| 15 | 0.3744 + 0.3449i | 0.3749 + 0.3459i | 0.3760 + 0.3442i | 0.3766 + 0.3452i | 0.3705 + 0.3376i | 0.3710 + 0.3387i | 0.3722 + 0.3369i | 0.3727 + 0.3380i |
| 15.5 | 0.3732 + 0.3528i | 0.3732 + 0.3532i | 0.3758 + 0.3524i | 0.3758 + 0.3528i | 0.3677 + 0.3432i | 0.3678 + 0.3437i | 0.3704 + 0.3428i | 0.3705 + 0.3433i |
| 16 | 0.3427 + 0.3720i | 0.3430 + 0.3737i | 0.3450 + 0.3710i | 0.3453 + 0.3727i | 0.3399 + 0.3524i | 0.3401 + 0.3541i | 0.3423 + 0.3515i | 0.3426 + 0.3531i |
| 16.5 | 0.3356 + 0.3584i | 0.3354 + 0.3617i | 0.3386 + 0.3587i | 0.3384 + 0.3620i | 0.3362 + 0.3559i | 0.3360 + 0.3589i | 0.3392 + 0.3562i | 0.3390 + 0.3592i |
| 17 | 0.3323 + 0.3615i | 0.3321 + 0.3654i | 0.3356 + 0.3619i | 0.3353 + 0.3658i | 0.3332 + 0.3333i | 0.3330 + 0.3365i | 0.3364 + 0.3337i | 0.3363 + 0.3369i |
| 17.5 | 0.3270 + 0.3659i | 0.3269 + 0.3699i | 0.3297 + 0.3663i | 0.3296 + 0.3703i | 0.3283 + 0.3291i | 0.3282 + 0.3320i | 0.3310 + 0.3294i | 0.3310 + 0.3323i |
| 18 | 0.3196 + 0.3715i | 0.3195 + 0.3745i | 0.3211 + 0.3718i | 0.3210 + 0.3748i | 0.3209 + 0.3209i | 0.3210 + 0.3227i | 0.3225 + 0.3211i | 0.3226 + 0.3228i |
| 18.5 | 0.2955 + 0.4576i | 0.2955 + 0.4582i | 0.2972 + 0.4573i | 0.2973 + 0.4578i | 0.2879 + 0.3423i | 0.2877 + 0.3423i | 0.2900 + 0.3421i | 0.2898 + 0.3420i |
| 19 | 0.2900 + 0.4850i | 0.2901 + 0.4854i | 0.2908 + 0.4848i | 0.2909 + 0.4852i | 0.2789 + 0.3494i | 0.2788 + 0.3493i | 0.2802 + 0.3492i | 0.2801 + 0.3491i |
| 19.5 | 0.2874 + 0.5021i | 0.2874 + 0.5021i | 0.2876 + 0.5020i | 0.2877 + 0.5020i | 0.2733 + 0.3579i | 0.2732 + 0.3578i | 0.2739 + 0.3578i | 0.2738 + 0.3577i |
| 20 | 0.3344 + 0.3598i | 0.3343 + 0.3604i | 0.3344 + 0.3597i | 0.3340 + 0.3603i | 0.3465 + 0.2744i | 0.3465 + 0.2743i | 0.3463 + 0.2743i | 0.3464 + 0.2743i |
| 20.5 | 0.2986 + 0.4522i | 0.2984 + 0.4516i | 0.2984 + 0.4522i | 0.2984 + 0.4514i | 0.2938 + 0.3207i | 0.2938 + 0.3206i | 0.2936 + 0.3207i | 0.2937 + 0.3207i |
| 21 | 0.2959 + 0.4283i | 0.2959 + 0.4265i | 0.2957 + 0.4282i | 0.2957 + 0.4264i | 0.2958 + 0.3006i | 0.2957 + 0.3005i | 0.2956 + 0.3006i | 0.2955 + 0.3005i |
| 21.5 | 0.2979 + 0.4177i | 0.2983 + 0.4149i | 0.2981 + 0.4178i | 0.2985 + 0.4150i | 0.3055 + 0.2919i | 0.3054 + 0.2919i | 0.3056 + 0.2919i | 0.3056 + 0.2920i |
| 22 | 0.2966 + 0.4260i | 0.2962 + 0.4208i | 0.2972 + 0.4259i | 0.2967 + 0.4209i | 0.2958 + 0.2955i | 0.2956 + 0.2959i | 0.2964 + 0.2954i | 0.2962 + 0.2957i |
| 22.5 | 0.2940 + 0.4236i | 0.2939 + 0.4181i | 0.2967 + 0.4232i | 0.2971 + 0.4183i | 0.3005 + 0.2934i | 0.2994 + 0.2941i | 0.3021 + 0.2942i | 0.3012 + 0.2946i |
| 23 | 0.2935 + 0.4210i | 0.2962 + 0.4088i | 0.2951 + 0.4219i | 0.2986 + 0.4074i | 0.2899 + 0.2906i | 0.2947 + 0.2910i | 0.2943 + 0.2875i | 0.2966 + 0.2922i |
| 23.5 | 0.2933 + 0.4248i | 0.2932 + 0.4078i | 0.2997 + 0.4250i | 0.2994 + 0.4080i | 0.2935 + 0.2929i | 0.2935 + 0.2929i | 0.2998 + 0.2881i | 0.3002 + 0.2931i |
| 24 | 0.2813 + 0.4303i | 0.2841 + 0.4007i | 0.2981 + 0.4304i | 0.2918 + 0.4007i | 0.2830 + 0.2835i | 0.2828 + 0.2942i | 0.2996 + 0.2832i | 0.2995 + 0.2939i |
| 24.5 | 0.2901 + 0.4652i | 0.2841 + 0.4025i | 0.2913 + 0.4304i | 0.2918 + 0.4077i | 0.2816 + 0.2835i | 0.2773 + 0.2828i | 0.2936 + 0.2832i | 0.2935 + 0.2939i |
| 25 | 0.2876 + 0.4295i | 0.2869 + 0.3918i | 0.3057 + 0.4296i | 0.3056 + 0.3912i | 0.2822 + 0.2778i | 0.2830 + 0.2935i | 0.3018 + 0.2769i | 0.3025 + 0.2928i |
| 25.5 | 0.2771 + 0.4268i | 0.2768 + 0.3791i | 0.3135 + 0.4278i | 0.3155 + 0.3799i | 0.2772 + 0.2653i | 0.2769 + 0.2887i | 0.3198 + 0.2662i | 0.3190 + 0.2899i |
| 26 | 0.2679 + 0.4831i | 0.2671 + 0.4177i | 0.3196 + 0.4813i | 0.3153 + 0.4153i | 0.2642 + 0.2859i | 0.2656 + 0.3405i | 0.3076 + 0.2846i | 0.3109 + 0.3393i |
| 26.5 | 0.2625 + 0.4607i | 0.2678 + 0.3995i | 0.3477 + 0.4578i | 0.3484 + 0.3989i | 0.2773 + 0.2828i | 0.2787 + 0.3328i | 0.3433 + 0.2843i | 0.3468 + 0.3291i |
| 27 | 0.2775 + 0.4791i | 0.2786 + 0.4104i | 0.3331 + 0.4633i | 0.3357 + 0.4044i | 0.2800 + 0.2739i | 0.2750 + 0.3227i | 0.3456 + 0.2833i | 0.3396 + 0.3394i |
| 27.5 | 0.2845 + 0.4908i | 0.2855 + 0.4209i | 0.3419 + 0.4815i | 0.3447 + 0.4116i | 0.2784 + 0.2816i | 0.2788 + 0.3435i | 0.3453 + 0.2801i | 0.3462 + 0.3431i |
| 27.5 | | | 0.3510 + 0.4925i | 0.3519 + 0.4213i | 0.2848 + 0.2876i | 0.2849 + 0.3525i | 0.3530 + 0.2885i | 0.3520 + 0.3524i |
| 28 | 0.2735 + 0.4926i | 0.2751 + 0.4223i | 0.3391 + 0.4945i | 0.3402 + 0.4252i | 0.2814 + 0.2854i | 0.2775 + 0.3535i | 0.3445 + 0.2894i | 0.3418 + 0.3566i |

Figure 9:
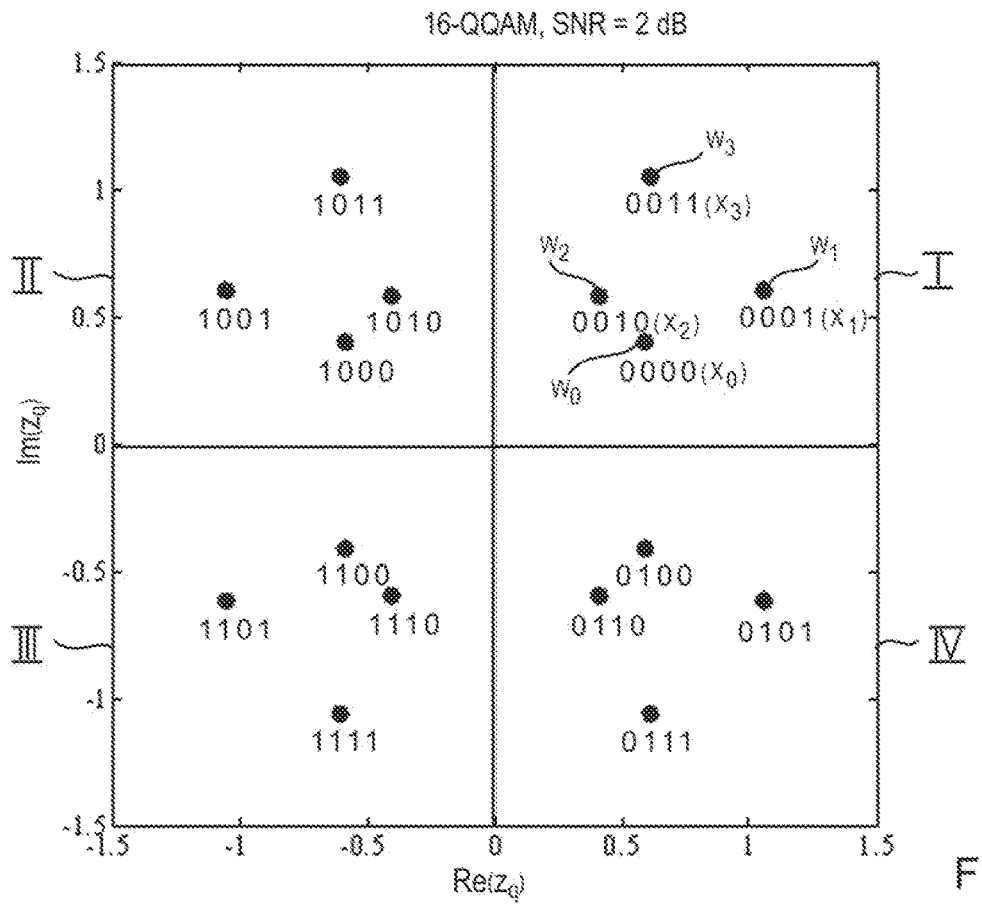
FIG. 9 shows a non-uniform 16-QQAM constellation.

Next, a definition of the QQAM constellation shall be provided. Each input cell word $(y_0, \ldots, y_{m-1})$ shall be modulated using a non-uniform QQAM constellations to give a constellation point zq prior to normalization, where m corresponds to the number of bits per QAM symbol m=$\log_2$ (M). The vector of complex constellation points $x_{0 \ldots M-1}$ for all combinations of the input bits $y_{0 \ldots m-1}$ (corresponding to the decimal values 0 to M−1) are given in the above shown tables for the various constellation sizes depending on the QQAM position vector $w_{0 \ldots b-1}$, which defines the constellation point positions of a first quadrant of the non-uniform constellation. The length b of the QQAM position vector w is defined by b=M/4. The QQAM position vector defines a first quadrant of the constellation (e.g. representing the first quadrant of a cartesian coordinate system according to which the constellation is oriented), namely the constellation points with the decimal values 0 (e.g. $y_{0 \ldots m}$=0000 in case of a 16-QQAM) to b−1 (e.g. $y_{0 \ldots m}$=0011 in case of a 16-QQAM), while the constellation points of the remaining quadrants are derived as follows:

$$x_{0 \ldots b-1} = w_{0 \ldots b-1} \quad \text{(1. quadrant I)}$$

$$x_{b \ldots 2b-1} = \text{conj}(w_{0 \ldots b-1}) \quad \text{(2. quadrant II)}$$

$$x_{2b \ldots 3b-1} = -\text{conj}(w_{0 \ldots b-1}) \quad \text{(3. quadrant IV)}$$

$$x_{3b \ldots 4b-1} = -w_{0 \ldots b-1} \quad \text{(4. quadrant III)}$$

with conj being the complex conjugate. For example, for SNR=2 dB, the corresponding constellation point $z_q$ for a 16-QQAM defined by the QQAM position vector $(w_{0 \ldots 3})$=(0.5879+0.4053i, 1.0566+0.6114i, 0.4053+0.5879i, 0.6114+1.0566i) and the input cell word $(y_0 \ldots y_{m-1})$=(1100) is $x_{12}$=−$w_0$=−0.5879−0.4053i. The complete constellation for this NUC position vector for SNR=2 dB for 16-QQAM is shown in the FIG. 9 with all input cell words marked at the corresponding constellation points.

As mentioned above the constellation position vector w as defined herein does not necessarily contain the constellation points of the first quadrant of the constellation, but could also contain the constellation points of any of the four quadrants. Due to the quadrant symmetry this leads to constellations with a different bit mapping but with identical performance. The constellation position vector w in the tables defined herein should therefore be considered as an example for all four symmetric constellations with different bit mapping but identical performance.

Obviously, numerous modifications and variations of the present disclosure are possible in light of the above teachings. It is therefore to be understood that within the scope of the appended claims, the disclosure may be practiced otherwise than as specifically described herein (e.g., if the NUC position vectors are rounded to a smaller number of digits).

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

In so far as embodiments of the disclosure have been described as being implemented, at least in part, by software-controlled data processing apparatus, it will be appreciated that a non-transitory machine-readable medium carrying such software, such as an optical disk, a magnetic disk, semiconductor memory or the like, is also considered to represent an embodiment of the present disclosure. Further, such a software may also be distributed in other forms, such as via the Internet or other wired or wireless telecommunication systems.

A circuit that may be used for implementing one or more of the elements of the claimed apparatus is a structural assemblage of electronic components including conventional circuit elements, integrated circuits including application specific integrated circuits, standard integrated circuits, application specific standard products, and field programmable gate arrays. Further a circuit includes central processing units, graphics processing units, and microprocessors which are programmed or configured according to software code. A circuit does not include pure software, although a circuit includes the above-described hardware executing software.

Any reference signs in the claims should not be construed as limiting the scope.

The invention claimed is:

1. A receiving apparatus comprising:
    a receiver configured to receive at least one transmission stream including symbols representative of constellation values; and
    at least one processor configured to
        demodulate the symbols into cell words and wherein each of the symbols is associated with a point of a non-uniform constellation (NUC),
        wherein the NUC includes 256 points,
        wherein a first quarter of the NUC includes 64 points defined by the following real and imaginary parts:

1.1980+j1.1541
0.9192+j1.2082
1.2778+j0.8523
1.0390+j0.9253
0.6057+j1.2200
0.7371+j1.4217
0.6678+j1.0021
0.8412+j0.9448
1.2128+j0.5373
1.0048+j0.5165
1.4321+j0.6343
1.0245+j0.7152
0.6384+j0.6073
0.8175+j0.5684
0.6568+j0.7801
0.8311+j0.7459
0.1349+j1.4742
0.1105+j0.2309
0.0634+j0.9796
0.1891+j1.0198
0.4142+j1.4461
0.3323+j1.2279
0.4998+j0.9827
0.3467+j1.0202
0.0680+j0.6501
0.2016+j0.6464
0.0719+j0.8075
0.2088+j0.8146
0.4809+j0.6296
0.3374+j0.6412
0.4955+j0.8008
0.3431+j0.8141
1.2731+j0.1108
1.0794+j0.0977
1.5126+j0.1256
0.9029+j0.0853
0.5429+j0.0694
0.6795+j0.0559

0.5628+j0.1945
0.7326+j0.1410
1.2283+j0.3217
1.0269+j0.3261
1.4663+j0.3716
0.9085+j0.2470
0.6160+j0.4549
0.7818+j0.4247
0.5938+j0.3170
0.7600+j0.2850
0.0595+j0.0707
0.1722+j0.0706
0.0599+j0.2119
0.1748+j0.2114
0.4134+j0.0701
0.2935+j0.0705
0.4231+j0.2066
0.2979+j0.2100
0.0638+j0.5002
0.1905+j0.4966
0.0612+j0.3552
0.1810+j0.3533
0.4630+j0.4764
0.3231+j0.4895
0.4416+j0.3397
0.3083+j0.3490;
  wherein a second quarter of the NUC includes 64 points, each being an opposite of a complex conjugate (−conj) of a point of the first quarter;
  wherein a third quarter of the NUC includes 64 points, each being a complex conjugate (conj) of a point of the first quarter;
  wherein a fourth quarter of the NUC includes 64 points, each being an opposite of a point of the first quarter.

2. The receiving apparatus according to claim 1, wherein the at least one transmission stream is a digital video broadcasting stream.

3. The receiving apparatus according to claim 1, wherein the at least one transmission stream is a terrestrial digital video broadcasting stream.

4. The receiving apparatus according to claim 1, wherein the NUC is a Quadrature Amplitude Modulation (QAM) constellation.

5. The receiving apparatus according to claim 1, wherein bits of the cell words are labeled on the NUC in accordance with a binary reflected Gray mapping.

6. The receiving apparatus according to claim 1, wherein the at least one processor is configured to decode the cell words into output data.

7. A receiving method comprising:
  receiving at least one transmission stream including symbols representative of constellation values; and
  demodulating the symbols into cell words, wherein each of the symbols is associated with a point of a non-uniform constellation (NUC),
  wherein the NUC includes 256 points,
  wherein a first quarter of the NUC includes 64 points defined by the following real and imaginary parts:
1.1980+j1.1541
0.9192+j1.2082
1.2778+j0.8523
1.0390+j0.9253
0.6057+j1.2200
0.7371+j1.4217
0.6678+j1.0021
0.8412+j0.9448
1.2128+j0.5373
1.0048+j0.5165
1.4321+j0.6343
1.0245+j0.7152
0.6384+j0.6073
0.8175+j0.5684
0.6568+j0.7801
0.8311+j0.7459
0.1349+j1.4742
0.1105+j0.2309
0.0634+j0.9796
0.1891+j1.0198
0.4142+j1.4461
0.3323+j1.2279
0.4998+j0.9827
0.3467+j1.0202
0.0680+j0.6501
0.2016+j0.6464
0.0719+j0.8075
0.2088+j0.8146
0.4809+j0.6296
0.3374+j0.6412
0.4955+j0.8008
0.3431+j0.8141
1.2731+j0.1108
1.0794+j0.0977
1.5126+j0.1256
0.9029+j0.0853
0.5429+j0.0694
0.6795+j0.0559
0.5628+j0.1945
0.7326+j0.1410
1.2283+j0.3217
1.0269+j0.3261
1.4663+j0.3716
0.9085+j0.2470
0.6160+j0.4549
0.7818+j0.4247
0.5938+j0.3170
0.7600+j0.2850
0.0595+j0.0707
0.1722+j0.0706
0.0599+j0.2119
0.1748+j0.2114
0.4134+j0.0701
0.2935+j0.0705
0.4231+j0.2066
0.2979+j0.2100
0.0638+j0.5002
0.1905+j0.4966
0.0612+j0.3552
0.1810+j0.3533
0.4630+j0.4764
0.3231+j0.4895
0.4416+j0.3397
0.3083+j0.3490;
  wherein a second quarter of the NUC includes 64 points, each being an opposite of a complex conjugate (−conj) of a point of the first quarter;
  wherein a third quarter of the NUC includes 64 points, each being a complex conjugate (conj) of a point of the first quarter;
  wherein a fourth quarter of the NUC includes 64 points, each being an opposite of a point of the first quarter.

8. The receiving method according to claim 7, wherein the at least one transmission stream is a digital video broadcasting stream.

9. The receiving method according to claim 7, wherein the at least one transmission stream is a terrestrial digital video broadcasting stream.

10. The receiving method according to claim 7, wherein the NUC is a Quadrature Amplitude Modulation (QAM) constellation.

11. The receiving method according to claim 7, wherein bits of the cell words are labeled on the NUC in accordance with a binary reflected Gray mapping.

12. The receiving method according to claim 7, further comprising decoding the cell words into output data.

13. A non-transitory computer-readable storage medium storing computer-readable instructions, which, when executed by a receiving apparatus, cause the receiving apparatus to perform a receiving method comprising:
   receiving at least one transmission stream including symbols representative of constellation values; and
   demodulating the symbols into cell words, wherein each of the symbols is associated with a point of a non-uniform constellation (NUC),
   wherein the NUC includes 256 points,
   wherein a first quarter of the NUC includes 64 points defined by the following real and imaginary parts:
   1.1980+j1.1541
   0.9192+j1.2082
   1.2778+j0.8523
   1.0390+j0.9253
   0.6057+j1.2200
   0.7371+j1.4217
   0.6678+j1.0021
   0.8412+j0.9448
   1.2128+j0.5373
   1.0048+j0.5165
   1.4321+j0.6343
   1.0245+j0.7152
   0.6384+j0.6073
   0.8175+j0.5684
   0.6568+j0.7801
   0.8311+j0.7459
   0.1349+j1.4742
   0.1105+j0.2309
   0.0634+j0.9796
   0.1891+j1.0198
   0.4142+j1.4461
   0.3323+j1.2279
   0.4998+j0.9827
   0.3467+j1.0202
   0.0680+j0.6501
   0.2016+j0.6464
   0.0719+j0.8075
   0.2088+j0.8146
   0.4809+j0.6296
   0.3374+j0.6412
   0.4955+j0.8008
   0.3431+j0.8141
   1.2731+j0.1108
   1.0794+j0.0977
   1.5126+j0.1256
   0.9029+j0.0853
   0.5429+j0.0694
   0.6795+j0.0559
   0.5628+j0.1945
   0.7326+j0.1410
   1.2283+j0.3217
   1.0269+j0.3261
   1.4663+j0.3716
   0.9085+j0.2470
   0.6160+j0.4549
   0.7818+j0.4247
   0.5938+j0.3170
   0.7600+j0.2850
   0.0595+j0.0707
   0.1722+j0.0706
   0.0599+j0.2119
   0.1748+j0.2114
   0.4134+j0.0701
   0.2935+j0.0705
   0.4231+j0.2066
   0.2979+j0.2100
   0.0638+j0.5002
   0.1905+j0.4966
   0.0612+j0.3552
   0.1810+j0.3533
   0.4630+j0.4764
   0.3231+j0.4895
   0.4416+j0.3397
   0.3083+j0.3490;
   wherein a second quarter of the NUC includes 64 points, each being an opposite of a complex conjugate (−conj) of a point of the first quarter;
   wherein a third quarter of the NUC includes 64 points, each being a complex conjugate (conj) of a point of the first quarter;
   wherein a fourth quarter of the NUC includes 64 points, each being an opposite of a point of the first quarter.

14. A transmitting apparatus comprising:
a transmitter configured to transmit at least one transmission stream including symbols representative of constellation values; and
at least one processor configured to
   modulate cell words into the symbols, wherein each of the symbols is associated with a point of a non-uniform constellation (NUC),
   wherein the NUC includes 256 points,
   wherein a first quarter of the NUC includes 64 points defined by the following real and imaginary parts:
   1.1980+j1.1541
   0.9192+j1.2082
   1.2778+j0.8523
   1.0390+j0.9253
   0.6057+j1.2200
   0.7371+j1.4217
   0.6678+j1.0021
   0.8412+j0.9448
   1.2128+j0.5373
   1.0048+j0.5165
   1.4321+j0.6343
   1.0245+j0.7152
   0.6384+j0.6073
   0.8175+j0.5684
   0.6568+j0.7801
   0.8311+j0.7459
   0.1349+j1.4742
   0.1105+j0.2309
   0.0634+j0.9796
   0.1891+j1.0198
   0.4142+j1.4461
   0.3323+j1.2279
   0.4998+j0.9827
   0.3467+j1.0202
   0.0680+j0.6501
   0.2016+j0.6464
   0.0719+j0.8075
   0.2088+j0.8146

0.4809+j0.6296
0.3374+j0.6412
0.4955+j0.8008
0.3431+j0.8141
1.2731+j0.1108
1.0794+j0.0977
1.5126+j0.1256
0.9029+j0.0853
0.5429+j0.0694
0.6795+j0.0559
0.5628+j0.1945
0.7326+j0.1410
1.2283+j0.3217
1.0269+j0.3261
1.4663+j0.3716
0.9085+j0.2470
0.6160+j0.4549
0.7818+j0.4247
0.5938+j0.3170
0.7600+j0.2850
0.0595+j0.0707
0.1722+j0.0706
0.0599+j0.2119
0.1748+j0.2114
0.4134+j0.0701
0.2935+j0.0705
0.4231+j0.2066
0.2979+j0.2100
0.0638+j0.5002
0.1905+j0.4966
0.0612+j0.3552
0.1810+j0.3533
0.4630+j0.4764
0.3231+j0.4895
0.4416+j0.3397
0.3083+j0.3490;
  wherein a second quarter of the NUC includes 64 points, each being an opposite of a complex conjugate (−conj) of a point of the first quarter;
  wherein a third quarter of the NUC includes 64 points, each being a complex conjugate (conj) of a point of the first quarter;
  wherein a fourth quarter of the NUC includes 64 points, each being an opposite of a point of the first quarter.

15. A transmitting method comprising:
modulating cell words into symbols and wherein each of the symbols is associated with a point of a non-uniform constellation (NUC); and
transmitting at least one transmission stream including the symbols representative of constellation values,
wherein the NUC includes 256 points,
wherein a first quarter of the NUC includes 64 points defined by the following real and imaginary parts:
1.1980+j1.1541
0.9192+j1.2082
1.2778+j0.8523
1.0390+j0.9253
0.6057+j1.2200
0.7371+j1.4217
0.6678+j1.0021
0.8412+j0.9448
1.2128+j0.5373
1.0048+j0.5165
1.4321+j0.6343
1.0245+j0.7152
0.6384+j0.6073
0.8175+j0.5684
0.6568+j0.7801
0.8311+j0.7459
0.1349+j1.4742
0.1105+j0.2309
0.0634+j0.9796
0.1891+j1.0198
0.4142+j1.4461
0.3323+j1.2279
0.4998+j0.9827
0.3467+j1.0202
0.0680+j0.6501
0.2016+j0.6464
0.0719+j0.8075
0.2088+j0.8146
0.4809+j0.6296
0.3374+j0.6412
0.4955+j0.8008
0.3431+j0.8141
1.2731+j0.1108
1.0794+j0.0977
1.5126+j0.1256
0.9029+j0.0853
0.5429+j0.0694
0.6795+j0.0559
0.5628+j0.1945
0.7326+j0.1410
1.2283+j0.3217
1.0269+j0.3261
1.4663+j0.3716
0.9085+j0.2470
0.6160+j0.4549
0.7818+j0.4247
0.5938+j0.3170
0.7600+j0.2850
0.0595+j0.0707
0.1722+j0.0706
0.0599+j0.2119
0.1748+j0.2114
0.4134+j0.0701
0.2935+j0.0705
0.4231+j0.2066
0.2979+j0.2100
0.0638+j0.5002
0.1905+j0.4966
0.0612+j0.3552
0.1810+j0.3533
0.4630+j0.4764
0.3231+j0.4895
0.4416+j0.3397
0.3083+j0.3490;
  wherein a second quarter of the NUC includes 64 points, each being an opposite of a complex conjugate (−conj) of a point of the first quarter;
  wherein a third quarter of the NUC includes 64 points, each being a complex conjugate (conj) of a point of the first quarter;
  wherein a fourth quarter of the NUC includes 64 points, each being an opposite of a point of the first quarter.

16. A non-transitory computer-readable storage medium storing computer-readable instructions, which, when executed by a transmission apparatus, cause the transmission apparatus to perform a transmitting method comprising:
  modulating cell words into symbols and wherein each of the symbols is associated with a point of a non-uniform constellation (NUC); and
  transmitting at least one transmission stream including the symbols representative of constellation values, wherein the NUC includes 256 points,
wherein a first quarter of the NUC includes 64 points defined by the following real and imaginary parts:

1.1980+j1.1541
0.9192+j1.2082
1.2778+j0.8523
1.0390+j0.9253
0.6057+j1.2200
0.7371+j1.4217
0.6678+j1.0021
0.8412+j0.9448
1.2128+j0.5373
1.0048+j0.5165
1.4321+j0.6343
1.0245+j0.7152
0.6384+j0.6073
0.8175+j0.5684
0.6568+j0.7801
0.8311+j0.7459
0.1349+j1.4742
0.1105+j0.2309
0.0634+j0.9796
0.1891+j1.0198
0.4142+j1.4461
0.3323+j1.2279
0.4998+j0.9827
0.3467+j1.0202
0.0680+j0.6501
0.2016+j0.6464
0.0719+j0.8075
0.2088+j0.8146
0.4809+j0.6296
0.3374+j0.6412
0.4955+j0.8008
0.3431+j0.8141
1.2731+j0.1108
1.0794+j0.0977
1.5126+j0.1256
0.9029+j0.0853
0.5429+j0.0694
0.6795+j0.0559
0.5628+j0.1945
0.7326+j0.1410
1.2283+j0.3217
1.0269+j0.3261
1.4663+j0.3716
0.9085+j0.2470
0.6160+j0.4549
0.7818+j0.4247
0.5938+j0.3170
0.7600+j0.2850
0.0595+j0.0707
0.1722+j0.0706
0.0599+j0.2119
0.1748+j0.2114
0.4134+j0.0701
0.2935+j0.0705
0.4231+j0.2066
0.2979+j0.2100
0.0638+j0.5002
0.1905+j0.4966
0.0612+j0.3552
0.1810+j0.3533
0.4630+j0.4764
0.3231+j0.4895
0.4416+j0.3397
0.3083+j0.3490;

wherein a second quarter of the NUC includes 64 points, each being an opposite of a complex conjugate (−conj) of a point of the first quarter;
wherein a third quarter of the NUC includes 64 points, each being a complex conjugate (conj) of a point of the first quarter;
wherein a fourth quarter of the NUC includes 64 points, each being an opposite of a point of the first quarter.

* * * * *